United States Patent
Wang et al.

(10) Patent No.: US 10,574,227 B2
(45) Date of Patent: Feb. 25, 2020

(54) MAIN-AUXILIARY FIELD-EFFECT TRANSISTOR STRUCTURES FOR RADIO FREQUENCY APPLICATIONS

(71) Applicant: SKYWORKS SOLUTIONS, INC., Woburn, MA (US)

(72) Inventors: Hailing Wang, Acton, MA (US); Dylan Charles Bartle, Arlington, MA (US); Hanching Fuh, Allston, MA (US); Jerod F. Mason, Bedford, MA (US); David Scott Whitefield, Andover, MA (US); Paul T. DiCarlo, Marlborough, MA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/716,387

(22) Filed: Sep. 26, 2017

(65) Prior Publication Data
US 2018/0091136 A1 Mar. 29, 2018

Related U.S. Application Data

(60) Provisional application No. 62/399,635, filed on Sep. 26, 2016.

(51) Int. Cl.
*H03K 17/16* (2006.01)
*H01L 23/66* (2006.01)
*H01L 27/12* (2006.01)
*H04B 1/38* (2015.01)

(52) U.S. Cl.
CPC ........... *H03K 17/161* (2013.01); *H01L 23/66* (2013.01); *H01L 27/1203* (2013.01); *H01L 2223/6677* (2013.01); *H04B 1/38* (2013.01)

(58) Field of Classification Search
CPC .. H03K 17/161; H03K 17/102; H03K 17/122; H03K 17/693
USPC .................. 327/403–405, 293, 294, 108–112
See application file for complete search history.

(56) References Cited

U.S. PATENT DOCUMENTS

| 6,636,115 B2 * | 10/2003 | Kim ....................... H03D 7/145 327/359 |
| 6,819,184 B2 | 11/2004 | Pengelly et al. |
| 6,977,553 B1 | 12/2005 | Jin et al. |
| 7,319,364 B2 * | 1/2008 | Kim ........................ H03F 1/223 330/283 |

(Continued)

FOREIGN PATENT DOCUMENTS

WO 2014011510 A2 1/2014

OTHER PUBLICATIONS

International Search Report, PCT/US2017/053560, dated Mar. 8, 2018, in 4 pages.

(Continued)

*Primary Examiner* — Tomi Skibinski
(74) *Attorney, Agent, or Firm* — Chang & Hale LLP

(57) ABSTRACT

Disclosed herein are switching or other active FET configurations that implement a main-auxiliary branch design. Such designs include a circuit assembly for performing a switching function that includes a branch including a main path in parallel with an auxiliary path. The circuit assembly also includes a gate bias network connected to the main path and to the auxiliary path, the main path and the auxiliary path each having different structures that are configured to improve linearity of the switching function.

10 Claims, 79 Drawing Sheets

(56) References Cited

U.S. PATENT DOCUMENTS

| | | | |
|---|---|---|---|
| 7,362,183 B2* | 4/2008 | Kim | H03F 1/223 |
| | | | 330/295 |
| 8,242,847 B1* | 8/2012 | Leong | H03F 1/223 |
| | | | 330/149 |
| 8,868,008 B2 | 10/2014 | Tanaka et al. | |
| 9,893,723 B1 | 2/2018 | Garofalo | |
| 2004/0085132 A1* | 5/2004 | Pengelly | H03F 1/3205 |
| | | | 330/295 |
| 2006/0284652 A1 | 12/2006 | Abe et al. | |
| 2007/0287404 A1* | 12/2007 | Arnborg | H01L 21/823412 |
| | | | 455/333 |
| 2009/0174481 A1* | 7/2009 | Chang | H03F 1/223 |
| | | | 330/277 |
| 2010/0194449 A1* | 8/2010 | Arnborg | H03F 1/3205 |
| | | | 327/109 |
| 2010/0308891 A1 | 12/2010 | Von Kaenel | |
| 2011/0037518 A1 | 2/2011 | Lee et al. | |
| 2014/0009203 A1* | 1/2014 | Cebi | H03K 17/162 |
| | | | 327/379 |
| 2014/0171005 A1 | 6/2014 | Mikhemar et al. | |
| 2015/0341026 A1 | 11/2015 | de Jongh | |
| 2018/0091131 A1 | 3/2018 | Wang et al. | |
| 2018/0091132 A1 | 3/2018 | Wang et al. | |
| 2018/0091133 A1 | 3/2018 | Wang et al. | |
| 2018/0091134 A1 | 3/2018 | Wang et al. | |
| 2018/0091135 A1 | 3/2018 | Wang et al. | |

OTHER PUBLICATIONS

Written Opinion of the International Searching Authority, PCT/US2017/053560, dated Mar. 8, 2018, in 38 pages.

* cited by examiner

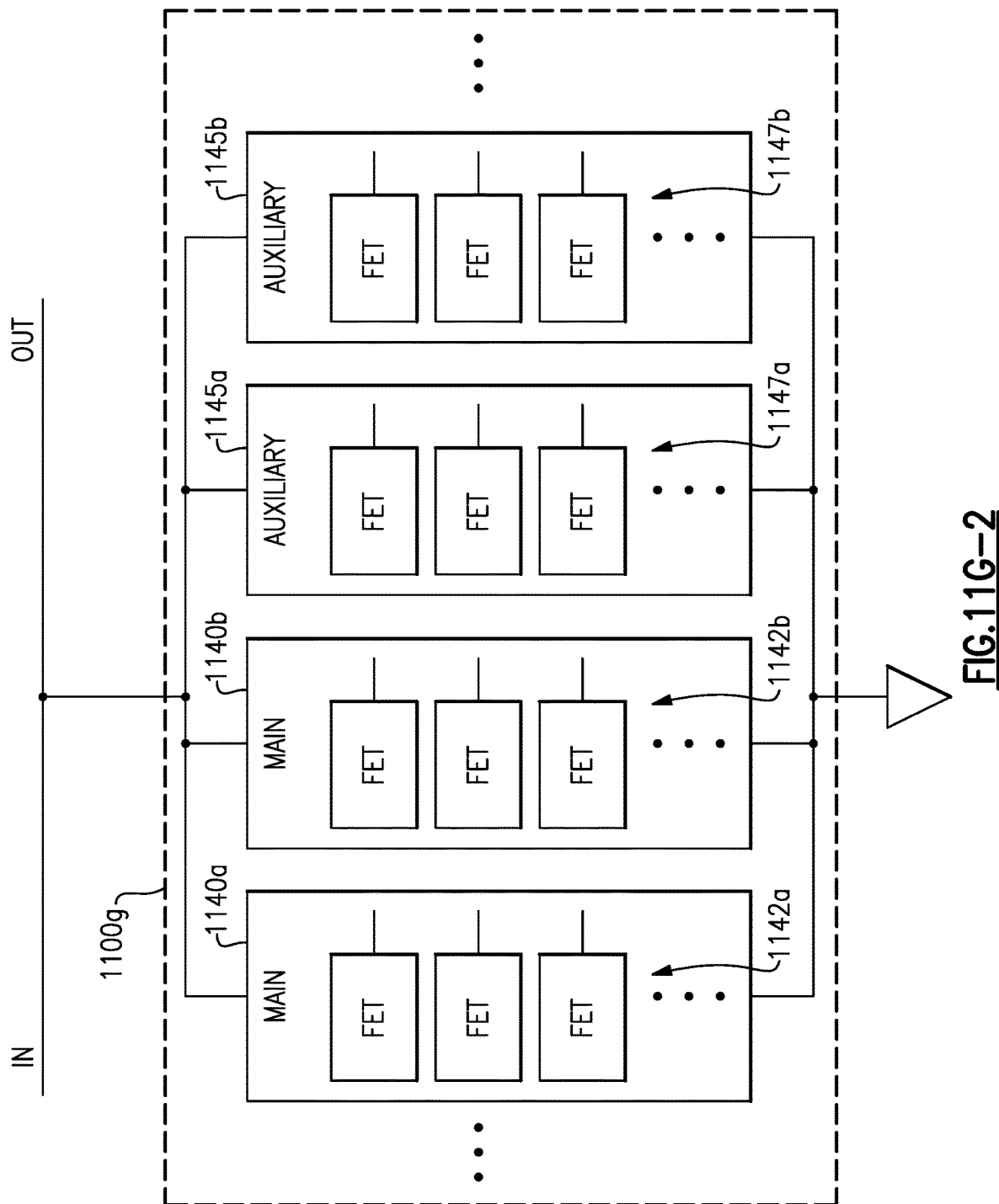

MAIN-AUXILIARY FIELD-EFFECT TRANSISTOR STRUCTURES FOR RADIO FREQUENCY APPLICATIONS

CROSS-REFERENCE TO RELATED APPLICATIONS

This application claims priority to U.S. Provisional Application No. 62/399,635 filed Sep. 26, 2016 and entitled "Master-Slave Field-Effect Transistor Configurations for Radio Frequency Applications," which is expressly incorporated by reference herein in its entirety for all purposes.

BACKGROUND

Field

The present disclosure generally relates to transistor and switch configurations for wireless communication.

Description of Related Art

In electronics applications, field-effect transistors (FETs) can be utilized as switches and in amplifiers. Switches can allow, for example, routing of radio-frequency (RF) signals in wireless devices. FETs in switches and other circuits can introduce distortions into signals due at least in part to harmonics generated by the FETs.

SUMMARY

According to a number of implementations, the present disclosure relates to a circuit assembly for performing a switching function, the circuit assembly having a branch including a main path in parallel with an auxiliary path, a first gate bias network connected to the main path, and a second gate bias network connected to the auxiliary path, the second gate bias network configured to improve linearity of the switching function.

In some embodiments, the circuit assembly further includes a body bias network coupled to the main path. In some embodiments, the body bias network is further coupled to the auxiliary path.

In some embodiments, the main path comprises a plurality of field-effect transistors. In some embodiments, the auxiliary path comprises a plurality of field-effect transistors.

In some embodiments, the branch is coupled between a series arm and a reference potential node in a shunt configuration. In some embodiments, the second gate bias network is configured to reduce capacitive nonlinearity of the switching function.

In some embodiments, the first gate bias network is configured to bias the main path in a strong inversion region and the second gate bias network is configured to bias the auxiliary path in a weak inversion region. In some embodiments, the circuit assembly further includes a bias feedback module configured to adjust a bias of the second gate bias network based at least in part on a power or a frequency of an input signal to the branch. In some embodiments, the second gate bias network is configured to bias the auxiliary path to generate third-order harmonics or third-order intermodulation products that are opposite in phase to third-order harmonics or third-order intermodulation products generated by the main path.

According to a number of implementations, the present disclosure relates to a radio-frequency (RF) switching configuration including an input node configured to receive an input signal; an output node configured to provide an output signal related to the input signal; a main-auxiliary branch coupled between the input node and the output node, the main-auxiliary branch including a main path having a main field-effect transistor (FET) and an auxiliary path having an auxiliary FET, the main path coupled in parallel with the auxiliary path; a main gate bias network configured to provide a main gate bias voltage to the main FET; and an auxiliary gate bias network configured to provide an auxiliary bias voltage to the auxiliary FET such that the auxiliary path generates distortions that are opposite in phase to distortions generated by the main path to reduce distortions through the main-auxiliary branch.

In some embodiments, the main FET is configured to operate in a strong inversion region responsive to the main bias voltage. In some embodiments, the auxiliary FET is configured to operate in a weak inversion region responsive to the auxiliary bias voltage.

In some embodiments, the main gate bias voltage is greater than the auxiliary gate bias voltage. In some embodiments, the main path further includes a second main FET. In some embodiments, the main gate bias network is further configured to provide the main gate bias voltage to the second main FET.

In some embodiments, the auxiliary path further includes a second auxiliary FET. In some embodiments, the auxiliary gate bias network is further configured to provide the auxiliary gate bias voltage to the second auxiliary FET. In some embodiments, the RF switching configuration further includes a second auxiliary gate bias network configured to provide a second auxiliary gate bias voltage to the second auxiliary FET. In some embodiments, the second auxiliary gate bias voltage is different from the auxiliary gate bias voltage. In some embodiments, the main gate bias network is further configured to provide the main gate bias voltage to the second auxiliary FET.

In some embodiments, the RF switching configuration further includes a body bias network configured to provide a body bias voltage to the main FET and to the auxiliary FET. In some embodiments, the main gate bias network is configured to provide two static voltages to the main FET corresponding to on and off states. In some embodiments, the auxiliary gate bias network is configured to provide a dynamic voltage to the auxiliary FET. In some embodiments, the auxiliary gate bias network is configured to generate the auxiliary gate bias voltage responsive to a power of the input signal at the input node. In some embodiments, the auxiliary gate bias network is configured to generate the auxiliary gate bias voltage responsive to a frequency of the input signal at the input node.

According to a number of implementations, the present disclosure relates to a radio-frequency (RF) module including a packaging substrate configured to receive a plurality of devices; and a circuit assembly mounted on the packaging substrate, the circuit assembly including a branch including a main path in parallel with an auxiliary path, a first gate bias network connected to the main path, and a second gate bias network connected to the auxiliary path, the second gate bias network configured to improve linearity of the switching function.

In some embodiments, the first gate bias network is configured to bias the main path in a strong inversion region and the second gate bias network is configured to bias the auxiliary path in a weak inversion region.

According to a number of implementations, the present disclosure relates to a wireless device including a transceiver configured to process radio-frequency (RF) signals; an RF module in communication with the transceiver, the RF module including a circuit assembly including a branch including a main path in parallel with an auxiliary path, a first gate bias network connected to the main path, and a second gate bias network connected to the auxiliary path, the second gate bias network configured to improve linearity of the switching function; and an antenna in communication with the RF module, the antenna configured to facilitate transmitting and/or receiving of the RF signals.

In some embodiments, the first gate bias network is configured to bias the main path in a strong inversion region and the second gate bias network is configured to bias the auxiliary path in a weak inversion region.

According to a number of implementations, the present disclosure relates to a circuit assembly for performing a switching function, the circuit assembly including a branch including a main path in series with an auxiliary path; a first gate bias network connected to the main path; and a second gate bias network connected to the auxiliary path, the second gate bias network configured to improve linearity of the switching function.

In some embodiments, the circuit assembly further includes a body bias network coupled to the main path. In some embodiments, the body bias network is further coupled to the auxiliary path.

In some embodiments, the main path comprises a plurality of field-effect transistors. In some embodiments, the auxiliary path comprises a plurality of field-effect transistors.

In some embodiments, the branch is coupled between a series arm and a reference potential node in a shunt configuration. In some embodiments, the second gate bias network is configured to reduce capacitive nonlinearity of the switching function.

In some embodiments, the first gate bias network is configured to bias the main path in a strong inversion region and the second gate bias network is configured to bias the auxiliary path in a weak inversion region. In some embodiments, the circuit assembly further includes a bias feedback module configured to adjust a bias of the second gate bias network based at least in part on a power or a frequency of an input signal to the branch. In some embodiments, the second gate bias network is configured to bias the auxiliary path to generate third-order harmonics or third-order intermodulation products that are opposite in phase to third-order harmonics or third-order intermodulation products generated by the main path.

According to a number of implementations, the present disclosure relates to a radio-frequency (RF) switching configuration including an input node configured to receive an input signal; an output node configured to provide an output signal related to the input signal; a main-auxiliary branch coupled between the input node and the output node, the main-auxiliary branch including a main path having a main field-effect transistor (FET) and an auxiliary path having an auxiliary FET, the main path coupled in series with the auxiliary path; a main gate bias network configured to provide a main gate bias voltage to the main FET; and an auxiliary gate bias network configured to provide an auxiliary bias voltage to the auxiliary FET such that the auxiliary path generates distortions that are opposite in phase to distortions generated by the main path to reduce distortions through the main-auxiliary branch.

In some embodiments, the main FET is configured to operate in a strong inversion region responsive to the main bias voltage. In some embodiments, the auxiliary FET is configured to operate in a weak inversion region responsive to the auxiliary bias voltage.

In some embodiments, the main gate bias voltage is greater than the auxiliary gate bias voltage. In some embodiments, the main path further includes a second main FET. In some embodiments, the main gate bias network is further configured to provide the main gate bias voltage to the second main FET.

In some embodiments, the auxiliary path further includes a second auxiliary FET. In some embodiments, the auxiliary gate bias network is further configured to provide the auxiliary gate bias voltage to the second auxiliary FET. In some embodiments, the circuit assembly further including a second auxiliary gate bias network configured to provide a second auxiliary gate bias voltage to the second auxiliary FET. In some embodiments, the second auxiliary gate bias voltage is different from the auxiliary gate bias voltage. In some embodiments, the main gate bias network is further configured to provide the main gate bias voltage to the second auxiliary FET.

In some embodiments, the circuit assembly further includes a body bias network configured to provide a body bias voltage to the main FET and to the auxiliary FET. In some embodiments, the main gate bias network is configured to provide two static voltages to the main FET corresponding to on and off states. In some embodiments, the auxiliary gate bias network is configured to provide a dynamic voltage to the auxiliary FET. In some embodiments, the auxiliary gate bias network is configured to generate the auxiliary gate bias voltage responsive to a power of the input signal at the input node. In some embodiments, the auxiliary gate bias network is configured to generate the auxiliary gate bias voltage responsive to a frequency of the input signal at the input node.

According to a number of implementations, the present disclosure relates to a radio-frequency (RF) module including a packaging substrate configured to receive a plurality of devices; and a circuit assembly mounted on the packaging substrate, the circuit assembly including a branch including a main path in series with an auxiliary path, a first gate bias network connected to the main path, and a second gate bias network connected to the auxiliary path, the second gate bias network configured to improve linearity of the switching function.

In some embodiments, the first gate bias network is configured to bias the main path in a strong inversion region and the second gate bias network is configured to bias the auxiliary path in a weak inversion region.

According to a number of implementations, the present disclosure relates to a wireless device that includes a transceiver configured to process radio-frequency (RF) signals; an RF module in communication with the transceiver, the RF module including a circuit assembly including a branch including a main path in series with an auxiliary path, a first gate bias network connected to the main path, and a second gate bias network connected to the auxiliary path, the second gate bias network configured to improve linearity of the switching function; and an antenna in communication with the RF module, the antenna configured to facilitate transmitting and/or receiving of the RF signals.

In some embodiments, the first gate bias network is configured to bias the main path in a strong inversion region and the second gate bias network is configured to bias the auxiliary path in a weak inversion region.

According to a number of implementations, the present disclosure relates to a circuit assembly for performing a switching function that includes a branch including a main path in parallel with an auxiliary path; and a gate bias network connected to the main path and to the auxiliary path, the main path and the auxiliary path each having different structures that are configured to improve linearity of the switching function.

In some embodiments, the gate bias network is configured to bias the main path in a strong inversion region and to bias the auxiliary path in a weak inversion region. In some embodiments, the gate bias network is configured to bias the auxiliary path to generate third-order harmonics or third-order intermodulation products that are opposite in phase to third-order harmonics or third-order intermodulation products generated by the main path.

In some embodiments, the different structures include different well implants. In some embodiments, the different structures include different halo implants. In some embodiments, the different structures include different device geometries. In some embodiments, the different structures include different gate oxide thicknesses. In some embodiments, the different structures include different buried oxide (BOX) layer thickness. In some embodiments, the different structures include different silicon thickness.

In some embodiments, the circuit assembly further includes a body bias network connected to both the main path and the auxiliary path. In some embodiments, the main path and the auxiliary path are part of a multi-finger device.

According to a number of implementations, the present disclosure relates to a circuit assembly for performing a switching function that includes a branch including a main path in series with an auxiliary path; and a gate bias network connected to the main path and to the auxiliary path, the main path and the auxiliary path each having different structures that are configured to improve linearity of the switching function.

In some embodiments, the gate bias network is configured to bias the main path in a strong inversion region and to bias the auxiliary path in a weak inversion region. In some embodiments, the gate bias network is configured to bias the auxiliary path to generate third-order harmonics or third-order intermodulation products that are opposite in phase to third-order harmonics or third-order intermodulation products generated by the main path. In some embodiments, the branch further includes a second auxiliary path in series with the main path and the auxiliary path.

In some embodiments, the auxiliary path includes a plurality of field-effect transistors. In some embodiments, the main path includes a plurality of field-effect transistors. In some embodiments, a first subset of the plurality of field-effect transistors of the auxiliary path is coupled to an input of the branch, a second subset of the plurality of field-effect transistors of the auxiliary path is coupled to an output of the branch, and the plurality of field-effect transistors of the main path are coupled between the first subset and the second subset of the plurality of field-effect transistors of the auxiliary path.

In some embodiments, the circuit assembly further includes a body bias network connected to the main path and to the auxiliary path.

In some embodiments, the different structures include at least one of different well implants, halo implants, device geometries, gate oxide thicknesses, buried oxide layer thicknesses, or silicon thicknesses. In some embodiments, the main path and the auxiliary path are part of a multi-finger device.

In some embodiments, the branch is coupled between a series arm and a reference potential node in a shunt configuration. In some embodiments, the second gate bias network is configured to reduce capacitive nonlinearity of the switching function.

According to a number of implementations, the present disclosure relates to a radio-frequency (RF) module that includes a packaging substrate configured to receive a plurality of devices; and a circuit assembly mounted on the packaging substrate, the circuit assembly including a branch including a main path in parallel with an auxiliary path, and a gate bias network connected to the main path and to the auxiliary path, the main path and the auxiliary path each having different structures that are configured to improve linearity of the switching function.

In some embodiments, the gate bias network is configured to bias the main path in a strong inversion region and to bias the auxiliary path in a weak inversion region. In some embodiments, the circuit assembly is implemented in a series arm of a multi-pole, multi-throw switch.

According to a number of implementations, the present disclosure relates to a wireless device that includes a transceiver configured to process radio-frequency (RF) signals; an RF module in communication with the transceiver, the RF module including a circuit assembly including a branch including a main path in series with an auxiliary path, a first gate bias network connected to the main path, and a second gate bias network connected to the auxiliary path, the second gate bias network configured to improve linearity of the switching function; and an antenna in communication with the RF module, the antenna configured to facilitate transmitting and/or receiving of the RF signals.

In some embodiments, the gate bias network is configured to bias the main path in a strong inversion region and to bias the auxiliary path in a weak inversion region. In some embodiments, the circuit assembly is implemented to switch signals to and from the antenna. In some embodiments, the circuit assembly is implemented in a series arm of a multi-pole, multi-throw switch.

According to a number of implementations, the present disclosure relates to a circuit assembly for performing a switching function, the circuit assembly that includes a branch including a main path in parallel with an auxiliary path, both the main path and the auxiliary path having a plurality of field-effect transistors; a first gate bias network connected to the main path; a second gate bias network connected to a first subset of the plurality of FETs of the auxiliary path; and a third gate bias network connected to a second subset of the plurality of FETs of the auxiliary path, the second gate bias network and the third gate bias network being independently configurable to improve linearity of the switching function.

In some embodiments, the third gate bias network is configured to bias the second subset of the plurality of FETs using a first voltage. In some embodiments, the second gate bias network is configured to bias the third subset of the plurality of FETs using a second voltage different from the first voltage. In some embodiments, the second gate bias network is configured to bias the third subset of the plurality of FETs using a second voltage equal to the first voltage.

In some embodiments, the third gate bias network is configured to turn off the second subset of the plurality of FETs of the auxiliary path to improve linearity of the switching function. In some embodiments, the second subset of the plurality of FETs of the auxiliary path includes a greater number of FETs than the first subset of the plurality of FETs of the auxiliary path. In some embodiments, the second subset of the plurality of FETs of the auxiliary path includes the same number of FETs as the first subset of the plurality of FETs of the auxiliary path.

In some embodiments, the first gate bias network is configured to bias the main path in a strong inversion region, the second gate bias network is configured to bias the first subset of the plurality of FETs of the auxiliary path in a weak inversion region, and the third gate bias network is configured to bias the second subset of the plurality of FETs of the auxiliary path in a weak inversion region.

In some embodiments, the second gate bias network is configured to bias the first subset of the plurality of FETs of the auxiliary path to generate third-order harmonics or third-order intermodulation products that are opposite in phase to third-order harmonics or third-order intermodulation products generated by the main path. In some embodiments, the third gate bias network is configured to bias the second subset of the plurality of FETs of the auxiliary path to generate third-order harmonics or third-order intermodulation products that are opposite in phase to third-order harmonics or third-order intermodulation products generated by the main path.

In some embodiments, the branch is coupled between a series arm and a reference potential node in a shunt configuration. In some embodiments, the second gate bias network and the third gate bias network are configured to reduce capacitive nonlinearity of the switching function.

According to a number of implementations, the present disclosure relates to a circuit assembly for performing a switching function, the circuit assembly that includes a branch including a main path in series with an auxiliary path, both the main path and the auxiliary path having a plurality of field-effect transistors; a first gate bias network connected to the main path; a second gate bias network connected to a first subset of the plurality of FETs of the auxiliary path; and a third gate bias network connected to a second subset of the plurality of FETs of the auxiliary path, the second gate bias network and the third gate bias network being independently configurable to improve linearity of the switching function.

In some embodiments, the third gate bias network is configured to bias the second subset of the plurality of FETs using a first voltage. In some embodiments, the second gate bias network is configured to bias the third subset of the plurality of FETs using a second voltage different from the first voltage. In some embodiments, the second gate bias network is configured to bias the third subset of the plurality of FETs using a second voltage equal to the first voltage.

In some embodiments, the third gate bias network is configured to turn off the second subset of the plurality of FETs of the auxiliary path to improve linearity of the switching function. In some embodiments, the second subset of the plurality of FETs of the auxiliary path includes a greater number of FETs than the first subset of the plurality of FETs of the auxiliary path. In some embodiments, the second subset of the plurality of FETs of the auxiliary path includes the same number of FETs as the first subset of the plurality of FETs of the auxiliary path. In some embodiments, the first gate bias network is configured to bias the main path in a strong inversion region, the second gate bias network is configured to bias the first subset of the plurality of FETs of the auxiliary path in a weak inversion region, and the third gate bias network is configured to bias the second subset of the plurality of FETs of the auxiliary path in a weak inversion region.

In some embodiments, the second gate bias network is configured to bias the first subset of the plurality of FETs of the auxiliary path to generate third-order harmonics or third-order intermodulation products that are opposite in phase to third-order harmonics or third-order intermodulation products generated by the main path. In some embodiments, the third gate bias network is configured to bias the second subset of the plurality of FETs of the auxiliary path to generate third-order harmonics or third-order intermodulation products that are opposite in phase to third-order harmonics or third-order intermodulation products generated by the main path.

In some embodiments, the branch is coupled between a series arm and a reference potential node in a shunt configuration. In some embodiments, the second gate bias network and the third gate bias network are configured to reduce capacitive nonlinearity of the switching function.

In some embodiments, the first subset of the plurality of field-effect transistors of the auxiliary path is coupled to an input of the branch, the second subset of the plurality of field-effect transistors of the auxiliary path is coupled to an output of the branch, and the plurality of field-effect transistors of the main path are coupled between the first subset and the second subset of the plurality of field-effect transistors of the auxiliary path.

According to a number of implementations, the present disclosure relates to a radio-frequency (RF) module that includes a packaging substrate configured to receive a plurality of devices; and a circuit assembly mounted on the packaging substrate, the circuit assembly including a branch including a branch including a main path in parallel with an auxiliary path, both the main path and the auxiliary path having a plurality of field-effect transistors, a first gate bias network connected to the main path, a second gate bias network connected to a first subset of the plurality of FETs of the auxiliary path, and a third gate bias network connected to a second subset of the plurality of FETs of the auxiliary path, the second gate bias network and the third gate bias network being independently configurable to improve linearity of the switching function.

In some embodiments, the first gate bias network is configured to bias the main path in a strong inversion region, the second gate bias network is configured to bias the first subset of the plurality of FETs of the auxiliary path in a weak inversion region, and the third gate bias network is configured to bias the second subset of the plurality of FETs of the auxiliary path in a weak inversion region.

According to a number of implementations, the present disclosure relates to a wireless device that includes a transceiver configured to process radio-frequency (RF) signals; an RF module in communication with the transceiver, the RF module including a circuit assembly including a branch including a branch including a main path in parallel with an auxiliary path, both the main path and the auxiliary path having a plurality of field-effect transistors, a first gate bias network connected to the main path, a second gate bias network connected to a first subset of the plurality of FETs of the auxiliary path, and a third gate bias network connected to a second subset of the plurality of FETs of the auxiliary path, the second gate bias network and the third gate bias network being independently configurable to improve linearity of the switching function; and an antenna in communication with the RF module, the antenna configured to facilitate transmitting and/or receiving of the RF signals.

In some embodiments, the first gate bias network is configured to bias the main path in a strong inversion region, the second gate bias network is configured to bias the first subset of the plurality of FETs of the auxiliary path in a weak inversion region, and the third gate bias network is configured to bias the second subset of the plurality of FETs of the auxiliary path in a weak inversion region. In some embodiments, the circuit assembly is implemented in a series arm of a multi-pole, multi-throw switch.

According to a number of implementations, the present disclosure relates to a circuit assembly for performing a switching function that includes a branch including a main path in parallel with an auxiliary path, both the main path and the auxiliary path having a plurality of field-effect transistors; a first gate bias network connected to the main path; a second gate bias network connected to a first subset of the plurality of FETs of the auxiliary path; and a third gate bias network connected to a second subset of the plurality of FETs of the auxiliary path so that the third gate bias network switches on the auxiliary path when the main path is on for nonlinear cancellation, and switches off the auxiliary path when the main path is off to enable the branch to withstand maximum voltage swings.

The circuit assembly of claim 1 wherein the third gate bias network off the auxiliary path responsive to performance of the main path performance being sufficient to achieve a targeted linearity. In some embodiments, the third gate bias network is configured to bias the second subset of the plurality of FETs using a first voltage. In some embodiments, the second gate bias network is configured to bias the third subset of the plurality of FETs using a second voltage different from the first voltage. In some embodiments, the second gate bias network is configured to bias the third subset of the plurality of FETs using a second voltage equal to the first voltage.

In some embodiments, the third gate bias network is configured to turn off the second subset of the plurality of FETs of the auxiliary path to improve linearity of the switching function. In some embodiments, the second subset of the plurality of FETs of the auxiliary path includes a greater number of FETs than the first subset of the plurality of FETs of the auxiliary path. In some embodiments, the second subset of the plurality of FETs of the auxiliary path includes the same number of FETs as the first subset of the plurality of FETs of the auxiliary path. In some embodiments, the first gate bias network is configured to bias the main path in a strong inversion region and the second gate bias network is configured to bias the first subset of the plurality of FETs of the auxiliary path in a weak inversion region.

In some embodiments, the second gate bias network is configured to bias the first subset of the plurality of FETs of the auxiliary path to generate third-order harmonics or third-order intermodulation products that are opposite in phase to third-order harmonics or third-order intermodulation products generated by the main path. In some embodiments, the third gate bias network is configured to bias the second subset of the plurality of FETs of the auxiliary path to generate third-order harmonics or third-order intermodulation products that are opposite in phase to third-order harmonics or third-order intermodulation products generated by the main path.

In some embodiments, the branch is coupled between a series arm and a reference potential node in a shunt configuration. In some embodiments, the second gate bias network and the third gate bias network are configured to reduce capacitive nonlinearity of the switching function.

In some embodiments, the second subset of the plurality of FETs of the auxiliary path are connected to an input of the branch and the first subset of the plurality of FETs of the auxiliary path are connected to an output of the branch. In some embodiments, the second subset of the plurality of FETs of the auxiliary path are connected to an output of the branch and the first subset of the plurality of FETs of the auxiliary path are connected to an input of the branch. In some embodiments, the second subset of the plurality of FETs of the auxiliary path are connected to an input of the branch and to an output of the branch and the first subset of the plurality of FETs of the auxiliary path is connected in series with the second subset of the plurality of FETs of the auxiliary path.

According to a number of implementations, the present disclosure relates to a radio-frequency (RF) module that includes a packaging substrate configured to receive a plurality of devices; and a circuit assembly mounted on the packaging substrate, the circuit assembly including a branch including a main path in parallel with an auxiliary path, both the main path and the auxiliary path having a plurality of field-effect transistors, a first gate bias network connected to the main path, a second gate bias network connected to a first subset of the plurality of FETs of the auxiliary path, and a third gate bias network connected to a second subset of the plurality of FETs of the auxiliary path so that the third gate bias network switches on the auxiliary path when the main path is on for nonlinear cancellation, and switches off the auxiliary path when the main path is off to enable the branch to withstand maximum voltage swings.

In some embodiments, the first gate bias network is configured to bias the main path in a strong inversion region and the second gate bias network is configured to bias the first subset of the plurality of FETs of the auxiliary path in a weak inversion region.

According to a number of implementations, the present disclosure relates to a wireless device that includes a transceiver configured to process radio-frequency (RF) signals; an RF module in communication with the transceiver, the RF module including a circuit assembly including a branch including a main path in parallel with an auxiliary path, both the main path and the auxiliary path having a plurality of field-effect transistors, a first gate bias network connected to the main path, a second gate bias network connected to a first subset of the plurality of FETs of the auxiliary path, and a third gate bias network connected to a second subset of the plurality of FETs of the auxiliary path so that the third gate bias network switches on the auxiliary path when the main path is on for nonlinear cancellation, and switches off the auxiliary path when the main path is off to enable the branch to withstand maximum voltage swings; and an antenna in communication with the RF module, the antenna configured to facilitate transmitting and/or receiving of the RF signals.

In some embodiments, the first gate bias network is configured to bias the main path in a strong inversion region and the second gate bias network is configured to bias the first subset of the plurality of FETs of the auxiliary path in a weak inversion region.

According to a number of implementations, the present disclosure relates to a circuit assembly for performing a switching function, the circuit assembly includes a branch including a main path in parallel with a first auxiliary path and the main path in series with a second auxiliary path; a first gate bias network connected to the main path; a second gate bias network connected to the first auxiliary path; and a third gate bias network connected to the second auxiliary path, the second gate bias network and the third gate bias network configured to improve linearity of the switching function.

In some embodiments, the circuit assembly further includes a body bias network coupled to the main path. In some embodiments, the body bias network is further coupled to the first auxiliary path and to the second auxiliary path.

In some embodiments, the main path comprises a plurality of field-effect transistors. In some embodiments, the first auxiliary path comprises a plurality of field-effect transistors and the second auxiliary path comprises a plurality of field-effect transistors.

In some embodiments, the branch is coupled between a series arm and a reference potential node in a shunt configuration. In some embodiments, the second gate bias network and the third gate bias network are configured to reduce capacitive nonlinearity of the switching function.

In some embodiments, the first gate bias network is configured to bias the main path in a strong inversion region, the second gate bias network is configured to bias the first auxiliary path in a weak inversion region, and the third gate bias network is configured to bias the auxiliary path in a weak inversion region. In some embodiments, the circuit assembly further includes a bias feedback module configured to adjust a bias of the second gate bias network based at least in part on a power or a frequency of an input signal to the branch. In some embodiments, the second gate bias network is configured to bias the first auxiliary path to generate third-order harmonics or third-order intermodulation products that are opposite in phase to third-order harmonics or third-order intermodulation products generated by the main path.

According to a number of implementations, the present disclosure relates to a radio-frequency (RF) switching configuration that includes an input node configured to receive an input signal; an output node configured to provide an output signal related to the input signal; a main-auxiliary branch coupled between the input node and the output node, the main-auxiliary branch including a main path having a main field-effect transistor (FET), a first auxiliary path having a first auxiliary FET, and a second auxiliary path having a second auxiliary FET, the main path coupled in parallel with the first auxiliary path and in series with the second auxiliary path; a main gate bias network configured to provide a main gate bias voltage to the main FET; a first auxiliary gate bias network configured to provide a first auxiliary bias voltage to the first auxiliary FET such that the first auxiliary path generates distortions that are opposite in phase to distortions generated by the main path to reduce distortions through the main-auxiliary branch; and a second auxiliary gate bias network configured to provide a second auxiliary bias voltage to the second auxiliary FET such that the second auxiliary path generates distortions that are opposite in phase to distortions generated by the main path to reduce distortions through the main-auxiliary branch.

In some embodiments, the main FET is configured to operate in a strong inversion region responsive to the main bias voltage. In some embodiments, the first auxiliary FET is configured to operate in a weak inversion region responsive to the first auxiliary bias voltage and the second auxiliary FET is configured to operate in a weak inversion region responsive to the second auxiliary bias voltage.

In some embodiments, the main gate bias voltage is greater than the first auxiliary gate bias voltage and the second auxiliary gate bias voltage. In some embodiments, the main path further includes a second main FET. In some embodiments, the main gate bias network is further configured to provide the main gate bias voltage to the second main FET.

In some embodiments, the first auxiliary path further includes a third auxiliary FET. In some embodiments, the first auxiliary gate bias network is further configured to provide the first auxiliary gate bias voltage to the third auxiliary FET. In some embodiments, the RF switching configuration further includes a third auxiliary gate bias network configured to provide a third auxiliary gate bias voltage to the third auxiliary FET. In some embodiments, the third auxiliary gate bias voltage is different from the first auxiliary gate bias voltage and the second auxiliary gate bias voltage. In some embodiments, the main gate bias network is further configured to provide the main gate bias voltage to the third auxiliary FET.

In some embodiments, the RF switching configuration further includes a body bias network configured to provide a body bias voltage to the main FET, to the first auxiliary FET, and to the second auxiliary FET. In some embodiments, the main gate bias network is configured to provide two static voltages to the main FET corresponding to on and off states. In some embodiments, the first auxiliary gate bias network is configured to provide a dynamic voltage to the first auxiliary FET. In some embodiments, the first auxiliary gate bias network is configured to generate the first auxiliary gate bias voltage responsive to a power of the input signal at the input node. In some embodiments, the second auxiliary gate bias network is configured to generate the second auxiliary gate bias voltage responsive to a frequency of the input signal at the input node.

According to a number of implementations, the present disclosure relates to a radio-frequency (RF) module that includes a packaging substrate configured to receive a plurality of devices; and a circuit assembly mounted on the packaging substrate, the circuit assembly including a branch including a main path in parallel with a first auxiliary path and the main path in series with a second auxiliary path, a first gate bias network connected to the main path, a second gate bias network connected to the first auxiliary path, and a third gate bias network connected to the second auxiliary path, the second gate bias network and the third gate bias network configured to improve linearity of the switching function.

In some embodiments, the first gate bias network is configured to bias the main path in a strong inversion region, the second gate bias network is configured to bias the first auxiliary path in a weak inversion region, and the third gate bias network is configured to bias the second auxiliary path in a weak inversion region.

According to a number of implementations, the present disclosure relates to a wireless device that includes a transceiver configured to process radio-frequency (RF) signals; an RF module in communication with the transceiver, the RF module including a circuit assembly including a branch including a main path in parallel with a first auxiliary path and the main path in series with a second auxiliary path, a first gate bias network connected to the main path, a second gate bias network connected to the first auxiliary path, and a third gate bias network connected to the second auxiliary path, the second gate bias network and the third gate bias network configured to improve linearity of the switching function; and an antenna in communication with the RF module, the antenna configured to facilitate transmitting and/or receiving of the RF signals.

In some embodiments, the first gate bias network is configured to bias the main path in a strong inversion region, the second gate bias network is configured to bias the first auxiliary path in a weak inversion region, and the third gate bias network is configured to bias the second auxiliary path in a weak inversion region.

For purposes of summarizing the disclosure, certain aspects, advantages and novel features have been described herein. It is to be understood that not necessarily all such advantages may be achieved in accordance with any par-

BRIEF DESCRIPTION OF THE DRAWINGS

FIG. 11A-1 illustrates a main-auxiliary branch having a main path and an auxiliary path connected in parallel.

FIG. 11A-2 illustrates the main-auxiliary branch of FIG. 11A-1 in a shunt configuration.

FIG. 11B-1 illustrates a main-auxiliary branch having a main path and an auxiliary path connected in parallel, the auxiliary path including a plurality of FETs.

FIG. 11B-2 illustrates the main-auxiliary branch of FIG. 11B-1 in a shunt configuration.

FIG. 11C-1 illustrates a main-auxiliary branch having a main path and an auxiliary path connected in parallel, the main path including a plurality of FETs.

FIG. 11C-2 illustrates the main-auxiliary branch of FIG. 11C-1 in a shunt configuration.

FIG. 11D-1 illustrates a main-auxiliary branch having a main path and an auxiliary path connected in parallel, the main path and the auxiliary path each including a plurality of FETs.

FIG. 11D-2 illustrates the main-auxiliary branch of FIG. 11D-1 in a shunt configuration.

FIG. 11E-1 illustrates a main-auxiliary branch having a main path and a plurality of auxiliary paths, each of the paths being connected in parallel.

FIG. 11E-2 illustrates the main-auxiliary branch of FIG. 11E-1 in a shunt configuration.

FIG. 11F-1 illustrates a main-auxiliary branch having a plurality of main paths and an auxiliary path, each of the paths being connected in parallel.

FIG. 11F-2 illustrates the main-auxiliary branch of FIG. 11F-1 in a shunt configuration.

FIG. 11G-1 illustrates a main-auxiliary branch having a plurality of main paths and a plurality of auxiliary paths, each of the paths being connected in parallel.

FIG. 11G-2 illustrates the main-auxiliary branch of FIG. 11G-1 in a shunt configuration.

FIG. 11H-1 illustrates a main-auxiliary branch having a main path and an auxiliary path connected in series.

FIG. 11H-2 illustrates the main-auxiliary branch of FIG. 11H-1 in a shunt configuration.

FIG. 11I-1 illustrates a main-auxiliary branch having a main path and an auxiliary path connected in series, the auxiliary path including a plurality of FETs.

FIG. 11I-2 illustrates the main-auxiliary branch of FIG. 11I-1 in a shunt configuration.

FIG. 11J-1 illustrates a main-auxiliary branch having a main path and an auxiliary path connected in series, the main path including a plurality of FETs.

FIG. 11J-2 illustrates the main-auxiliary branch of FIG. 11J-1 in a shunt configuration.

FIG. 11K-1 illustrates a main-auxiliary branch having a main path and an auxiliary path connected in series, the main path and the auxiliary path each including a plurality of FETs.

FIG. 11K-2 illustrates the main-auxiliary branch of FIG. 11K-1 in a shunt configuration.

FIG. 11L-1 illustrates a main-auxiliary branch having a main path and a plurality of parallel auxiliary paths, the main path connected in series to the plurality of parallel auxiliary paths.

FIG. 11L-2 illustrates the main-auxiliary branch of FIG. 11L-1 in a shunt configuration.

FIG. 11M-1 illustrates a main-auxiliary branch having a plurality of parallel main paths connected in series with an auxiliary path.

FIG. 11M-2 illustrates the main-auxiliary branch of FIG. 11M-1 in a shunt configuration.

FIG. 11N-1 illustrates a main-auxiliary branch having a plurality of parallel main paths connected in series with a plurality of parallel auxiliary paths.

FIG. 11N-2 illustrates the main-auxiliary branch of FIG. 11N-1 in a shunt configuration.

FIG. 11O-1 illustrates a main-auxiliary branch having a plurality of parallel main paths connected in series with a first plurality of parallel auxiliary paths and a second plurality of parallel auxiliary paths.

FIG. 11O-2 illustrates the main-auxiliary branch of FIG. 11O-1 in a shunt configuration.

FIG. 11P-1 illustrates a main-auxiliary branch having a plurality of parallel auxiliary paths connected in series with a first plurality of parallel main paths and a second plurality of parallel main paths.

FIG. 11P-2 illustrates the main-auxiliary branch of FIG. 11P-1 in a shunt configuration.

DETAILED DESCRIPTION OF SOME EMBODIMENTS

Figure 1:
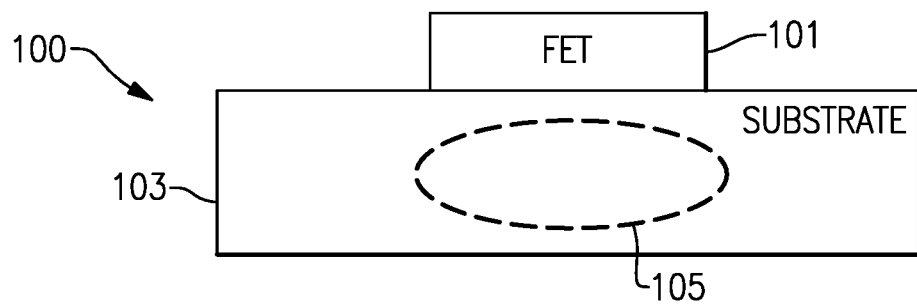
FIG. 1 illustrates an example of a FET device having an active FET implemented on a substrate.

The headings provided herein, if any, are for convenience only and do not necessarily affect the scope or meaning of the claimed invention.

INTRODUCTION

In electronics applications, field-effect transistors (FETs) can be utilized as switches. Such switches can allow, for example, routing of radio-frequency (RF) signals in wireless devices. High performance switches can be important elements in a wide variety of RF systems, including cellular smartphones, WLAN front-end modules, and RF/microwave test instruments. Linearity of the switches in these types of systems directly affects the overall system performance. Silicon-on-insulator (SOI) switches have become popular due at least in part to ease of integration, low cost, etc. However, linearity of typical SOI switches is not as competitive as some of its counterparts. Therefore, it would be advantageous to improve the linearity of SOI switches for high performance switching systems including wide RF applications.

Field-Effect-Transistors (FETs) are one of the most important active devices in a typical switching circuit and its characteristics can greatly influence circuit performance. The characteristics of the FET are largely determined by the signals/biases applied at its terminals (e.g., source, drain, gate, body or source, drain, gate, body, and substrate). Intelligent control of the terminal biases can improve device performance.

To further improve device performance, disclosed herein are active FETs that implement a main-auxiliary branch design. Such designs include at least two FETs, an auxiliary FET providing an auxiliary path and a main FET providing a main path. Distortions that are generated in the main path, such as third-order harmonics and/or intermodulation distortions, can be reduced by distortions generated in the auxiliary path. This can be accomplished by applying a tailored gate bias to the auxiliary path so that the auxiliary path generates signals with distortions of a similar magnitude but opposite in phase relative to the distortions of the signals in the main path. Accordingly, the overall performance in the active FET is improved by reducing these distortions or nonlinearities. By way of example, the auxiliary path can be configured (e.g., through the physical design of the FET(s) and/or through applied bias signals) so that cancelling harmonics are generated in the auxiliary path. In some embodiments, this reduces the overall nonlinearity of the active FET.

In some embodiments, gate, body, source, drain, and/or substrate bias voltages can be intelligently applied to improve performance of an active FET that includes a main-auxiliary branch. For example, the FET(s) of the main path can be biased in a strong inversion region (e.g., the voltage at the gate is much larger than the threshold voltage, or Vgs>>Vth) while the FET(s) of the auxiliary path can be biased in a subthreshold or weak inversion region. Where the current and voltage characteristics of a FET can be described as:

$$I = g_1 V + g_2 V^2 + g_3 V^3$$

g3 is generally positive (g3>0) if the FET is biased in a subthreshold or weak inversion region while g3 (g3<0) is negative if the FET is biased in a strong inversion region. Accordingly, because the main path is generally biased in the strong inversion region, the disclosed main-auxiliary branches advantageously bias the auxiliary path in a subthreshold or weak inversion region to achieve at least partial cancellation or reduction of distortions.

As a specific example, and without intending to be limited to a particular embodiment, where the main path is biased with a gate voltage that is substantially above the threshold (e.g., about 3 V), the FET(s) of the main path are biased on the strong inversion region and g3 is negative. To improve performance of the switch or other such circuit with the main-auxiliary branch, the auxiliary path can be biased in a subthreshold or weak inversion region so that g3 is positive and its third harmonic is about 180 degrees out of phase from the signals generated by the main path. The magnitude of the third-order harmonic is also a function of the gate bias, and the main-auxiliary branches disclosed herein can be configured to tune or tailor the gate bias of the auxiliary path to generate a third-order harmonic of a similar magnitude to the main path. This can result in a signal where third-order harmonics are substantially cancelled or reduced, thereby improving the overall performance of the device (e.g., by reducing third-order harmonic distortions and/or third-order intermodulation distortions). In some embodiments, the gate voltage on the auxiliary path is less than or equal to about 1.5 V, less than or equal to about 1.2 V, less than or equal to about 0.6 V, or less than or equal to about 0.5 V.

In addition, where the auxiliary path includes multiple FETs or multiple FET stacks, a plurality of gate biases can be applied to individual or groups of FETs. This can be done to further fine-tune distortion cancellation and/or to further improve signal characteristics of the main-auxiliary branch.

As another example of improving the signal through a main-auxiliary branch, the gate bias of the main FET can be biased in a region such that low $R_{on}$ and/or $C_{off}$ is achieved, while the gate bias of the auxiliary FET can be tuned to improve the linearity of the combination of the auxiliary FET and the main FET. The disclosed main-auxiliary branch configurations, and switches that employ such branch configurations, can realize improved performance by reducing nonlinearity, harmonics, intermodulation distortions (IMDs), cross-products, insertion losses, $R_{on}$, $C_{off}$, and/or any combination of these or other similar characteristics.

The main-auxiliary branches disclosed herein provide a variety of advantageous features. For example, a main path, an auxiliary path, and/or a main hybrid path (e.g., a path that combines main FETs and auxiliary FETs) can be independently designed to improve performance of the main-auxiliary FET device. In some implementations, the characteristics of the auxiliary FET can be tailored to provide third-order intermodulation (IM3) with a similar magnitude and opposite phase as IM3 of the main FET to improve linearity of the main-auxiliary FET device. Besides tuning the gate bias signal for the auxiliary path, the characteristics of the auxiliary FET that can be tuned to improve performance. For example, characteristics that can be tailored include, for example and without limitation, oxide thickness (Tox), device geometry, channel length, gate length, gate width, buried oxide (BOX) layer thickness, silicon thickness, channel doping (including well doping and/or halo doping), gate work function, etc. The characteristics of the auxiliary FET(s) can be tailored so that an applied gate bias can result in targeted signal properties that reduce distortions generated by the main FET(s).

Another advantageous feature is that the gate voltage of the auxiliary FET that achieves a higher linearity is reduced relative to an SOI FET that uses a substrate bias to achieve improved performance. This may be due at least in part to the lower gate oxide used in some main-auxiliary FET configurations. This lower gate oxide makes it easier to generate the targeted voltages using a charge pump.

Another advantageous feature is that the variation of the IM3 dependence on the gate voltage of the auxiliary FET can be better controlled due at least in part to the lower gate oxide used relative to FET designs that use a substrate bias to achieve improved performance. For example, the thinner the gate oxide, the lower the variation generated by random dopant fluctuations due to channel doping.

In some implementations, independent auxiliary FETs can be used both in series with and in parallel with the main FET. Advantageously, this allows different device parameters (e.g., $R_{on}$ and $C_{off}$, linearity) to be independently tuned, thereby improving linearity for both on and off branches.

In some embodiments, main-auxiliary FET devices disclosed herein can be implemented using a control terminal with up to 7 terminals (or up to 8 terminals for SOI FETs) for fine-tuning of the FET characteristics to improve switching and/or RF performance. This is in contrast to typical FET devices that have 4 terminals (or 5 terminals for SOI FETs). This additional control can improve performance of devices that implement the disclosed main-auxiliary configurations. In this way, the characteristics or performance of the main FET can be controlled by the signals applied to the terminals of the auxiliary FET.

Accordingly, disclosed herein are FET devices wherein an active signal applied to a first FET or FET stack (the auxiliary FET or auxiliary path) influences operation of a second FET or FET stack (the main FET or main path) to improve performance of the second FET or FET stack. This improvement can be improved linearity, for example. The disclosed main-auxiliary FET devices can be substituted into any circuit that utilizes a bulk FET or SOI FET. The gate bias applied to the first FET is tailored to achieve targeted signal properties. The gate bias signals applied to the first FET can be different from the gate bias signals applied to the second FET. In some embodiments, the gate signals applied to the first FET can be dynamic and may depend, at least in part, on input signal characteristics. In some embodiments, the gate signals applied to the second FET are static while the gate signals applied to the first FET are dynamic. The gate signals applied to the first FET can be configured so that the first FET is in a weak inversion region and the gate signals applied to the second FET can be configured so that the second FET is in a strong inversion region.

In some embodiments, the auxiliary FET can be implemented as a transistor stack. Similarly, the main FET can be implemented as a transistor stack. In certain embodiments, one or both of the auxiliary FET and/or main FET can be implemented as a transistor stack. Additional nonlinear elements may also be combined with the disclosed main-auxiliary FET designs for additional tuning of FET characteristics. This can be done to achieve better RF performance, for example. Accordingly, unless explicitly stated otherwise, embodiments disclosed herein that reference a main FET and/or an auxiliary FET should be understood to include embodiments where the main FET is implemented as a transistor stack and/or where the auxiliary FET is implemented as a transistor stack.

Disclosed herein are various examples of field-effect transistor (FET) devices having a main-auxiliary FET configuration for an active FET portion, an auxiliary FET configured to operate in a manner that improves the performance of a main FET relative to a configuration without an auxiliary FET. This is done to provide a desired operating condition for the active FET. In such various examples, terms such as FET device, active FET portion, and FET are sometimes used interchangeably, with each other, or some combination thereof. Accordingly, such interchangeable usage of terms should be understood in appropriate contexts.

FIG. 1 illustrates an example of a FET device 100 having an active FET 101 implemented on a substrate 103. As described herein, the active FET 101 can include a main-auxiliary FET configuration. The substrate 103 can include one or more layers configured to facilitate, for example, operating functionality of the active FET, processing functionality for fabrication and support of the active FET, etc. For example, if the FET device 100 is implemented as a Silicon-On-Insulator (SOI) device, the substrate 103 can include an insulator layer such as a buried oxide (BOX) layer, an interface layer, and a handle wafer layer.

FIG. 1 further illustrates that in some embodiments, a region 105 below the active FET 101 can be configured to include one or more features to provide one or more desirable operating functionalities for the active FET 101. For the purpose of description, it will be understood that relative positions above and below are in the example context of the active FET 101 being oriented above the substrate 103 as shown. Accordingly, some or all of the region 105 can be implemented within the substrate 103. Further, it will be understood that the region 105 may or may not overlap with the active FET 101 when viewed from above (e.g., in a plan view).

Figure 2:
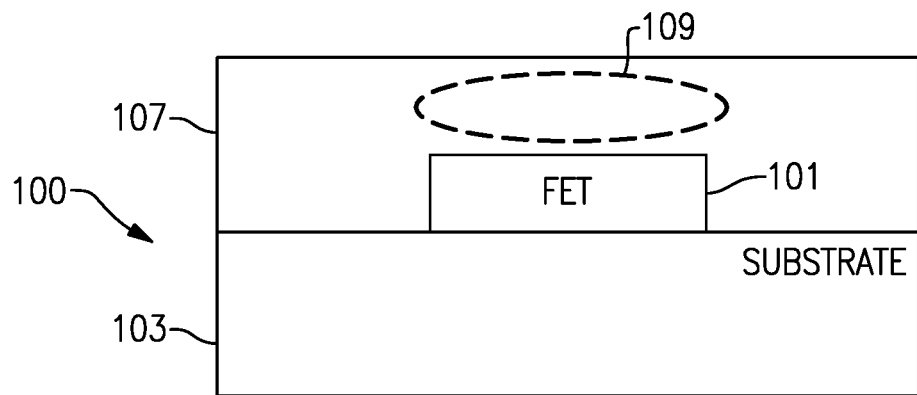
FIG. 2 illustrates an example of a FET device having an active FET implemented on a substrate, the FET device including an upper layer implemented over the substrate.

FIG. 2 illustrates an example of a FET device 100 having an active FET 101 implemented on a substrate 103. As described herein, the active FET 101 can include a main-auxiliary FET configuration. The substrate 103 can include one or more layers configured to facilitate, for example, operating functionality of the active FET 100, processing functionality for fabrication and support of the active FET 100, etc. For example, if the FET device 100 is implemented as a Silicon-On-Insulator (SOI) device, the substrate 103 can include an insulator layer such as a buried oxide (BOX) layer, an interface layer, and a handle wafer layer.

In the example of FIG. 2, the FET device 100 is shown to further include an upper layer 107 implemented over the substrate 103. In some embodiments, such an upper layer can include, for example, a plurality of layers of metal routing features and dielectric layers to facilitate, for example, connectivity functionality for the active FET 100.

FIG. 2 further illustrates that in some embodiments, a region 109 above the active FET 101 can be configured to include one or more features to provide one or more desirable operating functionalities for the active FET 101. Accordingly, some or all of the region 109 can be implemented within the upper layer 107. Further, it will be understood that the region 109 may or may not overlap with the active FET 101 when viewed from above (e.g., in a plan view).

Figure 3:
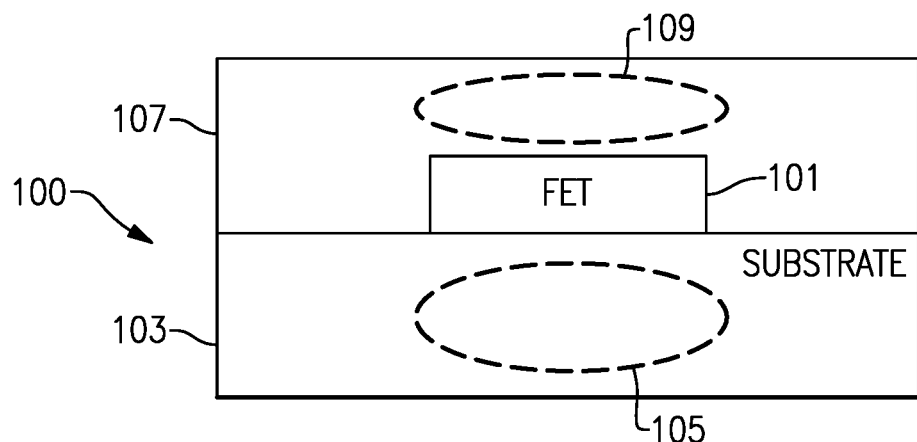
FIG. 3 illustrates an example of a FET device having an active FET implemented on a substrate, the FET device including a lower layer and an upper layer.

FIG. 3 illustrates an example of a FET device 100 having an active FET 101 implemented on a substrate 103, and also having an upper layer 107. In some embodiments, the substrate 103 can include a region 105 similar to the example of FIG. 1, and the upper layer 107 can include a region 109 similar to the example of FIG. 2.

Examples related to some or all of the configurations of FIGS. 1-3 are described herein in greater detail.

Figure 4:
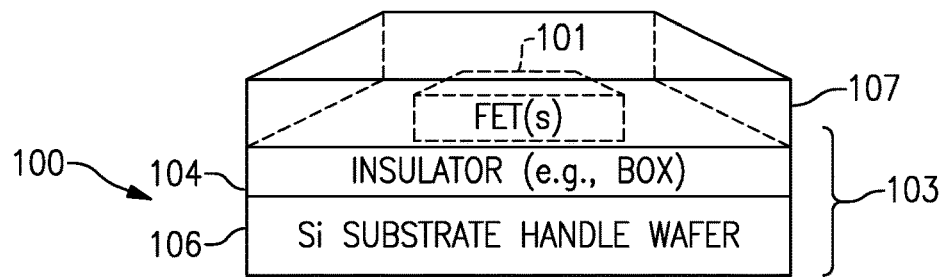
FIG. 4 illustrates an example FET device implemented as an individual SOI unit
Figure 5:
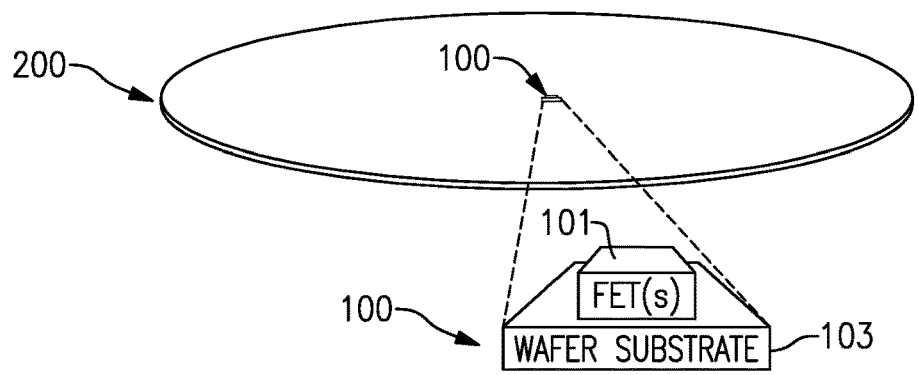
FIG. 5 illustrates a plurality of individual SOI devices implemented on a wafer.

In the examples of FIGS. 1-3, the FET devices 100 are illustrated as being individual units (e.g., as semiconductor die). FIGS. 4-6 illustrate that in some embodiments, a plurality of FET devices having one or more features as described herein can be fabricated partially or fully in a wafer format, and then be singulated to provide such individual units.

For example, FIG. 4 illustrates an example FET device 100 implemented as an individual SOI unit. Such an individual SOI device can include one or more active FETs 101 implemented over an insulator such as a BOX layer 104 which is itself implemented over a handle layer such as a silicon (Si) substrate handle wafer 106. In the example of FIG. 4, the BOX layer 104 and the Si substrate handle wafer 106 can collectively form the substrate 103 of the examples of FIG. 1-3, with or without the corresponding region 105.

In the example of FIG. 4, the individual SOI device 100 is shown to further include an upper layer 107. In some embodiments, such an upper layer can be the upper layer 107 of FIGS. 2 and 3, with or without the corresponding region 109.

FIG. 5 illustrates that in some embodiments, a plurality of individual SOI devices similar to the example SOI device 100 of FIG. 4 can be implemented on a wafer 200. As shown, such a wafer can include a wafer substrate 103 that includes a BOX layer 104 and a Si handle wafer layer 106 as described in reference to FIG. 4. As described herein, one or more active FETs can be implemented over such a wafer substrate.

In the example of FIG. 5, the SOI device 100 is shown without the upper layer (107 in FIG. 4). It will be understood that such a layer can be formed over the wafer substrate 103, be part of a second wafer, or any combination thereof.

Figure 6A:
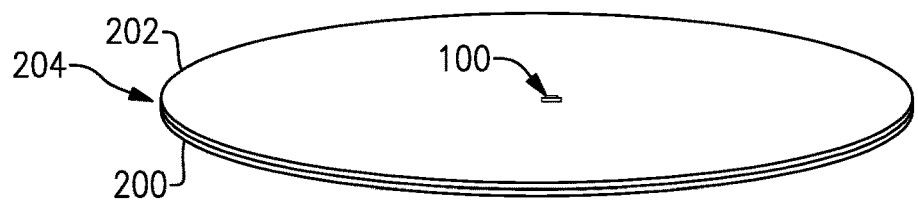
FIG. 6A illustrates an example wafer assembly having a first wafer and a second wafer positioned over the first wafer.
Figure 6B:
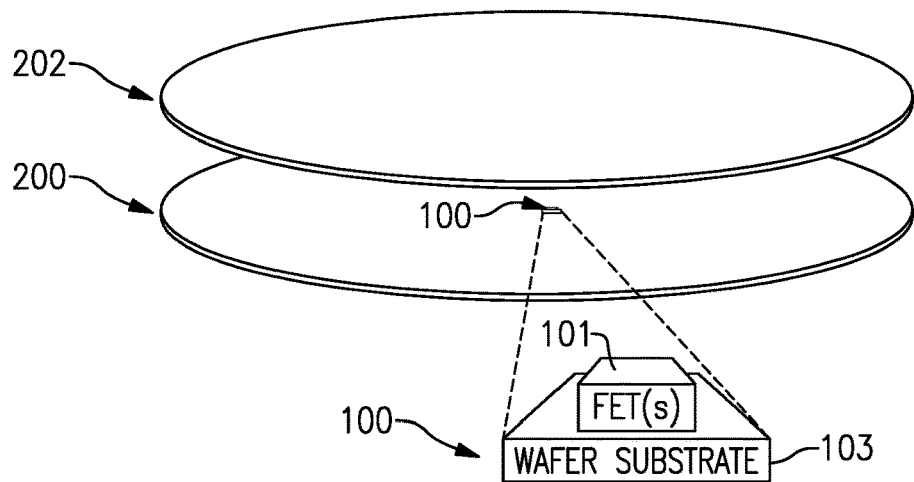
FIG. 6B illustrates an unassembled view of the first and second wafers of the example wafer assembly of FIG. 6A.

FIG. 6A illustrates an example wafer assembly 204 having a first wafer 200 and a second wafer 202 positioned over the first wafer 200. FIG. 6B illustrates an unassembled view of the first and second wafers 200, 202 of the example of FIG. 6A.

In some embodiments, the first wafer 200 can be similar to the wafer 200 of FIG. 5. Accordingly, the first wafer 200 can include a plurality of SOI devices 100 such as the example of FIG. 4. In some embodiments, the second wafer 202 can be configured to provide, for example, a region (e.g., 109 in FIGS. 2 and 3) over a FET of each SOI device 100, and/or to provide temporary or permanent handling wafer functionality for process steps involving the first wafer 200.

Examples of SOI Implementation of FET Devices

Silicon-On-Insulator (SOI) process technology is utilized in many switching circuits, especially radio-frequency (RF) switching circuits, including those involving high performance, low loss, high linearity switches. In such switching circuits, performance advantages typically result from building a transistor in silicon, which sits on an insulator such as an insulating buried oxide (BOX). The BOX typically sits on a handle wafer, typically silicon, but can be glass, borosilicon glass, fused quartz, sapphire, silicon carbide, or any other electrically-insulating material. As described herein, the main-auxiliary transistor configurations can be implemented as an SOI device. These configurations may also be more broadly implemented as a main-auxiliary FET device with individual transistors having gate, source, drain, and body terminals. In some implementations, the main-auxiliary FET device can be implemented as a device with source and drain terminals, an auxiliary gate terminal, a main gate terminal, an auxiliary body terminal, and a main body terminal. In some implementations, substrate terminals for the auxiliary and main FETs can be included. In certain implementations with multiple auxiliary FETs and/or main FETs, one or more of the FETs can have dedicated terminals for gate and/or body connections.

Typically, an SOI transistor is viewed as a 4-terminal field-effect transistor (FET) device with gate, drain, source, and body terminals. However, an SOI FET can be represented as a 5-terminal device, with an addition of a substrate node. Such a substrate node can be biased and/or be coupled one or more other nodes of the transistor to, for example, improve both linearity and loss performance of the transistor. Although various examples are described in the context of RF switches, it will be understood that one or more features of the present disclosure can also be implemented in other applications involving FETs.

Figure 7A:
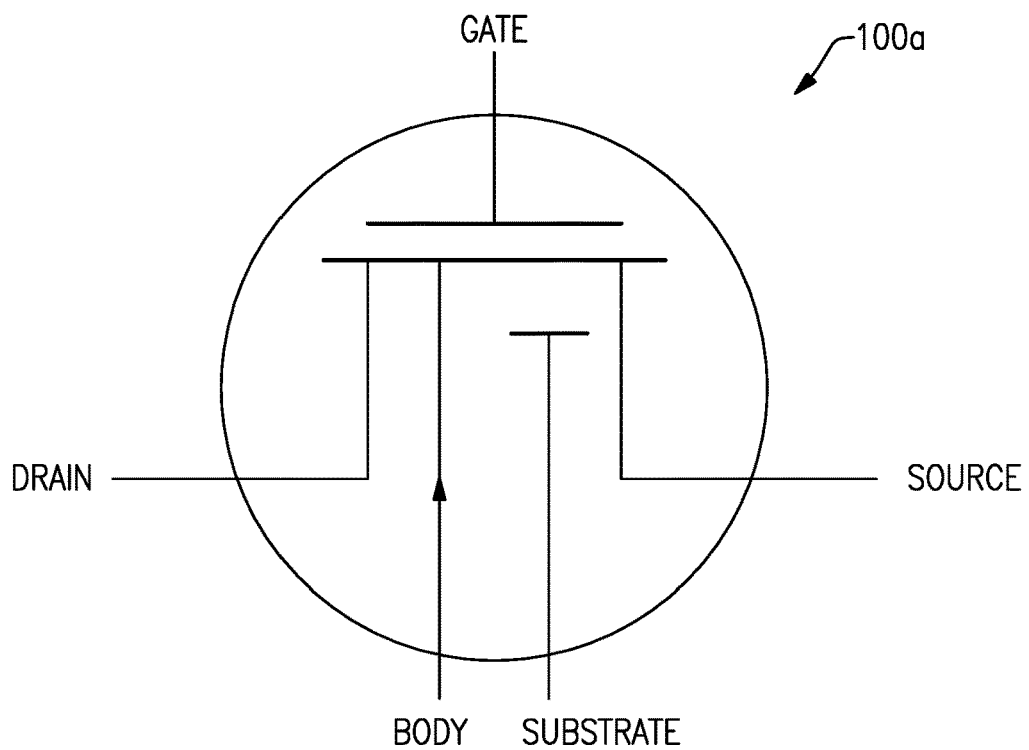
FIG. 7A illustrates a terminal representation of an SOI FET having nodes associated with a gate, a source, a drain, a body, and a substrate.
Figure 7B:
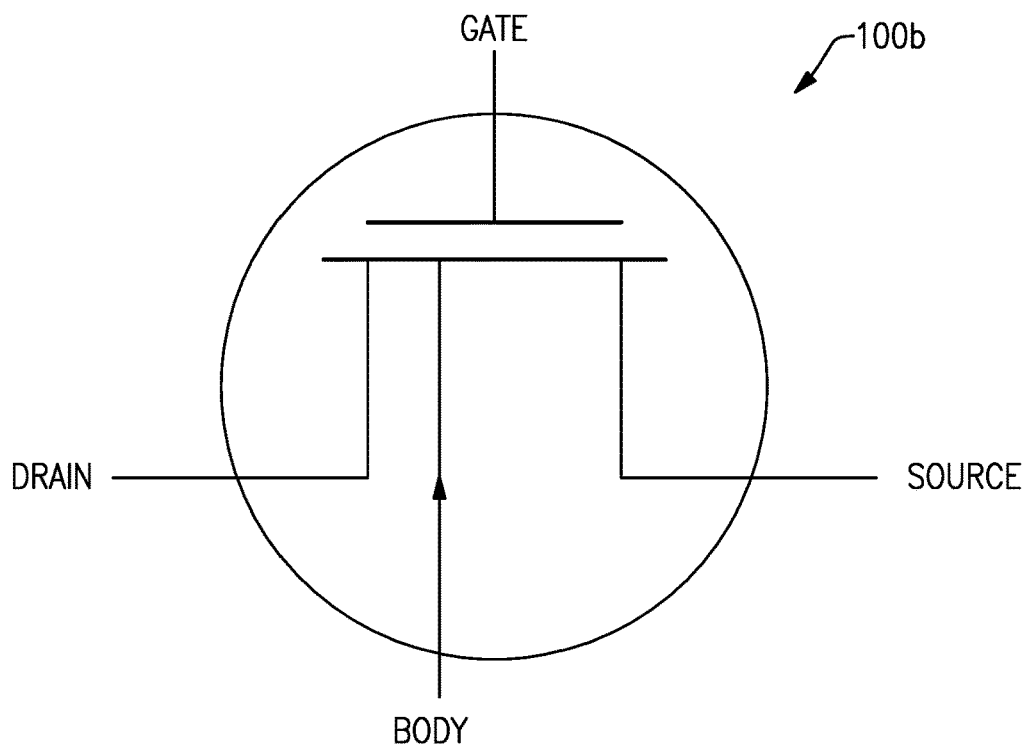
FIG. 7B illustrates a terminal representation of an SOI FET having nodes associated with a gate, a source, a drain, and a body.

FIG. 7A illustrates a terminal representation of an SOI FET 100a having nodes associated with a gate, a source, a drain, a body, and a substrate. FIG. 7B illustrates a terminal representation of an SOI FET 100b having nodes associated with a gate, a source, a drain, and a body. It will be understood that in some embodiments, the source and the drain can be reversed for SOI FETS 100a, 100b. Such FETs 100a, 100b can be used to build the main-auxiliary FET configurations disclosed herein.

Figure 8A:
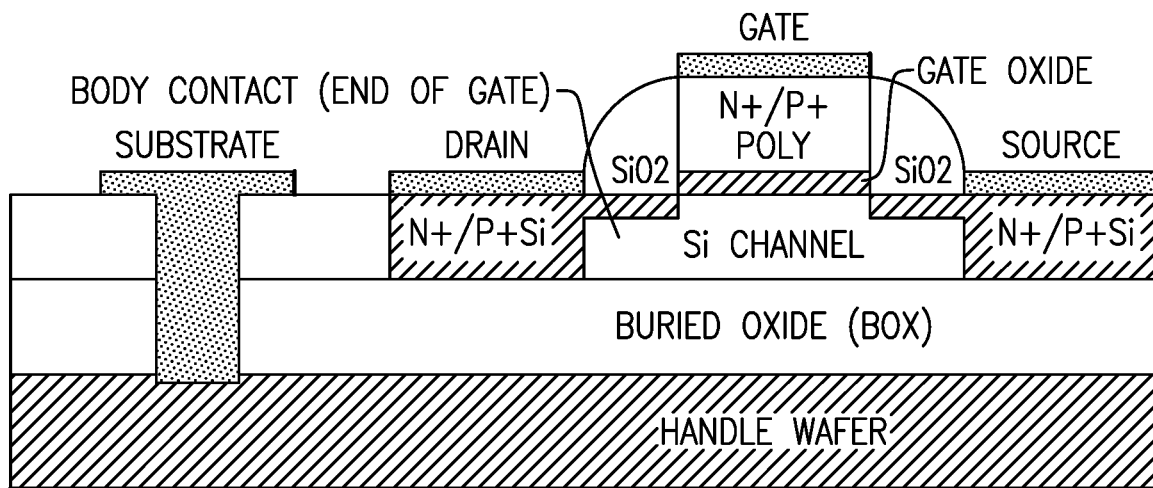
FIGS. 8A, 8B, 8C, and 8D illustrates side sectional and plan views of an example SOI FET device having an optional node for its substrate and variations of the gate terminal.
Figure 8B:
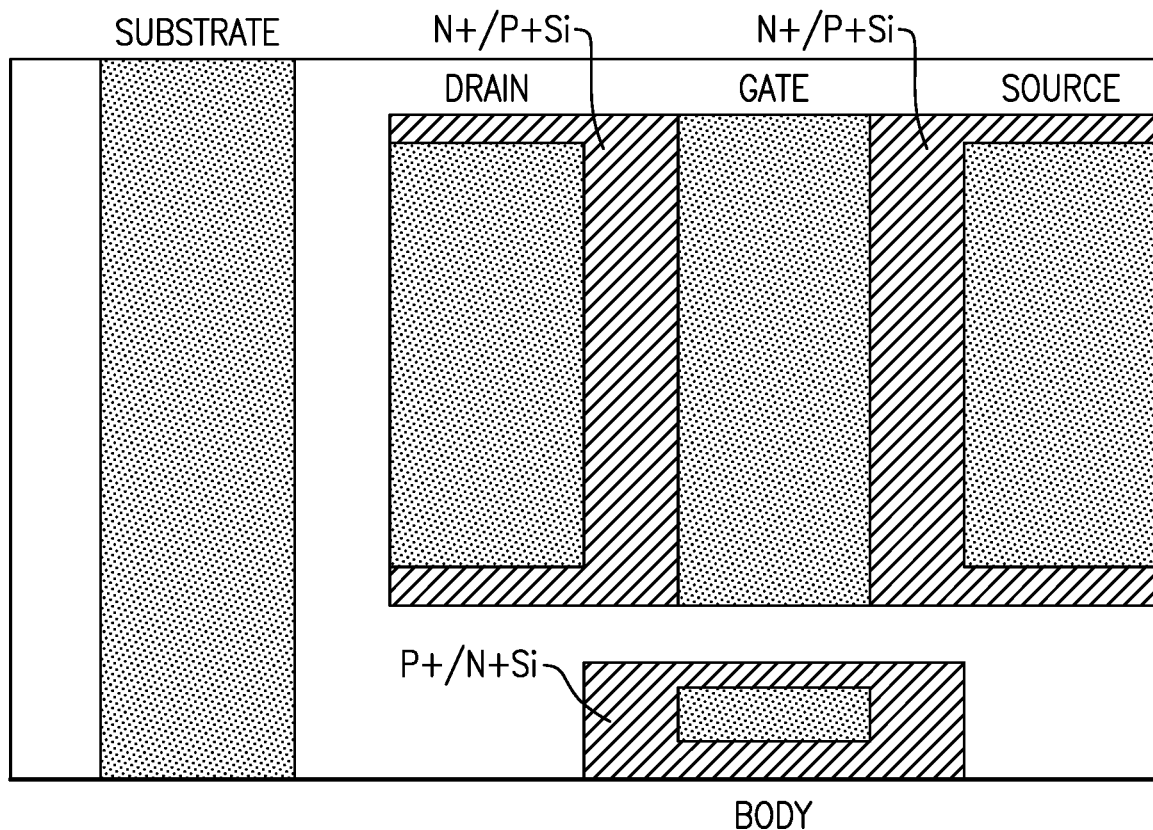

FIGS. 8A and 8B illustrate side sectional and plan views of an example SOI FET device 100 having an optional node for its substrate 108. The substrate 108 can be, for example, a silicon substrate associated with a handle wafer 106. Although described in the context of the handle wafer 106, it will be understood that the substrate 108 does not necessarily need to have functionality associated with a handle wafer.

An insulator layer such as a BOX layer 104 is shown to be formed over the handle wafer 106, and a FET structure is shown to be formed based on an active silicon device 102 over the BOX layer 104. The FET structure can be configured as an NPN or PNP device.

In the example of FIGS. 8A and 8B, terminals for the gate, source, drain and body are shown to be configured and provided so as to allow operation of the FET. As described in greater detail herein, these terminals can be coupled to another FET structure to form a main-auxiliary FET configuration. A substrate terminal is shown to be electrically connected to the substrate (e.g., handle wafer) 106 through an electrically conductive feature 108 extending through the BOX layer 104. Such an electrically conductive feature can include, for example, one or more conductive vias, one or more conductive trenches, or any combination thereof.

Figure 8C:
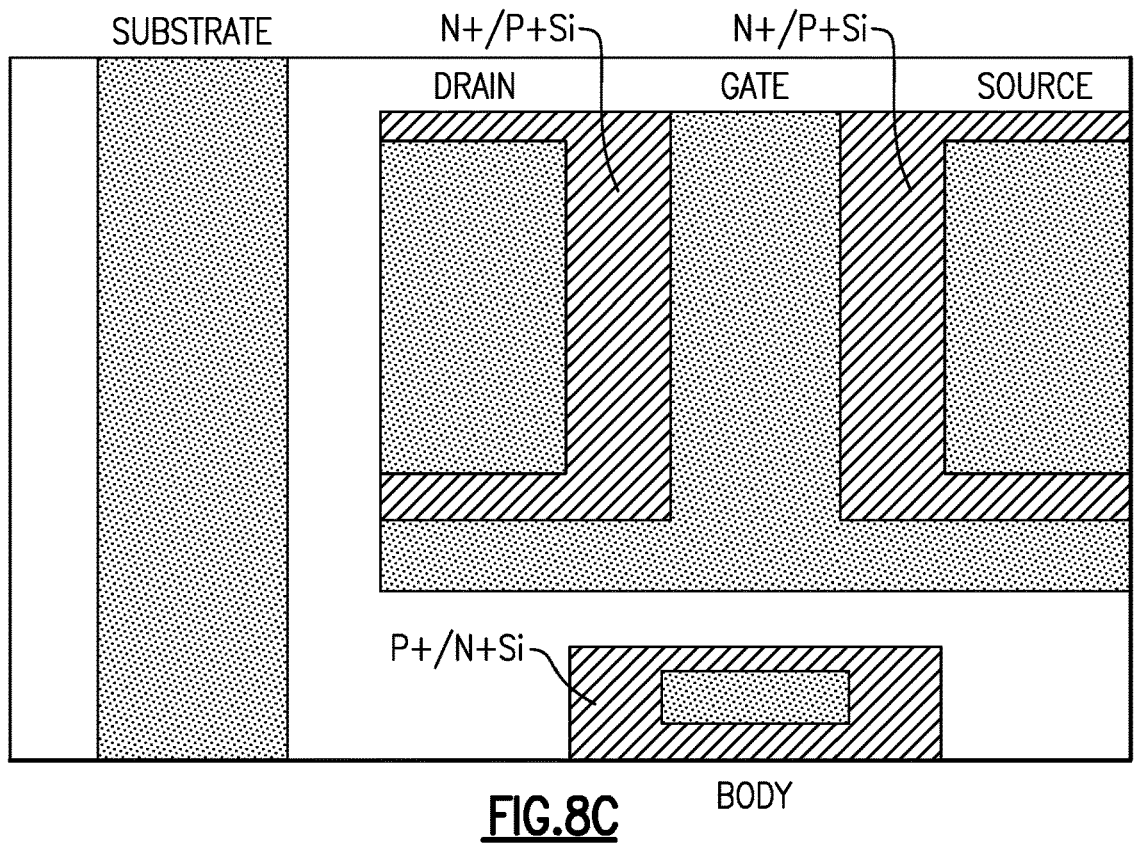
Figure 8D:
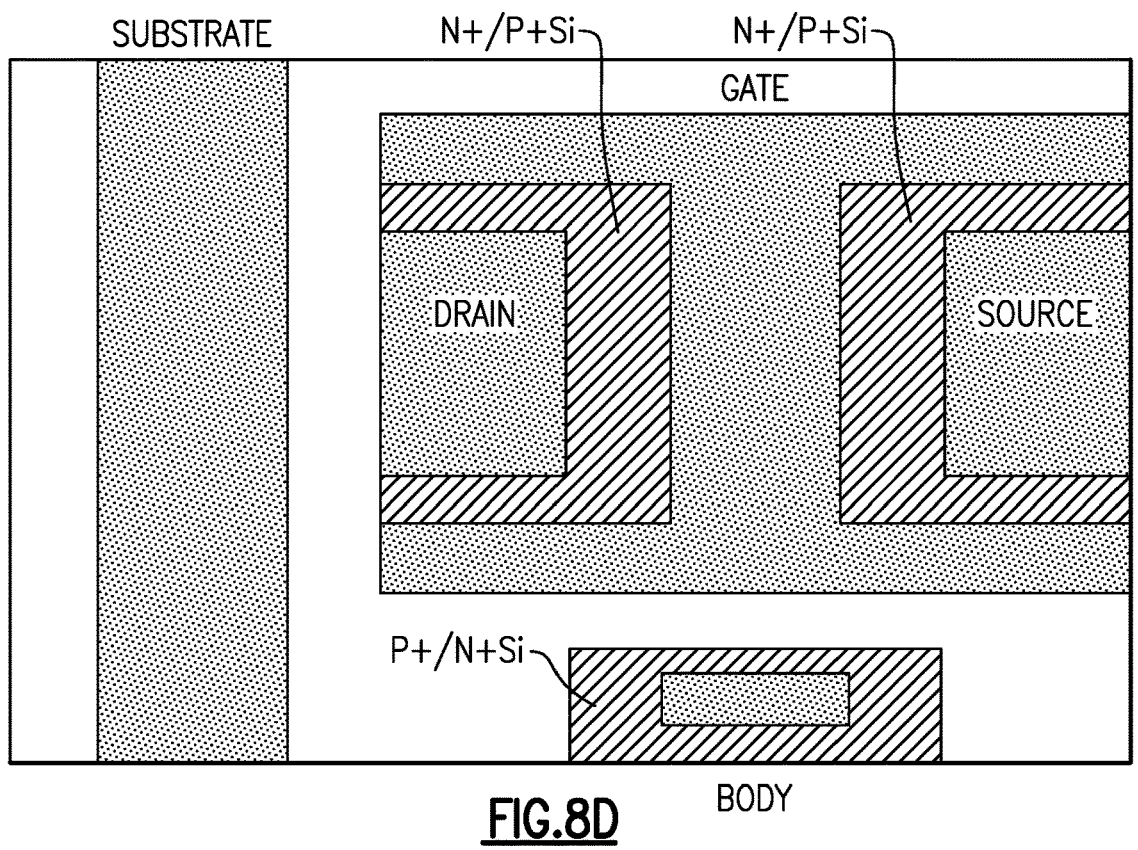

FIGS. 8C and 8D illustrate different configurations for the gate terminal. FIG. 8C illustrates the gate as a "T-gate" terminal and FIG. 8D illustrates the gate as an "H-gate" terminal. Other configurations and shapes of the gate terminal can also be implemented and are to be considered within the scope of this disclosure.

In some embodiments, a substrate connection can be connected to ground, for example, to avoid an electrically floating condition associated with the substrate. Such a substrate connection for grounding typically includes a seal-ring implemented at an outermost perimeter of a given die. Further description of example implementations and associated advantages of the substrate connection are provided in U.S. patent application Ser. No. 15/085,980, entitled "SUBSTRATE BIAS FOR FIELD-EFFECT TRANSISTOR DEVICES," filed Mar. 30, 2016 (included herewith as an Appendix), which is incorporated herein by reference in its entirety for all purposes to form part of this application.

Figure 9A:
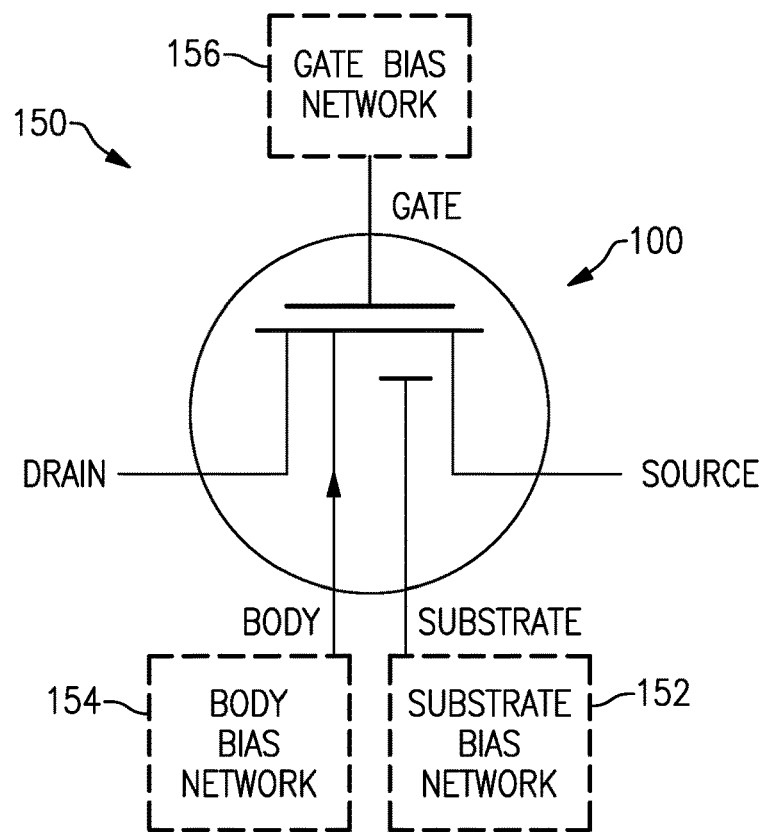
FIG. 9A illustrates an SOI FET device including a biasing configuration wherein the gate and the body of the SOI FET device are respectively biased by a gate bias network and a body bias network.
Figure 9B:
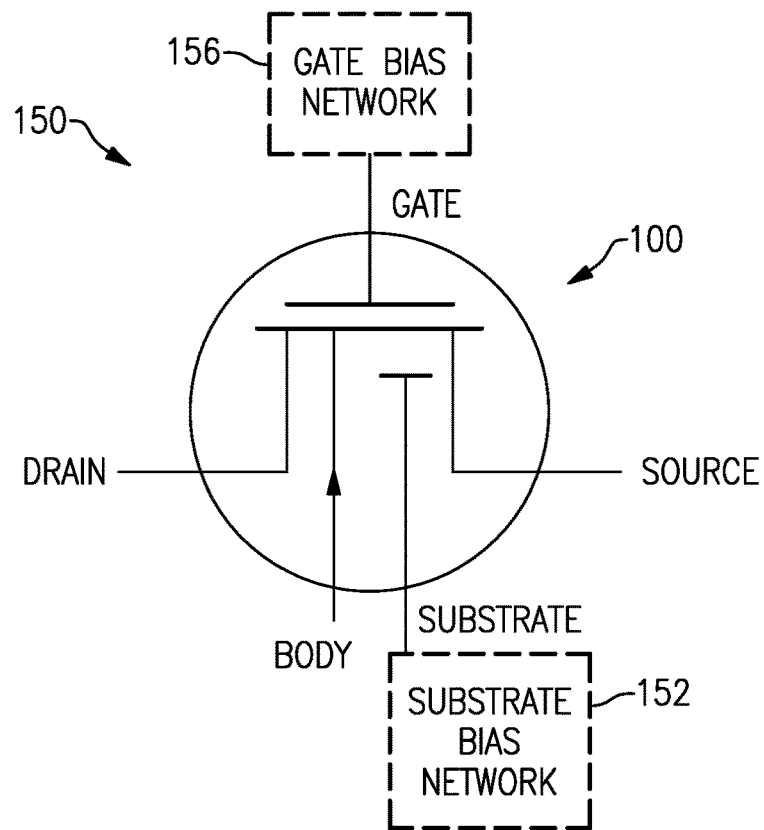
FIG. 9B illustrates an SOI FET device including a biasing configuration wherein the gate is biased by a gate bias network and a body terminal is left unconnected or floating.

FIG. 9A illustrates an SOI FET device 100 having features as described herein including a biasing configuration 150 wherein the gate and the body of the SOI FET device 100 are respectively biased by a gate bias network 156 and a body bias network 154. FIG. 9B illustrates an SOI FET device 100 having features as described herein including a biasing configuration 150 wherein the gate is biased by a gate bias network 156 and a body terminal is left unconnected or floating. Further details and examples related to gate and body bias networks can be found in PCT Publication No. WO 2014/011510 entitled "CIRCUITS, DEVICES, METHODS AND COMBINATIONS RELATED TO SILICON-ON-INSULATOR BASED RADIO-FREQUENCY SWITCHES," which is incorporated by reference herein in its entirety for all purposes. In some embodiments, the SOI FET device 100 of FIGS. 9A and 9B and other devices having one or more features as described herein can have its substrate node biased by a substrate bias network 152.

Figure 10A:
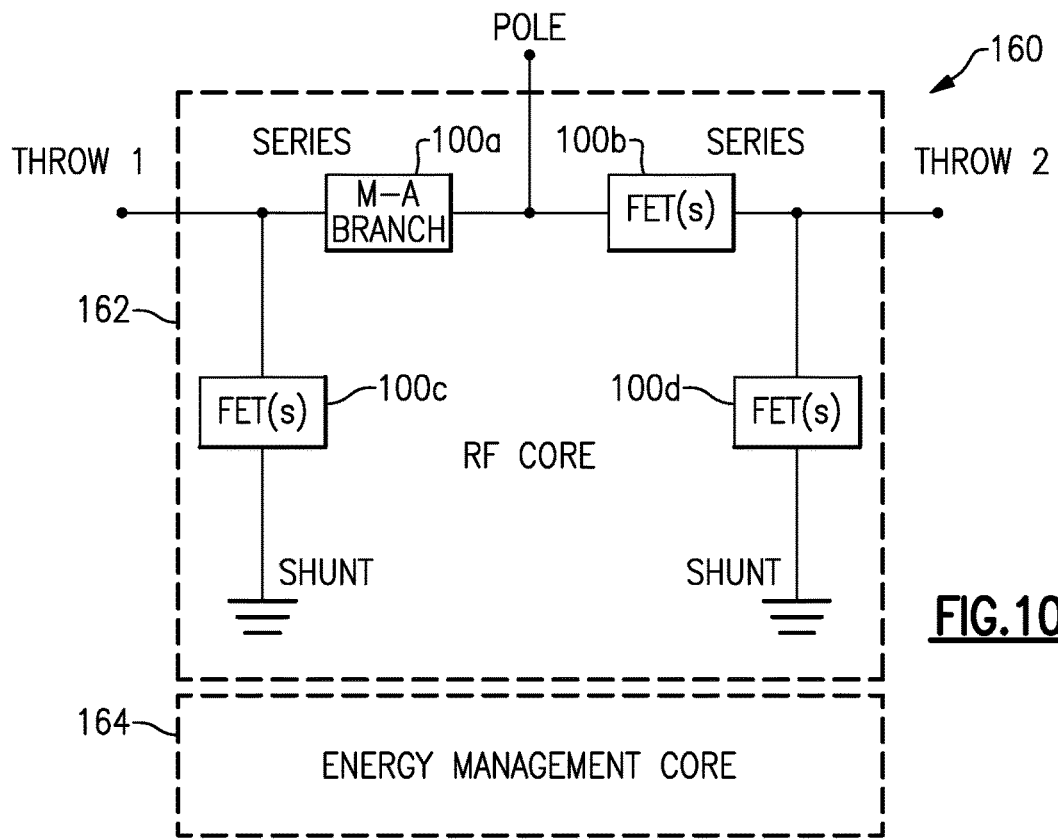
FIGS. 10A, 10B, 10C, and 10D illustrate switching applications that implement one or more main-auxiliary branches having features as described herein.
Figure 10B:
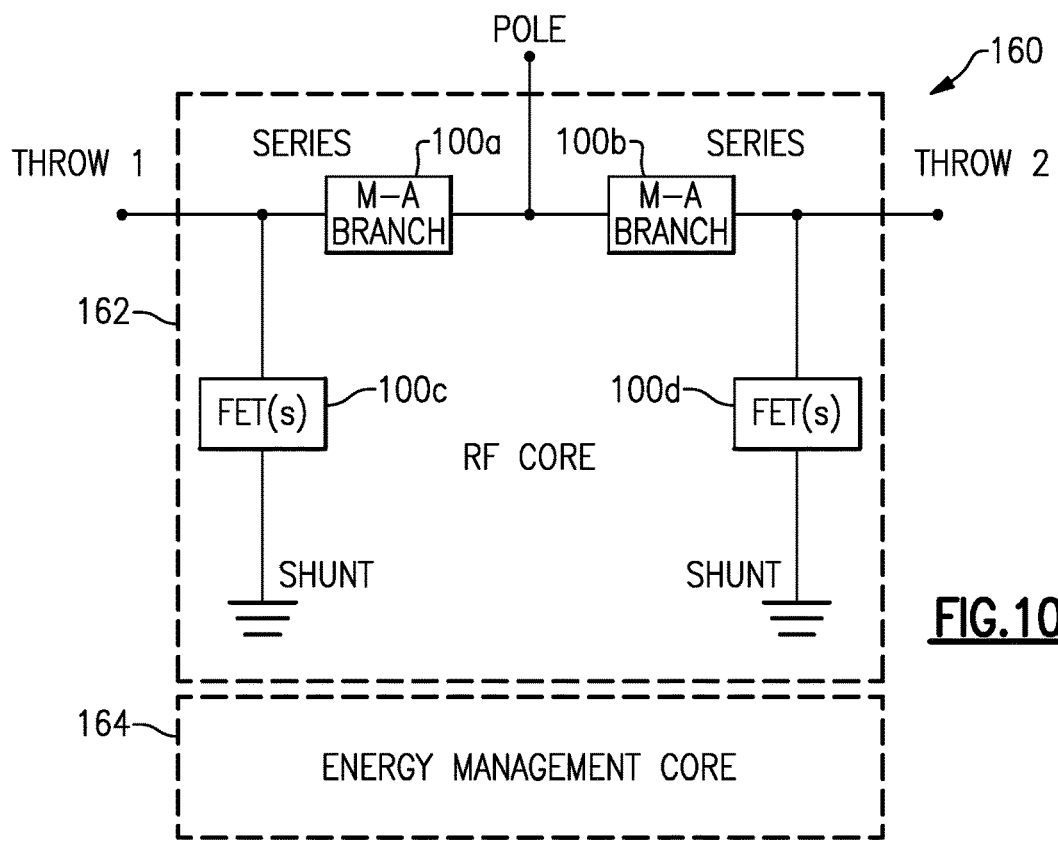
Figure 10C:
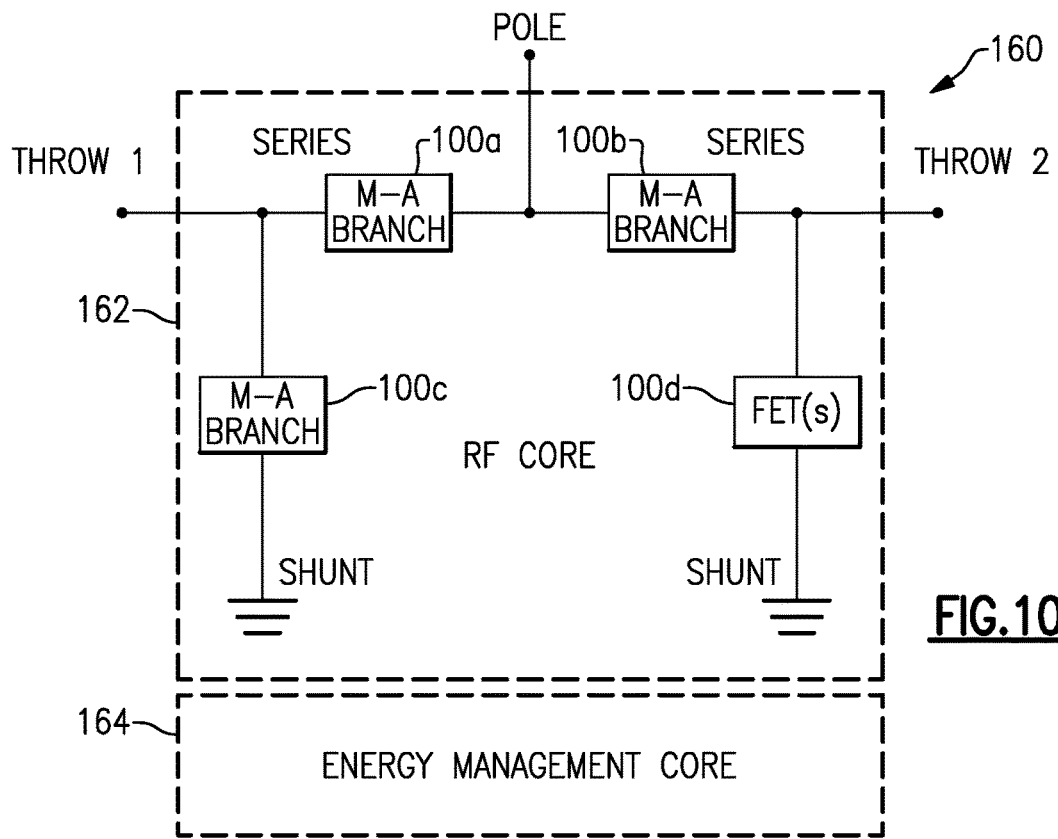
Figure 10D:
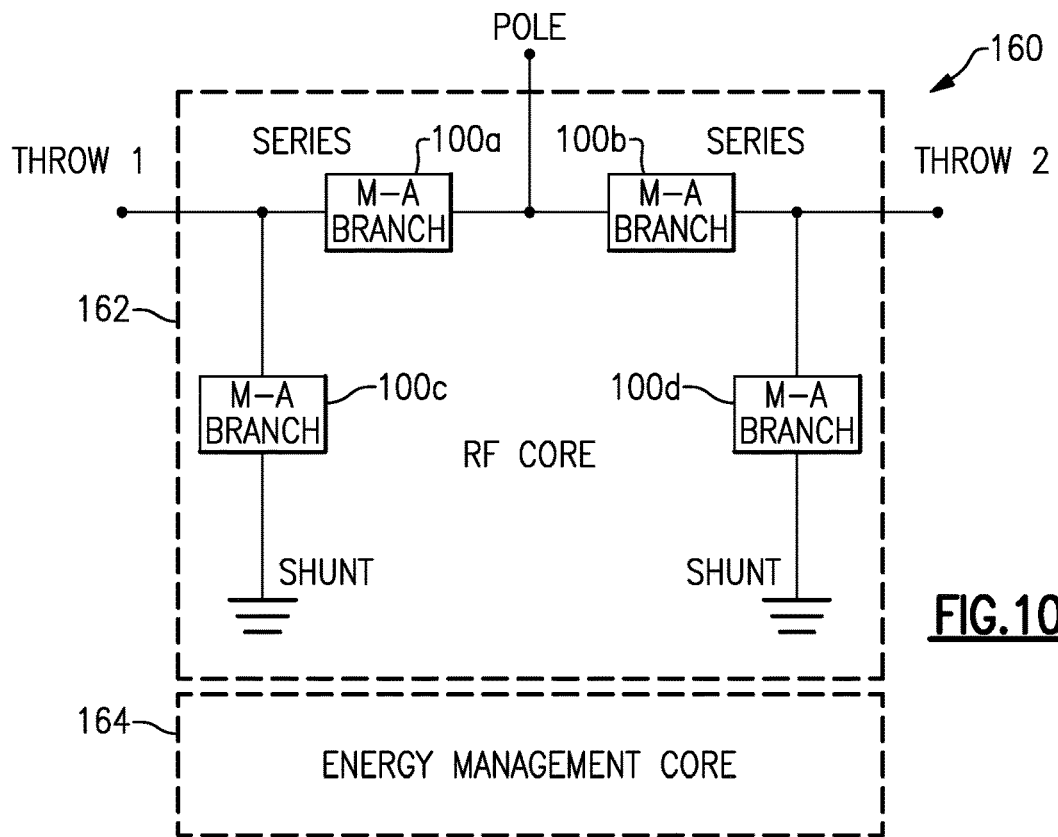

FIG. 10A illustrates that, in some embodiments, main-auxiliary branches (e.g., a main-auxiliary FET configuration) or M-A branch having one or more features as described herein can be implemented in switching applications (e.g., RF switching applications). FIG. 10A illustrates an example of an RF switching configuration 160 having an RF core 162 and an energy management (EM) core 164. Additional details concerning such RF and EM cores can be found in the above-referenced PCT Publication No. WO 2014/011510. The example RF core 162 of FIG. 10A is shown as a single-pole-double-throw (SPDT) configuration in which series arms of transistors 100a, 100b are arranged between a pole and first and second throws, respectively. Throw 1 is coupled to a main-auxiliary branch 100a and throw 2 is coupled to a FET device 100b. The main-auxiliary branch 100a includes one or more active devices in a main path or a main hybrid path and one or more active devices in an auxiliary path, as described in greater detail herein. Nodes associated with the first and second throws are shown to be coupled to a reference potential node (e.g., ground) through their respective shunt arms of FETs 100c, 100d. It will be understood that other switching configurations can also be implemented with a main-auxiliary branch configuration having one or more of the features described herein. For example, a single pole single throw (SPST) switch can be implemented, a single pole multiple throw (SPNT) switch can be implemented, a multiple pole single throw (MPST) switch can be implemented, a multiple pole multiple throw (MPNT) can be implemented, and the like.

FIGS. 10A-10D illustrate that one, some, or all of the active devices 100a-100d can be implemented as a stack of FET devices in a main-auxiliary branch configuration, examples of which are described herein. The main-auxiliary branches (M-A branches) can be implemented to improve signal characteristics in switching applications. For example and without limitation, the main-auxiliary branches 100a, 100b, 100c, and/or 100d can be configured to improve linearity, reduce harmonics, reduce intermodulation distortions, reduce cross products, reduce insertion losses, achieve low $R_{on}$, achieve low $C_{off}$, and/or reduce gate bias voltages. Each of the main-auxiliary branches 100c and 100d are implemented in a shunt configuration.

For the purpose of description, each FET in a main-auxiliary branch can be referred to as a FET, the stack of FETs can be collectively referred to as a FET, or some combination thereof can also be referred to as a FET. Furthermore, each FET in the stack can be biased with a separate gate, body, and/or substrate bias network; a plurality of the FETs in the stack can be biased with a common gate, body, and/or substrate bias network; or any combination thereof.

Other switching configurations involving a single pole (SP) can be implemented utilizing one or more of the main-auxiliary configurations with one or more features as described herein. Thus, it will be understood that a switch having a SPNT can be implemented utilizing one or more of the main-auxiliary configurations as described herein, where the quantity N is a positive integer. Furthermore, it will be understood that a switch having multiple poles and multiple throws (MPNT) can be implemented utilizing one or more of the main-auxiliary configurations as described herein, where the quantities M and N are independent positive integers. For example, in many applications switching configurations having a plurality of poles and a plurality of throws can provide increased flexibility in how RF signals can be routed therethrough.

It is noted that in various switching configuration examples described herein, switchable shunt paths are not shown for simplified views of the switching configurations. Accordingly, it will be understood that some or all of switchable paths in such switching configurations may or may not have associated with them switchable shunt paths (e.g., similar to the example of FIGS. 10A-10D).

Example Main-Auxiliary Branch Configurations

FIGS. 11A-1 through 11P-2 illustrate a variety of example main-auxiliary branch configurations. The main-auxiliary branch configurations can be configured to act as a switch. Similarly, the main-auxiliary branch configurations can be configured as a shunt. In certain implementations, such as when the configuration acts as a switch or is part of a series arm in a switch circuit, the main-auxiliary branch configurations can include a main path and an auxiliary path between an input node and an output node. In various implementations, such as in a shunt configuration, the main-auxiliary branch configurations can be configured to provide a switchable path to a reference potential node (e.g., ground). This can be done to provide a shunt path in switch, such as the configurations illustrated in FIGS. 10C and 10D. Accordingly, a shunt configuration, as described herein, includes a switchable path to a reference potential node that couples to a signal line, the signal line providing a path between an input node and an output node. The shunt configuration has a first node coupled to the signal line between the input node and the output node and a second node coupled to a reference potential node. The shunt configuration can be configured so that the main-auxiliary branch reduces capacitive nonlinearity of the switching function. In some embodiments, the main path and the auxiliary path can be segmented with nodes between the segments being connected to one another, thereby forming a main hybrid path, or a path that includes main and auxiliary active devices (e.g., FETs).

Figures 1, 11A:
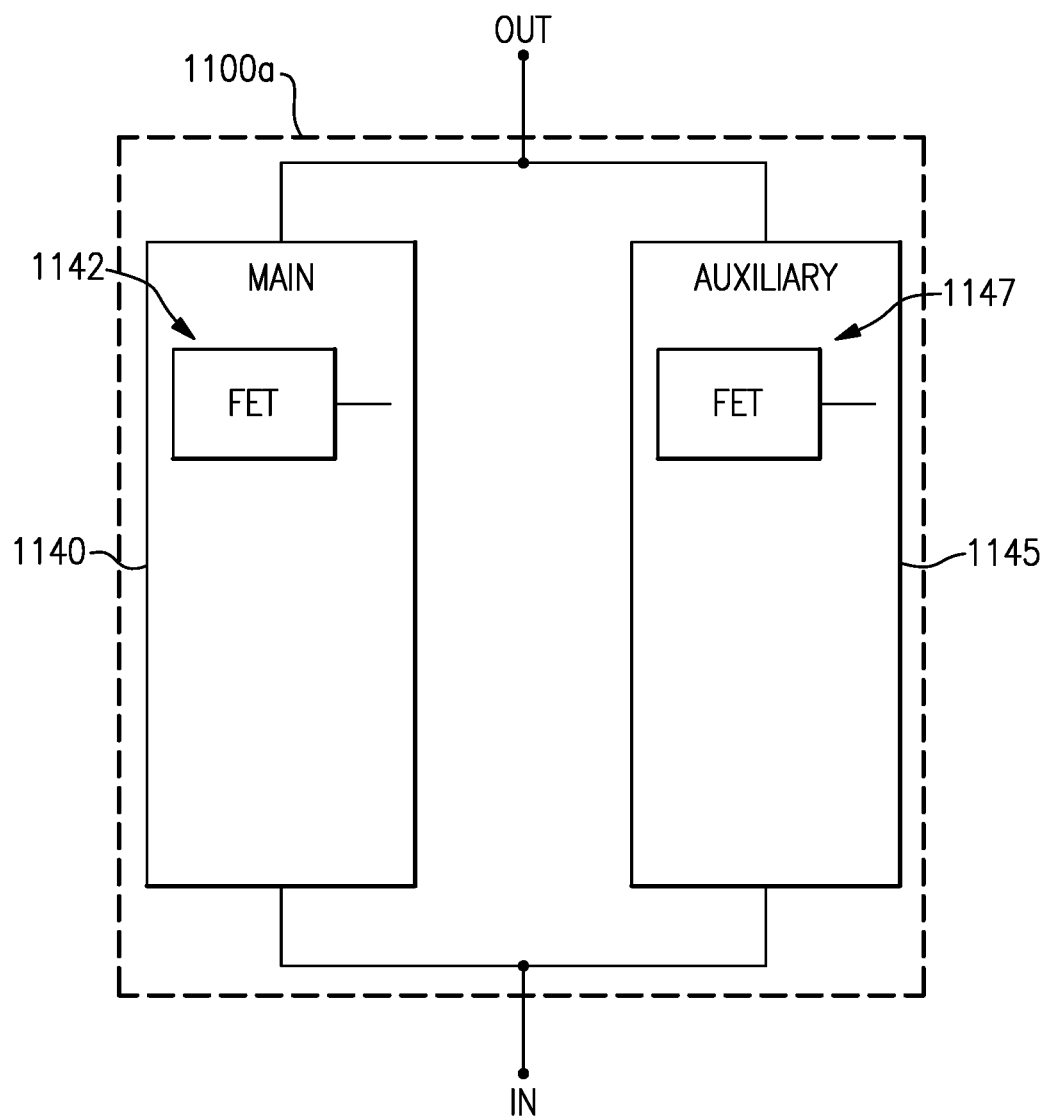
Figures 2, 11A:
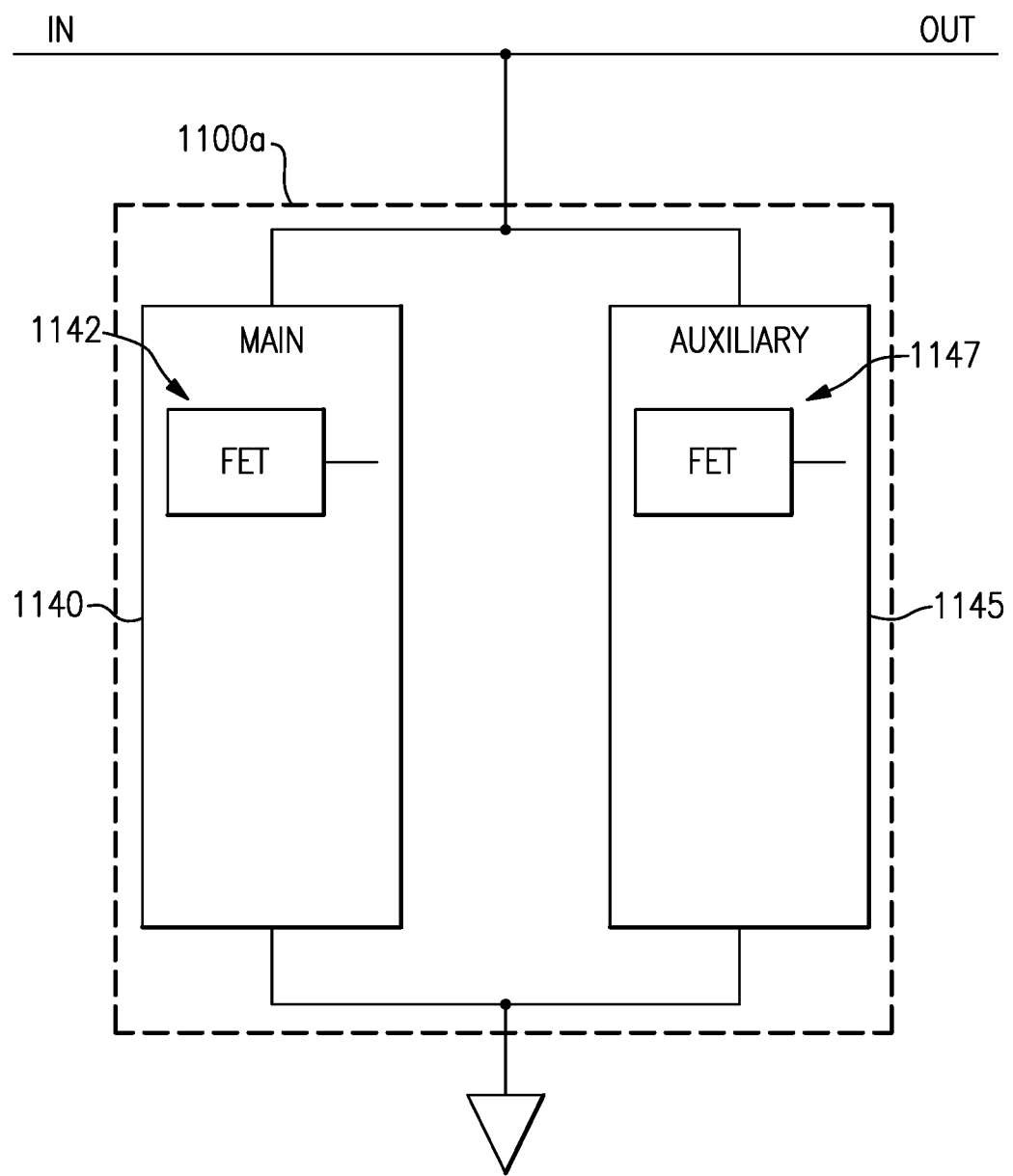

FIG. 11A-1 illustrates a main-auxiliary branch 1100a having a main path 1140 and an auxiliary path 1145 connected in parallel. The main path 1140 includes a FET 1142 and the auxiliary path 1145 includes a FET 1147. FIG. 11A-2 illustrates the main-auxiliary branch 1100a of FIG. 11A-1 in a shunt configuration.

Figures 1, 11B:
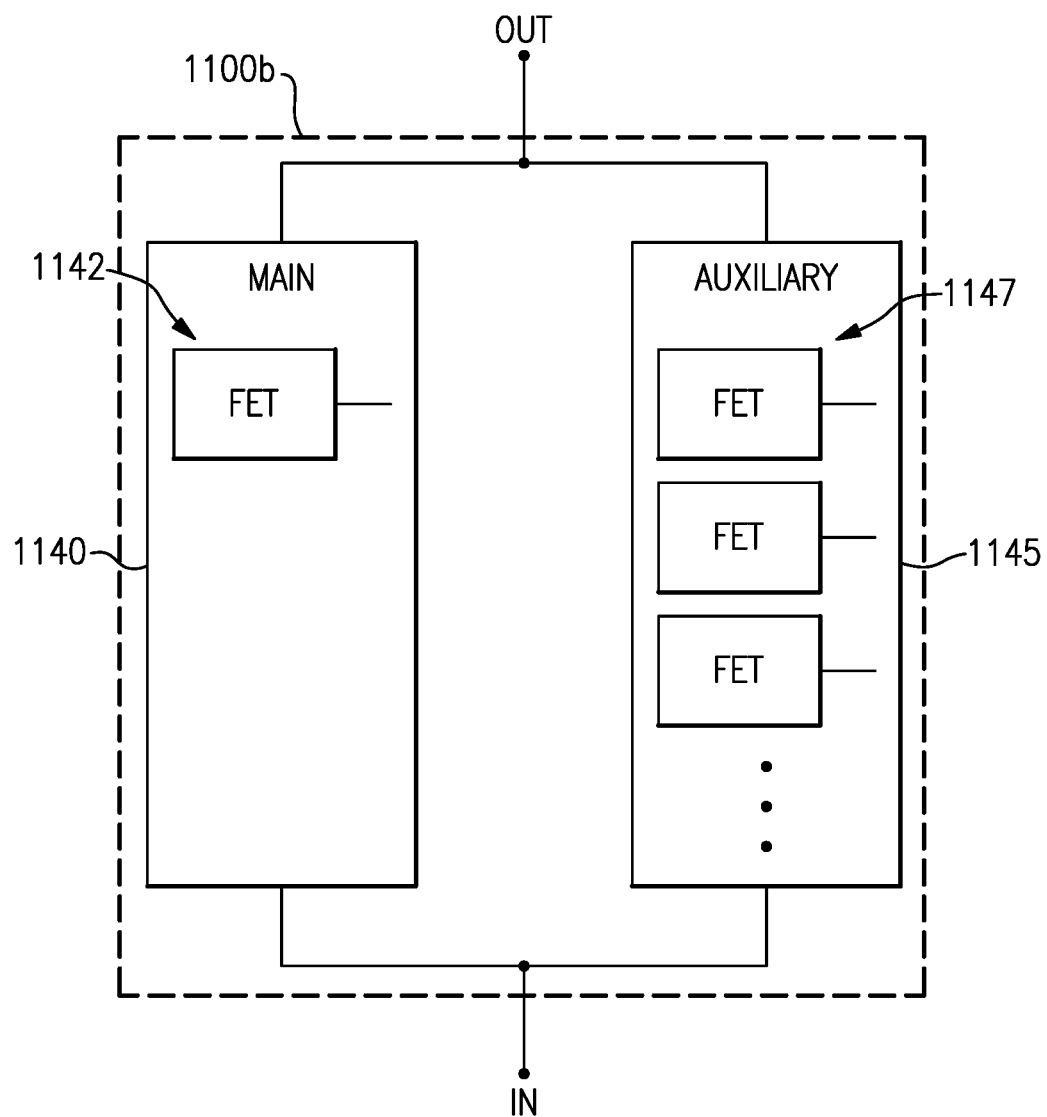
Figures 2, 11B:
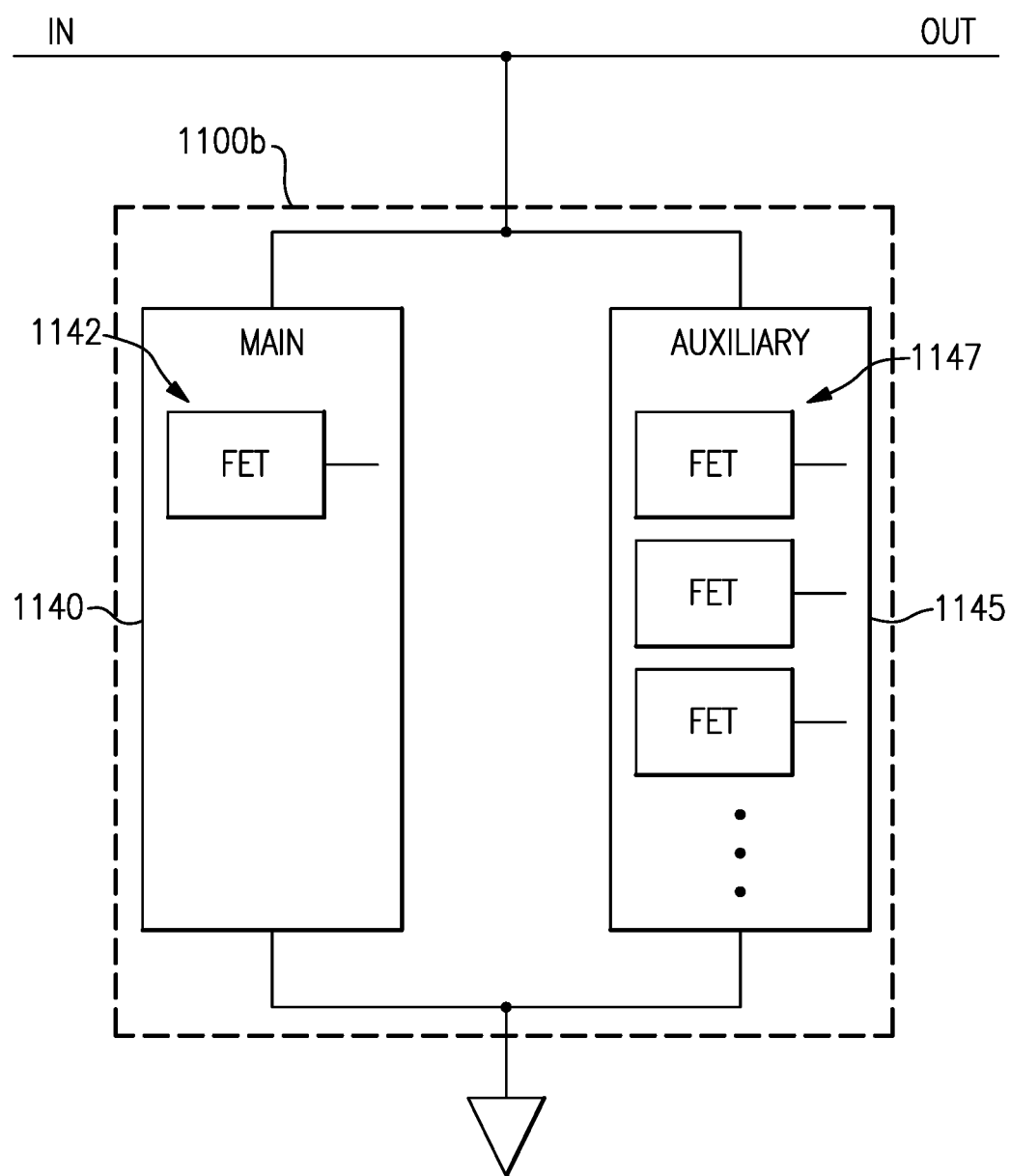

FIG. 11B-1 illustrates a main-auxiliary branch 1100b having a main path 1140 and an auxiliary path 1145 connected in parallel. The main path 1140 includes a FET 1142 and the auxiliary path 1145 includes a plurality of FETs 1147. FIG. 11B-2 illustrates the main-auxiliary branch 1100b of FIG. 11B-1 in a shunt configuration.

Figures 1, 11C:
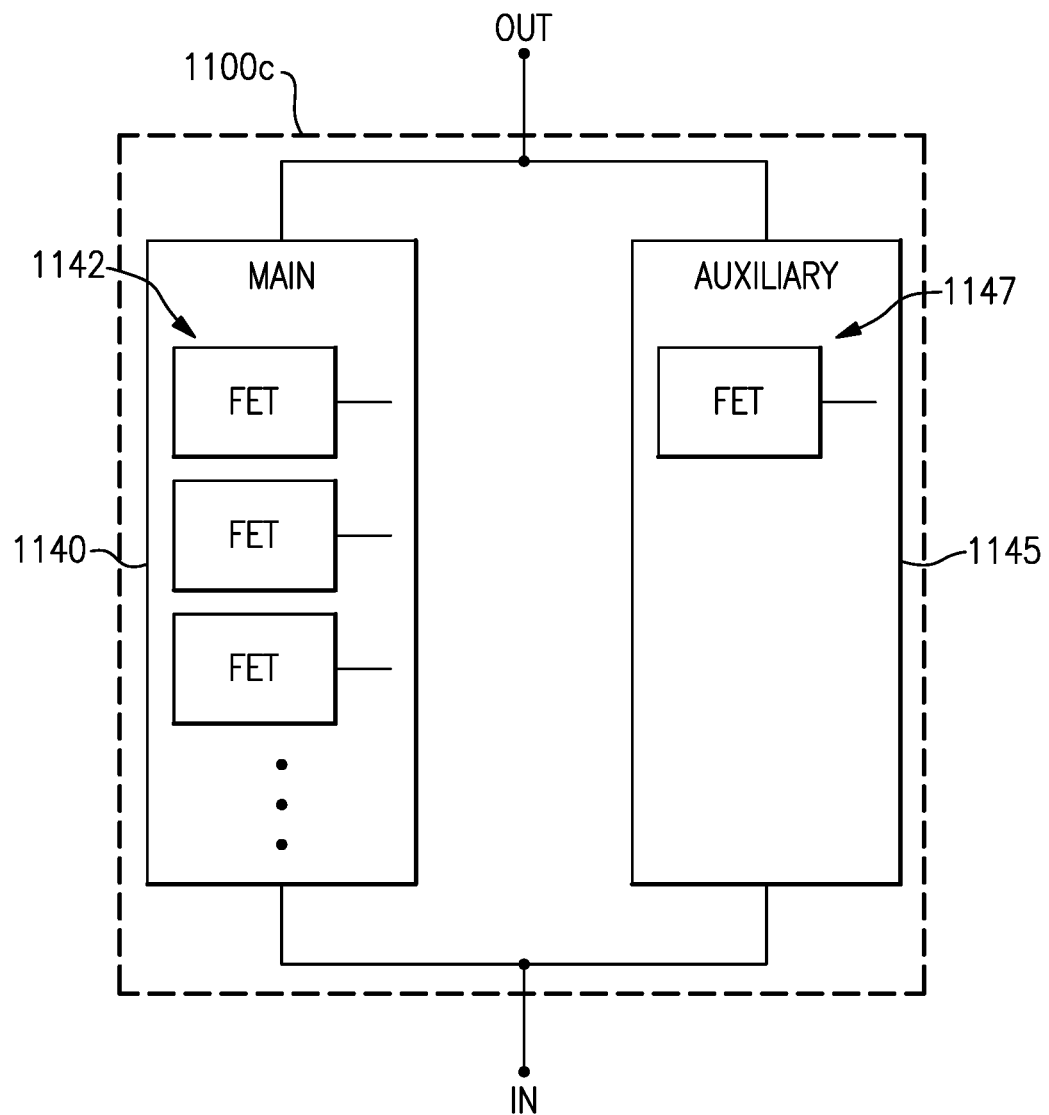
Figures 2, 11C:
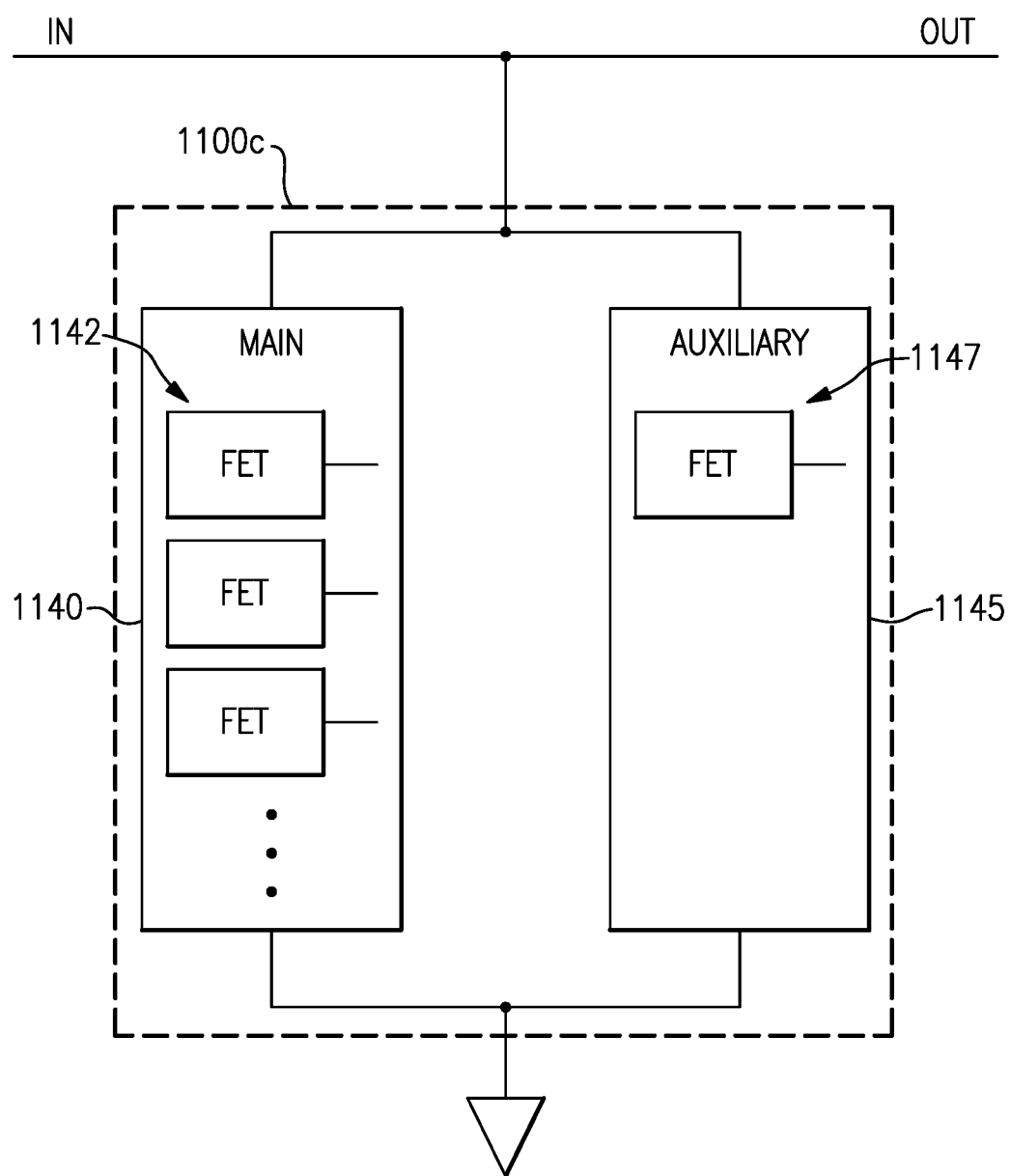

FIG. 11C-1 illustrates a main-auxiliary branch 1100c having a main path 1140 and an auxiliary path 1145 connected in parallel. The main path 1140 includes a plurality of FETs 1142 and the auxiliary path 1145 includes a FET 1147. FIG. 11C-2 illustrates the main-auxiliary branch 1100c of FIG. 11C-1 in a shunt configuration.

Figures 1, 11D:
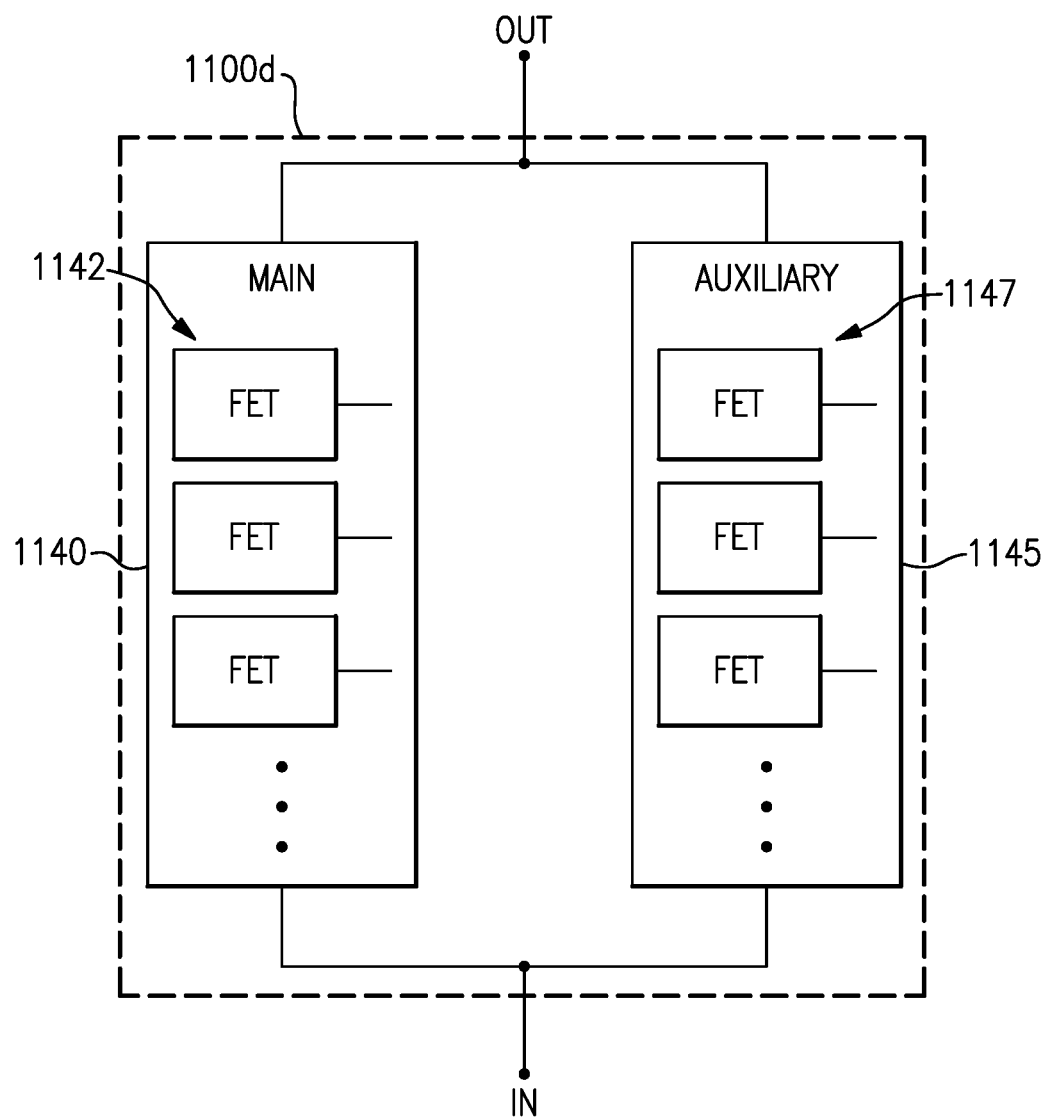
Figures 2, 11D:
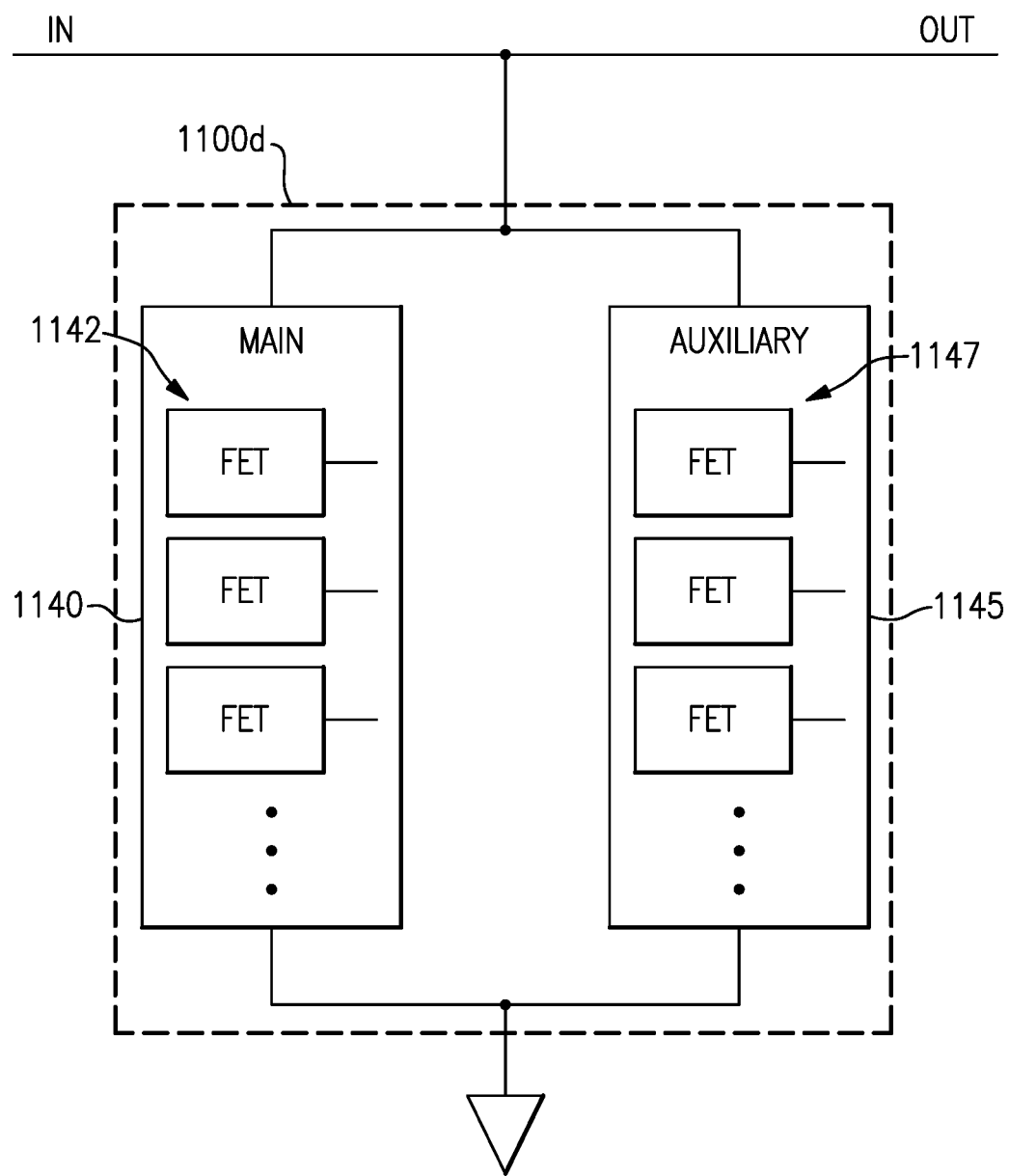

FIG. 11D-1 illustrates a main-auxiliary branch 1100d having a main path 1140 and an auxiliary path 1145 connected in parallel. The main path 1140 includes a plurality of FETs 1142 and the auxiliary path 1145 includes a plurality of FETs 1147. The number of FETs in the main path 1140 can differ from the number of FETs in the auxiliary path 1145. FIG. 11D-2 illustrates the main-auxiliary branch 1100d of FIG. 11D-1 in a shunt configuration.

Figures 1, 11E:
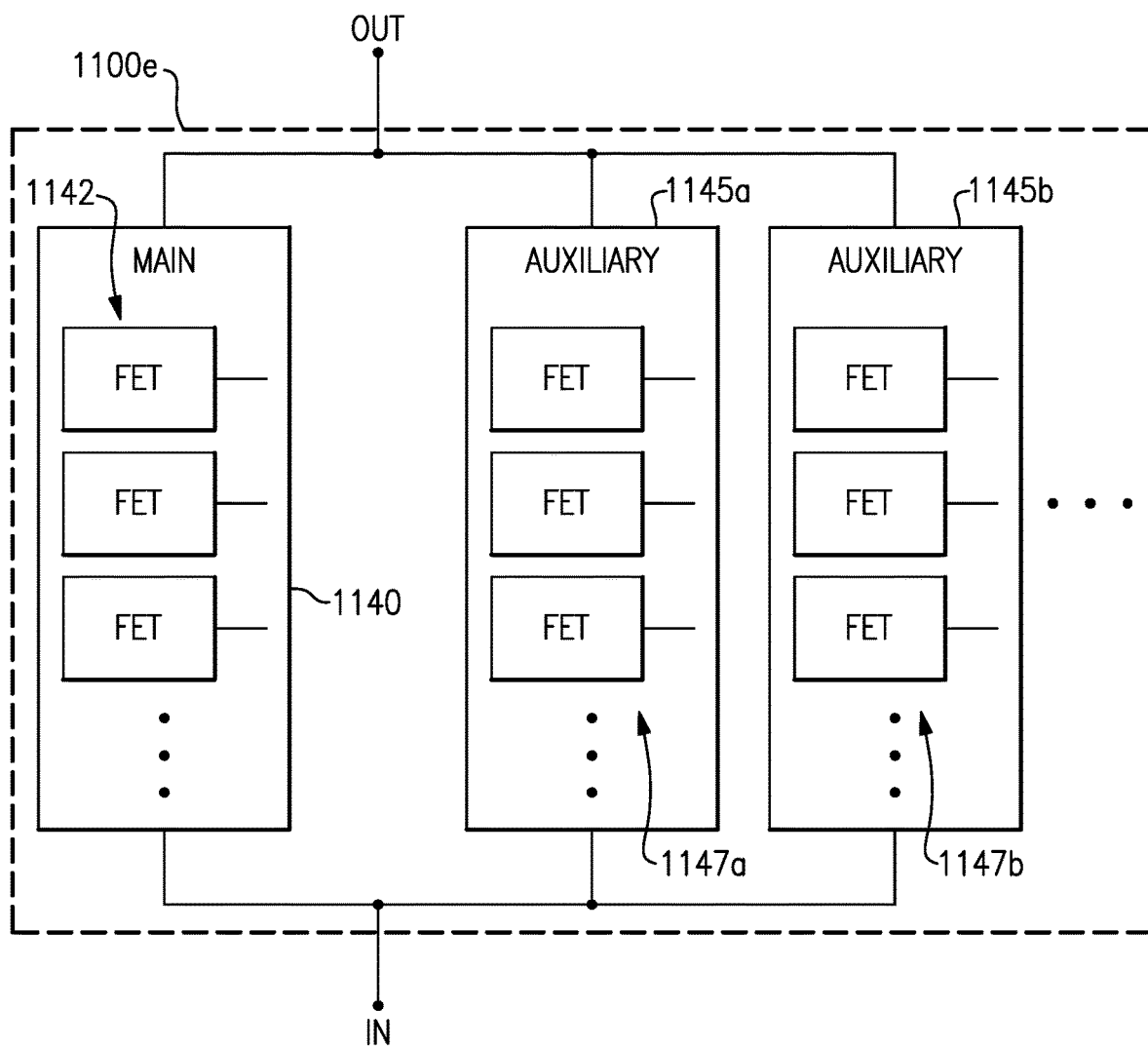
Figures 2, 11E:
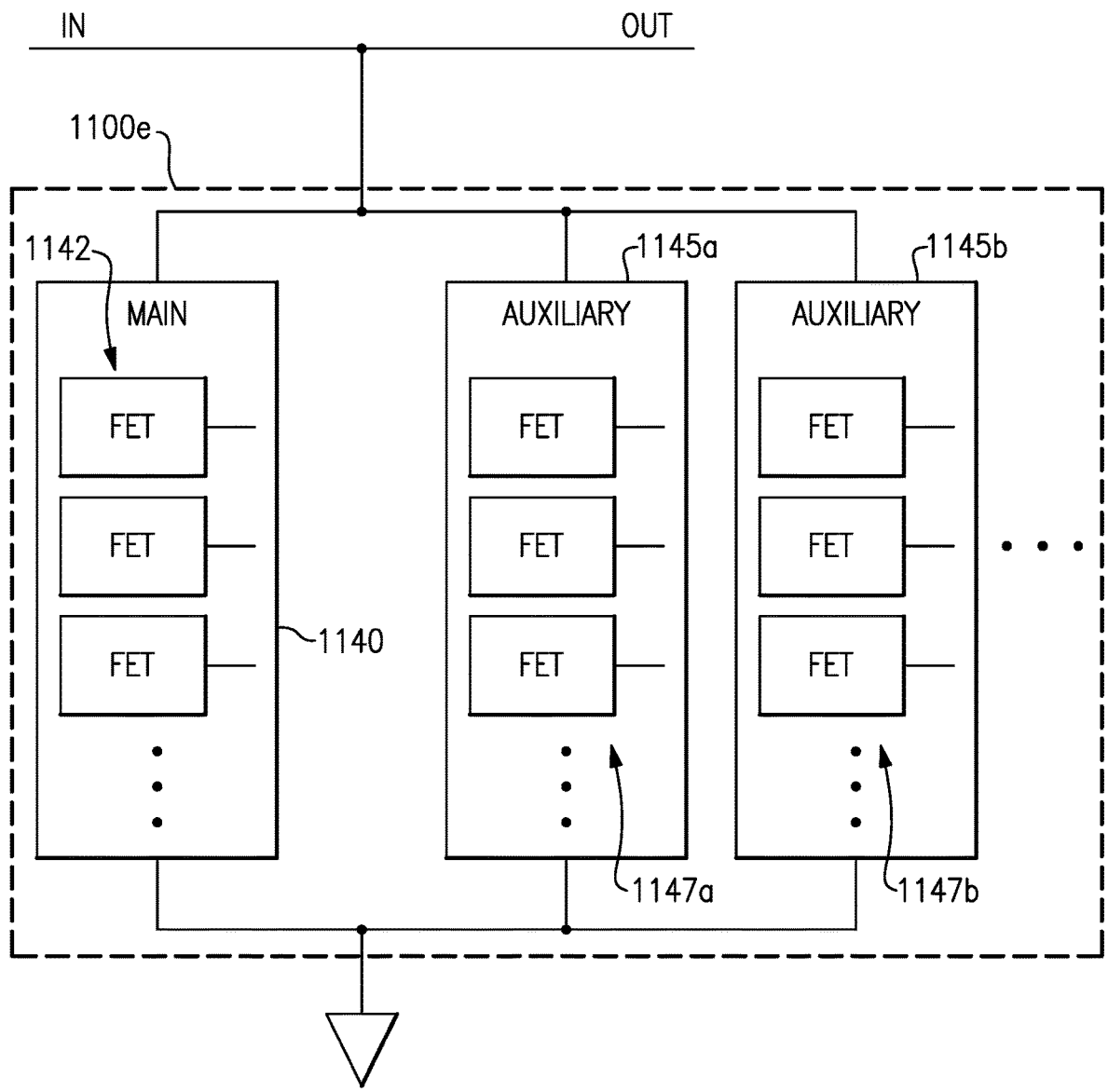

FIG. 11E-1 illustrates a main-auxiliary branch 1100e having a main path 1140 and a plurality of auxiliary paths 1145a, 1145b, each of the paths being connected in parallel. The main path 1140 includes a plurality of FETs 1142 and the auxiliary paths 1145a, 1145b include a plurality of FETs 1147a, 1147b. However, it is to be understood that the main path 1140 and/or individual auxiliary paths 1145a, 1145b can include a single FET or a plurality of FETs. In addition, the number of FETs in individual paths can be the same or different from one another. FIG. 11E-2 illustrates the main-auxiliary branch 1100e of FIG. 11E-1 in a shunt configuration.

Figures 1, 11F:
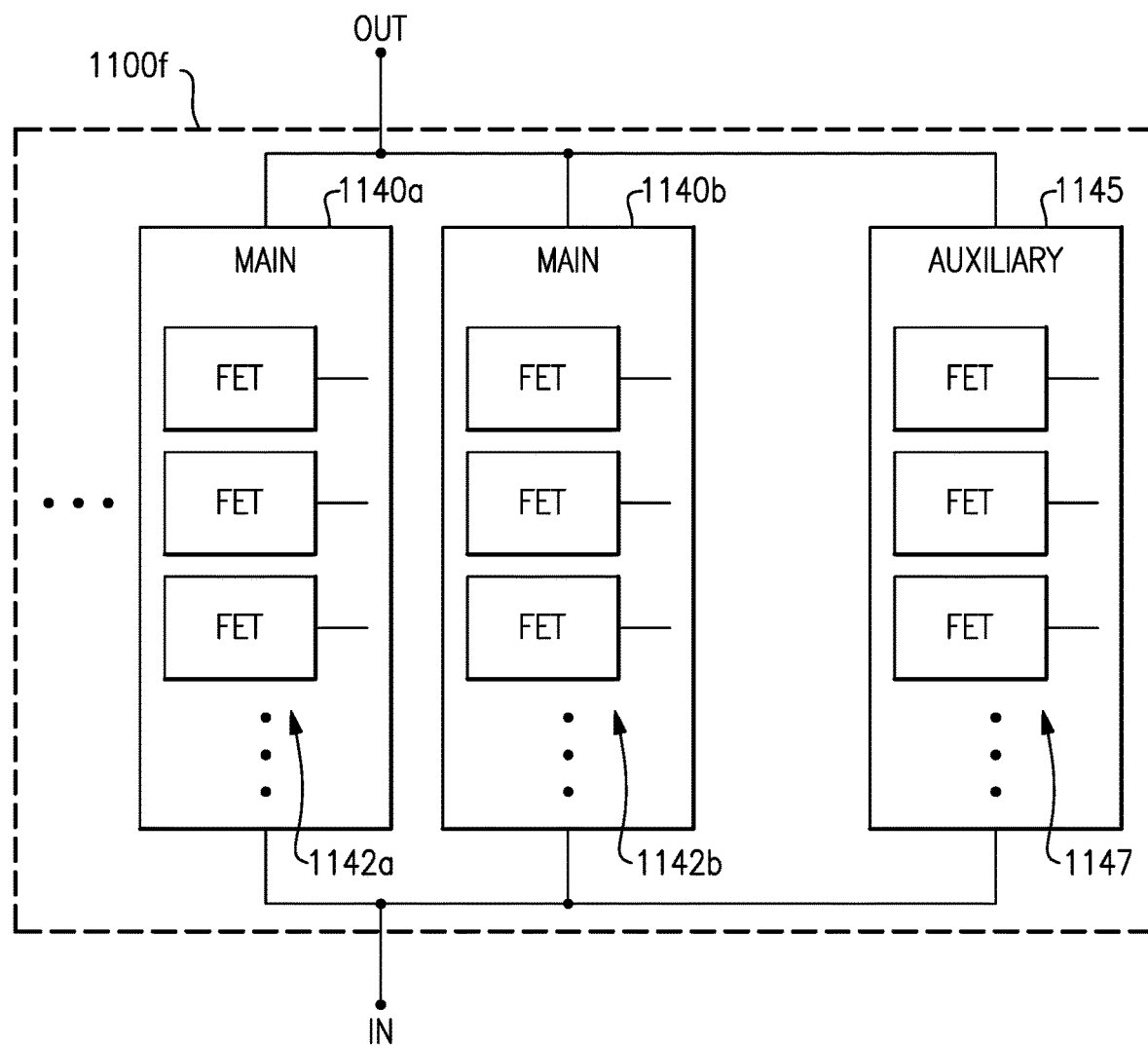
Figures 2, 11F:
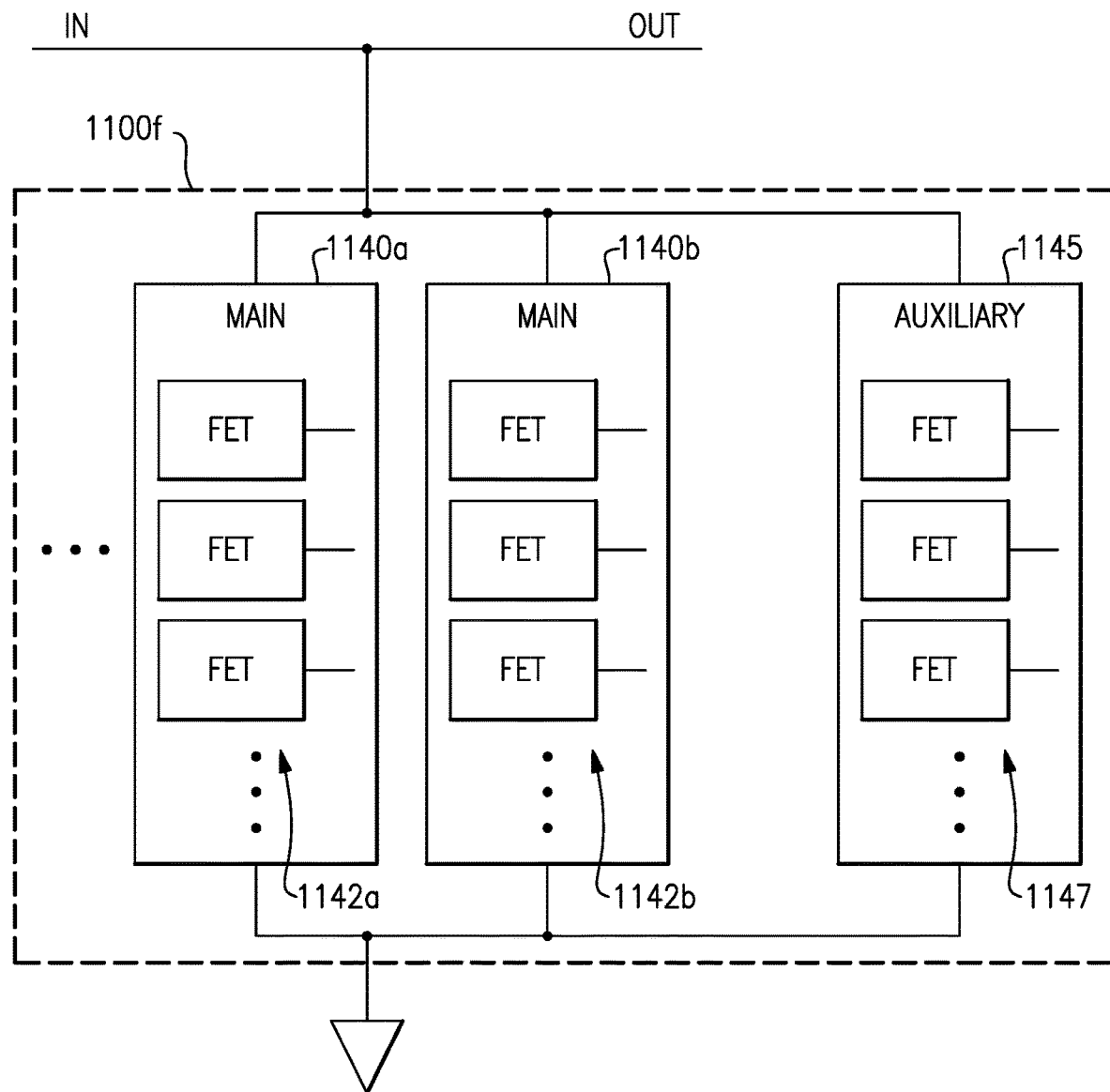

FIG. 11F-1 illustrates a main-auxiliary branch 1100f having a plurality of main paths 1140a, 1140b and an auxiliary path 1145, each of the paths being connected in parallel. The main paths 1140a, 1140b include a plurality of FETs 1142a, 1142b and the auxiliary path 1145 includes a plurality of FETs 1147. However, it is to be understood that individual main paths 1140 and/or the auxiliary path 1145 can include a single FET or a plurality of FETs. In addition, the number of FETs in individual paths can be the same or different from one another. FIG. 11F-2 illustrates the main-auxiliary branch 1100f of FIG. 11F-1 in a shunt configuration.

Figures 1, 11G:
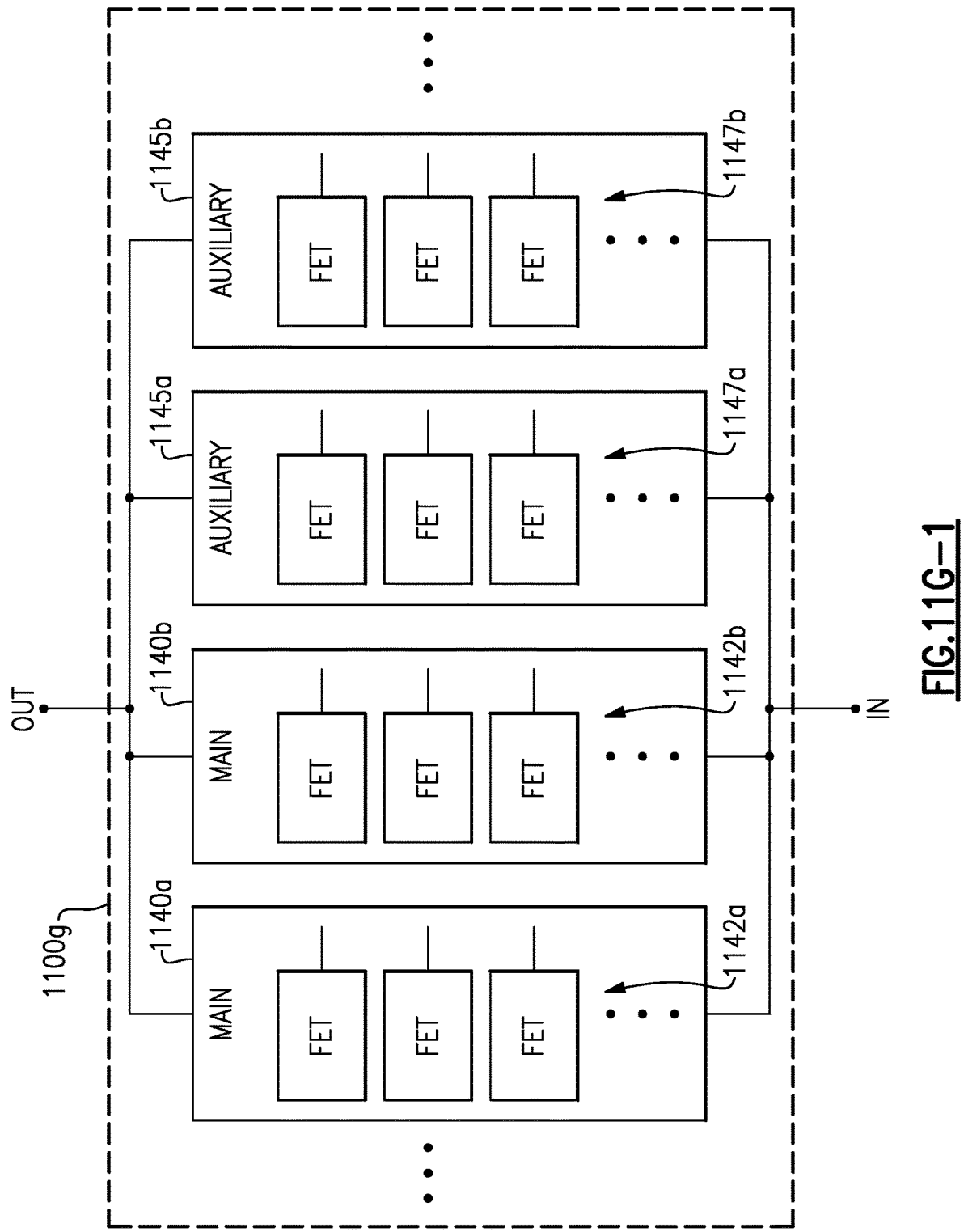

FIG. 11G-1 illustrates a main-auxiliary branch 1100g having a plurality of main paths 1140a, 1140b and a plurality of auxiliary paths 1145a, 1145b, each of the paths being connected in parallel. The main paths 1140a, 1140b include a plurality of FETs 1142a, 1142b and the auxiliary paths 1145a, 1145b include a plurality of FETs 1147a, 1147b. However, it is to be understood that individual main paths 1140 and/or individual auxiliary paths 1145a, 1145b can include a single FET or a plurality of FETs. In addition, the number of FETs in individual paths can be the same or different from one another. FIG. 11G-2 illustrates the main-auxiliary branch 1100g of FIG. 11G-1 in a shunt configuration.

Figures 1, 11H:
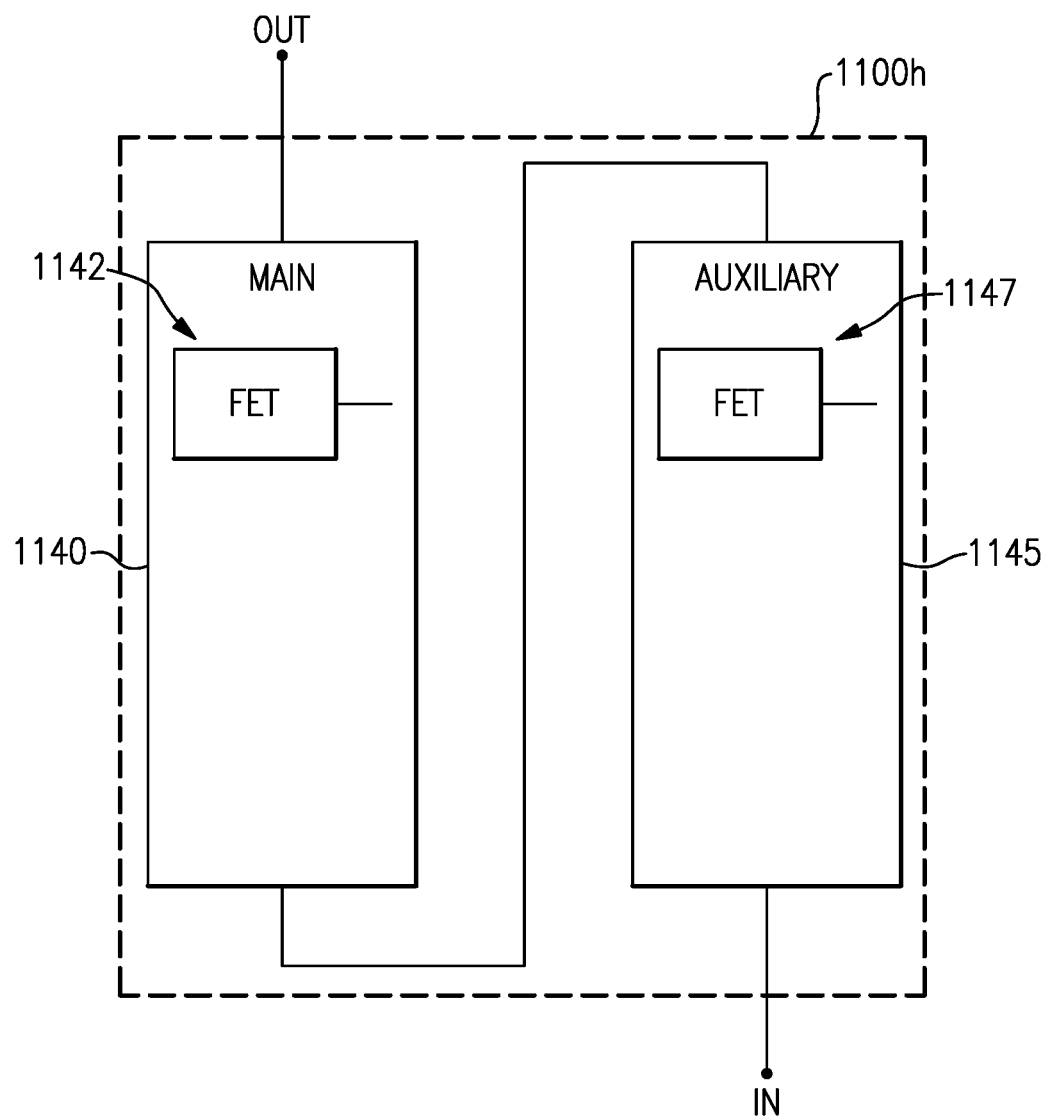
Figures 2, 11H:
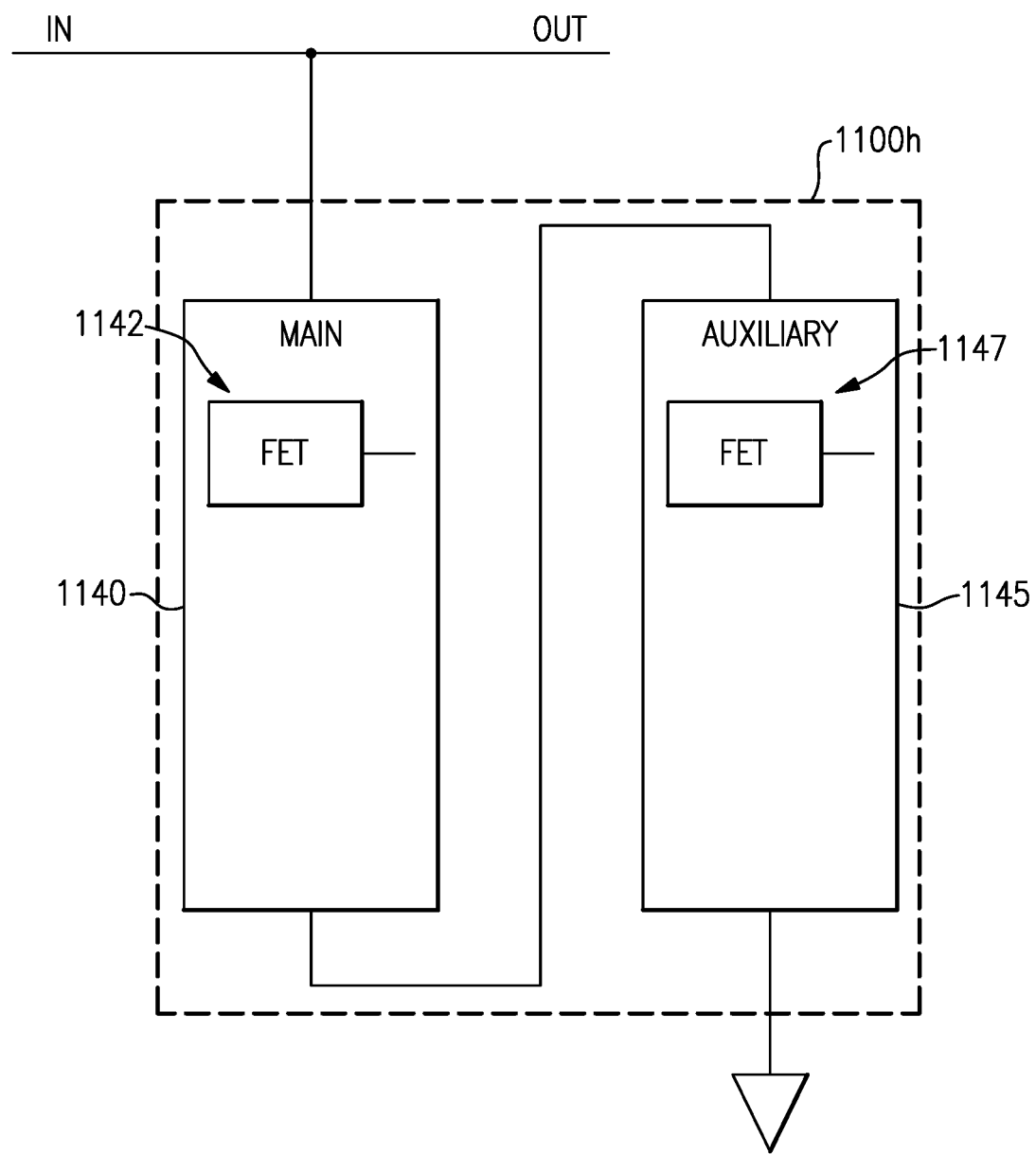

FIG. 11H-1 illustrates a main-auxiliary branch 1100h having a main path 1140 and an auxiliary path 1145 connected in series. The main path 1140 includes a FET 1142 and the auxiliary path 1145 includes a FET 1147. It is to be understood that the order of the main path 1140 and the auxiliary path 1145 can be reversed so that the main path 1140 is positioned between the input node and the auxiliary path 1145 and the auxiliary path 1145 is positioned between the output node and the main path 1140. FIG. 11H-2 illustrates the main-auxiliary branch 1100h of FIG. 11H-1 in a shunt configuration.

Figures 1, 11I:
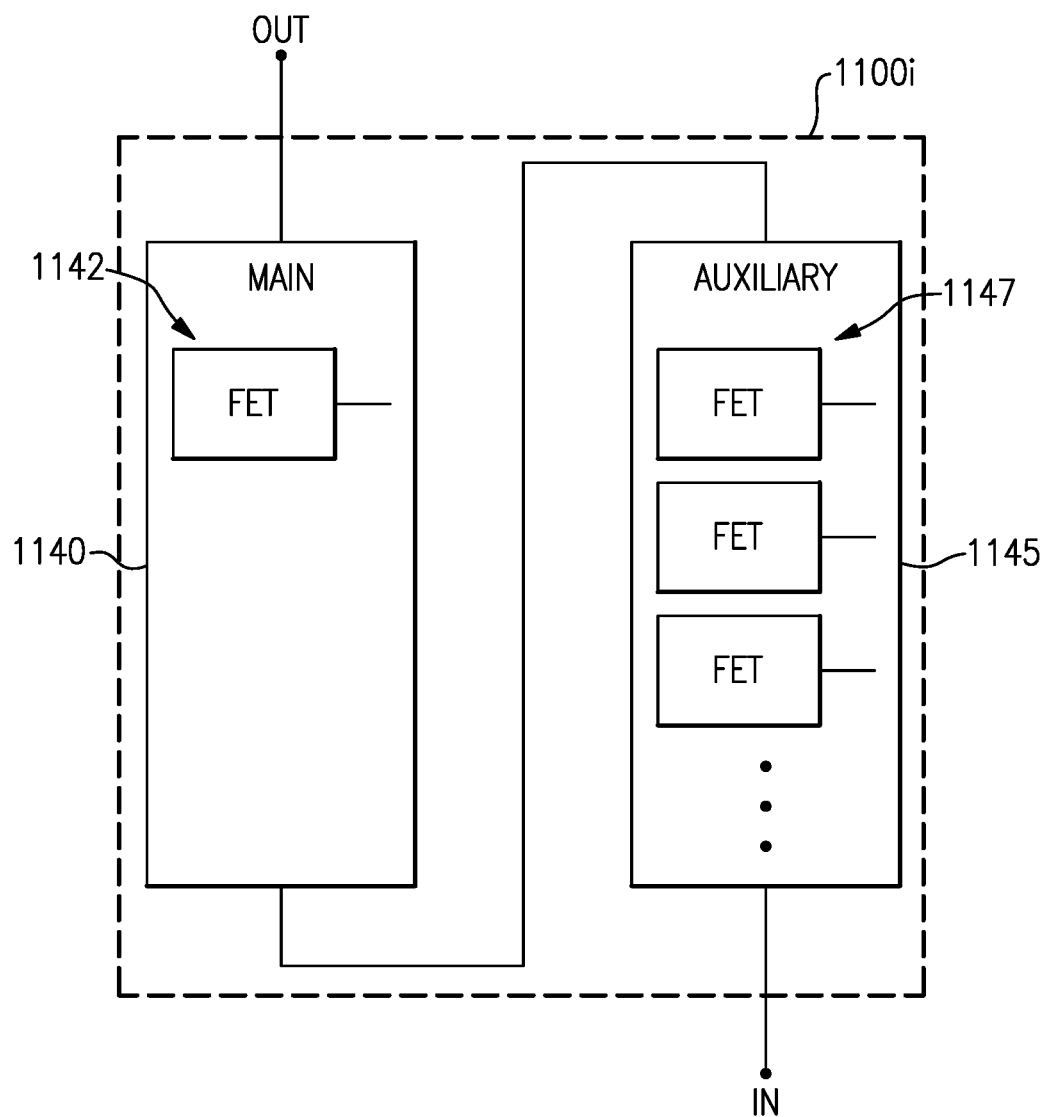
Figures 2, 11I:
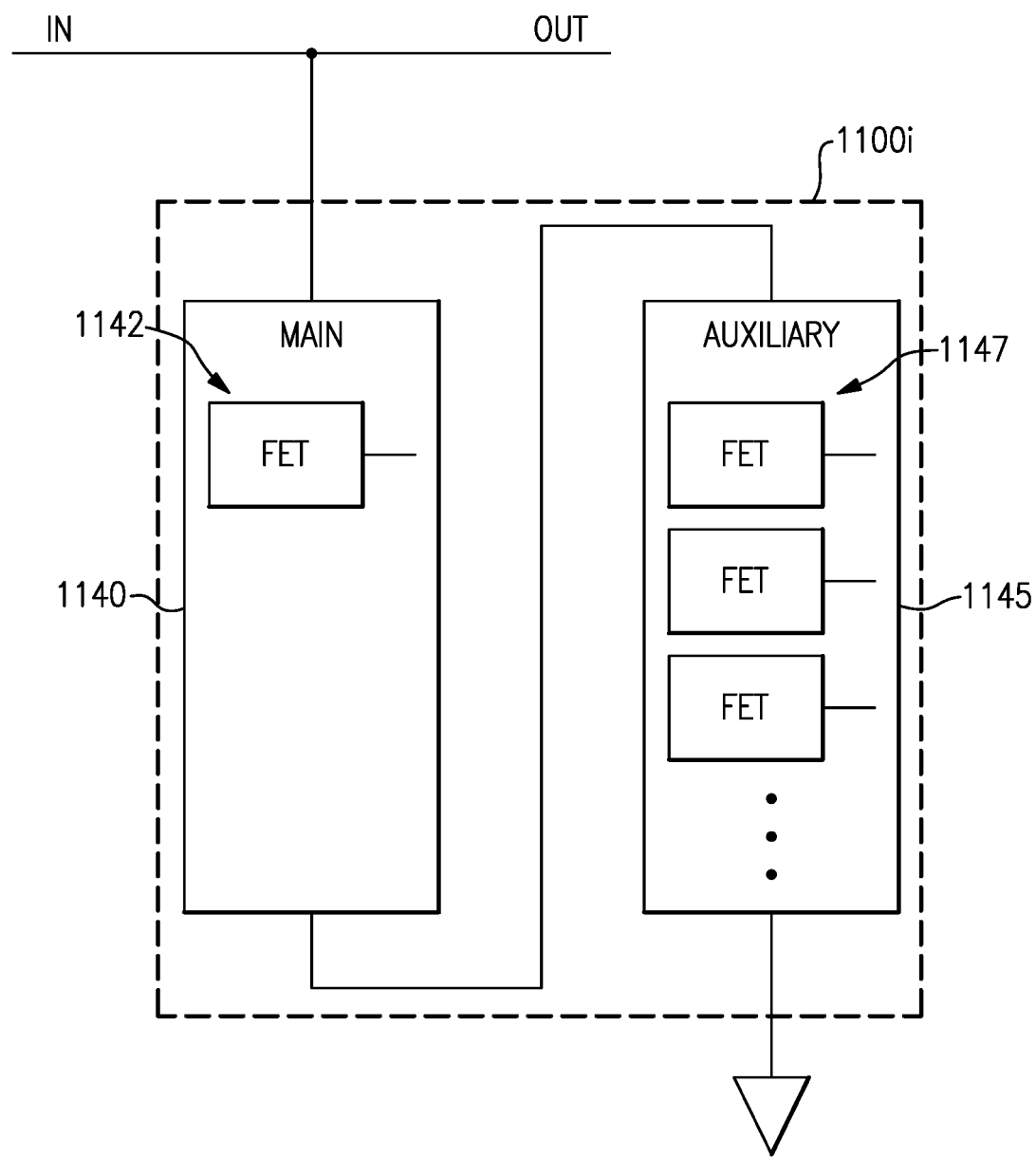

FIG. 11I-1 illustrates a main-auxiliary branch 1100i having a main path 1140 and an auxiliary path 1145 connected in series. The main path 1140 includes a FET 1142 and the auxiliary path 1145 includes a plurality of FETs 1147. It is to be understood that the order of the main path 1140 and the auxiliary path 1145 can be reversed so that the main path 1140 is positioned between the input node and the auxiliary path 1145 and the auxiliary path 1145 is positioned between the output node and the main path 1140. FIG. 11I-2 illustrates the main-auxiliary branch 1100i of FIG. 11I-1 in a shunt configuration.

Figures 1, 11J:
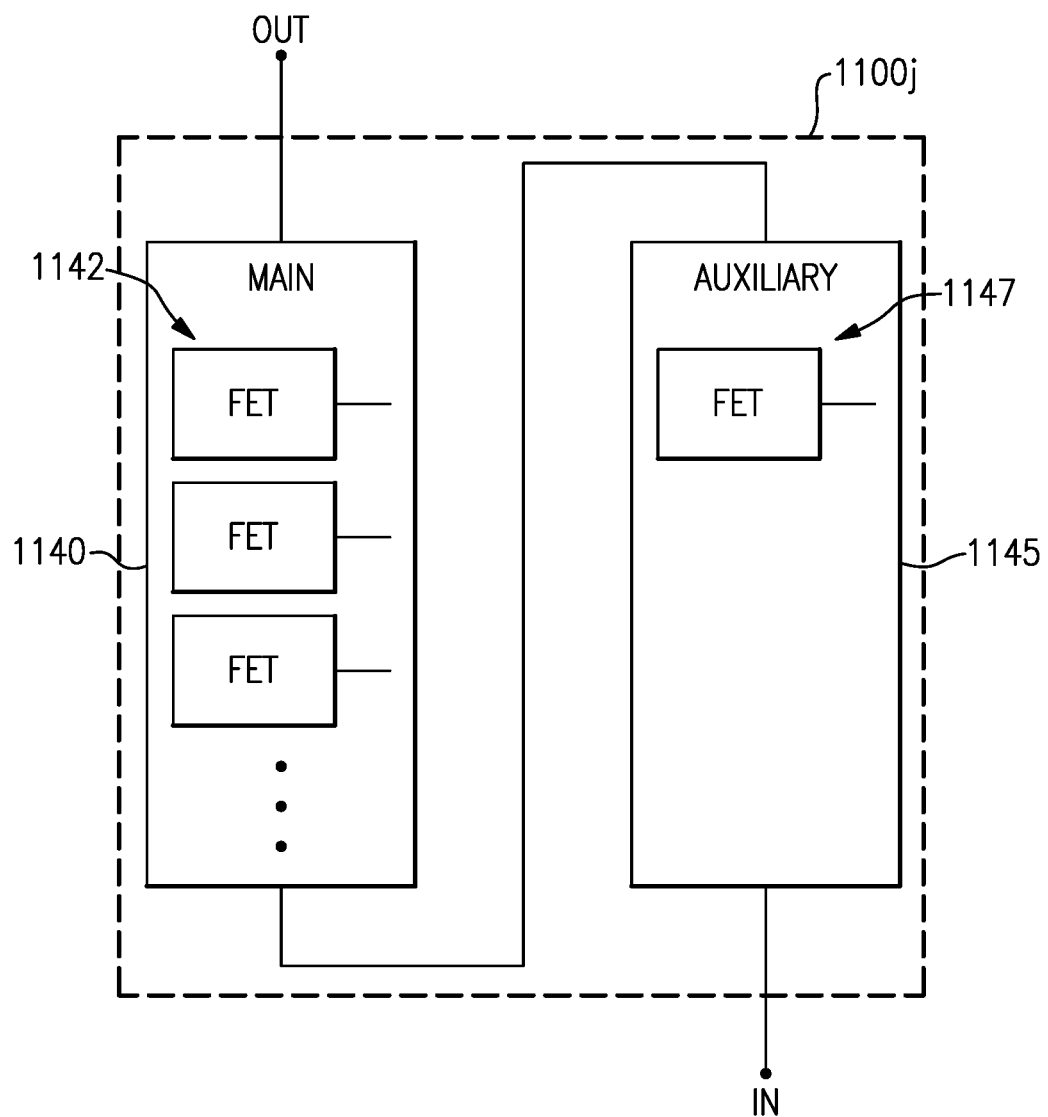
Figures 2, 11J:
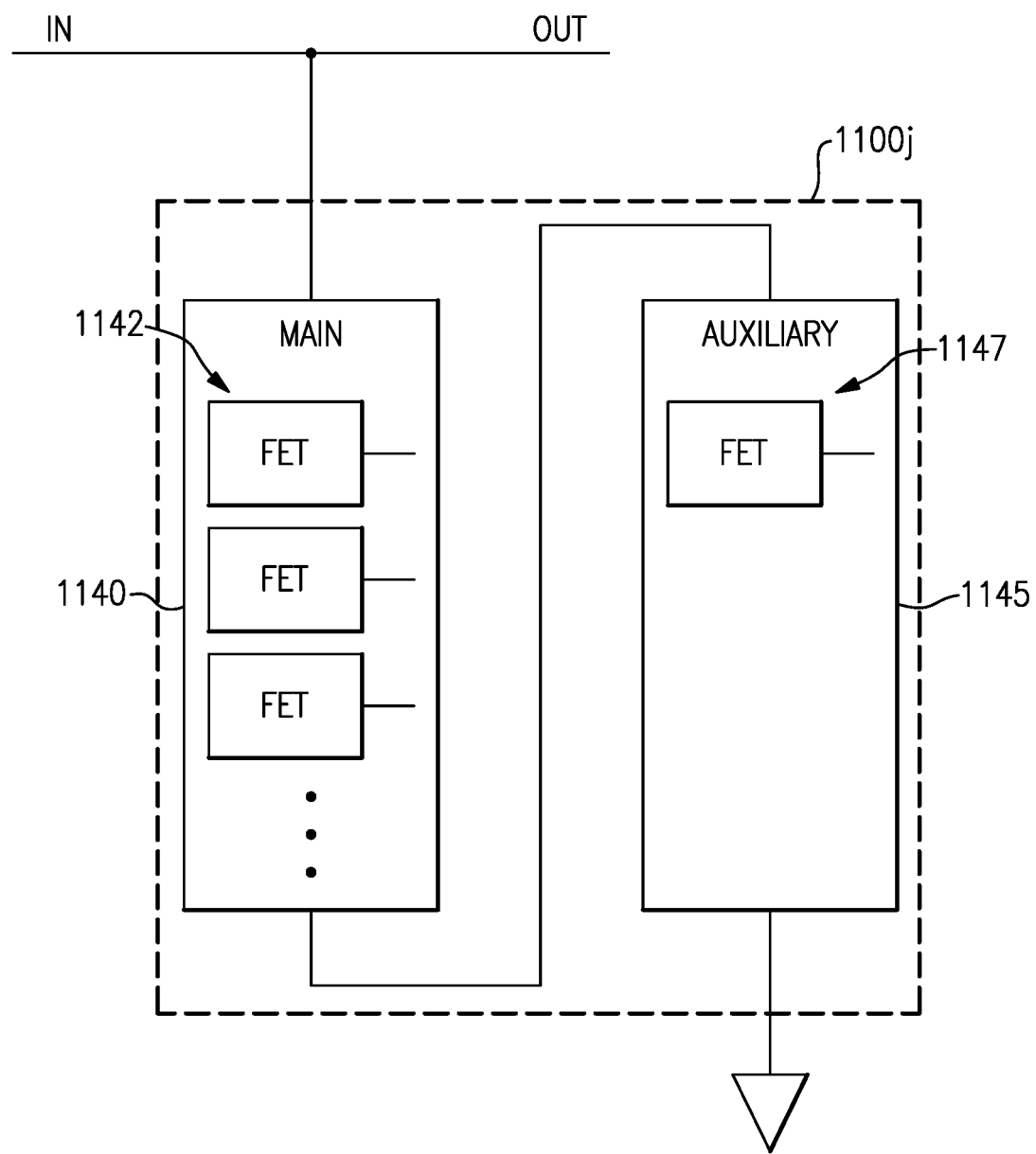

FIG. 11J-1 illustrates a main-auxiliary branch 1100j having a main path 1140 and an auxiliary path 1145 connected in series. The main path 1140 includes a plurality of FETs 1142 and the auxiliary path 1145 includes a FET 1147. It is to be understood that the order of the main path 1140 and the auxiliary path 1145 can be reversed so that the main path 1140 is positioned between the input node and the auxiliary path 1145 and the auxiliary path 1145 is positioned between the output node and the main path 1140. FIG. 11J-2 illustrates the main-auxiliary branch 1100j of FIG. 11J-1 in a shunt configuration.

Figures 1, 11K:
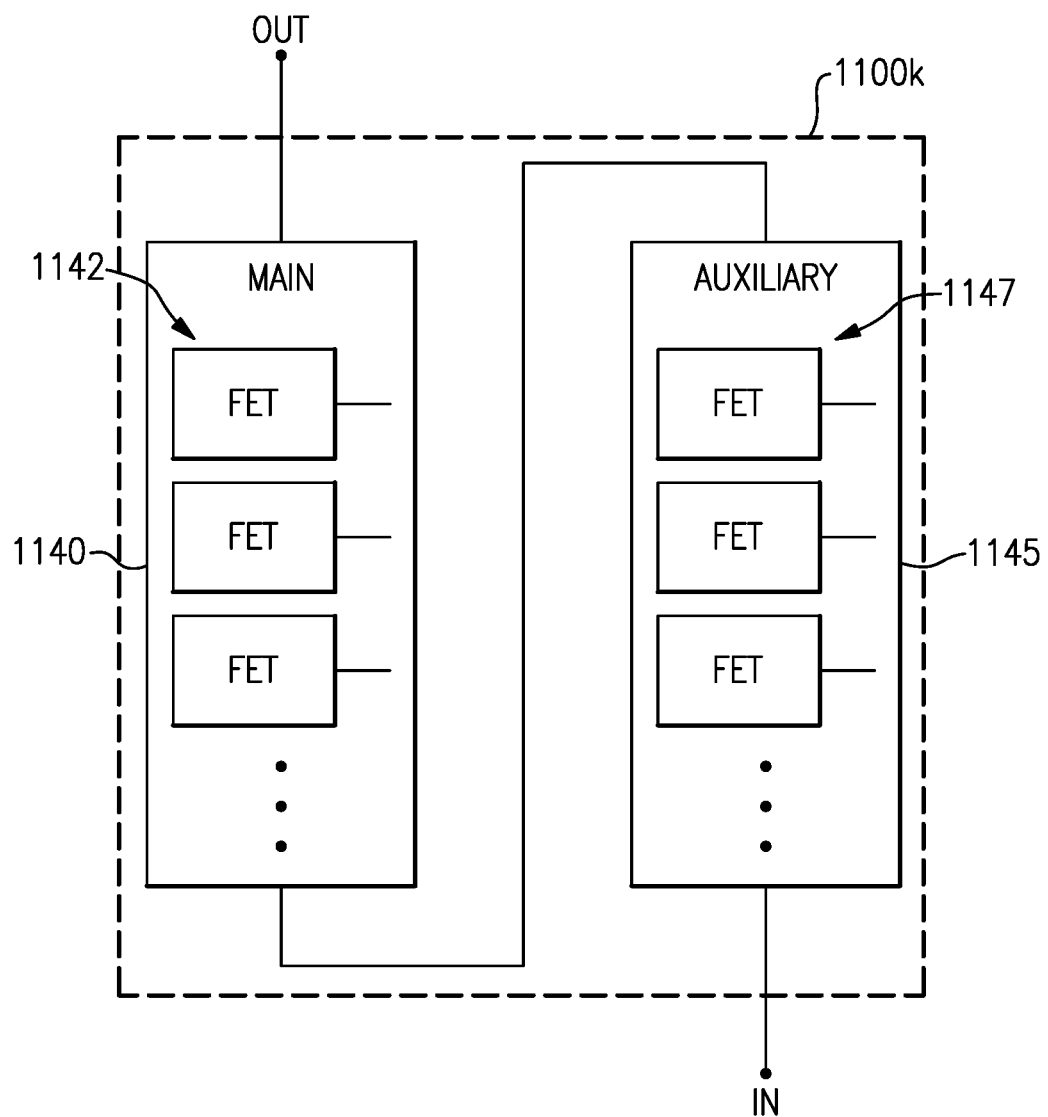
Figures 2, 11K:
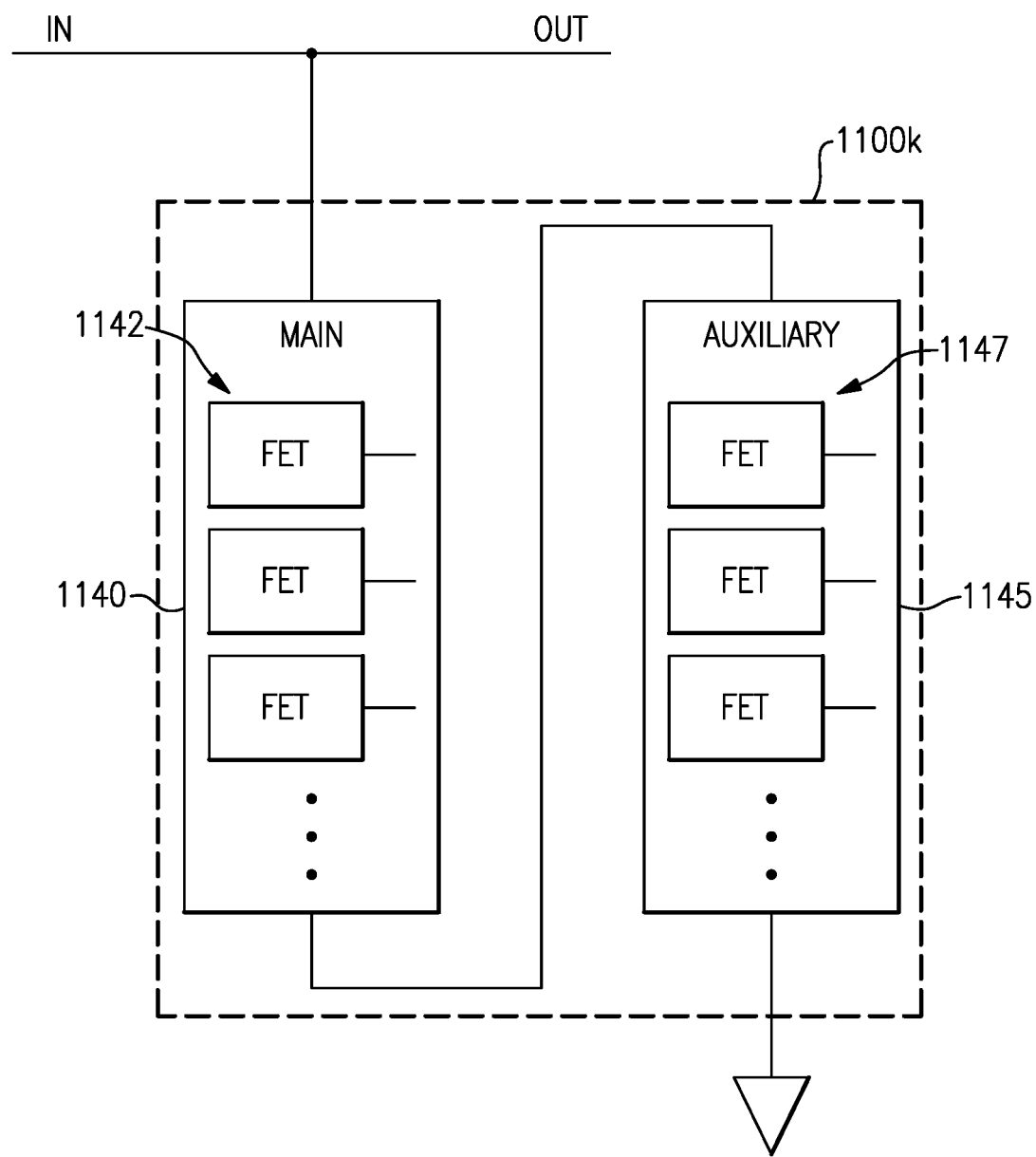

FIG. 11K-1 illustrates a main-auxiliary branch 1100k having a main path 1140 and an auxiliary path 1145 connected in series. The main path 1140 includes a plurality of FETs 1142 and the auxiliary path 1145 includes a plurality of FETs 1147. The number of FETs in the main path 1140 can differ from the number of FETs in the auxiliary path 1145. It is to be understood that the order of the main path 1140 and the auxiliary path 1145 can be reversed so that the main path 1140 is positioned between the input node and the auxiliary path 1145 and the auxiliary path 1145 is positioned between the output node and the main path 1140. FIG. 11K-2 illustrates the main-auxiliary branch 1100k of FIG. 11K-1 in a shunt configuration.

Figures 1, 11L:
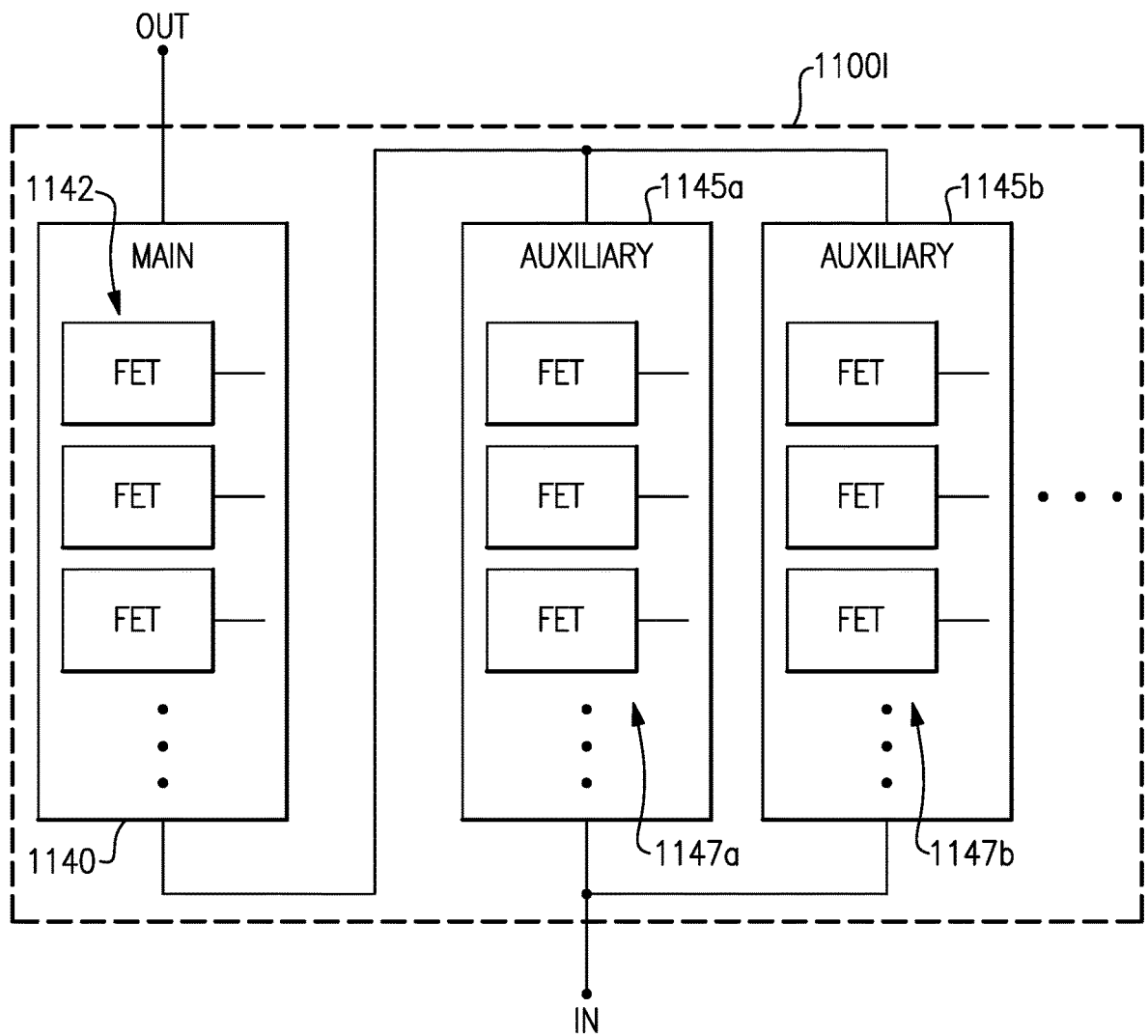
Figures 2, 11L:
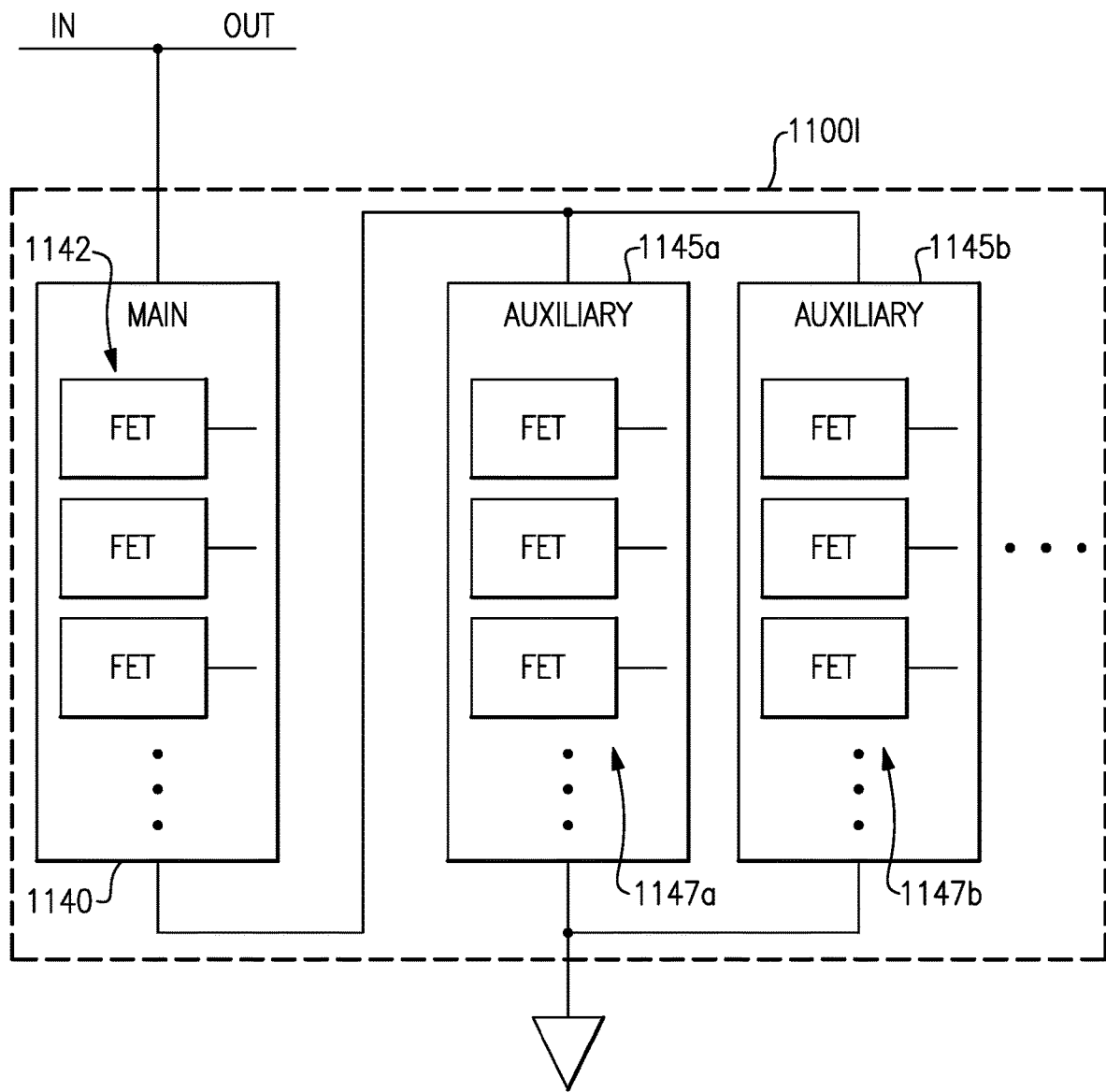

FIG. 11L-1 illustrates a main-auxiliary branch 1100l having a main path 1140 and a plurality of parallel auxiliary paths 1145a, 1145b, the main path 1140 connected in series to the plurality of parallel auxiliary paths 1145a, 1145b. The main path 1140 includes a plurality of FETs 1142 and the plurality of auxiliary paths 1145a, 1145b each includes a plurality of FETs 1147a, 1147b. However, it is to be understood that the main path 1140 and/or individual auxiliary paths 1145a, 1145b can include a single FET or a plurality of FETs. In addition, the number of FETs in individual paths can be the same or different from one another. It is to be understood that the order of the main path 1140 and the plurality of parallel auxiliary paths 1145a, 1145b can be reversed so that the main path 1140 is positioned between the input node and the plurality of parallel auxiliary paths 1145a, 1145b and the plurality of parallel auxiliary paths 1145a, 1145b is positioned between the output node and the main path 1140. FIG. 11L-2 illustrates the main-auxiliary branch 1100l of FIG. 11L-1 in a shunt configuration.

Figures 1, 11M:
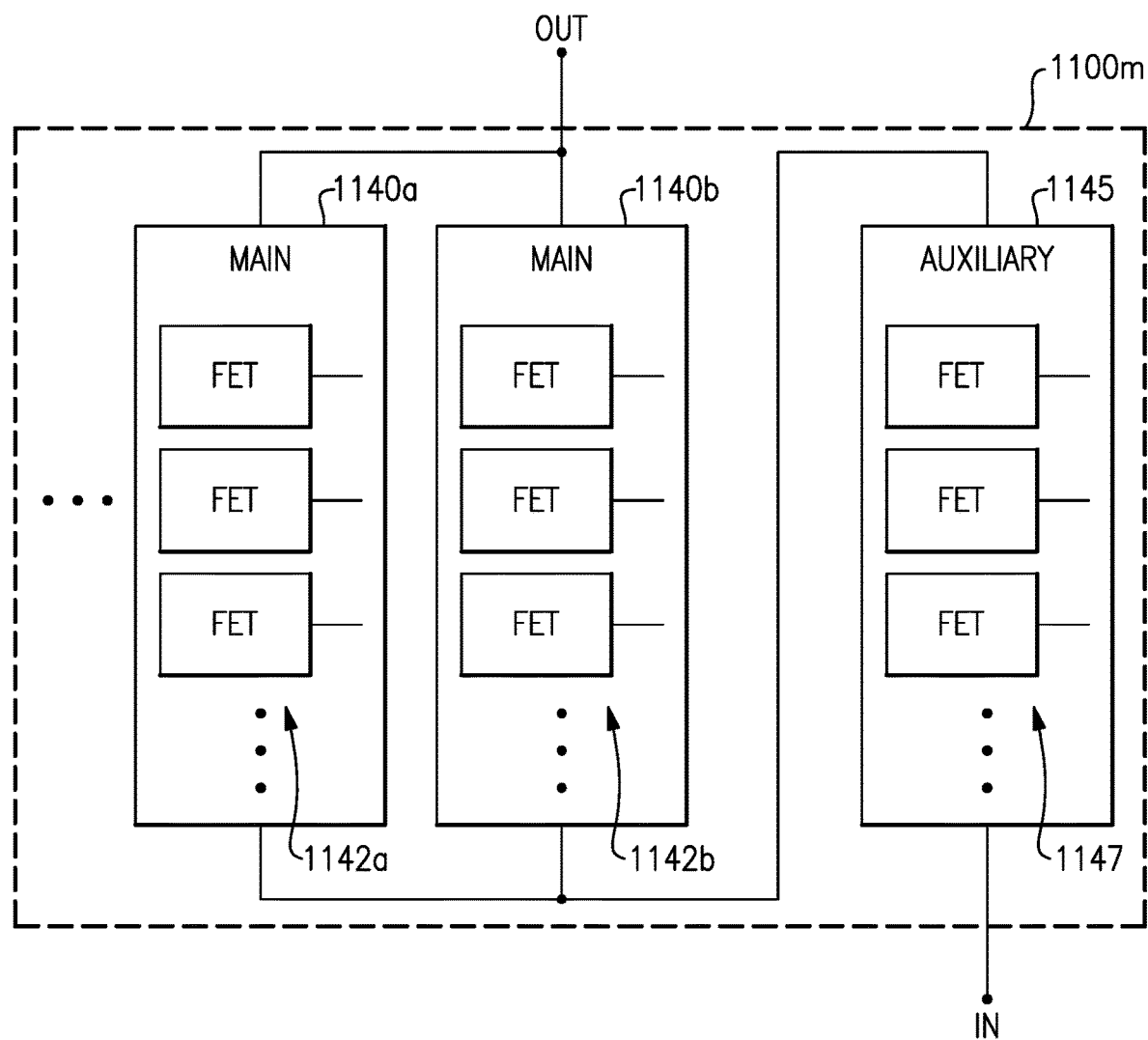
Figures 2, 11M:
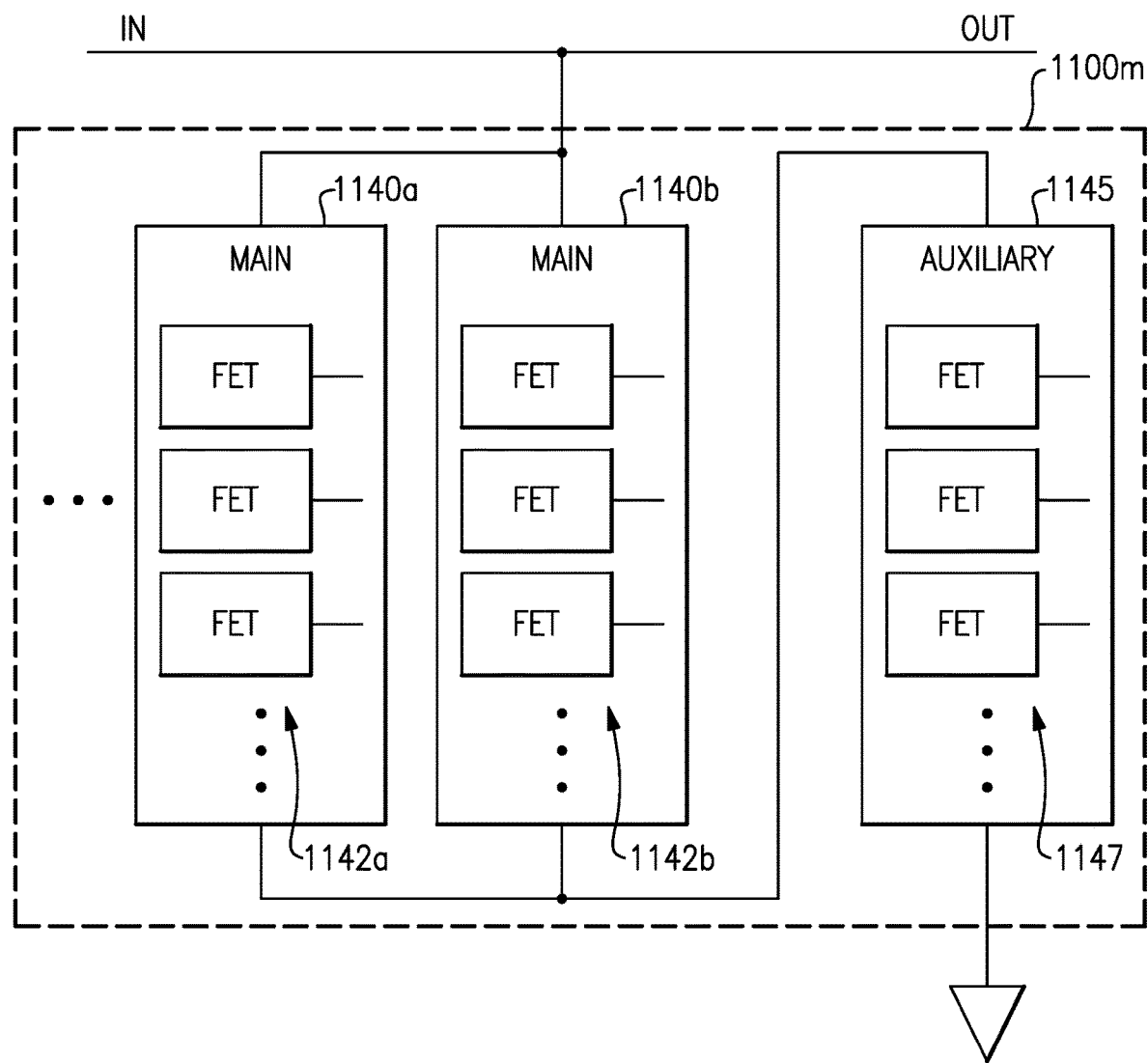

FIG. 11M-1 illustrates a main-auxiliary branch 1100m having a plurality of parallel main paths 1140a, 1140b connected in series with an auxiliary path 1145. The plurality of main paths 1140a, 1140b each include a plurality of FETs 1142a, 1142b and the auxiliary path 1145 includes a plurality of FETs 1147. However, it is to be understood that individual main paths 1140a, 1140b and/or the auxiliary path 1145 can include a single FET or a plurality of FETs. In addition, the number of FETs in individual paths can be the same or different from one another. It is to be understood that the order of the plurality of parallel main paths 1140a, 1140b and the auxiliary path 1145 can be reversed so that the plurality of parallel main paths 1140a, 1104b is positioned between the input node and the auxiliary path 1145 and the auxiliary path 1145 is positioned between the output node and the plurality of parallel main paths 1140a, 1140b. FIG. 11M-2 illustrates the main-auxiliary branch 1100m of FIG. 11M-1 in a shunt configuration.

Figures 1, 11N:
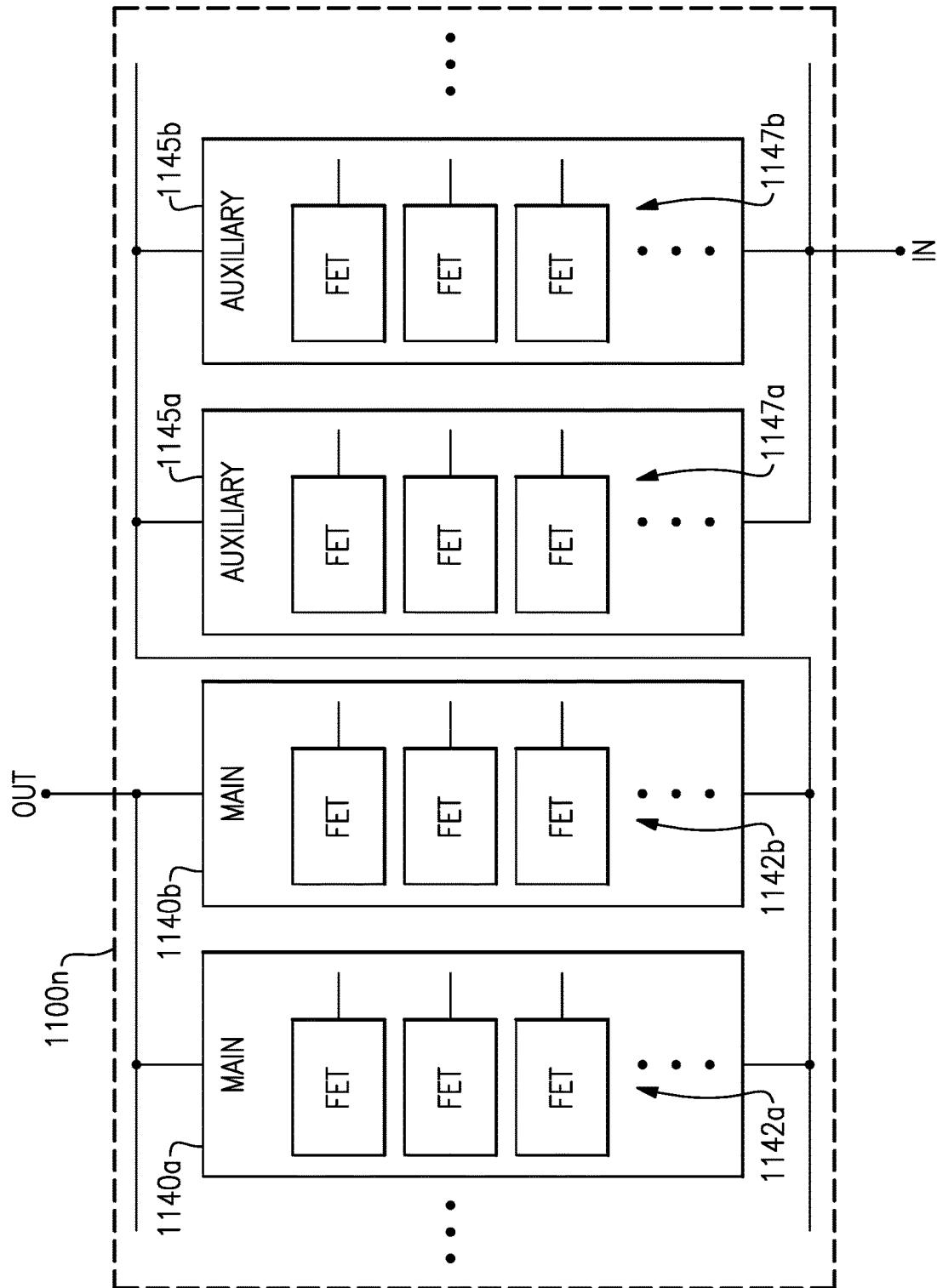
Figures 2, 11N:
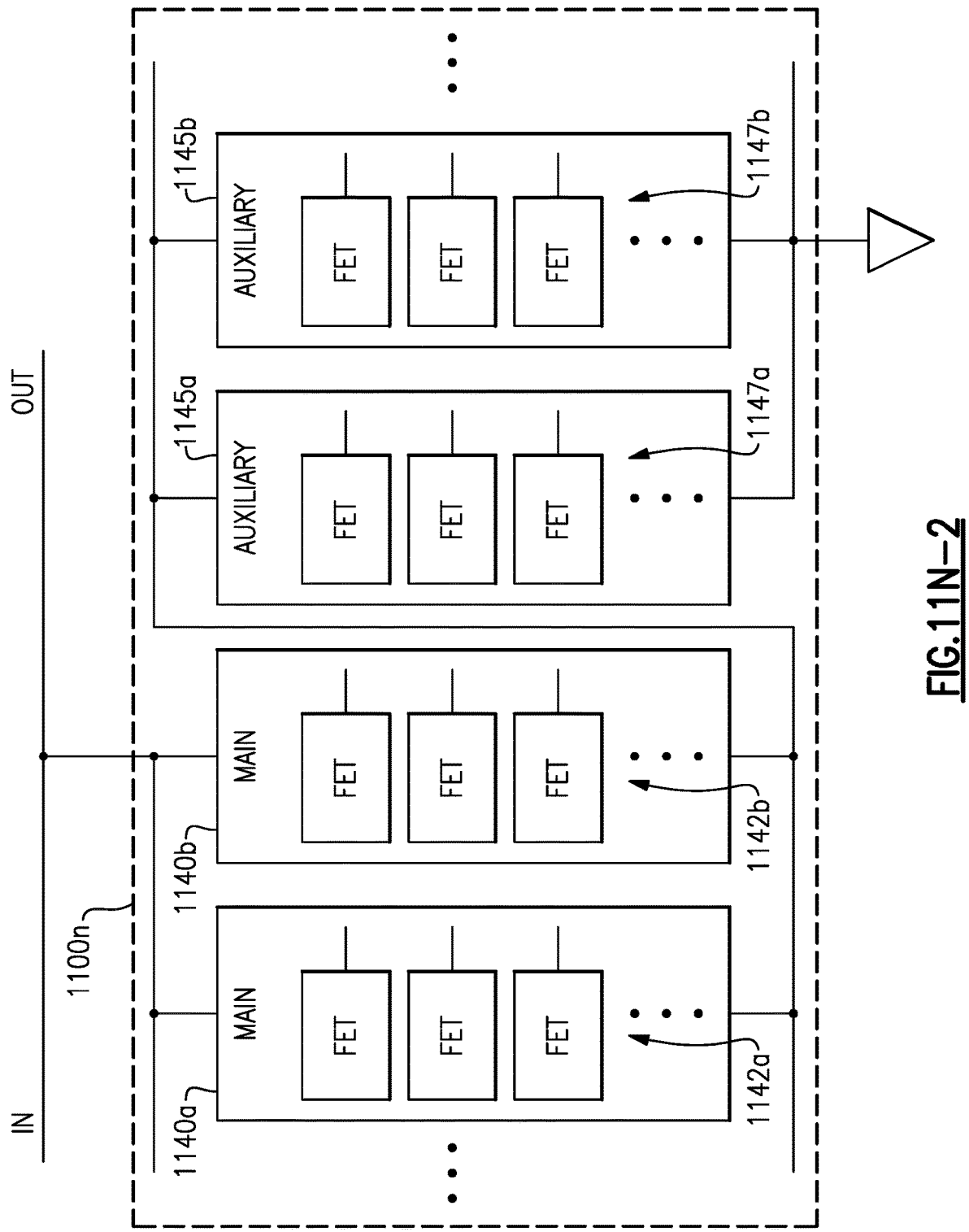
Figures 1, 110:
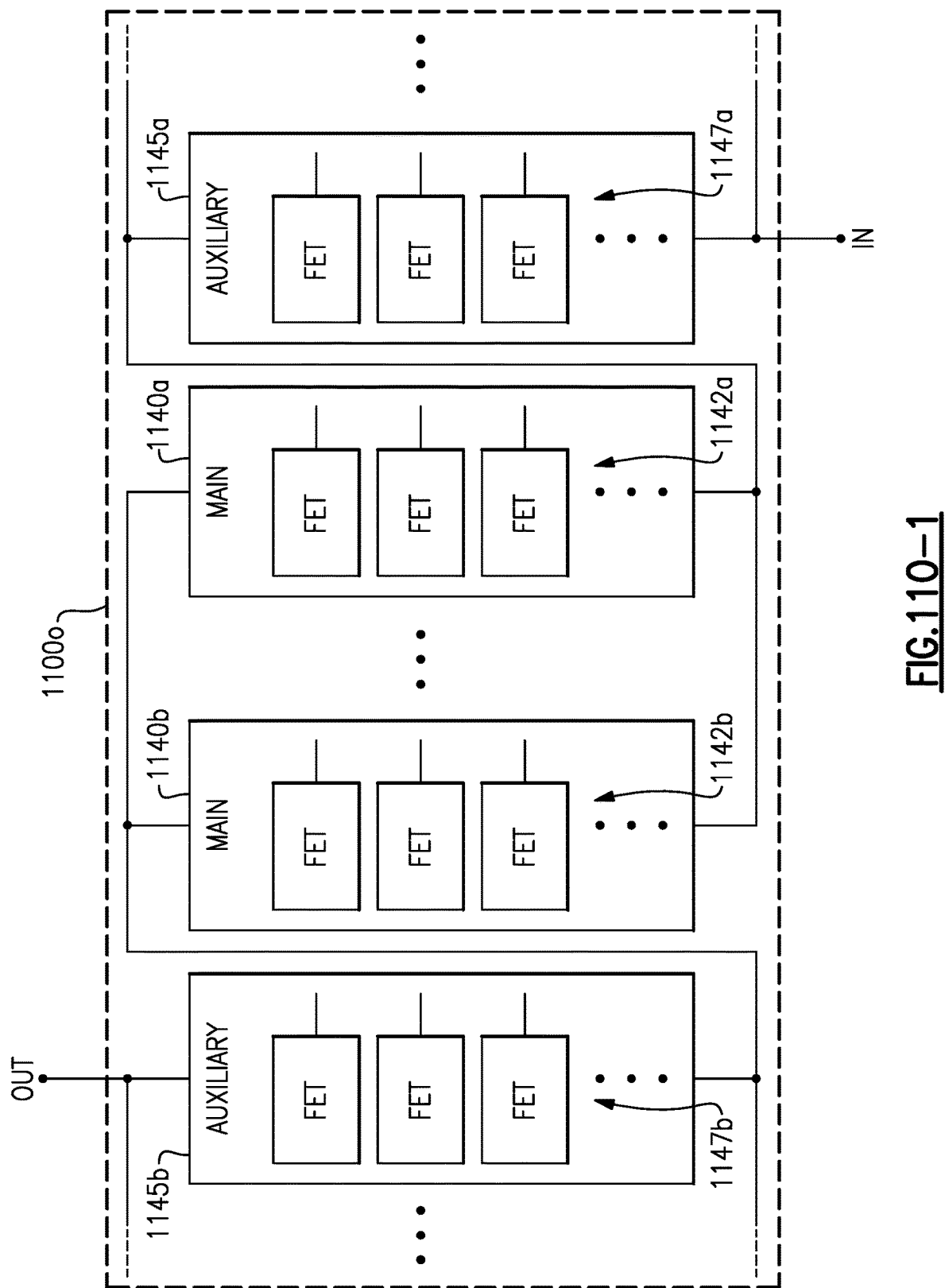
Figures 2, 110:
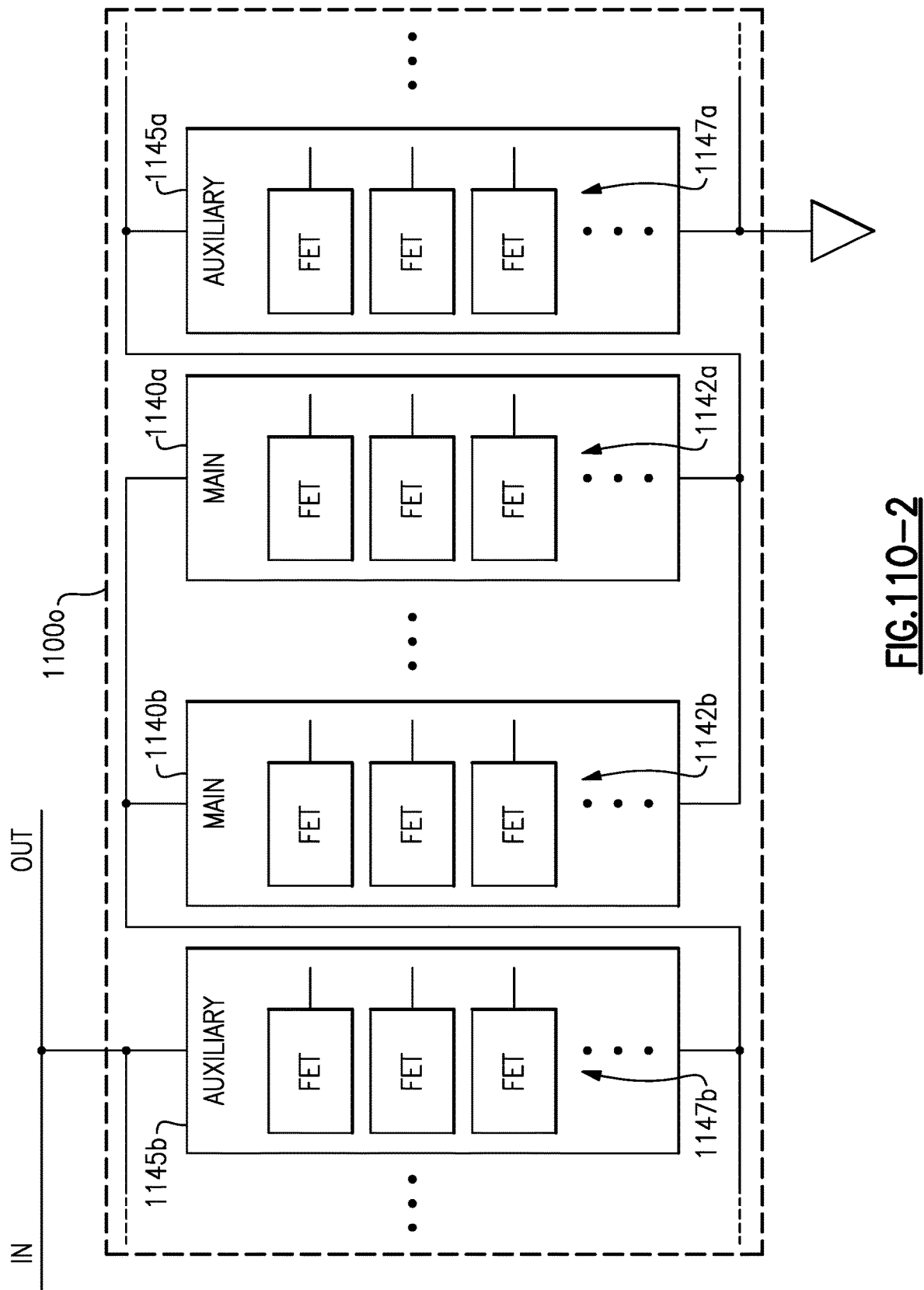

FIG. 11N-1 illustrates a main-auxiliary branch 1100n having a plurality of parallel main paths 1140a, 1140b connected in series with a plurality of parallel auxiliary paths 1145a, 1145b. The plurality of main paths 1140a, 1140b each include a plurality of FETs 1142a, 1142b and the plurality of auxiliary paths 1145a, 1145b each include a plurality of FETs 1147*a*, 1147*b*. However, it is to be understood that individual main paths 1140*a*, 1140*b* and/or individual auxiliary paths 1145*a*, 1145*b* can include a single FET or a plurality of FETs. In addition, the number of FETs in individual paths can be the same or different from one another. It is to be understood that the order of the plurality of parallel main paths 1140*a*, 1140*b* and the plurality of parallel auxiliary paths 1145*a*, 1145*b* can be reversed so that the plurality of parallel main paths 1140*a*, 1104*b* is positioned between the input node and the plurality of parallel auxiliary paths 1145*a*, 1145*b* and the plurality of parallel auxiliary paths 1145*a*, 1145*b* is positioned between the output node and the plurality of parallel main paths 1140*a*, 1140*b*. FIG. 11N-2 illustrates the main-auxiliary branch 1100*n* of FIG. 11N-1 in a shunt configuration.

FIG. 11O-1 illustrates a main-auxiliary branch 1100*o* having a plurality of parallel main paths 1140*a*, 1140*b* connected in series with a first plurality of parallel auxiliary paths 1145*a* and a second plurality of parallel auxiliary paths 1145*b*, the plurality of parallel main paths 1140*a*, 1140*b* positioned between the first plurality of parallel auxiliary paths 1145*a* and the second plurality of parallel auxiliary paths 1145*b*. The plurality of main paths 1140*a*, 1140*b* each include a plurality of FETs 1142*a*, 1142*b* and the plurality of auxiliary paths 1145*a*, 1145*b* each include a plurality of FETs 1147*a*, 1147*b*. However, it is to be understood that individual main paths 1140*a*, 1140*b* and/or individual auxiliary paths 1145*a*, 1145*b* can include a single FET or a plurality of FETs. In addition, the number of FETs in individual paths can be the same or different from one another. FIG. 11O-2 illustrates the main-auxiliary branch 1100*o* of FIG. 11O-1 in a shunt configuration.

Figures 1, 11P:
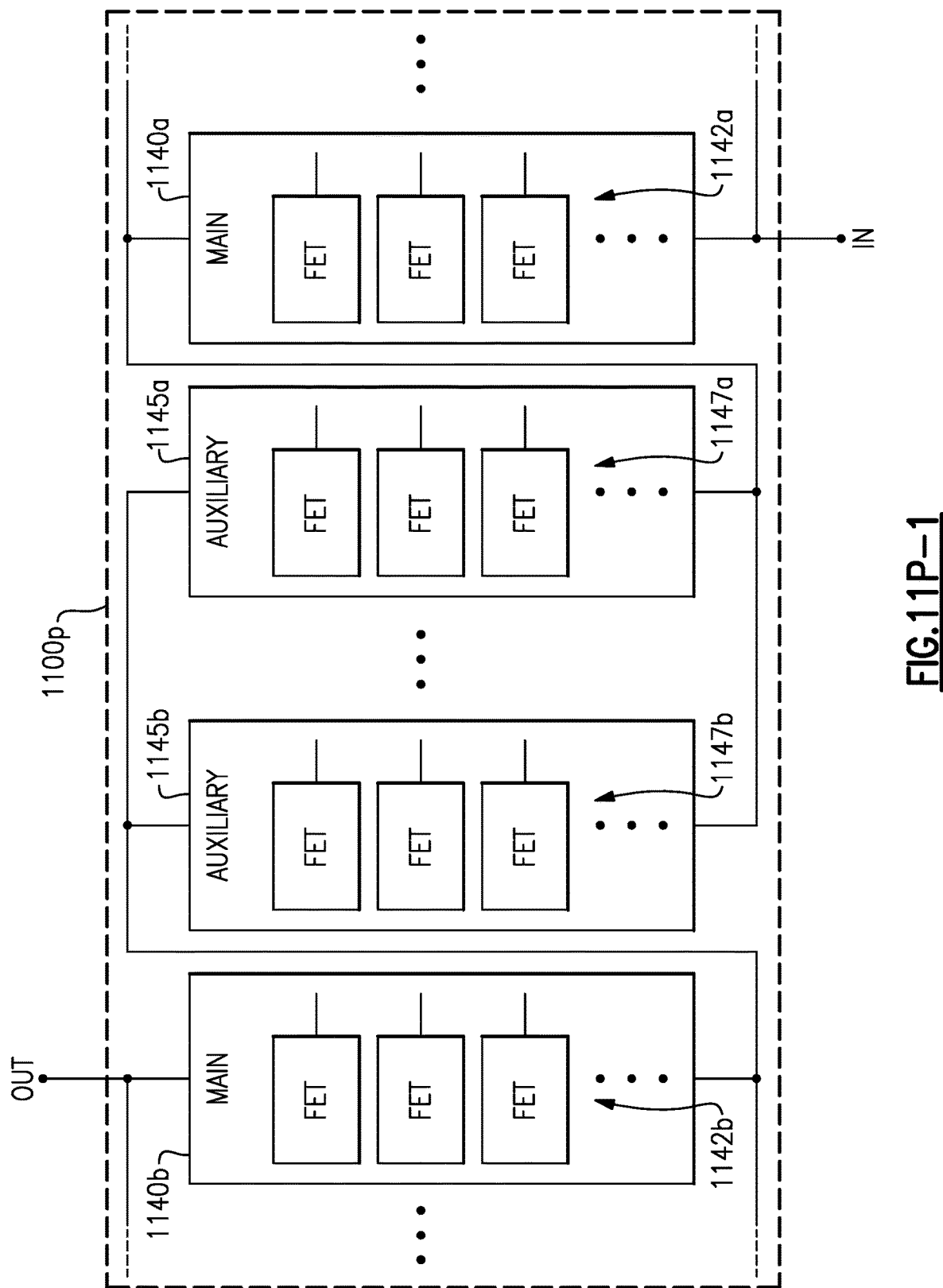
Figures 2, 11P:
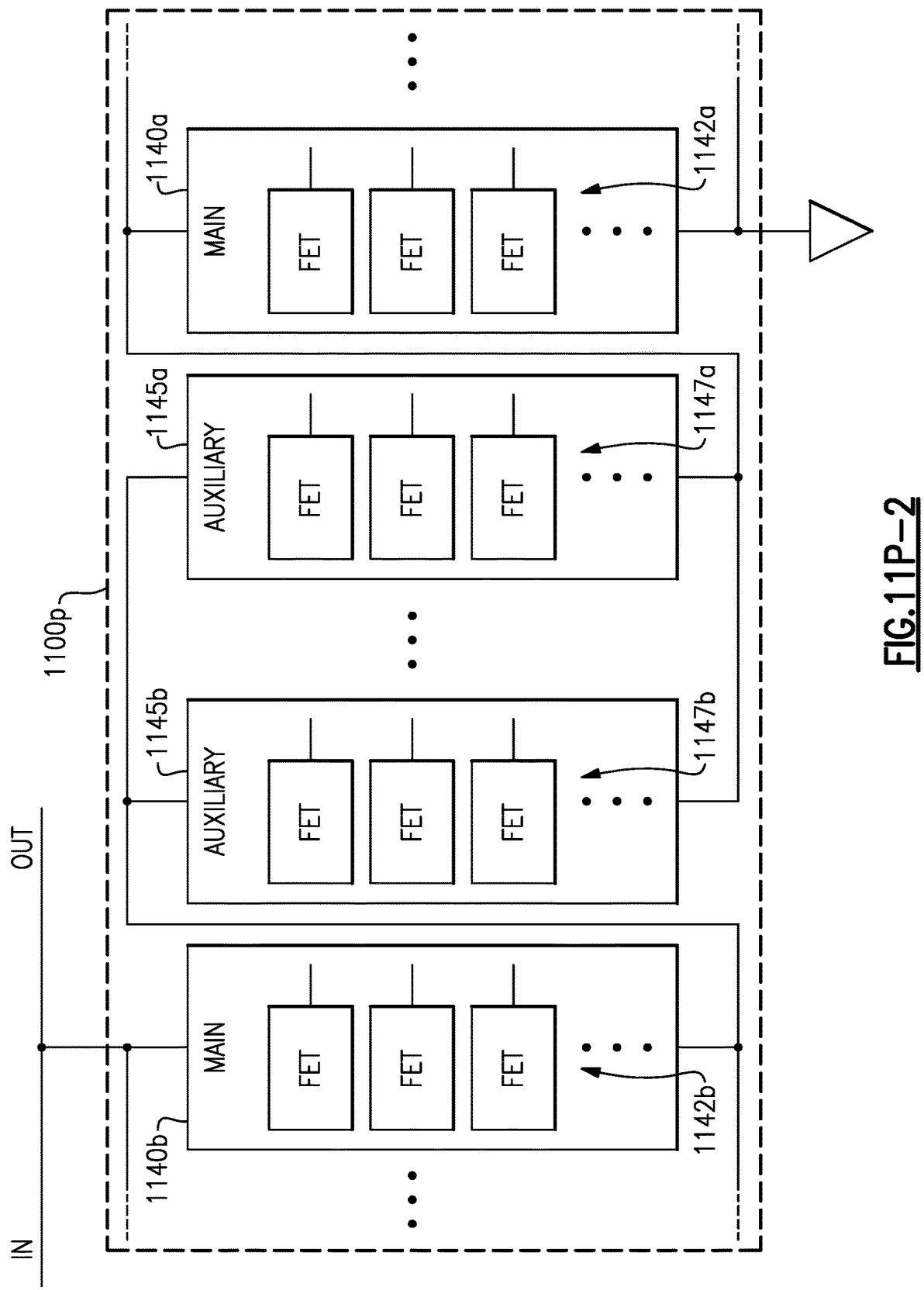

FIG. 11P-1 illustrates a main-auxiliary branch 1100*p* having a plurality of parallel auxiliary paths 1145*a*, 1145*b* connected in series with a first plurality of parallel main paths 1140*a* and a second plurality of parallel main paths 1140*b*, the plurality of parallel auxiliary paths 1145*a*, 1145*b* positioned between the first plurality of parallel main paths 1140*a* and the second plurality of parallel main paths 1140*b*. The plurality of main paths 1140*a*, 1140*b* each include a plurality of FETs 1142*a*, 1142*b* and the plurality of auxiliary paths 1145*a*, 1145*b* each include a plurality of FETs 1147*a*, 1147*b*. However, it is to be understood that individual main paths 1140*a*, 1140*b* and/or individual auxiliary paths 1145*a*, 1145*b* can include a single FET or a plurality of FETs. In addition, the number of FETs in individual paths can be the same or different from one another. FIG. 11P-2 illustrates the main-auxiliary branch 1100*p* of FIG. 11P-1 in a shunt configuration.

Figure 12A:
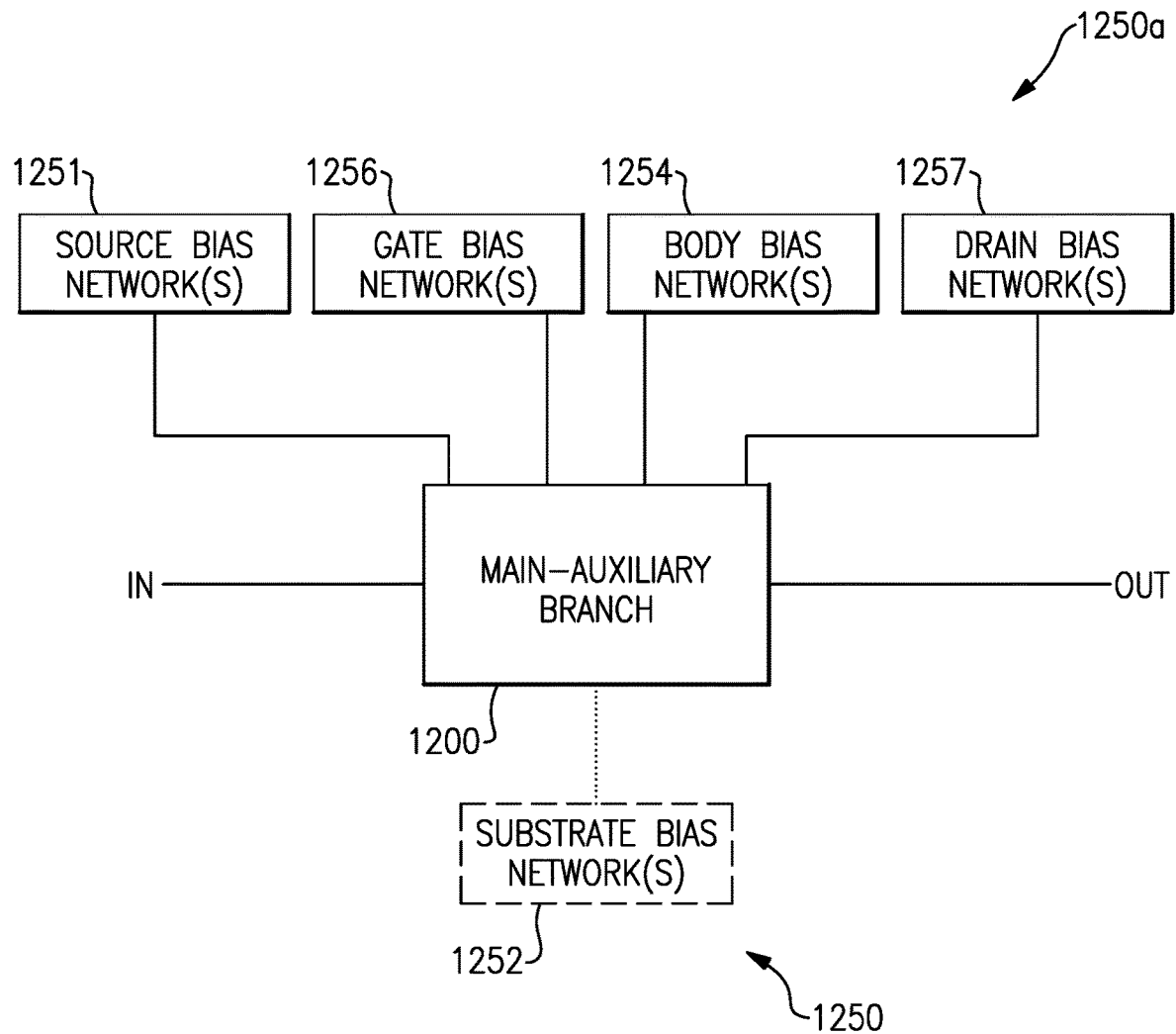
FIG. 12A illustrates a main-auxiliary branch with biasing networks configured to selectively provide a tailored gate bias voltage to a gate of an auxiliary FET to improve performance of the main-auxiliary branch.

FIG. 12A illustrates a main-auxiliary branch 1200 with biasing networks 1250 configured to selectively provide a tailored gate bias to a gate of an auxiliary FET to improve performance of the main-auxiliary branch 1200. The main-auxiliary branch 1200 includes an auxiliary path having one or more FETs that is configured to influence operation of a main path having one or more FETs, the auxiliary path being coupled to the main path in parallel and/or in series. The main-auxiliary branch 1200 is configured to receive a signal at an input terminal (e.g., a source or drain terminal) and to output a signal at an output terminal (e.g., a drain or source terminal).

A gate bias network 1256 is coupled to the main-auxiliary branch 1200 to selectively apply gate bias signals to the auxiliary FET(s) and the main FET(s) of the main-auxiliary branch 1200. The gate bias network 1256 can be similar to gate bias networks described herein. The gate bias network 1256 can include one or more gate bias networks. In some embodiments, individual auxiliary FETs in the main-auxiliary branch 1200 can be coupled to a dedicated gate bias network. In certain embodiments, a plurality of auxiliary FETs in the main-auxiliary branch 1200 can be coupled to a single gate bias network. In various embodiments, a plurality of auxiliary gate bias networks can be included in the gate bias network 1256 where individual auxiliary gate bias networks are coupled to one or more auxiliary FETs in the main-auxiliary branch 1200. Similarly, in some embodiments, individual main FETs in the main-auxiliary branch 1200 can be coupled to a dedicated gate bias network. In certain embodiments, a plurality of main FETs in the main-auxiliary branch 1200 can be coupled to a single gate bias network. In various embodiments, a plurality of main gate bias networks can be included in the gate bias network 1256 where individual main gate bias networks are coupled to one or more main FETs in the main-auxiliary branch 1200.

A body bias network 1254 is coupled to the main-auxiliary branch 1200 to selectively apply body bias signals to the auxiliary FET(s) and/or main FET(s) of the main-auxiliary branch 1200. The body bias network 1254 can be similar to the body bias networks described herein. The body bias network 1254 can include one or more body bias networks. In some implementations, such as the example embodiment of FIG. 12D, the body bias network 1254 is not included and the bodies of the respective auxiliary FET(s) and main FET(s) are biased using the gate bias network 1256 or the bodies of the respective auxiliary FET(s) and main FET(s) are left unconnected or floating.

In some embodiments, individual auxiliary FETs in the main-auxiliary branch 1200 can be coupled to a dedicated body bias network. In certain embodiments, a plurality of auxiliary FETs in the main-auxiliary branch 1200 can be coupled to a single body bias network. In various embodiments, a plurality of auxiliary body bias networks can be included in the body bias network 1254 where individual auxiliary body bias networks are coupled to one or more auxiliary FETs in the main-auxiliary branch 1200. Similarly, in some embodiments, individual main FETs in the main-auxiliary branch 1200 can be coupled to a dedicated body bias network. In certain embodiments, a plurality of main FETs in the main-auxiliary branch 1200 can be coupled to a single body bias network. In various embodiments, a plurality of main body bias networks can be included in the body bias network 1254 where individual main body bias networks are coupled to one or more main FETs in the main-auxiliary branch 1200.

A source bias network 1251 can be coupled to the main-auxiliary branch 1200 to selectively apply source bias signals to the main-auxiliary branch 1200. The source bias network 1251 can be coupled between the input node and the main-auxiliary branch 1200. Similarly, a drain bias network 1257 can be coupled to the main-auxiliary branch 1200 to selectively apply drain bias signals to the main-auxiliary branch 1200. The drain bias network 1257 can be coupled between the output node and the main-auxiliary branch 1200.

A substrate bias network 1252 can be coupled to the main-auxiliary branch 1200 to selectively apply substrate bias signals to the auxiliary FET(s) and/or main FET(s) of the main-auxiliary branch 1200. The substrate bias network 1252 can be similar to the substrate bias networks described herein. The substrate bias network 1252 can include one or more substrate bias networks. In some implementations, the substrate bias network 1252 is not included. In such implementations, the substrates of the respective auxiliary FET(s) and main FET(s) can be left floating or coupled to another bias network such as the body bias network 1254 or the gate bias network 1256. In some embodiments, the FETs in the main-auxiliary branch 1200 do not include SOI FETs and/or do not include substrate terminals so the substrate bias network 1252 can be omitted.

Figure 12B:
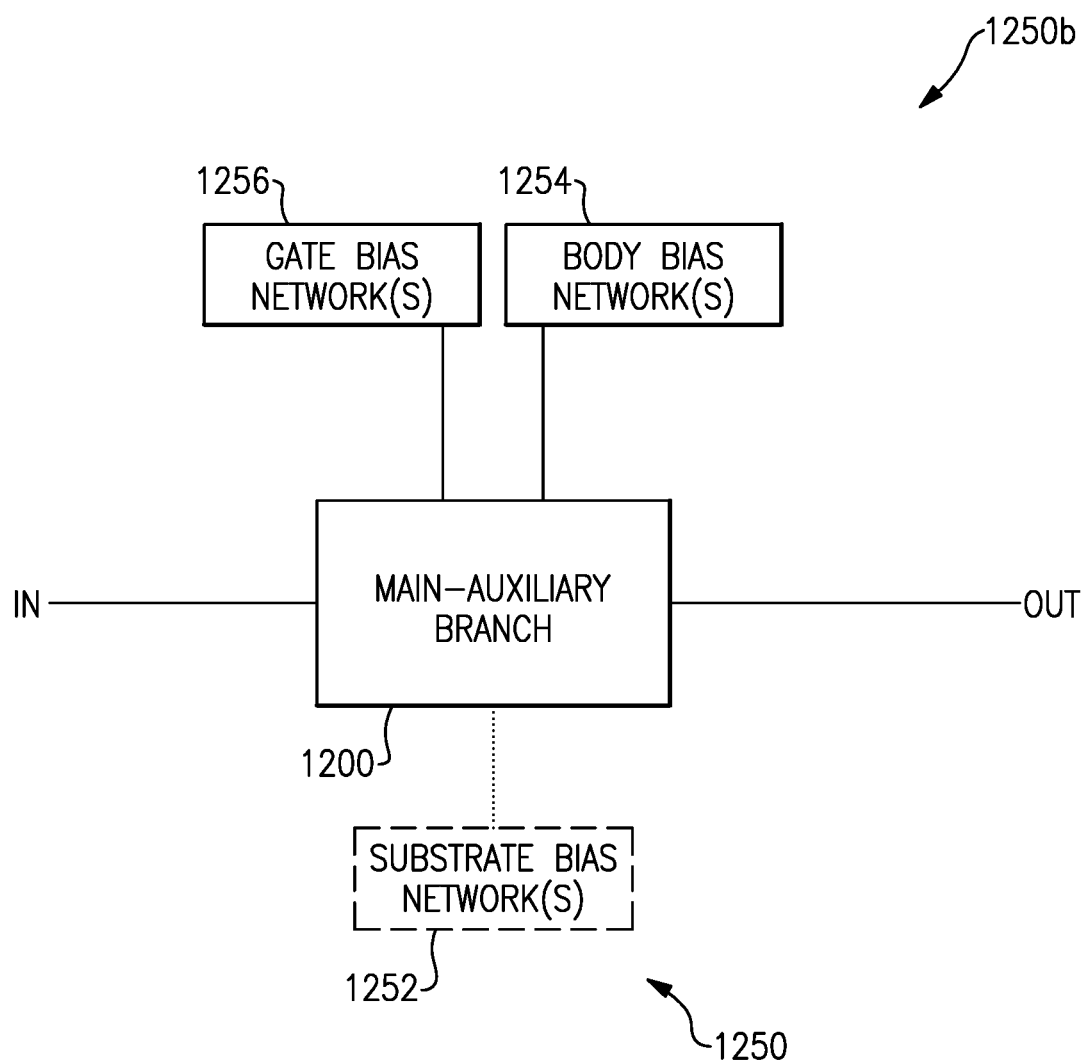
FIG. 12B illustrates the main-auxiliary branch of FIG. 12A without a source bias network or a drain bias network.
Figure 12C:
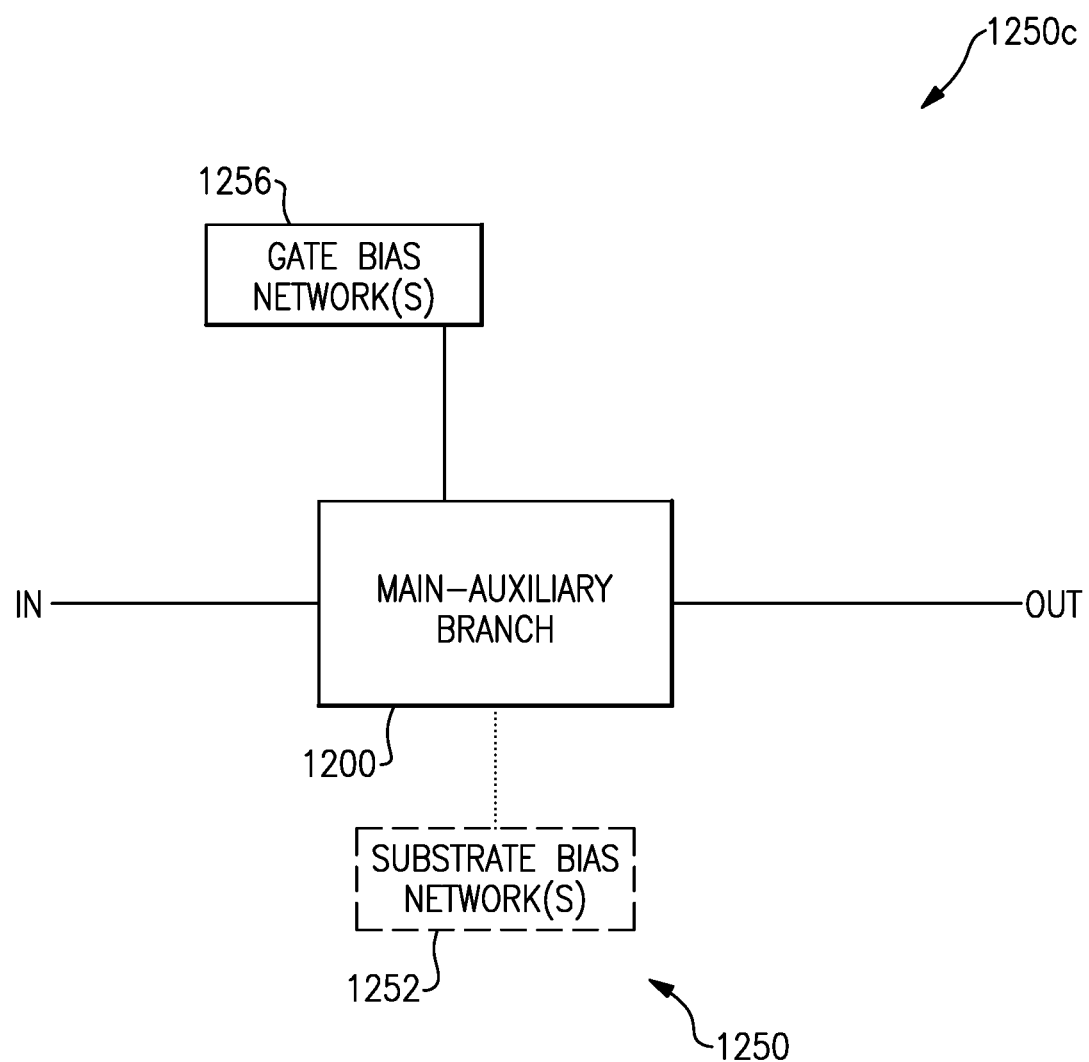
FIG. 12C illustrates the main-auxiliary branch of FIG. 12A without a body bias network, a source bias network, or a drain bias network.
Figure 12D:
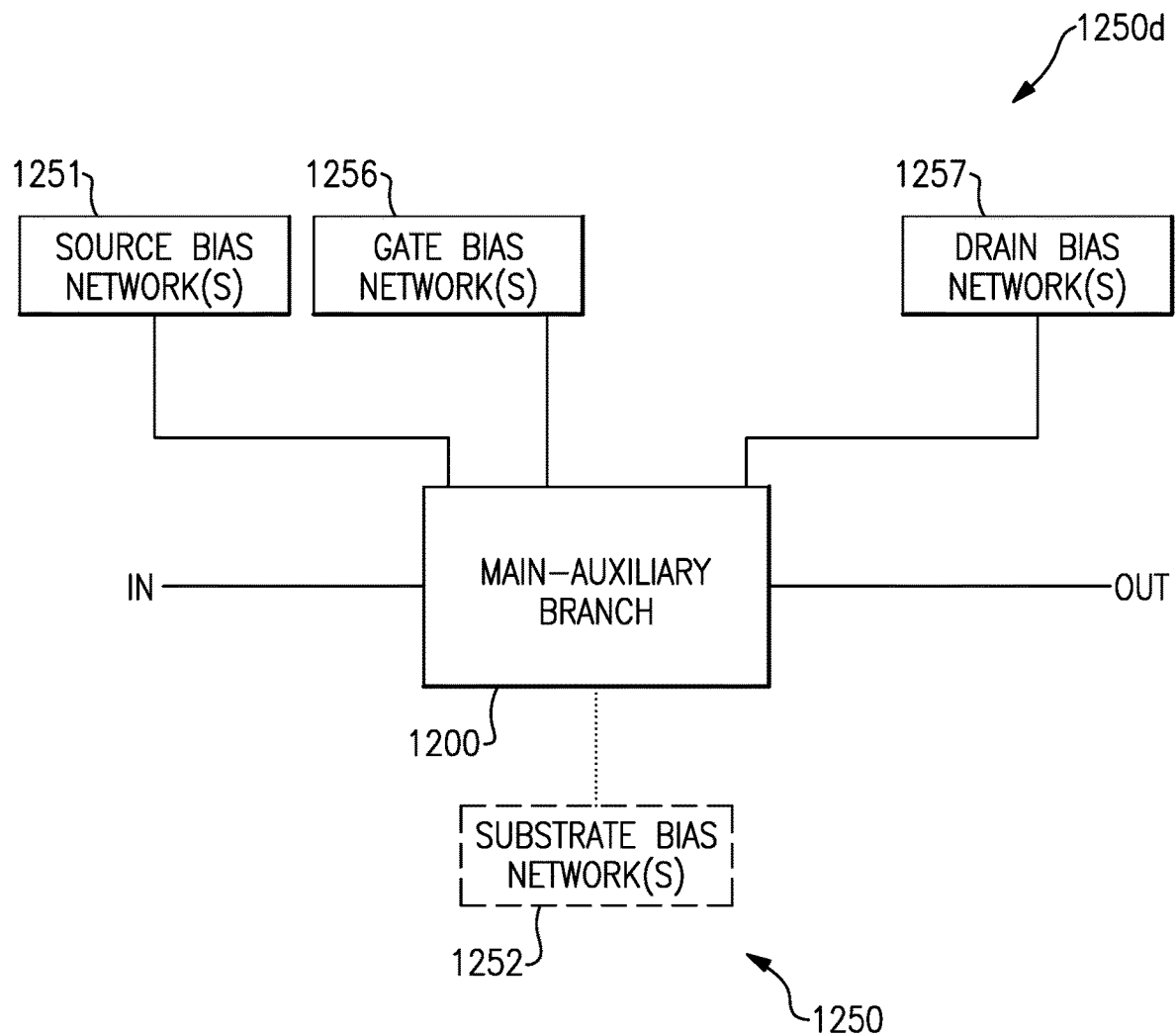
FIG. 12D illustrates the main-auxiliary branch of FIG. 12A without a body bias network.
Figure 12E:
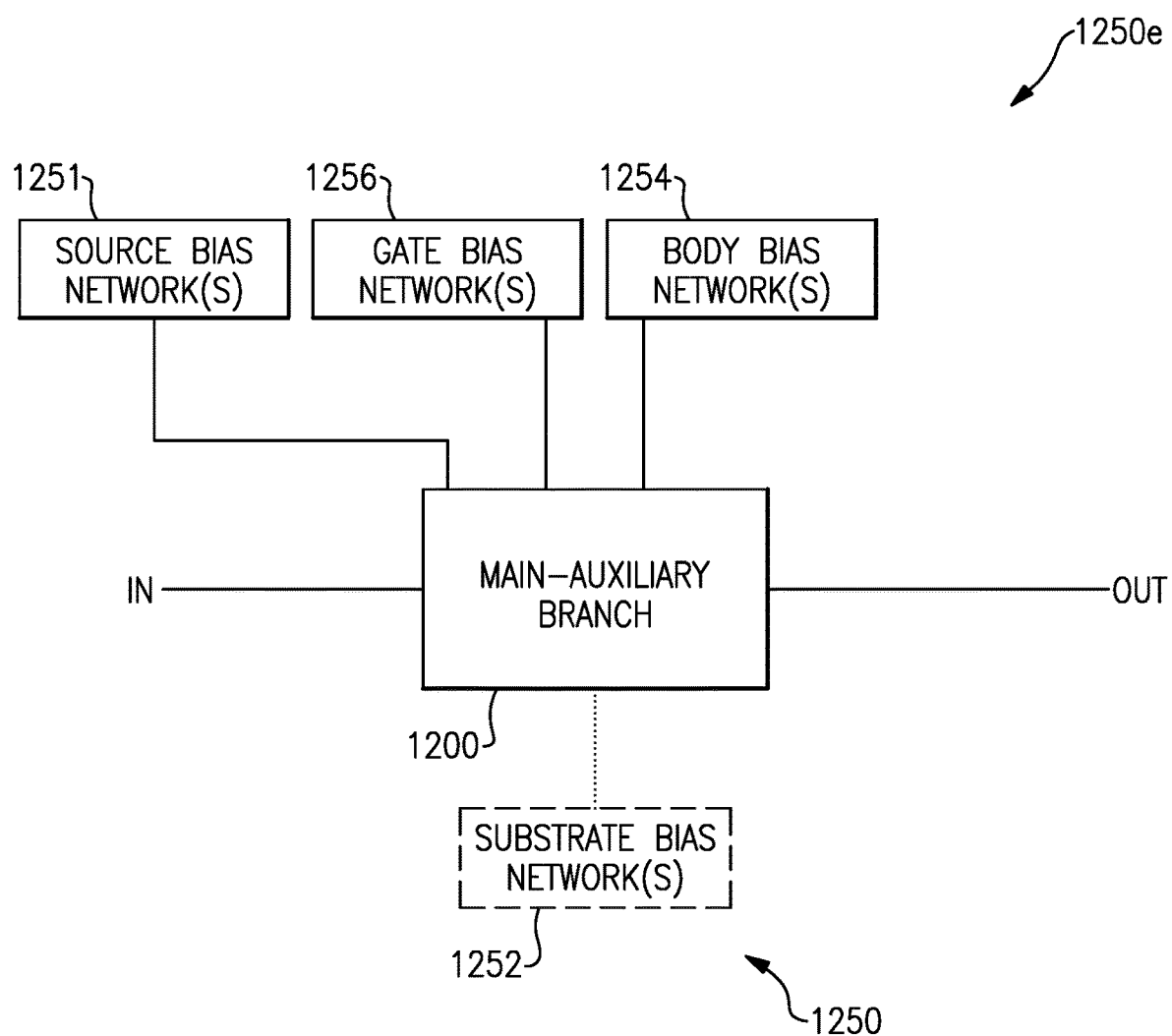
FIG. 12E illustrates the main-auxiliary branch of FIG. 12A without a drain bias network.
Figure 12F:
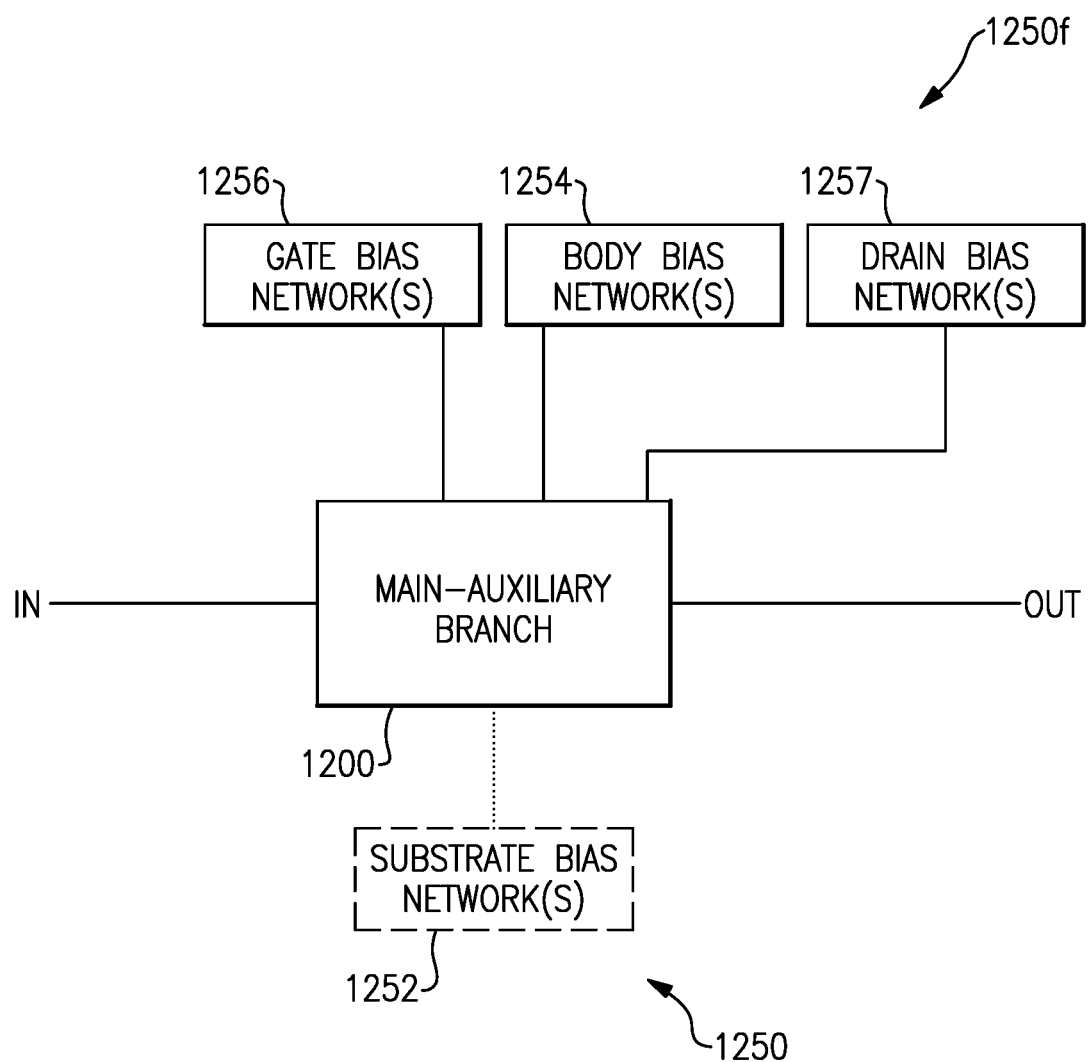
FIG. 12F illustrates the main-auxiliary branch of FIG. 12A without a source bias network.

FIG. 12B illustrates the main-auxiliary branch 1200 without a source bias network or a drain bias network. FIG. 12C illustrates the main-auxiliary branch 1200 without a body bias network, a source bias network, or a drain bias network. In such embodiments, the body terminals of the FETs can be left floating and/or can be coupled to the gate bias network 1256. FIG. 12D illustrates the main-auxiliary branch 1200 without a body bias network. In such embodiments, the body terminals of the FETs can be left floating and/or can be coupled to the gate bias network 1256. FIG. 12E illustrates the main-auxiliary branch 1200 without a drain bias network. FIG. 12F illustrates the main-auxiliary branch 1200 without a source bias network.

The main-auxiliary branches 1200 described herein with reference to FIGS. 12A-12F can be configured to provide improved device performance relative to switches that use FETs without an auxiliary FET or path. Gate, body, source, drain, and/or substrate bias voltages can be intelligently applied to the main-auxiliary branch 1200 to improve performance of the active FET in switching applications. For example, the gate bias of the main FET can be biased in a region such that low $R_{on}$ and/or $C_{off}$ is achieved, while the gate bias of the auxiliary FET can be tuned to improve the linearity of the combination of the auxiliary and main FETs. In certain implementations, the gate bias of the auxiliary FET can be tailored such that harmonics generated by the auxiliary FET are in opposite phase as the harmonics generated by the main FET, thereby improving linearity of the active FET circuit.

The main-auxiliary branch 1200 can be implemented in switching circuits (e.g., in a series arm and/or in a shunt configuration). Other applications may also use the disclosed main-auxiliary configurations where linearity of signal through a transistor is important.

FIGS. 13A through 24C illustrate various example embodiments of main-auxiliary devices or branches. Although these example embodiments are illustrated and described as being between an input node and an output node, it should be understood that the example embodiments can be implemented in a shunt configuration, providing a switchable path to a reference potential node, as described herein.

Figure 13A:
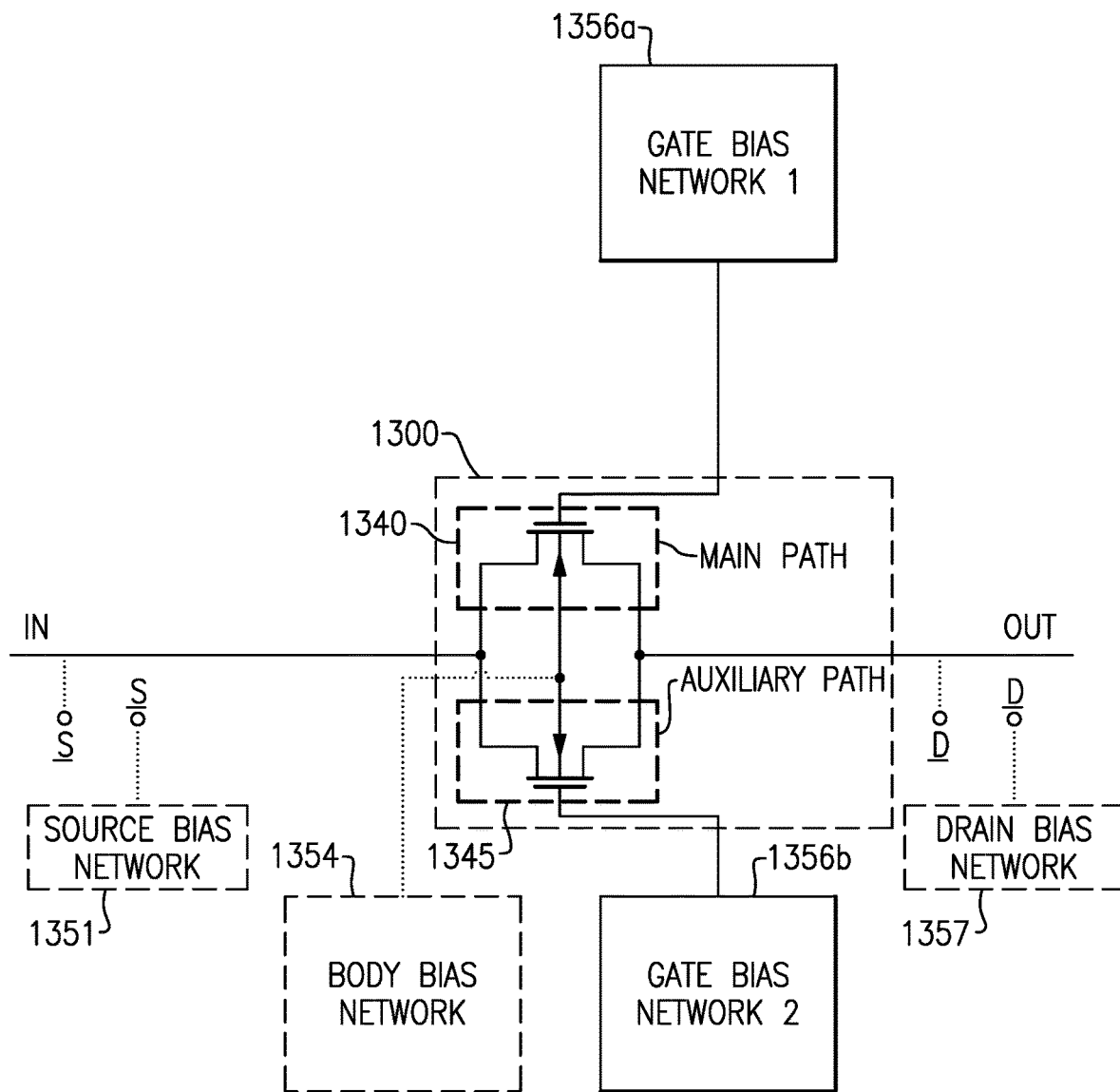
FIGS. 13A, 13B, and 13C illustrate example embodiments of main-auxiliary devices having an auxiliary FET or auxiliary path in parallel with a main FET or main path.

FIG. 13A illustrates an example embodiment of a main-auxiliary device 1300 having an auxiliary FET or auxiliary path 1345 in parallel with a main FET or main path 1340. The auxiliary FET and the main FET share the same source and drain connections. An input signal is received at a signal input port and, if the device 1300 is activated, the device 1300 outputs a signal at an output signal port.

A gate bias network 1 1356*a* can be coupled to the main FET and a gate bias network 2 1356*b* can be coupled to the auxiliary FET. The gate bias networks 1356*a*, 1356*b* can be operated independently to improve performance of the device. The independent gate bias networks 1356*a*, 1356*b* allow for independent control of the auxiliary FET and the main FET to improve performance of the device by, for example, reducing nonlinearity. This also allows tuning of the characteristics of the auxiliary FET to improve performance of the device. For example, the gate bias voltage applied to the auxiliary FET can be tailored to reduce nonlinearities in the signal through the device. In some embodiments, the characteristics of the auxiliary FET can be tailored to reduce $R_{on}$ and/or $C_{off}$ of the device. In some embodiments, the characteristics of the auxiliary FET can be tailored to reduce harmonics, intermodulation distortion, insertion losses, and/or cross products.

In some embodiments, the gate bias network 1 1356*a* provides a first gate bias voltage to the main path 1340 and the gate bias network 2 1356*b* provides a second gate bias voltage to the auxiliary path, the first gate bias voltage different from the second gate bias voltage. In certain implementations, the first gate bias voltage can be configured so that the main path 1340 operates in a strong inversion region and the second gate bias voltage can be configured so that the auxiliary path 1345 operates in a subthreshold or weak inversion region. The first gate bias voltage can be static or dynamic. The second gate bias voltage can be static or dynamic. In some embodiments, the second gate bias voltage depends at least in part on characteristics of the input signal. The characteristics of the input signal can include, for example, input power, frequency, and the like.

A body bias network 1354 is coupled to a body terminal of both the main FET and the auxiliary FET. In some embodiments, the body terminals can be coupled to separate body bias networks. The body bias network 1354 is coupled to the respective body nodes of the auxiliary FET and main FET of the device 1300.

The device 1300 can include a source bias network 1351 coupled at the input node. The source bias network 1351 can be configured to improve performance of the main-auxiliary device 1300. The device 1300 can include a drain bias network 1357 coupled at the output node. The drain bias network 1357 can be configured to improve performance of the main-auxiliary device 1300. The source bias network 1351 and/or the drain bias network 1357 can be omitted, in some embodiments. Furthermore, for each example embodiment illustrated in FIGS. 13A through 24C, the illustrated source bias networks (referenced with callouts NN51 where NN corresponds to the figure number) and/or drain bias networks (referenced with callouts NN57 where NN corresponds to the figure number) may be included or omitted.

Figure 13B:
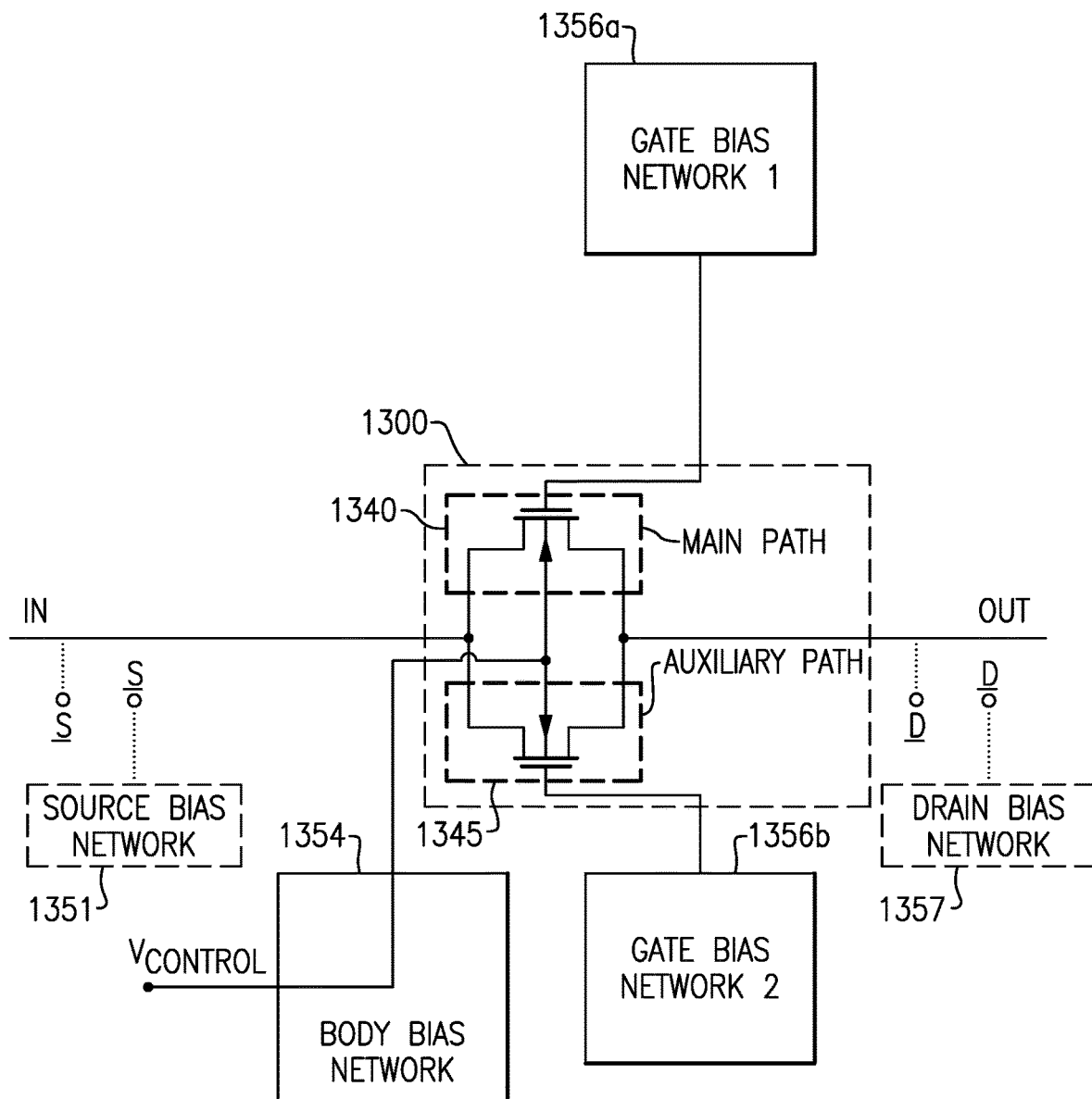
Figure 13C:
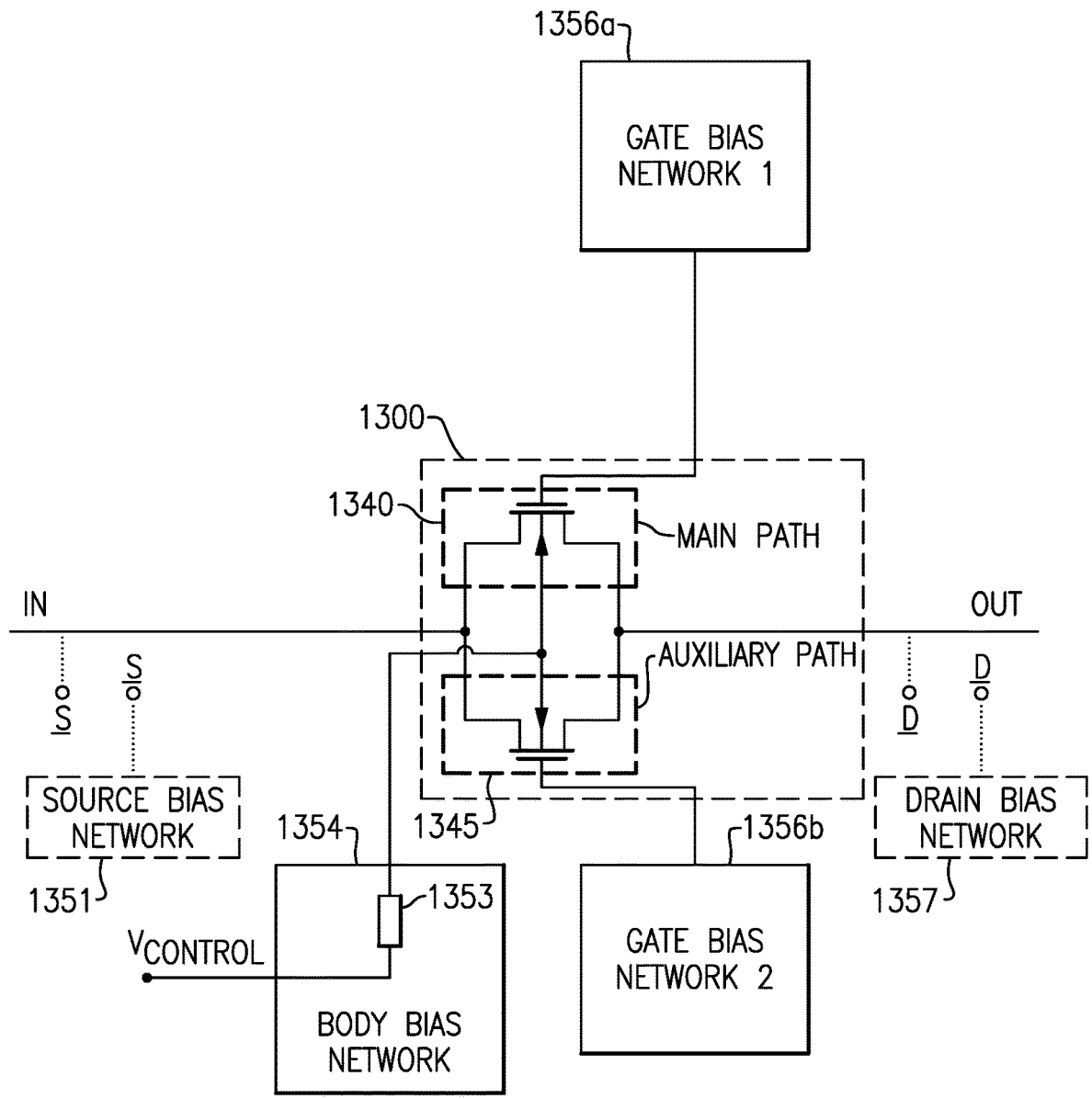

FIG. 13B illustrates the main-auxiliary device 1300 wherein the body bias network 1354 is configured to allow application of a DC control voltage (V_control) to the respective body nodes. FIG. 13C illustrates the main-auxiliary device 1300 wherein the control voltage is applied through an electrical component 1353 (e.g., a resistor, a diode, a combination of a resistor and diode, or the like). Other configurations are possible for the body bias network 1354 including, for example and without limitation, phase-matching circuits, capacitances, diodes, and the like.

It is to be understood that although the main path 1340 and the auxiliary path 1345 are each illustrated using a single FET, the main path 1340 can include a plurality of FETs or active devices, the auxiliary path 1345 can include a plurality of FETs or active devices, or each of the main path 1340 and the auxiliary path 1345 can include a plurality of FETs or active devices. In addition, the main path 1340 and/or the auxiliary path 1345 can include gated diodes, capacitors, and/or FETs as active devices. Furthermore, for each example embodiment illustrated in FIGS. 13A through 24C, unless explicitly stated otherwise, where an individual FET is illustrated, it is to be understood that a plurality of active devices or a stack of active devices can be implemented.

Figure 14A:
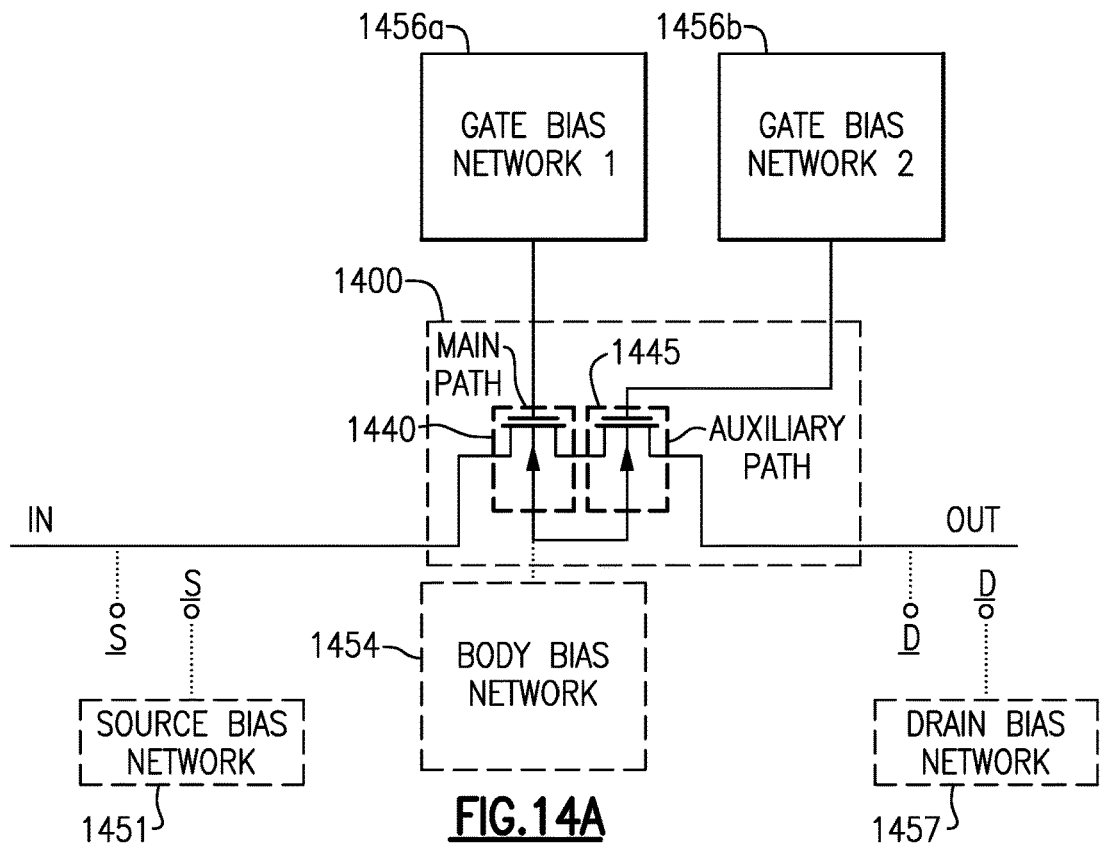
FIG. 14A illustrates an example main-auxiliary device having an auxiliary FET or auxiliary path in series with a main FET or main path.

FIG. 14A illustrates an example main-auxiliary device 1400 having an auxiliary FET or auxiliary path 1445 in series with a main FET or main path 1440. In this configuration, the auxiliary FET 1445 can still be used to affect and improve performance of the main FET 1440, resulting in improved performance of the device 1400 relative to a device without a main-auxiliary configuration. The main FET 1440 has a source node coupled to an input signal node, a drain node coupled to a source node of the auxiliary FET 1445 and the auxiliary FET 1445 has a drain node coupled to an output signal port. In some embodiments, the source and drain nodes of the auxiliary FET 1445 and the main FET 1440 can be reversed.

As in FIG. 13A, the device 1400 includes gate bias networks 1456a, 1456b that allow for independent control of the auxiliary FET 1445 and the main FET 1440. Also, the body bias network 1454 can be used to provide a bias voltage to the bodies of the auxiliary FET 1445 and the main FET 1440, but independent body bias networks may also be utilized.

Figure 14B:
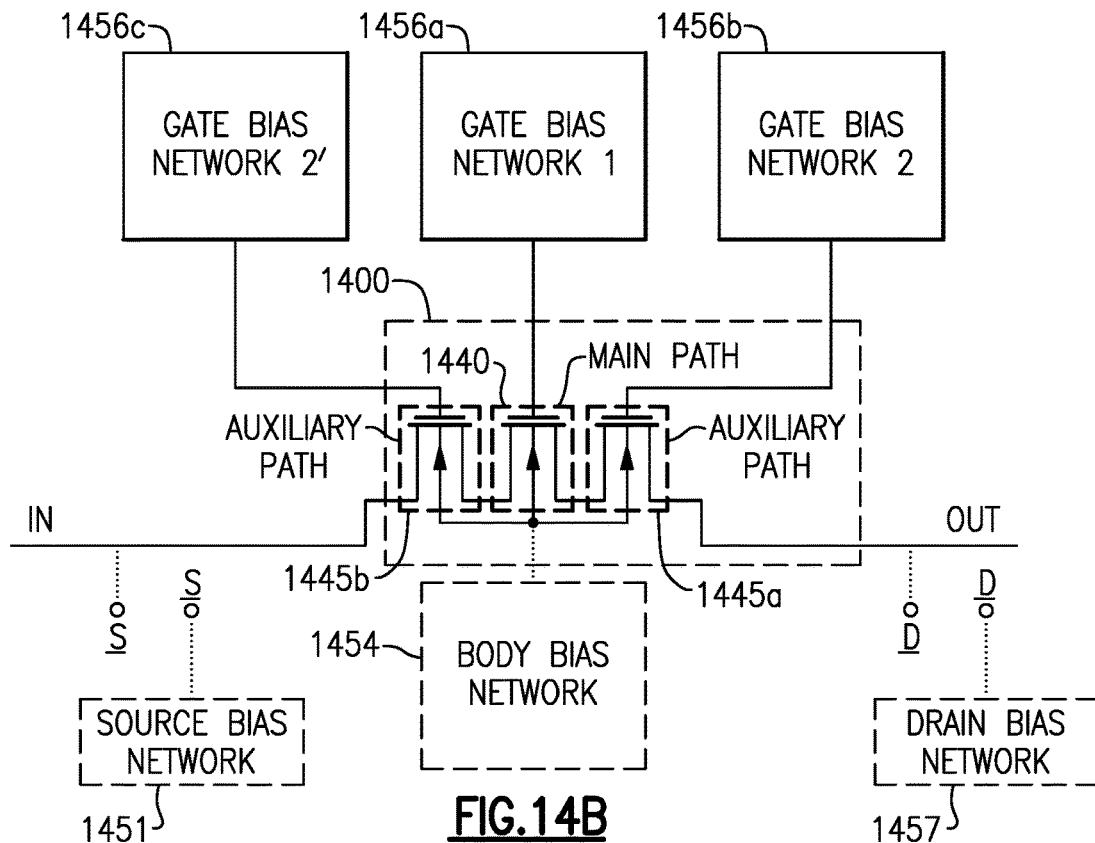
FIG. 14B illustrates an example main-auxiliary device having a first auxiliary FET and a second auxiliary FET in series with a main FET on either side of the main FET.

FIG. 14B illustrates a variation on the device 1400 described with reference to FIG. 14A. The device 1400 can include a second auxiliary FET 1445b in addition to the first auxiliary FET 1445a, the two auxiliary FETs 1445a, 1445b in series with the main FET 1440 on either side of the main FET. The device is controlled using 2 independent gate bias networks where the auxiliary FETs 1445a, 1445b are controlled by individual or joint gate bias networks 1456b, 1456c (e.g., the gate bias networks 1456b, 1456c can be independent, tied together, or it can be a single bias network) and the main FET 1440 is controlled by the gate bias network 1 1456a. Gate bias signals to the respective auxiliary FETs 1445a, 1445b can be tailored to achieved targeted performance from the main-auxiliary device 1400. Furthermore, the gate bias network 2 1456b provides a gate bias signal to the first auxiliary FET 1445a that can be tuned independently of the gate bias signal provided by the gate bias network 2' 1456c to the second auxiliary FET 1445b to achieve targeted performance characteristics.

Figure 15A:
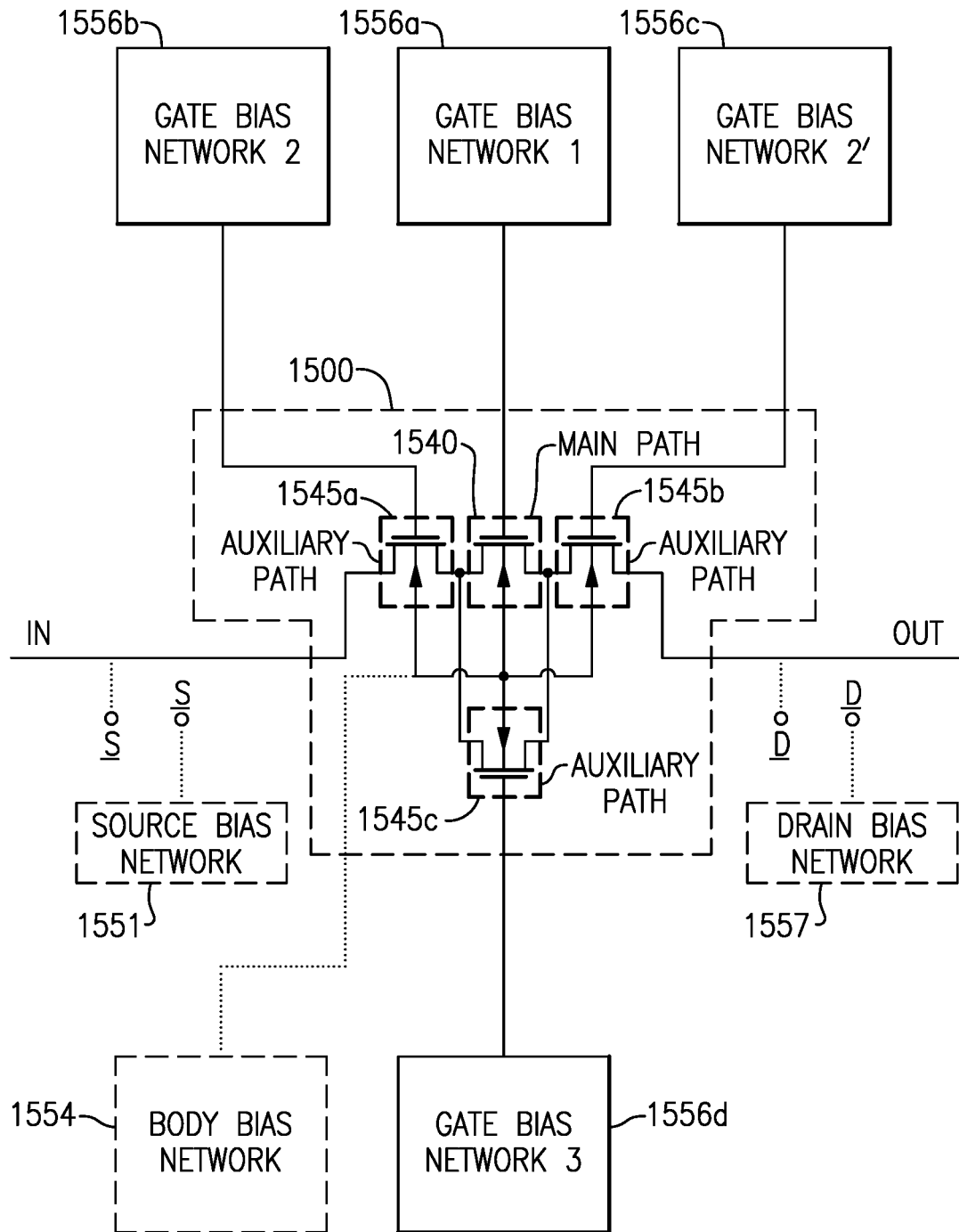
FIG. 15A illustrates an example main-auxiliary device including two auxiliary FETs or auxiliary paths in series with a main FET or main path and a third auxiliary FET or auxiliary path in parallel with the main FET.

FIG. 15A illustrates an example main-auxiliary device 1500 including two auxiliary FETs or auxiliary paths 1545a, 1545b in series with a main FET or main path 1540 and a third auxiliary FET or auxiliary path 1545c in parallel with the main FET 1540. The device 1500 can include two (or more) auxiliary FETs either in parallel or in series with the main FET with independent gate biases to achieve improved overall performance. With independent auxiliary FETs both in series with and in parallel with the main FET, the $R_{on}/C_{off}$ linearity can be independently tuned to improve linearity for both ON and OFF branches. The device 1500 is configured as a combination of the device 1300, described herein with reference to FIGS. 13A-13C, and the device 1400, described herein with reference to FIGS. 14A and 14B. As in those devices, the device 1500 can be independently controlled using gate bias networks 1556a-1556d. In some embodiments, the auxiliary gate bias networks 1556b and 1556c can be tied together or can be a common bias network. The bodies of the auxiliary FETs and the main FET can be shared with a common body bias network 1554. In some embodiments, one or more of the bodies of the auxiliary FETs and/or the main FET is independent and controlled independently or with the common body bias network 1554.

Figure 15B:
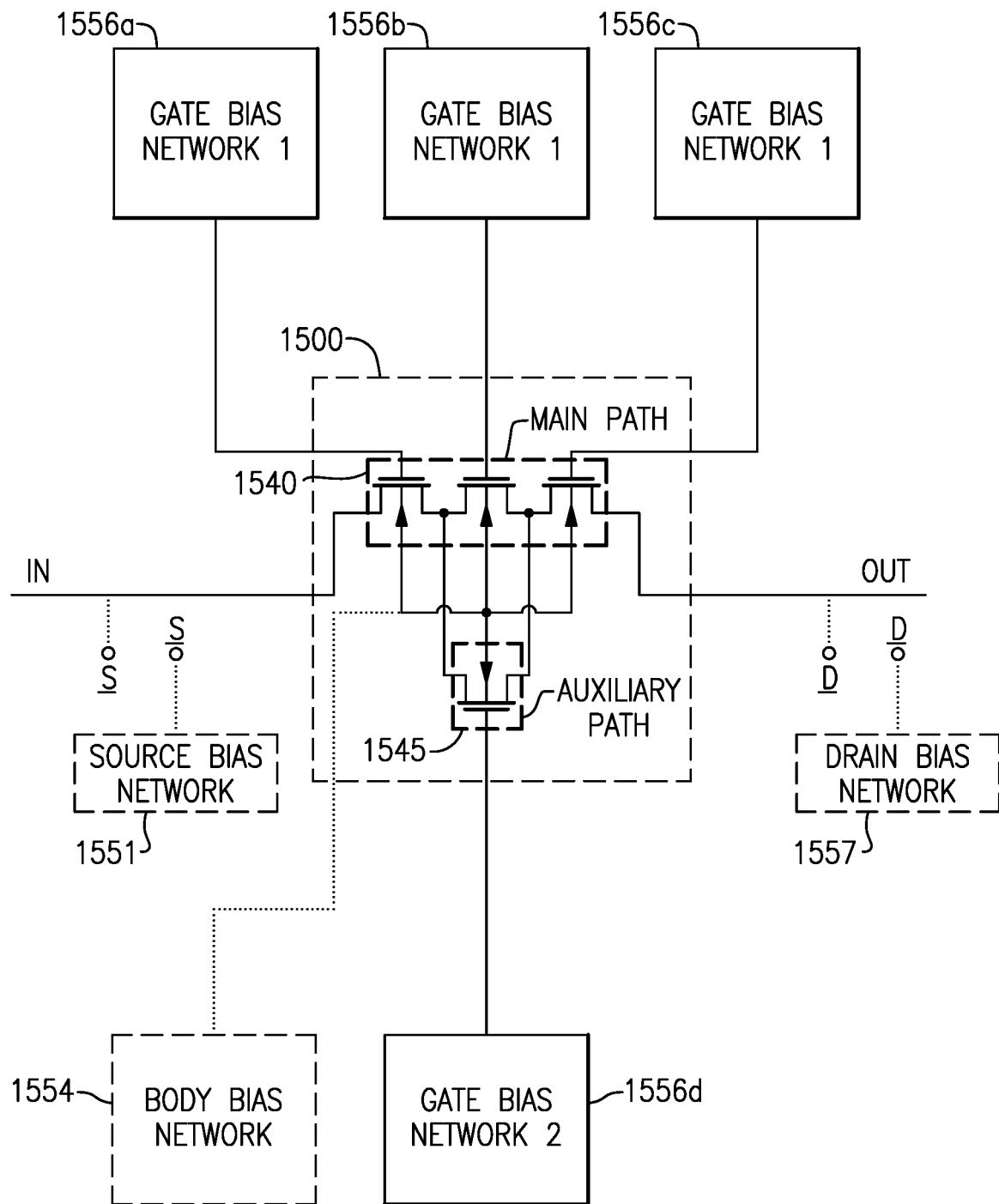
FIG. 15B illustrates an example main-auxiliary device that includes a main FET stack or path and an auxiliary FET or path.
Figure 15C:
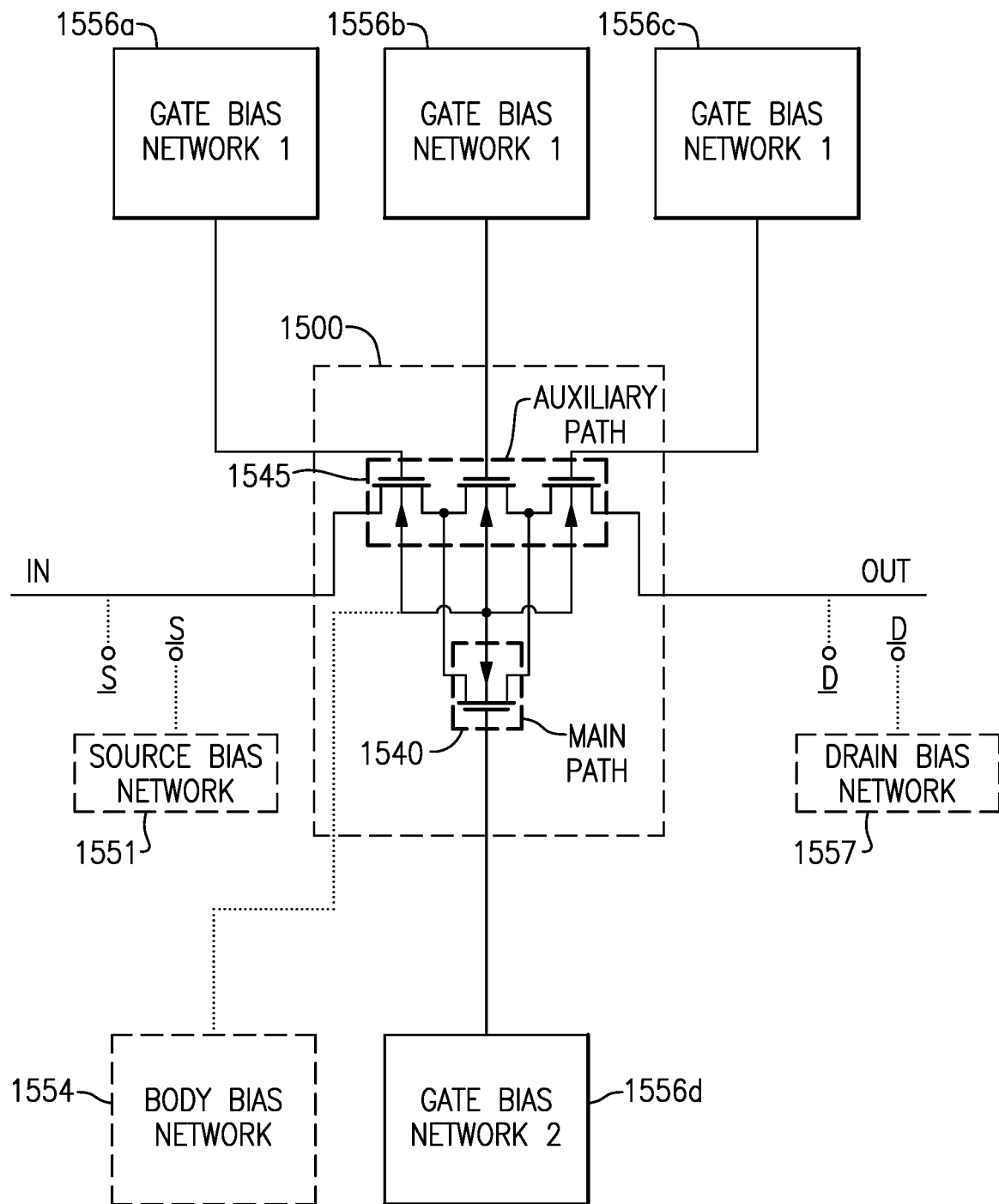
FIG. 15C illustrates an example main-auxiliary device that includes a main FET or path and an auxiliary FET stack or path.
Figure 15D:
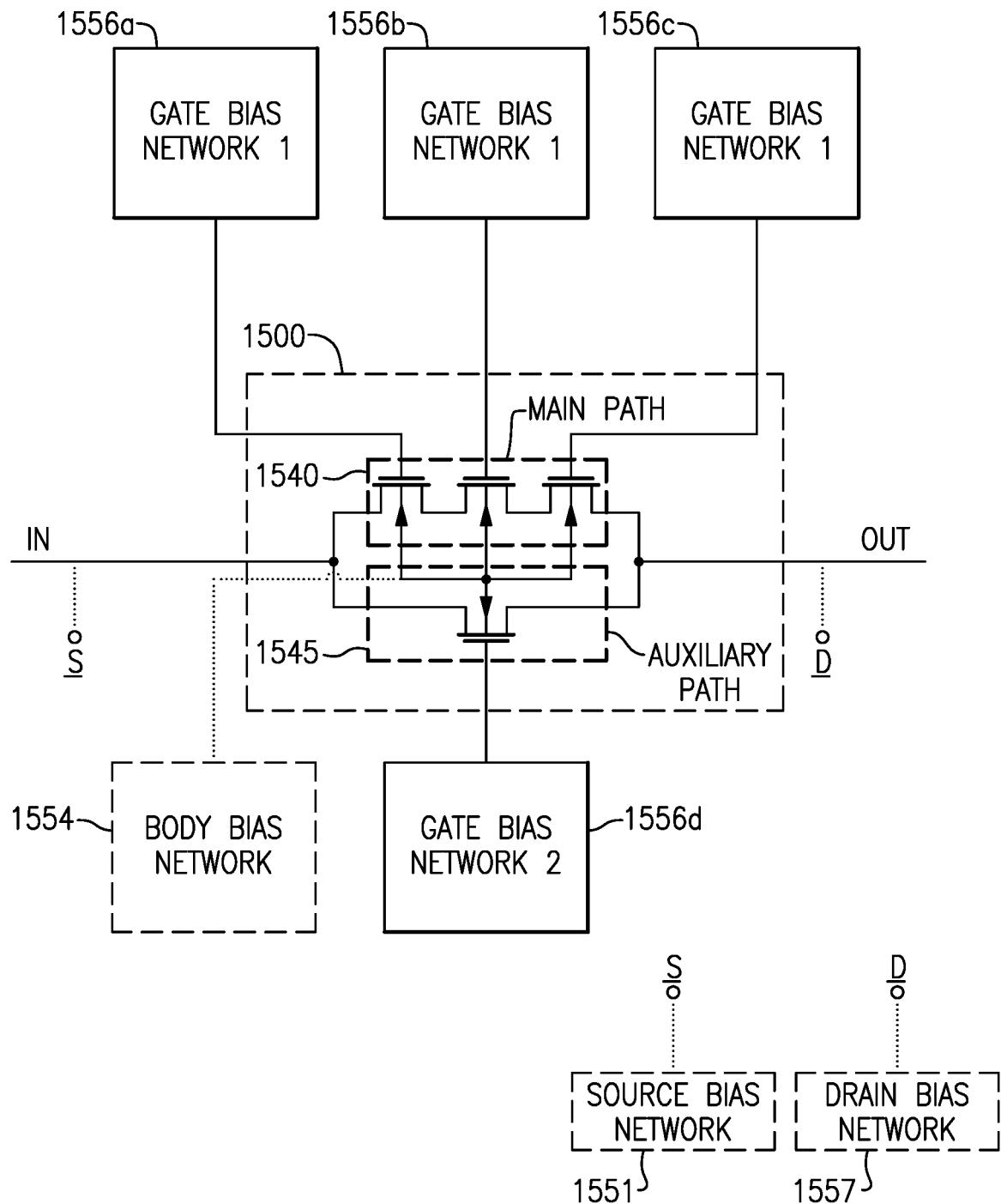
FIG. 15D illustrates an example main-auxiliary device where an auxiliary path is coupled to source and drain nodes of bottom and top FETs of a main FET stack or path.
Figure 15E:
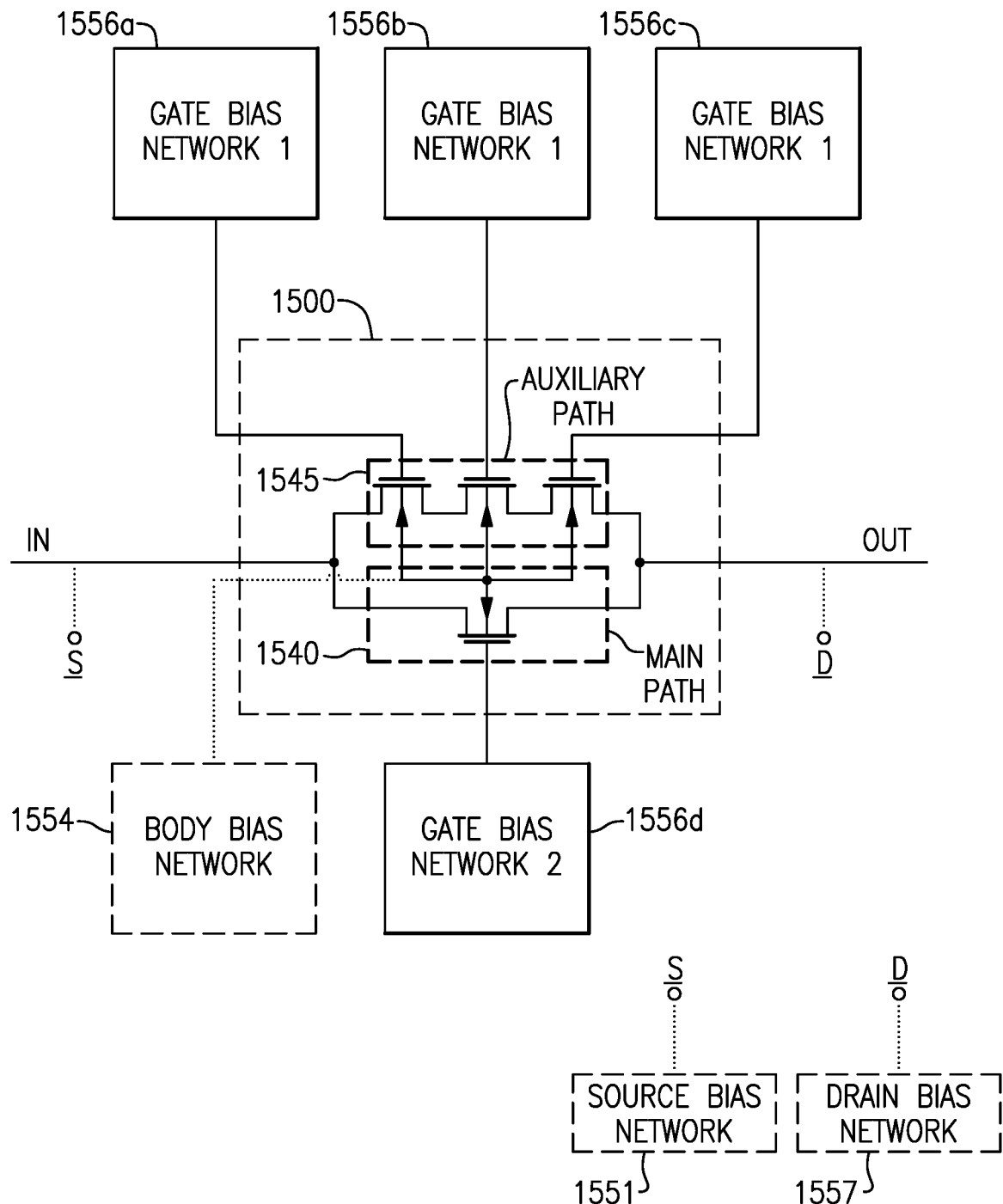
FIG. 15E illustrates an example main-auxiliary device where a main path is coupled to source and drain nodes of bottom and top FETs of an auxiliary FET stack or path.

FIG. 15B illustrates an example main-auxiliary device 1500 that includes a main FET stack or path 1540 and an auxiliary FET or path 1545. The main FET stack 1540 includes a plurality of main FETs connected in series. The auxiliary FET 1545 is coupled in parallel with one or more of the main FETs. In some embodiments, as illustrated in FIG. 15C, the auxiliary and main configurations are reversed, the device 1500 including an auxiliary FET stack 1540 and a main FET 1540 in parallel with one or more of the FETs in the auxiliary FET stack 1545. FIG. 15D illustrates the main-auxiliary device 1500 where the auxiliary path 1545 is coupled to the source and drain nodes of the bottom and top FETs of the main stack 1540. Similarly, FIG. 15E illustrates the main-auxiliary device 1500 where the main path 1540 is coupled to the source and drain nodes of the bottom and top FETs of the auxiliary stack 1545.

The device 1500 illustrates that both the auxiliary FET and the main FET can be 1-stack or multi-stack devices. The device can have the same source/drain node for each stack or can connect source/drain nodes after N stacks (not shown). The source/drain node of the auxiliary FET can be the same as the main FET or in between (e.g., coupled in parallel with one or more FETs within the stack). The number of FETs in the auxiliary and/or main stack can be different from one another.

As with the other devices described herein, the body and/or substrate of the main-auxiliary device 1500 can be shared between the active devices of the auxiliary and main paths. This allows a single body bias network to be used to bias the bodies of the respective devices. For example, auxiliary FETs and main FETs of the respective paths can have shared bodies so that a bias voltage applied to one body is applied to the other bodies. However, other configurations allow for auxiliary FETs and main FETs to have independent bodies and/or substrates. In such configurations, the independent bodies can be independently biased or they can be biased using a common body bias network. Accordingly, the main-auxiliary devices 1500 disclosed herein can include a body that is shared or not shared.

Figure 16:
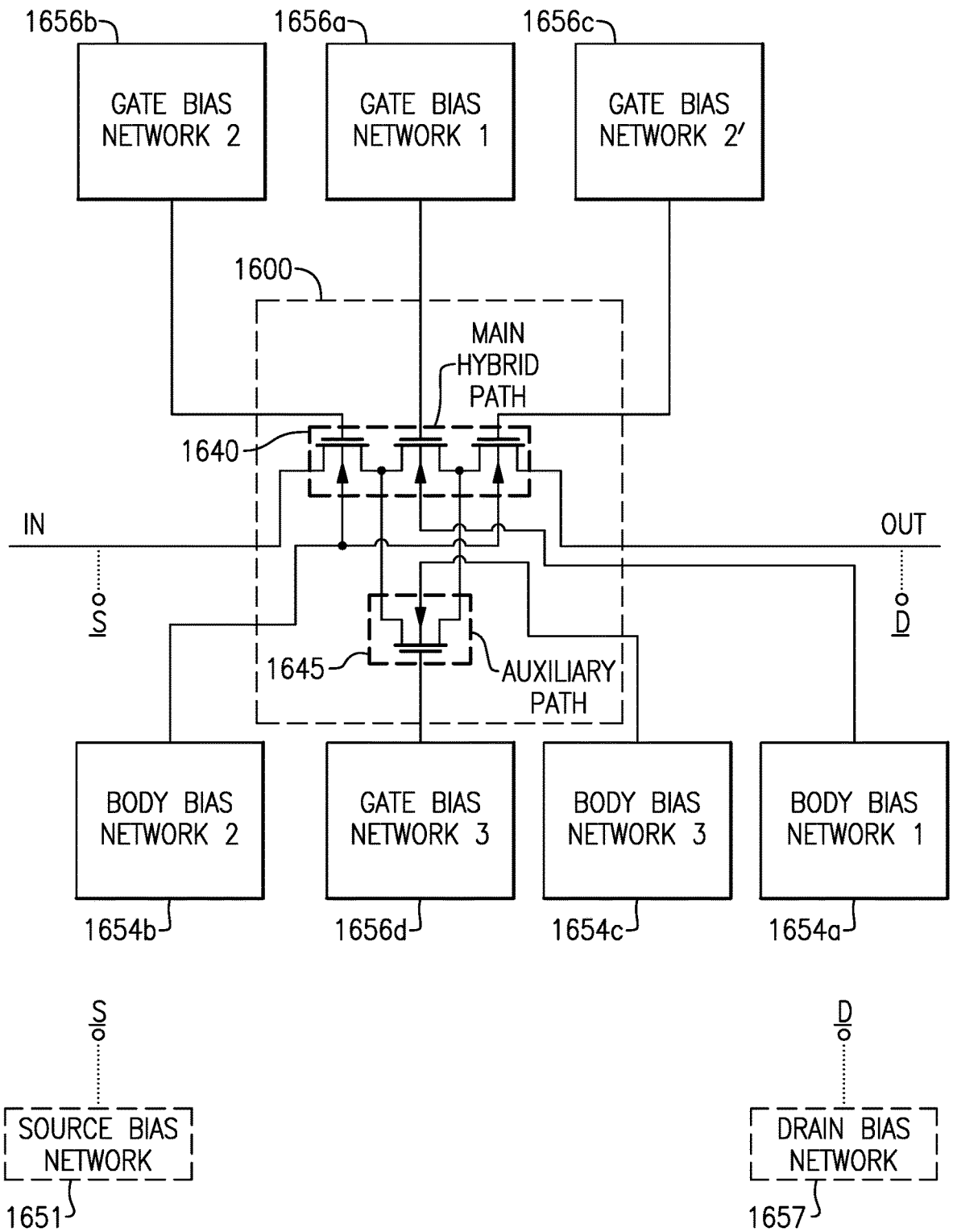
FIG. 16 illustrates an example main-auxiliary device with a configuration similar to the device of FIG. 15A-15E where the bodies of the respective FETs in the device are independently biased.

FIG. 16 illustrates an example main-auxiliary device 1600 with a configuration similar to the device 1500 described herein with reference to FIGS. 15A-15E. The device 1600 illustrates a configuration where the bodies of the respective FETs in the device 1600 are independently biased using body bias networks 1654a-1654d. In addition, the device 1600 includes a main hybrid path 1640 that includes one or more auxiliary FETs in series with one or more main FETs, the main hybrid path being connected in parallel with an auxiliary path 1645. For example, the top or the bottom active device in the main hybrid path 1640 can be a main FET and the middle FET or FET stack can be an auxiliary device that is coupled in parallel with the auxiliary path 1645.

Figure 17:
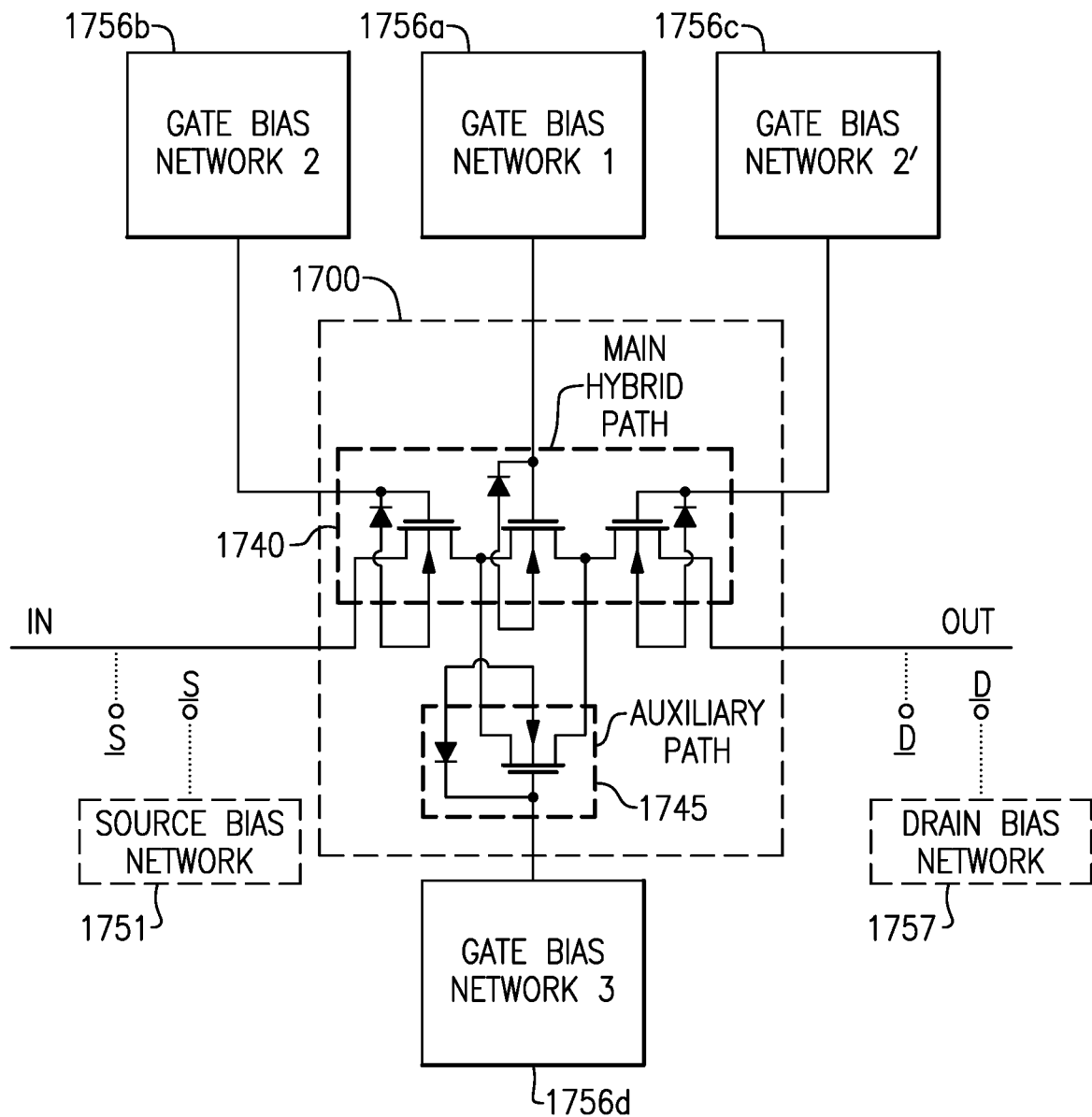
FIG. 17 illustrates an example main-auxiliary device where bodies of respective FETs are biased using gate bias networks.

FIG. 17 illustrates an example main-auxiliary device 1700 with a configuration similar to the device 1600 described herein with reference to FIG. 16. However, the device 1700 illustrates a configuration where the bodies of the respective FETs are biased using the gate bias networks 1756a-1756d. The device 1700 includes a coupling circuit for each auxiliary FET and main FET in the device, wherein the coupling circuit couples the respective body nodes to the gate nodes. The coupling circuit can include a diode between the body node and the gate node. Such a diode can be implemented to, for example, provide voltage-dependent couplings. In some embodiments, a given diode can be reversed from the configuration as shown as needed or desired.

Figure 18:
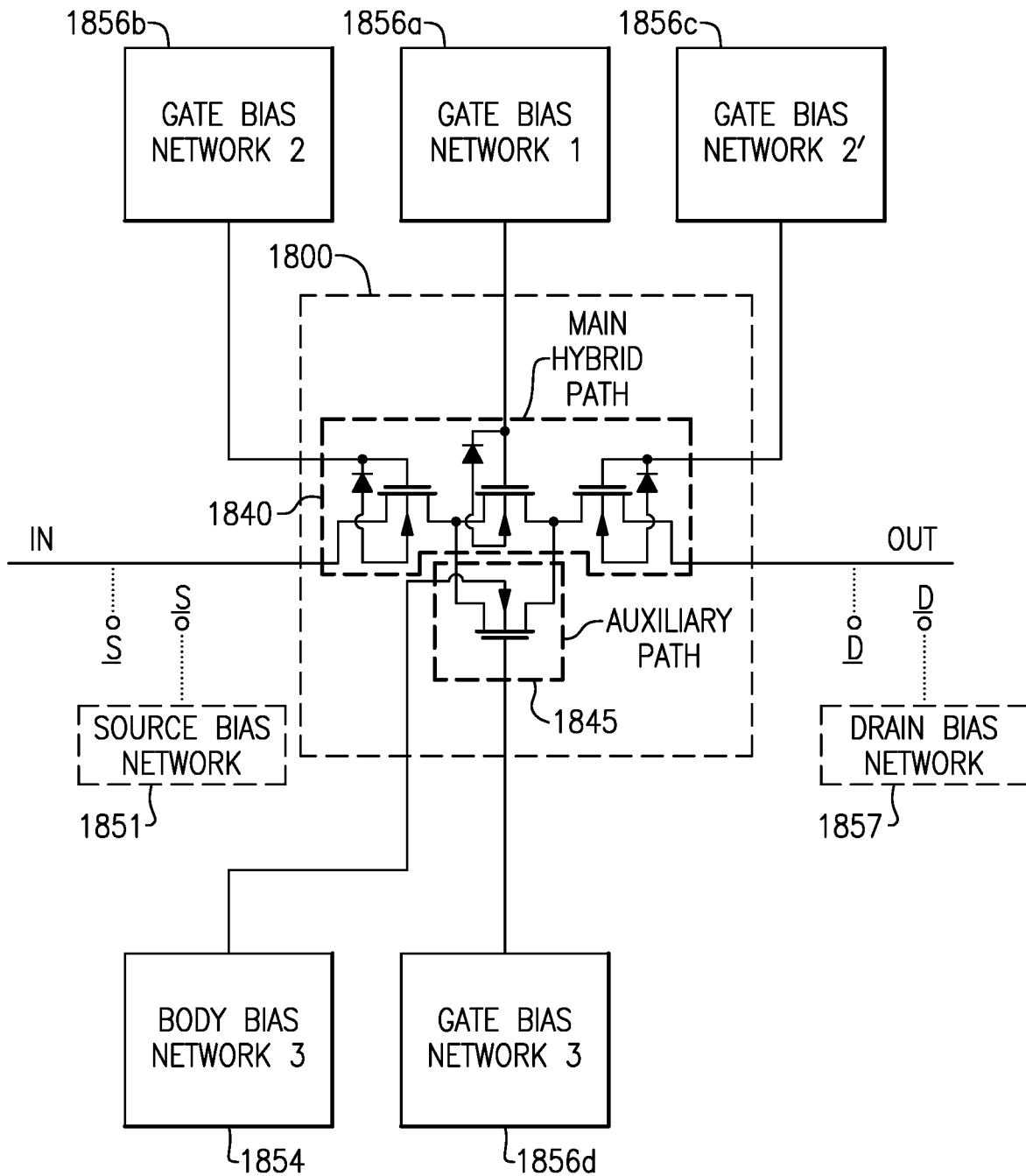
FIG. 18 illustrates an example main-auxiliary device where bodies of auxiliary and main FETs coupled in series are biased using gate bias networks and a body of an auxiliary FET coupled in parallel with the main FET is independently biased using a body bias network.

FIG. 18 illustrates an example main-auxiliary device 1800 with a configuration similar to the device 1600 described herein with reference to FIG. 16. However, the device 1800 illustrates a configuration where the bodies of the auxiliary and main FETs that are coupled together in series are biased using the gate bias networks 1856a-1856c and the body of the auxiliary FET coupled in parallel with the main hybrid path 1840 is independently biased using body bias network 1854. In some embodiments, it is the main hybrid path 1840 that is independently controlled by the body bias network 1854 and each auxiliary FET has a body node electrically coupled to its gate node to be controlled by the associated gate bias networks 1856b-1856d. In some embodiments, one or more body terminals of auxiliary FETs and/or main FETs can be coupled to a gate bias network and one or more body terminals of auxiliary FETs and/or main FETs can be coupled to individual body bias networks or a common body bias network.

Figure 19:
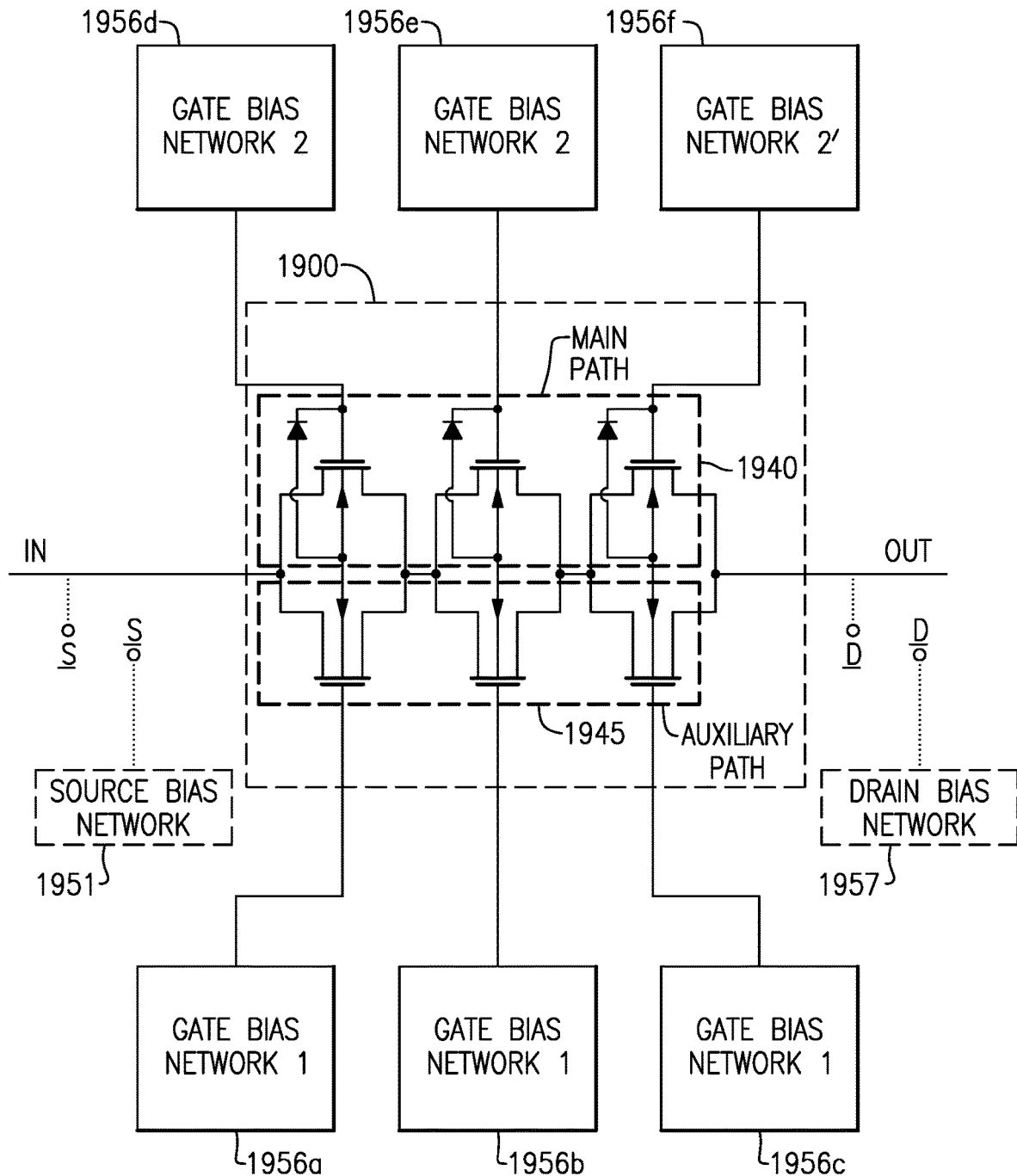
FIG. 19 illustrates an example main-auxiliary device with a series of main-auxiliary parallel FETs or pairings coupled in series.

FIG. 19 illustrates an example main-auxiliary device 1900 with a series of main-auxiliary parallel FETs coupled in series. Each main-auxiliary parallel FET or main-auxiliary pairing includes an auxiliary FET and a main FET connected in parallel, sharing source and drain nodes. These main-auxiliary parallel FETs also share a body or have body nodes that are coupled together. As illustrated, these body nodes are electrically coupled to the gate bias networks 1956d-1956f of the respective auxiliary FETs using a coupling circuit with a diode, but it is to be understood that a common or individualized body bias network can be utilized. The main path 1940 and the auxiliary path 1945 form a segmented main-auxiliary branch 1900 wherein a signal through the branch 1900 is divided at each main-auxiliary pairing and combined at a node between the pairings.

The main-auxiliary parallel FETs are coupled together in series to form the main-auxiliary device 1900. The respective auxiliary FETs 1945 and main FETs 1940 can be independently controlled using gate bias networks 1956a-1956f. However, it is to be understood that two or more auxiliary FETs may be controlled using a common auxiliary gate bias network. Similarly, it is to be understood that two or more main FETs may be controlled using a common main gate bias network. Although three main-auxiliary parallel FETs are illustrated, it is to be understood that the device 1900 can include at least 2 such parallel configurations, at least 3 such parallel configurations, at least 4 such parallel configurations, at least 5 such parallel configurations, at least 10 such parallel configurations, and so on.

Figure 20A:
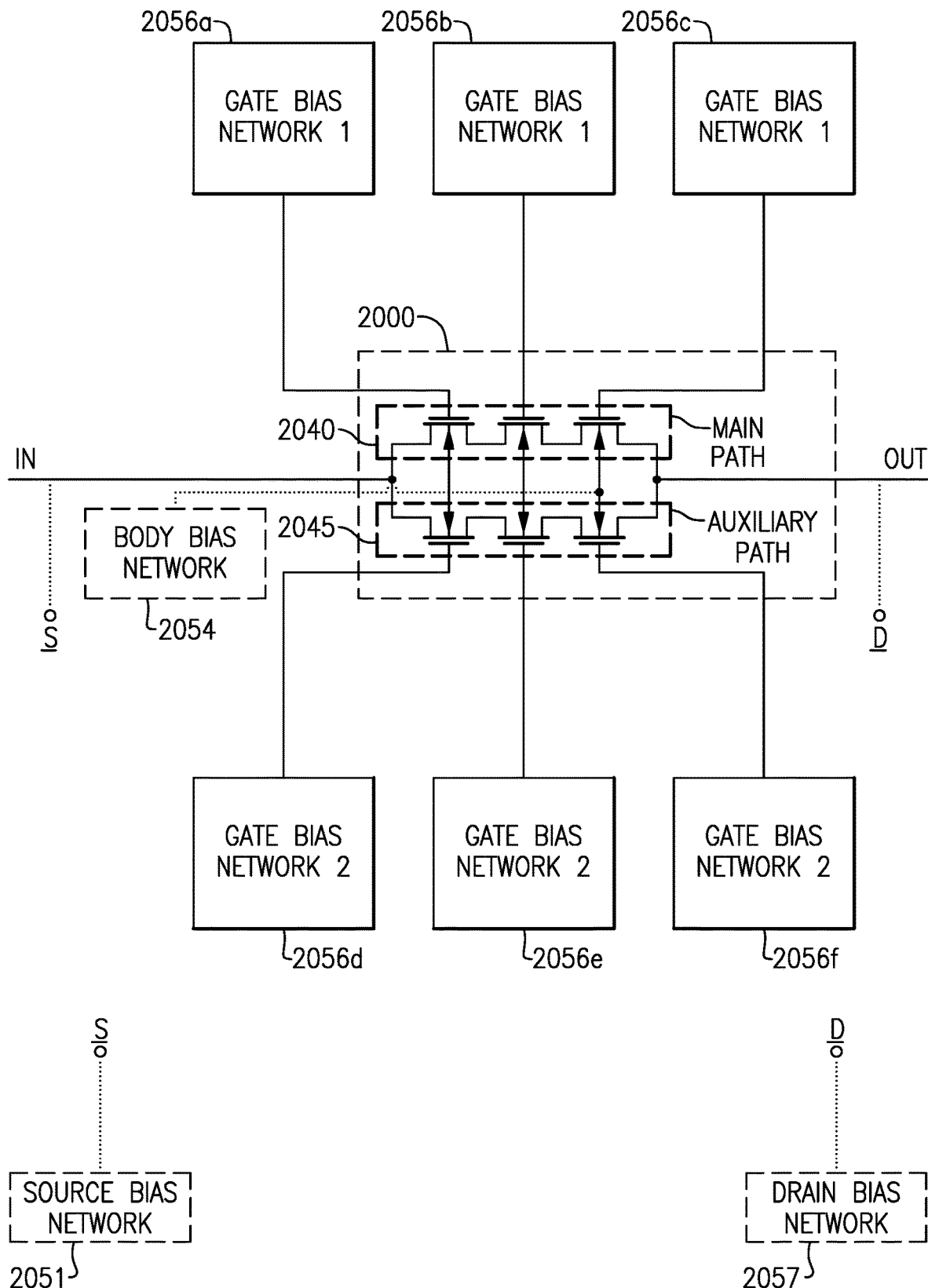
FIG. 20A illustrates an example main-auxiliary branch including an auxiliary FET stack and a main FET stack with FETs in individual stacks being capable of independent control.

FIG. 20A illustrates an example main-auxiliary branch 2000 including an auxiliary FET stack 2045 and a main FET stack 2040. The auxiliary FETs in the stack 2045 can be independently controlled (e.g., using gate bias network 2 2056d, 2056e, 2056f) or two or more of the auxiliary FETs in the stack 2045 can be controlled using a common auxiliary gate bias network (e.g., by consolidating gate bias network 2 2056d, 2056e, 2056f into a single gate bias network). Similarly, the main FETs in the stack 2040 can be independently controlled (e.g., using gate bias network 1 2056a, 2056b, 2056c) or two or more of the main FETs in the stack 2040 can be controlled using a common main gate bias network (e.g., by consolidating gate bias network 1 2056a, 2056b, 2056c into a single gate bias network).

The stack of auxiliary FETs 2045 and the stack of main FETs 2040 share a body so that a common body bias network 2054 can be used to provide a body bias voltage to the FETs in the main-auxiliary branch 2000. It is to be understood, however, that the main FETs 2040 can share a body and the auxiliary FETs 2045 can share a body, with the bodies of the auxiliary FET stack 2045 being independent from the bodies of the main FET stack 2040. In such embodiments, a common body bias network can be used to provide a bias voltage to the body nodes of the auxiliary FETs 2045, to the body nodes of the main FETs 2040, or to both the body nodes of the auxiliary FETs 2045 and the body nodes of the main FETs 2040.

The device 2000 can connect the source and drain nodes of the auxiliary FET stack 2045 and the main FET stack 2040 after N FETs. The number of FETs in the auxiliary stack 2045 and/or main stack 2040 can be different from one another. The main-auxiliary branch 2000 can include an input node (e.g., a source node), an output node (e.g., a drain node), a first gate node (e.g., an auxiliary gate node), a second gate node (e.g., a main gate node), and a body bias node. Using these five nodes, multiple auxiliary FETs and multiple main FETs can be controlled to provide a signal with improved linearity relative to configurations that do not utilize a main-auxiliary branch configuration.

Figure 20B:
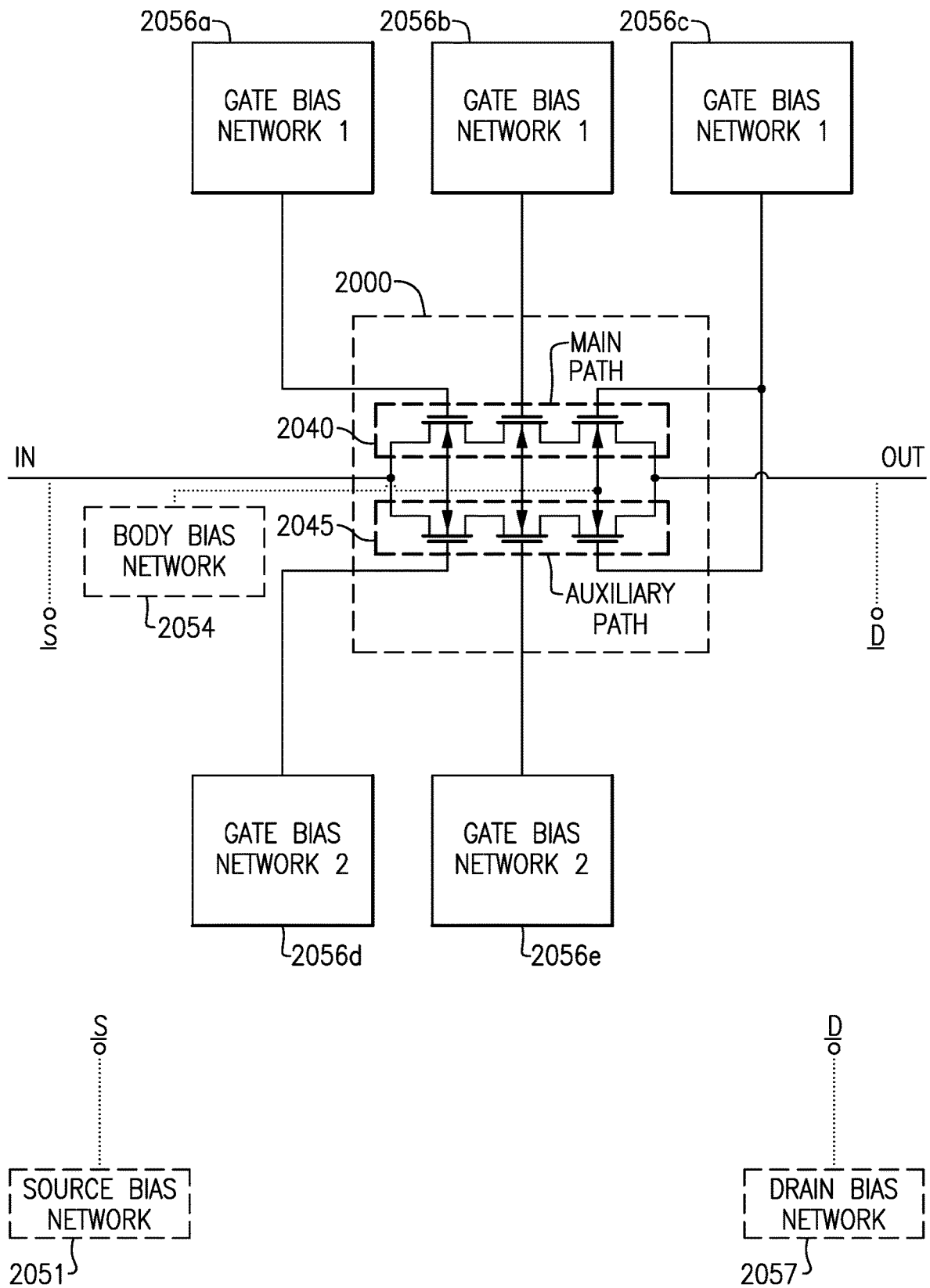
FIG. 20B illustrates a variation of the main-auxiliary branch of FIG. 20A wherein the gate of a FET in the auxiliary FET stack is biased using the gate bias network of a FET in the main FET stack.
Figure 20C:
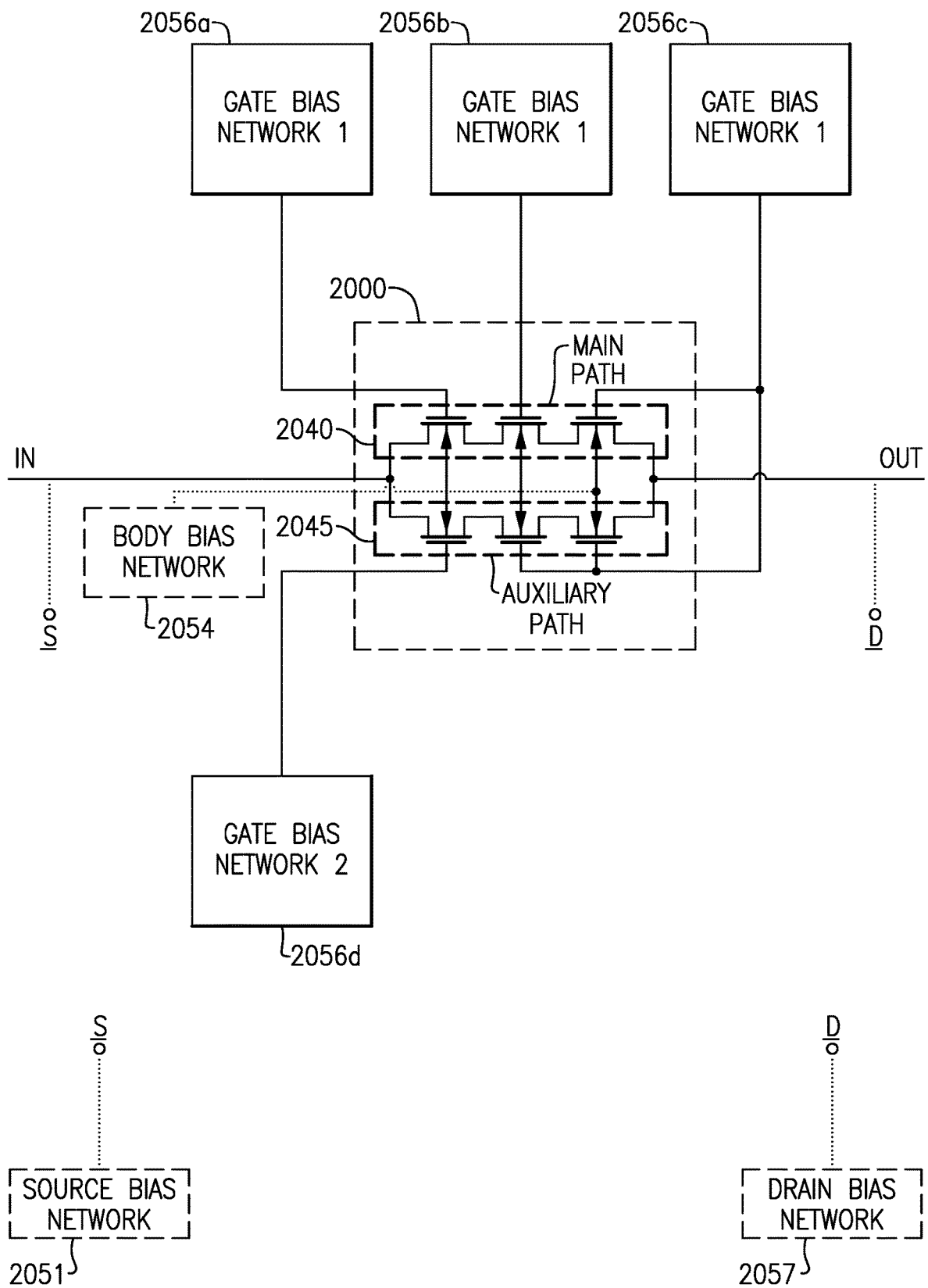
FIG. 20C illustrates a variation of the main-auxiliary branch of FIG. 20A wherein the gates of two or more of the FETs in the auxiliary FET stack are biased using the gate bias network of a FET in the main FET stack.
Figure 20D:
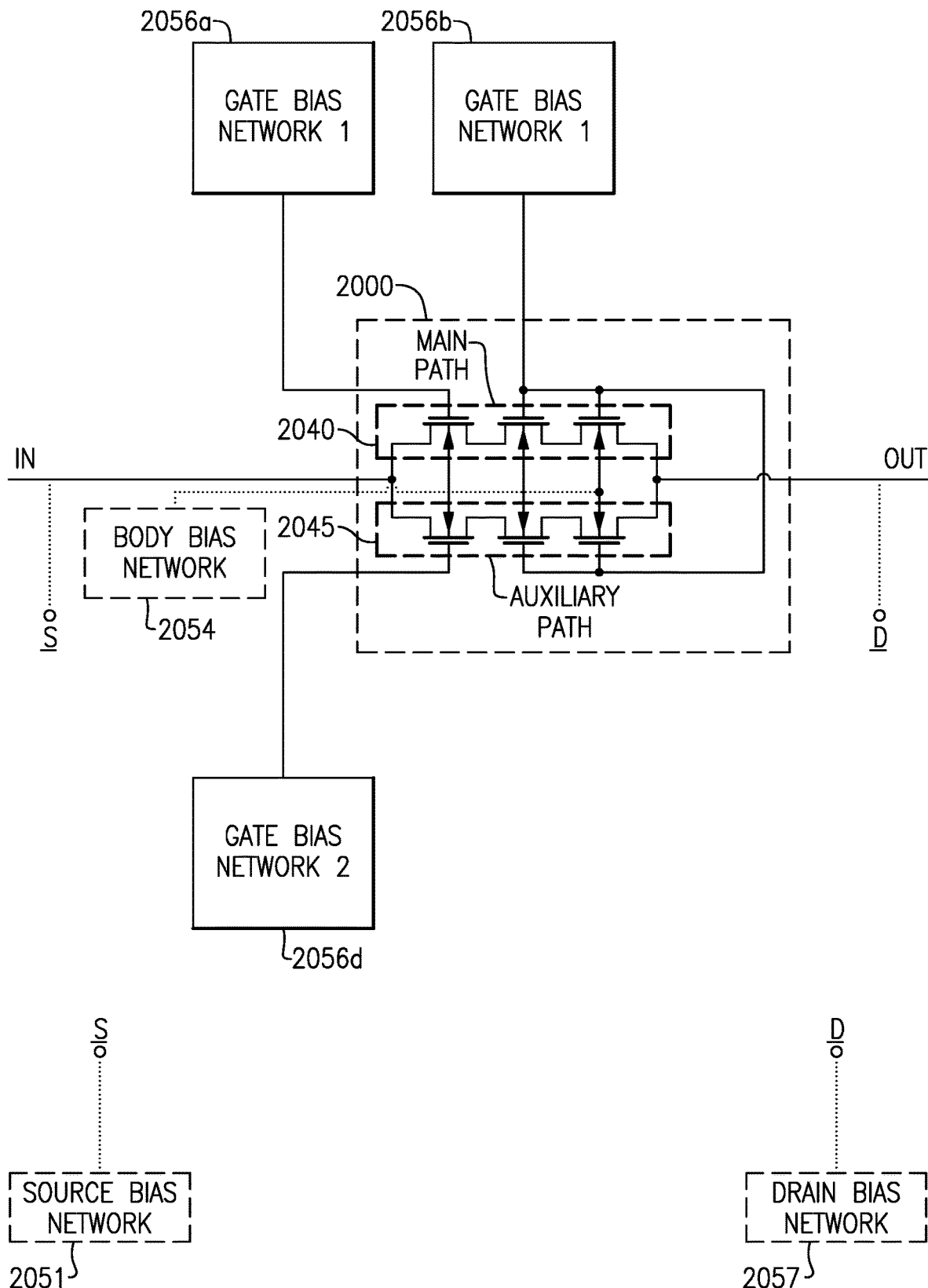
FIG. 20D illustrates a variation of the main-auxiliary branch of FIG. 20A wherein the gates of two or more of the FETs in the auxiliary FET stack are biased using the gate bias network of two or more FETs in the main FET stack.
Figure 20E:
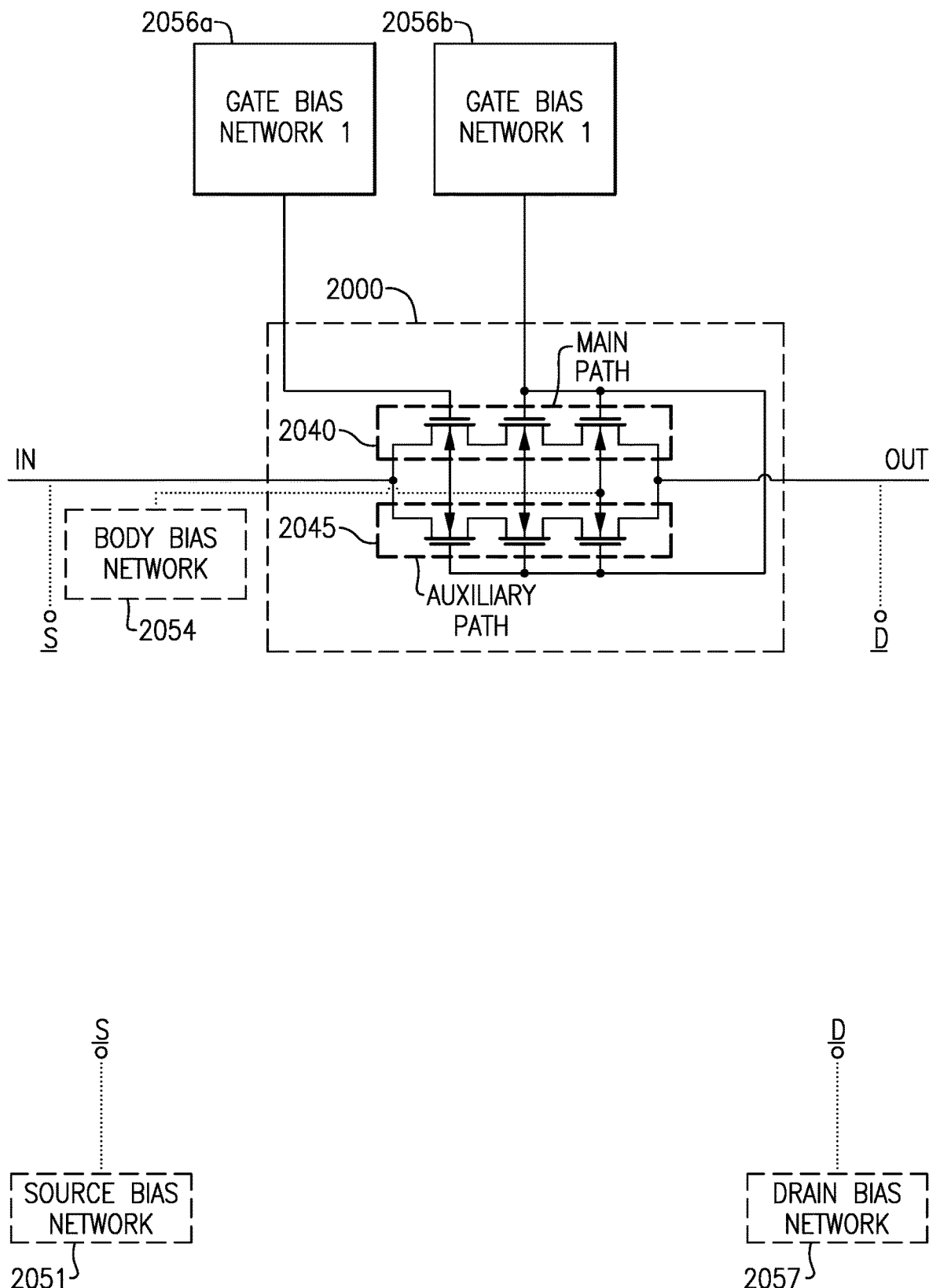
FIG. 20E illustrates a variation of the main-auxiliary branch of FIG. 20A wherein the gates of the FETs in the auxiliary FET stack are biased using the gate bias network of two or more FETs in the main FET stack.

FIG. 20B illustrates another example main-auxiliary branch 2000 wherein the gate of a FET in the auxiliary FET stack 2045 is biased using the gate bias network 1 2056c of a FET in the main FET stack 2040. FIG. 20C illustrates another example main-auxiliary branch 2000 wherein the gates of two or more of the FETs in the auxiliary FET stack 2045 are biased using the gate bias network 1 2056c of a FET in the main FET stack 2040. FIG. 20D illustrates another example main-auxiliary branch 2000 wherein the gates of two or more of the FETs in the auxiliary FET stack 2045 are biased using the gate bias network 1 2056b of two or more FETs in the main FET stack 2040. FIG. 20E illustrates another example main-auxiliary branch 2000 wherein the gates of all of the FETs in the auxiliary FET stack 2045 are biased using the gate bias network 1 2056b of two or more FETs in the main FET stack 2040.

Accordingly, FIGS. 20A-20E illustrate various main-auxiliary branches 2000 and configurations for gate bias networks to bias the gates of active devices in the main path 2040 and the auxiliary path 2045. For example, the gate of each active device in the main path 2040 and the gate of each active device in the auxiliary path 2045 can be biased using a dedicated gate bias network. As another example, the gates of some of the active devices in the main path 2040 share a common gate bias network with the gates of some of the active devices in the auxiliary path 2045. In such embodiments, the active devices that do not share a common gate bias network can be biased using individual gate bias networks.

Figure 21A:
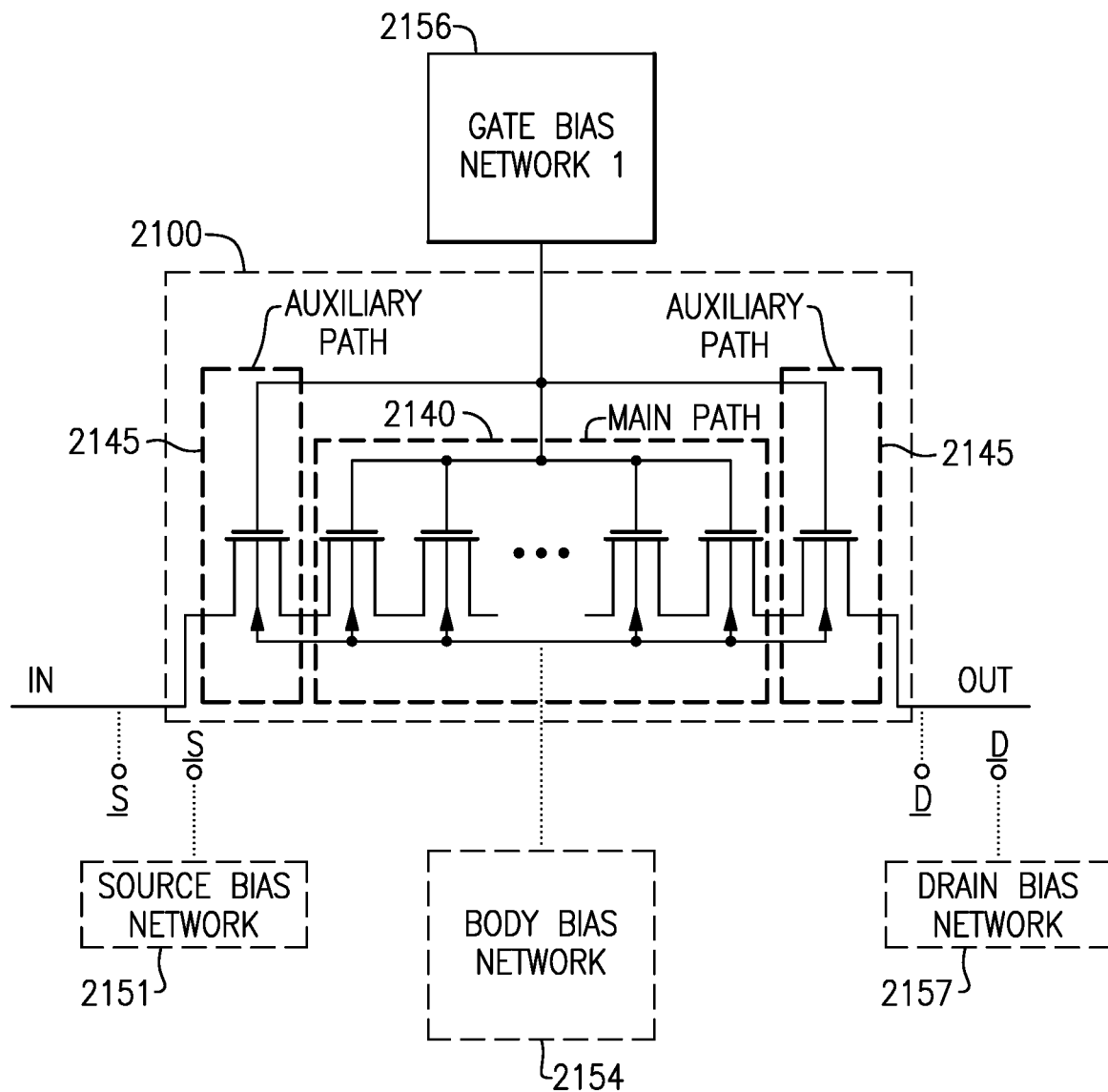
FIG. 21A illustrates an example main-auxiliary device having a first auxiliary FET or path coupled in series with a main FET stack or path that is in turn coupled in series with a second auxiliary FET or path, the auxiliary paths and the main path being controlled by a single gate bias network.

FIG. 21A illustrates an example main-auxiliary device 2100 having a first auxiliary FET 2145 coupled to a main FET stack 2140 that is in turn coupled to a second auxiliary FET 2145. In this configuration, the auxiliary/main devices are subsets of fingers of a multi-finger device wherein the auxiliary FETs 2145 are a subset of fingers and the main FET stack 2140 is the other subset of fingers. To illustrate an advantage of this configuration, and by way of example, the process details of the fingers used as the auxiliary FET 2145 may be adjusted differently from the fingers used as the main FET stack 2140 such that the auxiliary FET 2145 can be configured to be in a subthreshold or weak inversion region while the main FET stack 2140 is in a strong inversion region. As another example, the process details can be tailored such that third-order harmonics (H3) and/or intermodulation distortion (IMD3) generated by the auxiliary devices 2145 is in opposite phase and of similar magnitude with the H3 and/or IMD3 generated by the main device 2140 to improve the linearity of the main-auxiliary device 2100.

Another advantage of this configuration is that, with the auxiliary FETs 2145 and main FETs 2140 being produced using tailored processes, a common gate bias network 2156 can be used to control the auxiliary FETs 2145 and the main FET stack 2140. Due at least in part to the different characteristics of the auxiliary FETs 2145 and the main FETs 2140, different performance characteristics can be achieved using the common gate bias network 2156. Similarly, the auxiliary FETs 2145 and the main FETs 2140 can share a body or can tie their respective body nodes together to be controlled by a common body bias network 2154.

Figure 21B:
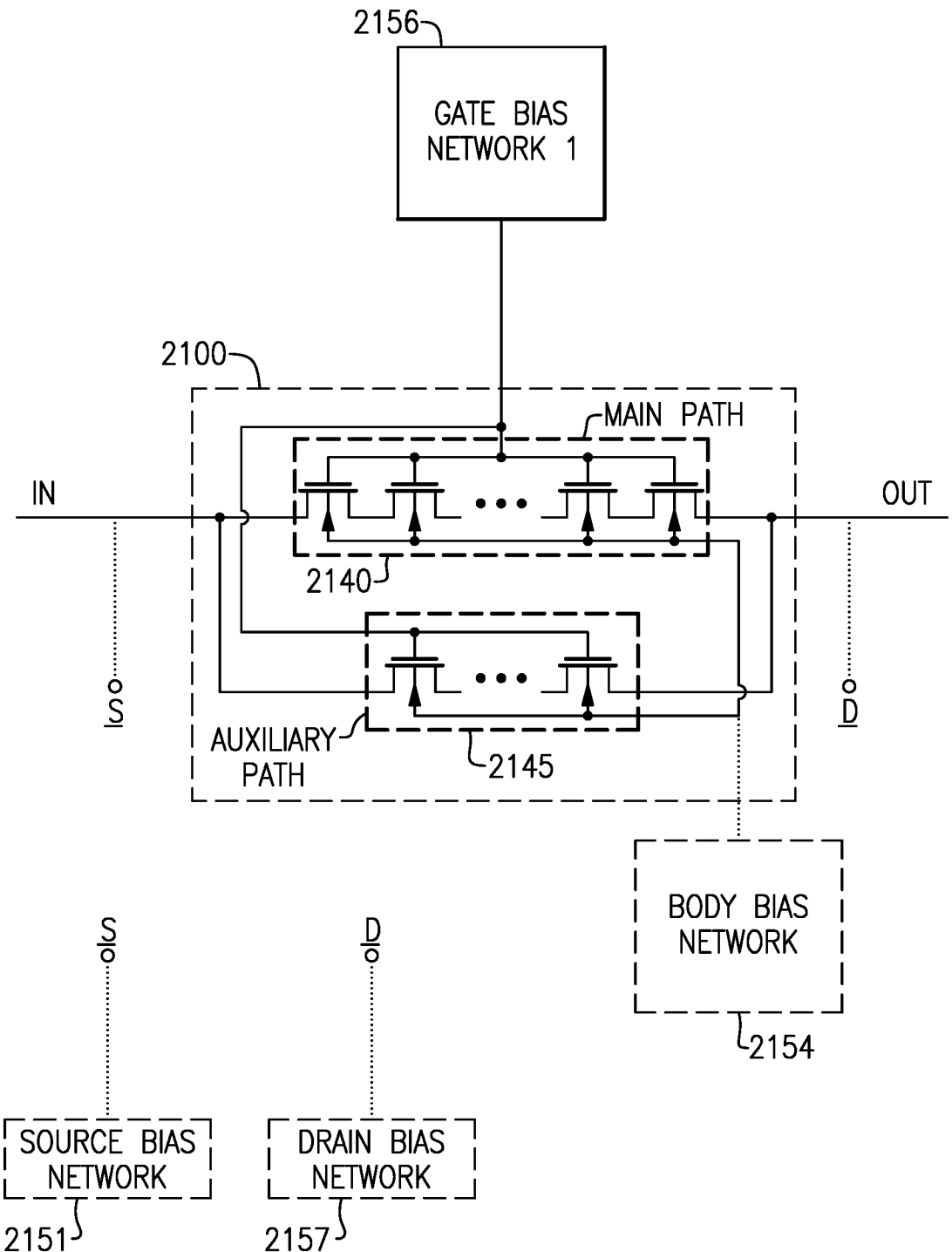
FIG. 21B illustrates an example main-auxiliary device having an auxiliary FET or path coupled to a main FET stack or path in parallel, the auxiliary path and the main path being controlled by a single gate bias network.

FIG. 21B illustrates an example embodiment of a main-auxiliary device 2100 wherein the auxiliary path 2145 is coupled in parallel with the main path 2140. Similar to the device described herein with reference to FIG. 21A, the auxiliary FETs in the auxiliary path 2145 and the main FETs in the main path 2140 are processed to have properties configured to result in a reduction in distortions when applying a single gate bias signal to the FETs of the auxiliary path 2145 and the FETs of the main path 2140.

The main-auxiliary devices 2100 described with respect to FIGS. 21A and 21B can be configured so that the main FETs 2140 operate in a strong inversion region and the auxiliary FETs 2145 operate in a subthreshold or weak inversion region when a tailored gate bias signal is applied by the gate bias network 1 2156 to the FETs in both the main path 2140 and the auxiliary path 2145. To accomplish this, the main FETs 2140 can be configured to have a threshold voltage that is much lower than the threshold voltage of the auxiliary FETs 2145. In this way, when a gate bias voltage is applied to the main FETs 2140 that is greater than the main FET threshold voltage, the gate bias voltage can also be less than the auxiliary FET threshold voltage, causing the main FETs 2140 to operate in the strong inversion region and the auxiliary FETs 2145 to operate in the subthreshold or weak inversion region. The main FETs 2140 and/or auxiliary FETs 2145 can be processed to have different physical characteristics to achieve these properties. For example, and without limitation, the channel length, thickness of the gate oxide, channel doping, gate work function, etc. can be tuned for the main FETs 2140 and the auxiliary FETs 2145 so that the threshold voltages and other characteristics are within targeted ranges.

Similarly, as described herein, the main FETs 2140 and the auxiliary FETs 2145 can be implemented as a multi-finger device. The physical characteristics of the multi-finger device can be tuned to reduce distortions. For example, properties of the auxiliary FETs can be tuned so that signals generated by the auxiliary FETs reduce or cancel distortions in signals generated by the main FETs. Properties of the multi-finger device that can be tuned include, for example and without limitation, channel length, thickness of the gate oxide, channel doping, gate work function, etc. This allows a single gate bias voltage to be applied to the multi-finger device that results in some fingers operating in a strong inversion region while the rest of the fingers operate in a subthreshold or weak inversion region. This can be done to achieve harmonic cancellation or reduction.

In the main-auxiliary devices described herein, the auxiliary FET(s) can be replaced with a gate-controlled MOSCAP. This can allow the devices to tailor the capacitor characteristics of the auxiliary element. Similarly, in the main-auxiliary devices described herein, the auxiliary FET(s) can be replaced with a gate-controlled diode. The gate-controlled diode can be implemented with an independent cathode bias network to provide similar advantages to those described herein. In some embodiments, this may improve control of the overall device performance characteristics. In some embodiments, a combination of gate-controlled capacitors, gate-controlled diodes, and transistors can form the active devices of the main-auxiliary branches described herein.

Figure 22A:
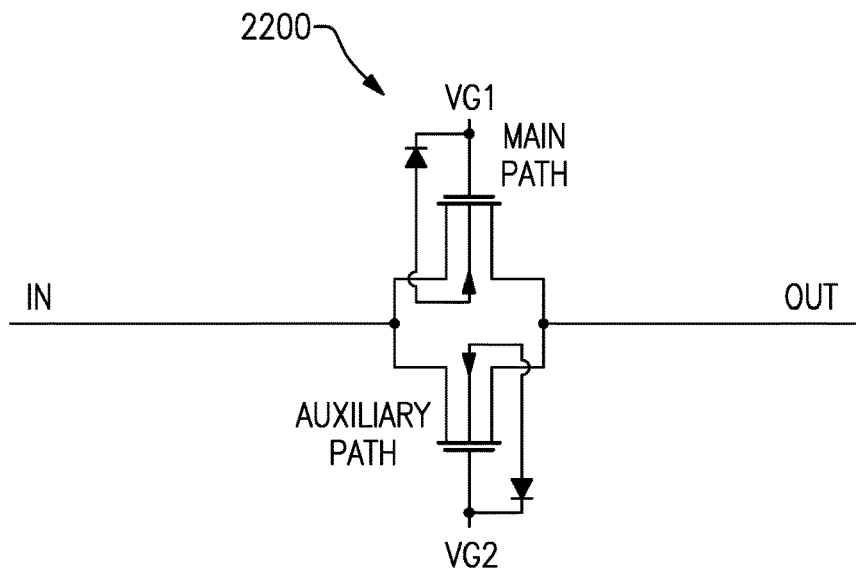
FIGS. 22A and 22B illustrate a simulation demonstrating improved linearity for a main-auxiliary device.
Figure 22B:
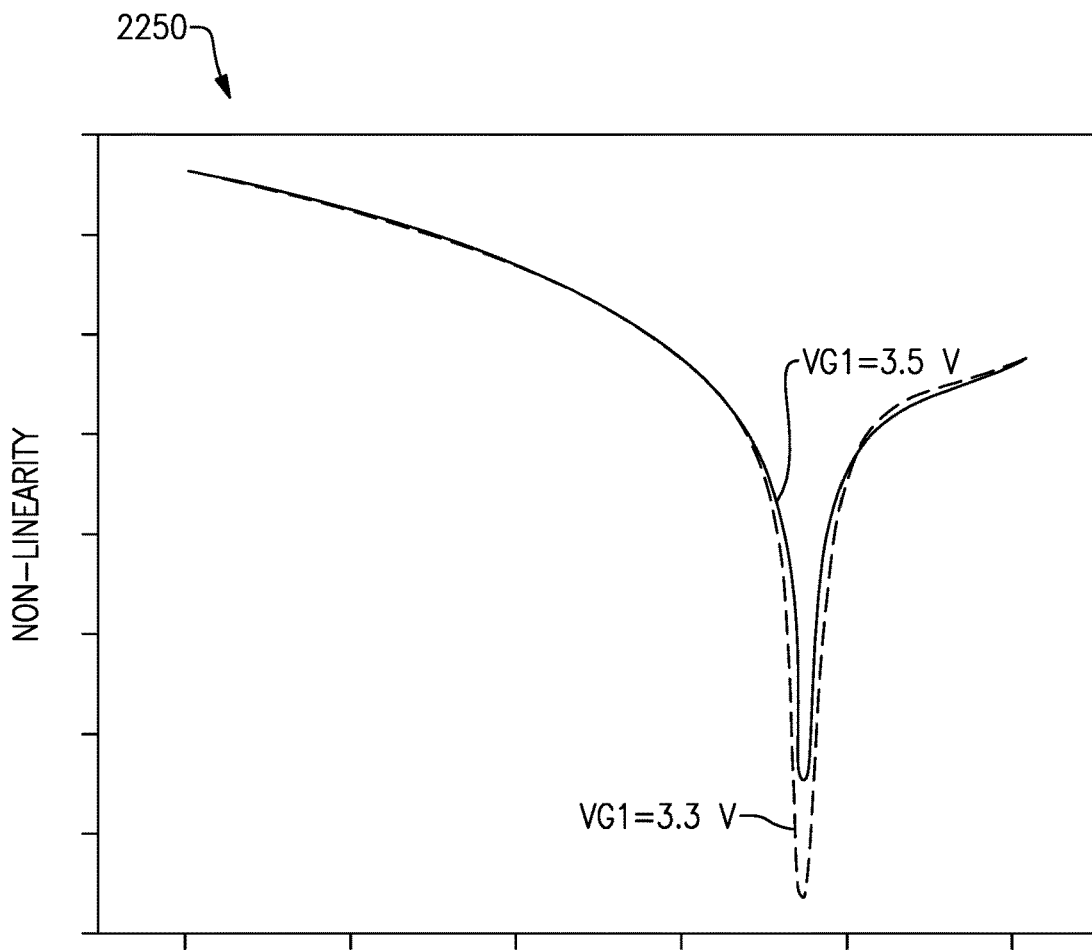

FIGS. 22A and 22B illustrate a simulation demonstrating improved linearity for a main-auxiliary device, as described herein. FIG. 22A illustrates an example main-auxiliary device 2200 implemented as an auxiliary FET in parallel with a main FET with the body nodes being coupled to the respective gate nodes through a coupling circuit having a diode, similar to the device 1700 described herein with reference to FIG. 17. A gate bias voltage VG1 is applied to the main FET and a gate bias voltage VG2 is applied to the auxiliary FET.

FIG. 22B illustrates a plot 2250 of simulated results related to the nonlinearity of the device 2200. To obtain the plot 2250, the gate bias voltage VG1 to the main was fixed and simulations were done over a range of gate bias voltages for the auxiliary FET. This was repeated for two gate bias voltages VG1, 3.3 V and 3.5 V. The results of the simulated data illustrate a marked improvement in linearity at a particular gate bias voltage VG2 applied to the auxiliary FET, which is seen in the plot where it dips downward for both VG1 voltages.

Without desiring to be limited to a single theory, it is believed that the improvement in the linearity for a particular gate bias voltage VG2 is due at least in part to harmonic cancellation. The harmonics generated by the auxiliary FET are similar in magnitude and opposite in phase or sign as those generated by the main FET. At the output, these generated harmonics interfere destructively (e.g., or substantially cancel each other out) resulting in reduced IMD3 (resulting in improved linearity through the device 2200). These perturbations caused by the auxiliary FET can be tailored to cancel or counteract harmonics generated by the main FET by tuning the gate bias voltage of the auxiliary FET.

The characteristics of the improvement in IMD3, and hence linearity, can be altered by altering the physical characteristics of the auxiliary FET, by altering the number of active devices used in the auxiliary path, and/or by altering the operating region of the auxiliary FET (e.g., by applying a targeted gate bias to the auxiliary FET). Thus, by tailoring the auxiliary FET or path characteristics and/or by tailoring the gate bias(es) to the auxiliary FET or path, the device 2200 and other similar main-auxiliary devices can be configured to improve the overall performance of the device. In certain simulations, improvements of about 12 dBm were measured by using gate bias tuning for the auxiliary FET. Accordingly, to derive improved or optimal operating conditions, a map can be made relating signal power, main gate bias voltage, and auxiliary gate bias voltage to determine targeted gate bias voltages for the auxiliary path to achieve targeted performance characteristics. In certain implementations, body bias voltages and/or substrate bias voltages may also be included in the map to further tailor operating parameters to achieve targeted performance.

Figure 23A:
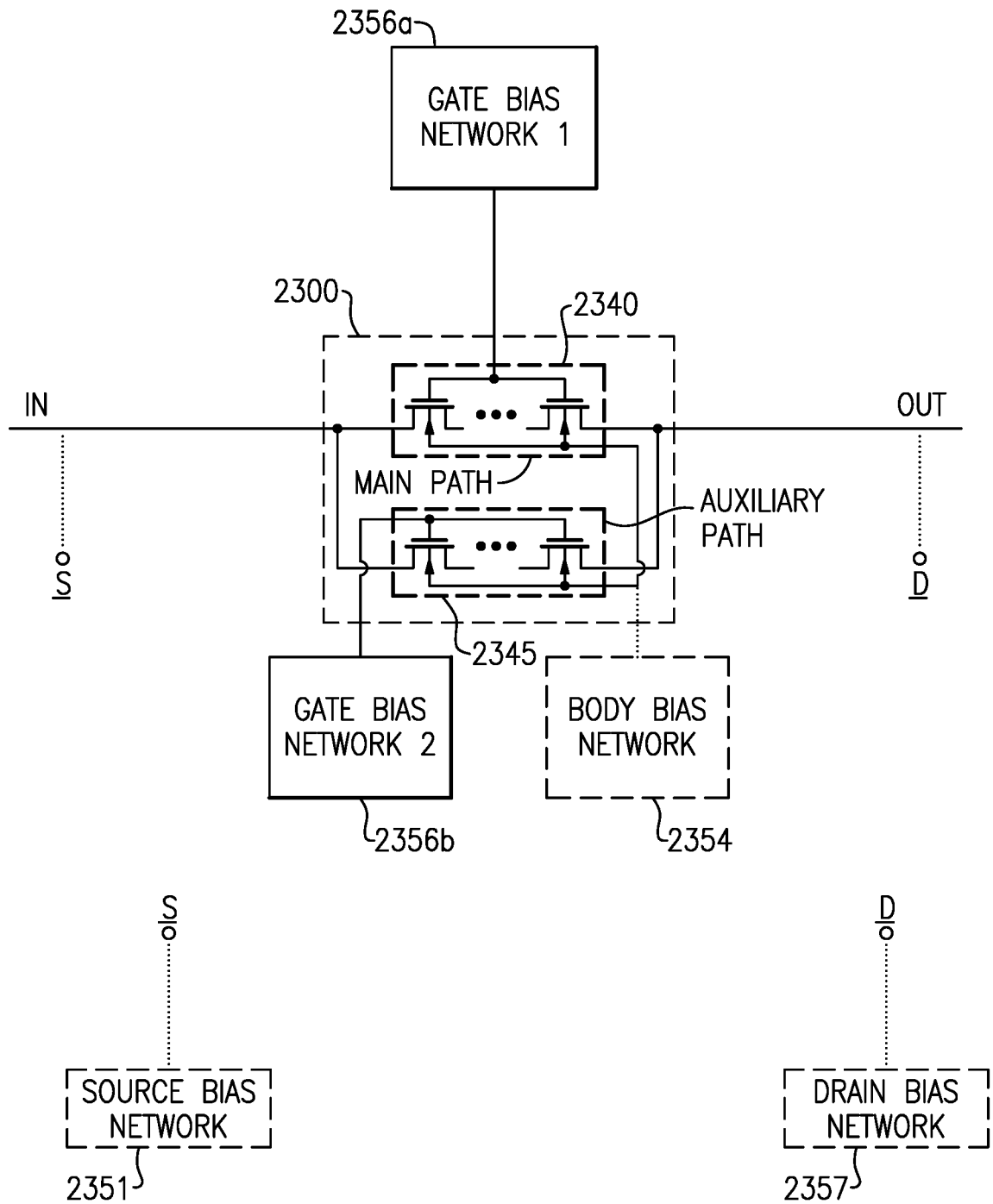
FIG. 23A illustrates an example main-auxiliary device wherein a main path includes a plurality of FETs biased using a main gate bias and an auxiliary path includes a plurality of FETs biased using an auxiliary gate bias independent of the main gate bias.

FIG. 23A illustrates an example main-auxiliary device 2300 wherein a main path 2340 includes a plurality of FETs biased using a main gate bias network 2356a and an auxiliary path 2345 includes a plurality of FETs biased using an auxiliary gate bias network 2356b independent of the main gate bias network 2356a. The number of FETs in the main path 2340 can be 2 or more FETs. The number of FETs in the stack can be configured based on power requirements of the device. For example, the number of FETs in the main path 2340 can be relatively high for power handling requirements and can be configured to have a relatively large periphery to reduce insertion losses. Because the auxiliary path 2345 is in parallel with the main path 2340, the stack number and periphery of the auxiliary FETs can be tuned more freely to achieve improved linearity. This is due at least in part to the nonlinearity of the auxiliary FETs being a function of the stack number and the FET periphery. This may be particularly applicable where the main and auxiliary FETs are of the same device type.

In some embodiments, the main gate bias network 2356a provides a static gate bias signal. In certain embodiments, the main gate bias network 2356a provides a dynamic gate bias signal. In some embodiments, the auxiliary gate bias network 2356b provides a static gate bias signal. In certain embodiments, the auxiliary gate bias network 2356b provides a dynamic gate bias signal. In various implementations, the main gate bias network 2356a provides a gate bias voltage that is greater than the gate bias voltage provided by the auxiliary gate bias network 2356b. The main gate bias network 2356a can be configured to provide a gate bias voltage that causes the FETs in the main path 2340 to operate in a strong inversion region and the gate bias voltage provided by the auxiliary gate bias network 2356b is configured to cause the FETs in the auxiliary path 2345 to operate in a subthreshold or weak inversion region.

The device 2300 can be used in a switch branch that can be switched on and off. In such implementations, both the main path 2340 and the auxiliary path 2345 can be advantageously configured to have relatively large stack numbers for power handling in the off state. To better improve performance, the gate bias signal applied to different FETs or subsets of FETs in the auxiliary path 2345 can differ from one another. This can allow more fine-tuning of the signal characteristics and may result in improved performance relative to embodiments where a single gate bias voltage is applied to all the FETs in the auxiliary path 2345. By way of example, to improve linearity in the "on" state, one or more FETs in the auxiliary path 2345 can be biased to operate in the weak inversion region, while the remaining FETs are biased to operate in the strong inversion region. Furthermore, to improve linearity in the "off" state, one or more FETs in the auxiliary path 2345 can be biased to operate in the weak inversion region, while the remaining FETs are biased to operate in the accumulation region. Accordingly, it is to be understood that the gate bias network 2356 can be configured to apply different gate bias signals to different FETs or groups of FETs in the auxiliary path 2345 (similar to the main-auxiliary device 2000 described herein with reference to FIG. 20A).

Figure 23B:
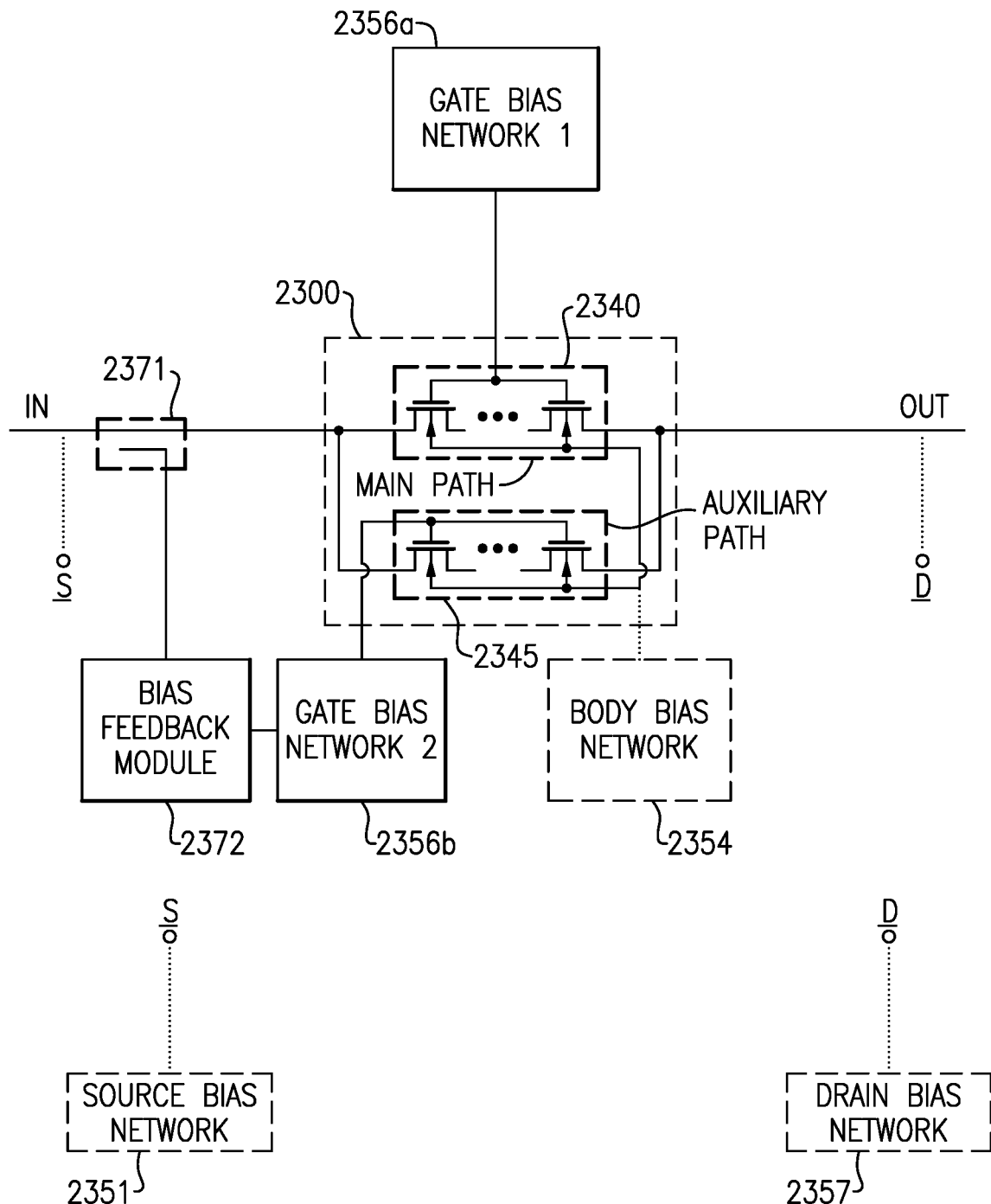
FIG. 23B illustrates the main-auxiliary device of FIG. 23A having a feedback loop configured to adjust the bias provided by the auxiliary gate bias.

FIG. 23B illustrates the main-auxiliary device 2300 of FIG. 23A having a feedback loop configured to adjust the bias provided by the auxiliary gate bias network 2356b. A coupler 2371 can be included to generate a signal related to the signal at the input node. The coupler 2371 is coupled to a bias feedback module 2372 that is configured to analyze or process the signal from the coupler 2371 and to generate a feedback signal. The bias feedback module 2372 sends the feedback to the auxiliary gate bias network 2356b which determines, generates, modifies, and/or adjusts the gate bias signal to the auxiliary path 2345. This can be done to improve performance of the main-auxiliary device.

Due at least in part to differences in coupling at the gate, body and between source and drain, performance of the main-auxiliary device 2300 can change as a function of input signal (e.g., input power, frequency, etc.). Accordingly, the bias feedback module 2372 is implemented to provide input to the gate bias network 2356b to dynamically adjust the gate bias voltage to the auxiliary path depending on the input signal characteristics.

Figure 24A:
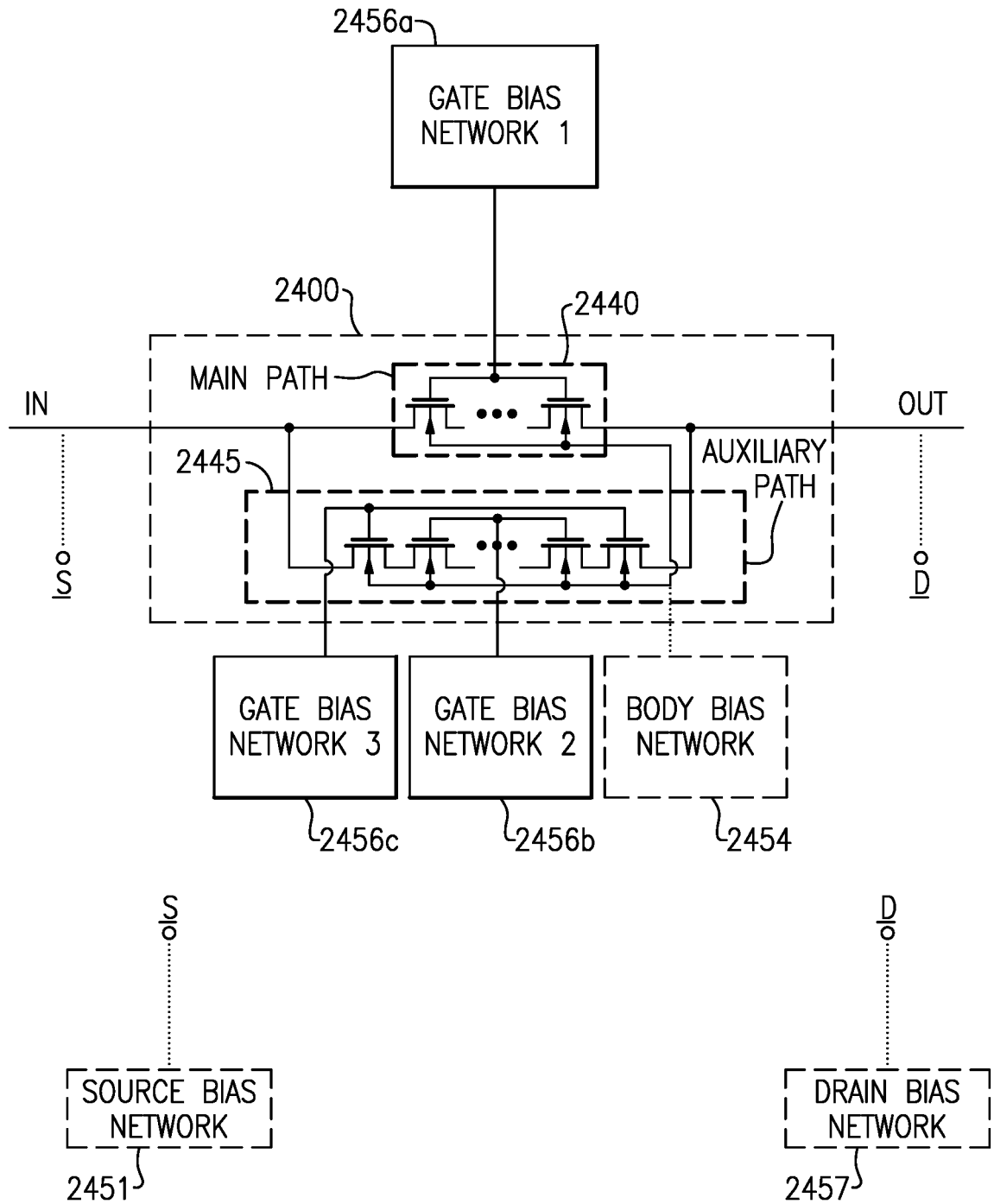
FIG. 24A illustrates an example main-auxiliary device having a main FET stack or path and an auxiliary FET stack or path, the auxiliary path including a first subset of FETs, a second subset of FETs, and a third subset of FETs wherein the first and third subsets of FETs are biased using a first auxiliary gate bias and the second subset of FETs is biased using a second auxiliary gate bias, the first and third subsets of FETs controlling access to the auxiliary path.

FIG. 24A illustrates an example main-auxiliary device 2400 having a main FET stack or path 2440 and an auxiliary FET stack or path 2445, the auxiliary path 2445 including a first subset of FETs, a second subset of FETs, and a third subset of FETs wherein the first and third subsets of FETs are biased using a auxiliary gate bias network 2456c and the second subset of FETs is biased using a different auxiliary gate bias 2456b, the first and third subsets of FETs controlling access to the auxiliary path 2445.

The main stack 2440, which includes an n-stack of switches, can be configured to serve as a primary signal path between the input node and the output node. Due at least in part to the nonlinearity of this configuration (e.g., harmonics, intermodulation products, etc.), it may be desirable to improve performance by at least reducing nonlinearity to meet specifications for wireless standards or other such standards. Accordingly, the auxiliary path 2445 is included in parallel with the main path 2440. The auxiliary path 2445 includes a nonlinear generator (e.g., the second subset of FETs) and FETs acting as secondary nonlinear generators and switches controlling access to the auxiliary path 2445. In some embodiments, the total stack of FETs in the auxiliary path 2445 would equal or exceed the number of FETs in the main path 2440, however the number of FETs in the auxiliary path 2445 can be less than, the same, or greater than the number of FETs in the main path 2440.

The first and third subsets of FETs can be configured to have a sufficient stack height to withstand voltage and power requirements at both the input node and the output node. This allows the device 2400 to be used in both "on" and "off" configurations in a switch application.

The auxiliary path 2445 can be configured to generate a nonlinearity (harmonic, IMD, etc.) that is approximately equal in magnitude and opposite in phase as the nonlinearity of the main path 2440. The net effect of the signal traveling between the input node and the output node through both the main path 2440 and the auxiliary path 2445 is improved relative to a signal path through the main path 2440 alone. The nonlinearity generated in the auxiliary path 2445 can be a function of biasing and sizing of the nonlinearity generator. The first and third subsets of FETs also contribute to the nonlinearity of the auxiliary path, aiding in the reduction of distortions generated by the main path 2400. The bias signal provided to the second subset of FETs (e.g., the primary nonlinearity generator) can depend on frequency, input power, temperature, and/or the type of nonlinearity to be cancelled in the device 2400.

The first and third subsets of FETs in the auxiliary path 2445 can be used in several ways in the device 2400. For example, when the first and third subsets of FETs are in the "on" state and the main switch is on, the first and third subsets of FETs can be biased at or near the same voltage as the FETs of the main path 2440 (e.g., about 2.5 V). In this arrangement, the distortions (e.g., nonlinearity) of the main path 2440 and the auxiliary path 2445 can substantially cancel, thus improving nonlinearity (harmonic, IMD, etc.,) of the switch.

As another example, when the first and third subsets of FETs are in the "off" state and the main switch on, the first and third subsets of FETs block the signal from entering the auxiliary path 2440. Thus, the signal travels from the input node to the output node through the main path 2440. This case may be utilized where the nonlinearity of the main path 2440 is suitable or in cases where using the auxiliary path 2445 is otherwise undesired. The first and third subsets of FETs can be designed (e.g., have a sufficient stack height) to withstand maximum voltages seen at the input and output nodes.

As another example, when the first and third subsets of FETs are in the "off" state and the main switch off, the main-auxiliary device 2400 is fully off. The first and third subsets of FETs in the auxiliary path 2445 and the main path 2440 can include sufficient stack height to withstand maximum voltage swings at the output node.

Figure 24B:
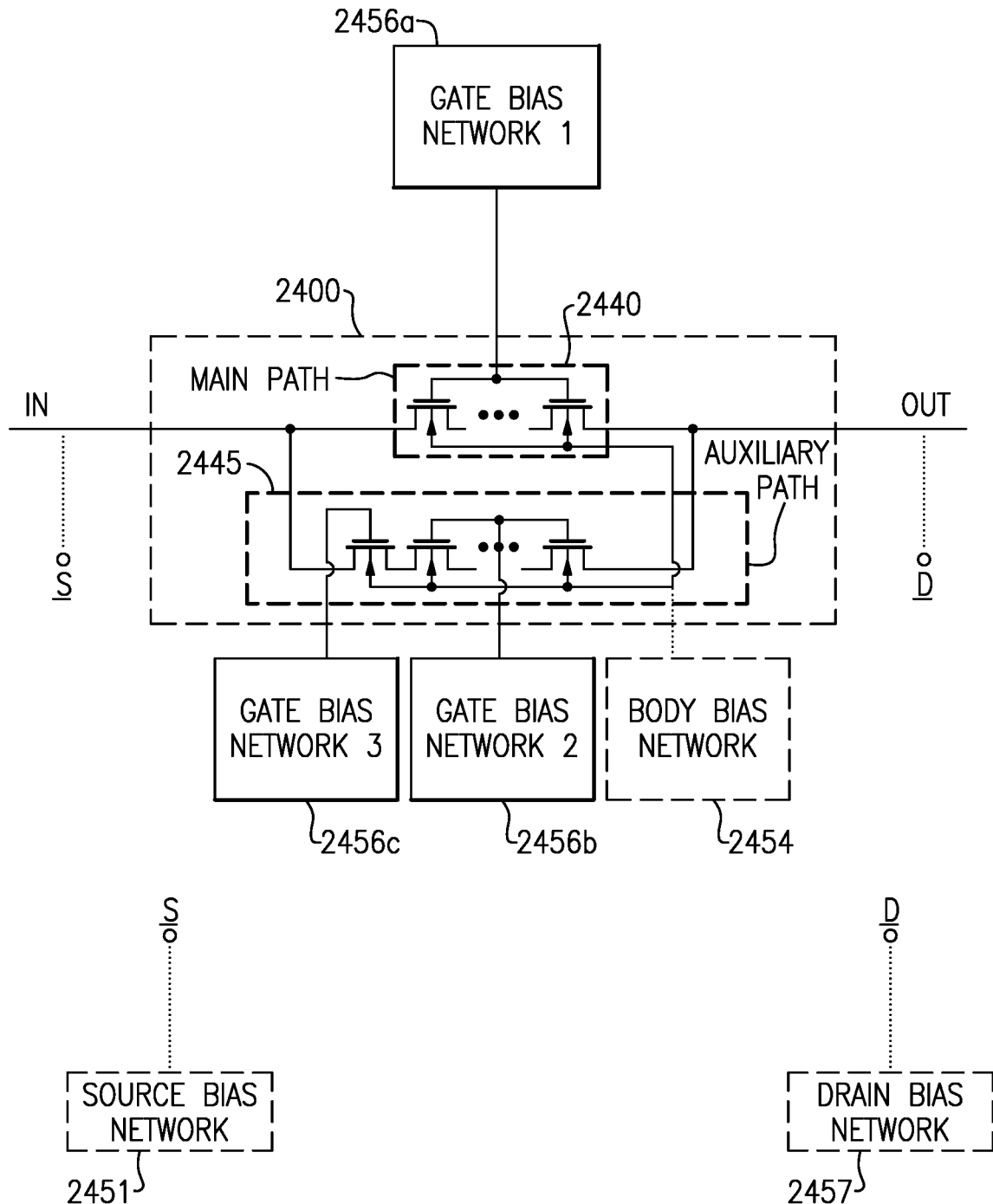
FIG. 24B illustrates the main-auxiliary device of FIG. 24A with the removal of the third subset of FETs in the auxiliary path.
Figure 24C:
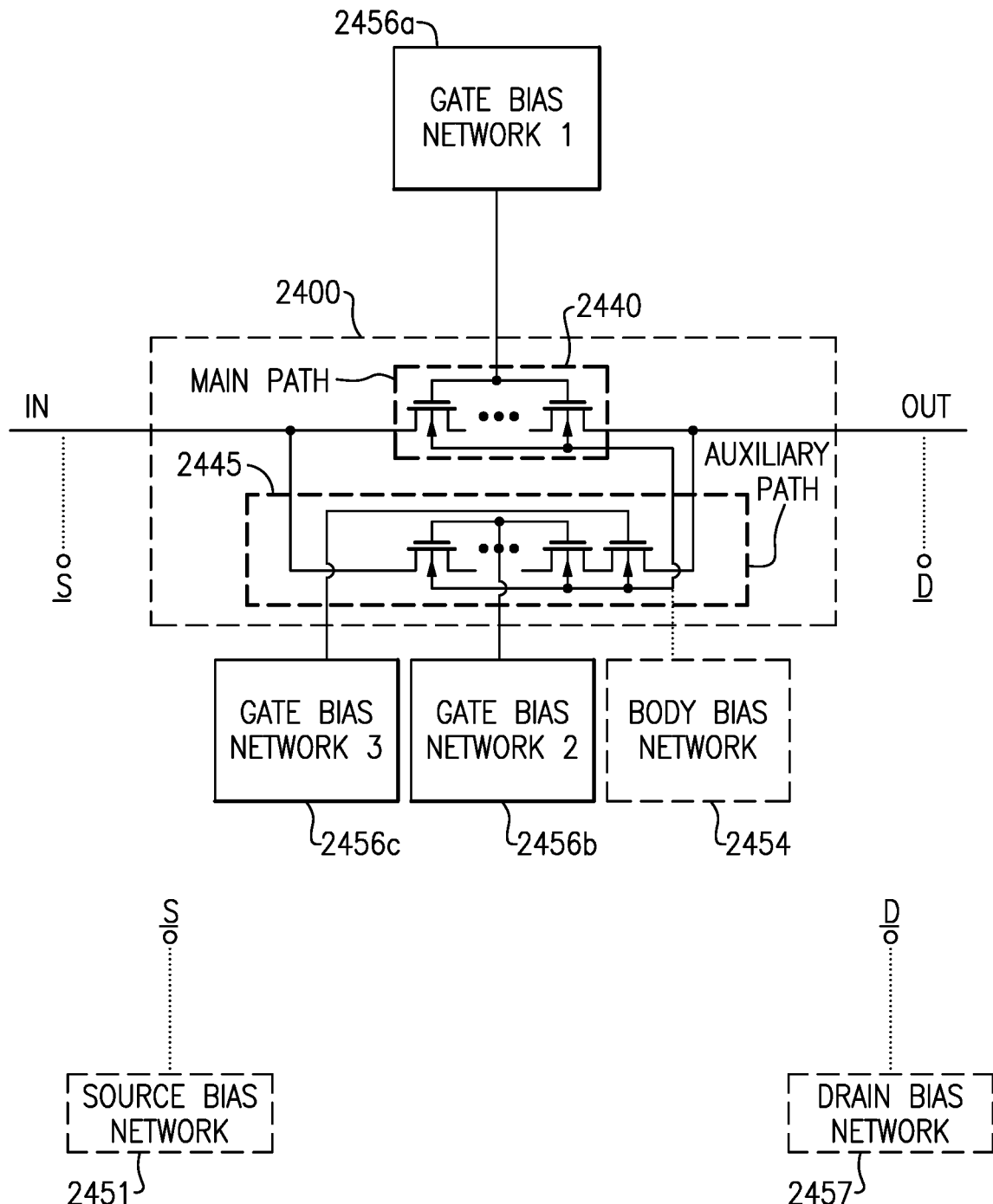
FIG. 24C illustrates the main-auxiliary device of FIG. 24A with the removal of the first subset of FETs in the auxiliary path.

FIG. 24B illustrates the main-auxiliary device 2400 of FIG. 24A with the removal of the third subset of FETs in the auxiliary path 2445. FIG. 24C illustrates the main-auxiliary device 2400 of FIG. 24A with the removal of the first subset of FETs in the auxiliary path 2445. These embodiments have similar functionality to the device 2400 described herein with reference to FIG. 24A.

Improvement of Linearity Using Auxiliary Paths

Figure 25:
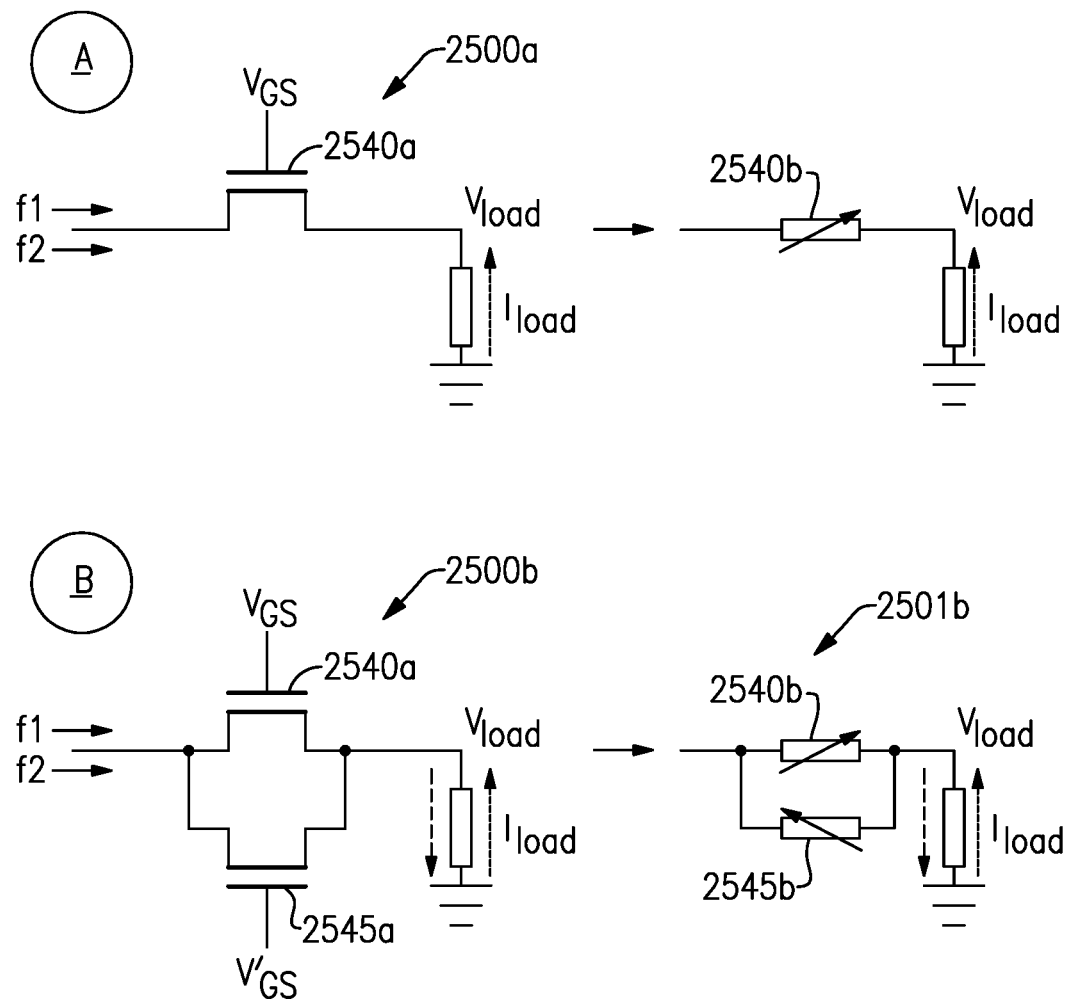
FIG. 25 illustrates example circuits that improve signal linearity through the use of an auxiliary path.

FIG. 25 illustrates example circuits that improve signal linearity through the use of an auxiliary path. Configuration A represents a switch path 2500a that goes through a main path having a main FET 2540a with a gate bias VGS applied to its gate and then through a load to ground. The signal is a two-tone signal that includes two frequency components: $f_1$ and $f_2$. The switch path 2500a is represented as a main nonlinear resistor 2540b in place of the main FET 2540a when the switch is turned on, as shown in the circuit on the right.

The nonlinear resistor 2540b generates harmonics with a particular magnitude and phase. By way of example, the magnitude of $V_{load}$ having the frequency components $f_1$ and $f_2$ is proportional to:

$$V_{load} \propto \frac{\partial I_d}{\partial V_{ds}}$$

with $I_d$ being the current through the nonlinear resistor and load. In addition, the output of the switch path includes harmonics and intermodulation products where the magnitude of $V_{load}$ includes frequencies $(2*f_1-f_2)$ and $(2*f_2-f_1)$, e.g., third-order harmonics, which is represented by the dotted line with an arrow at the load. Third-order harmonics (H3) and intermodulation products (IM3) (with frequencies $(2*f_1-f_2)$ and $(2*f_2-f_1)$) are closely related to the third-order derivative of the current flowing through the main switch path. Accordingly, $V_{load}$ is proportional to:

$$V_{load} \propto \frac{\partial^3 I_d}{\partial V_{ds}^3}$$

with $I_d$ being the current through the nonlinear resistor and load.

As described herein, distortions due to harmonics in a switch path can be reduced through the introduction of an auxiliary path. The auxiliary path can be used to generate harmonics with similar magnitude and opposite phase to reduce the harmonics of the switch path. This reduces harmonics through the switch path and thereby improves nonlinearity. By properly biasing the auxiliary path, a targeted reduction or cancellation of harmonics can be achieved.

Configuration B represents another switch path 2500b that goes through the main FET 2540a and load to ground but with the addition of an auxiliary FET 2545a in parallel with the FET 2540a. The same two-tone signal is applied that includes the two frequencies $f_1$ and $f_2$. When the switch path 2500b is on it can be represented as the main nonlinear resistor 2540b in parallel with an auxiliary nonlinear resistor 2545b in place of the auxiliary FET 2545a, as shown in the circuit on the right.

As stated above, the output of the auxiliary nonlinear resistor 2545b includes harmonics and intermodulation products where the magnitude of Wad includes frequencies $(2*f_1-f_2)$ and $(2*f_2-f_1)$, e.g., third-order harmonics, which is represented by the dashed line with an arrow at the load. The third-order harmonics (H3) and intermodulation products (IM3) (with frequencies $(2*f_1-f_2)$ and $(2*f_2-f_1)$) are closely related to the third-order derivative of the current flowing through the auxiliary nonlinear resistor 2545b. Accordingly, $V_{load}$ contributed by the auxiliary path is proportional to:

$$V_{load} \propto \frac{\partial^3 I'_d}{\partial V_{ds}^3}$$

with $I'_d$ being the current through the auxiliary nonlinear resistor 2545b. The resulting combination of signals from the main nonlinear resistor 2540b and the auxiliary nonlinear resistor 2545b can be configured to destructively interfere by configuring the bias of the auxiliary FET 2545a so that the resulting signal has third-order harmonics that are of a similar magnitude but opposite phase as the signal out of the main FET 2540a. In this way, nonlinearity can be improved at the load and/or the output of the main-auxiliary branch formed by the main path 2540a and the auxiliary path 2545a.

It is to be understood that although the switch paths are illustrated with a single FET, the switch paths can be implemented with stacks of FETs. For example, the main path 2540a can include a single FET or a plurality of FETs. Similarly, the auxiliary path 2545a can include a single FET or a plurality of FETs, with the number of FETs in the main path 2540a different from the number of FETs in the auxiliary path 2545a.

Figure 26A:
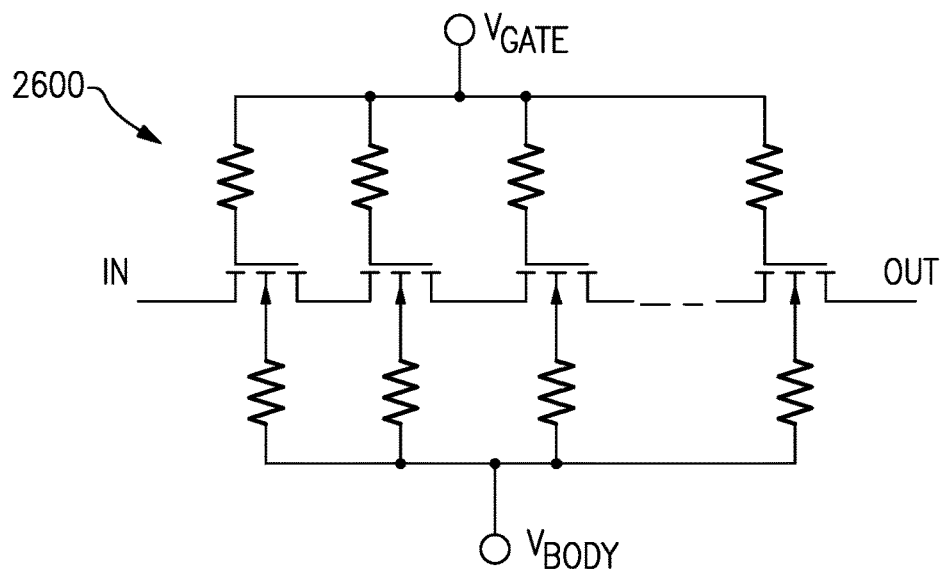
FIG. 26A illustrates an example FET stack that is used in simulating the magnitude and phase of third-order harmonics.
Figure 26B:
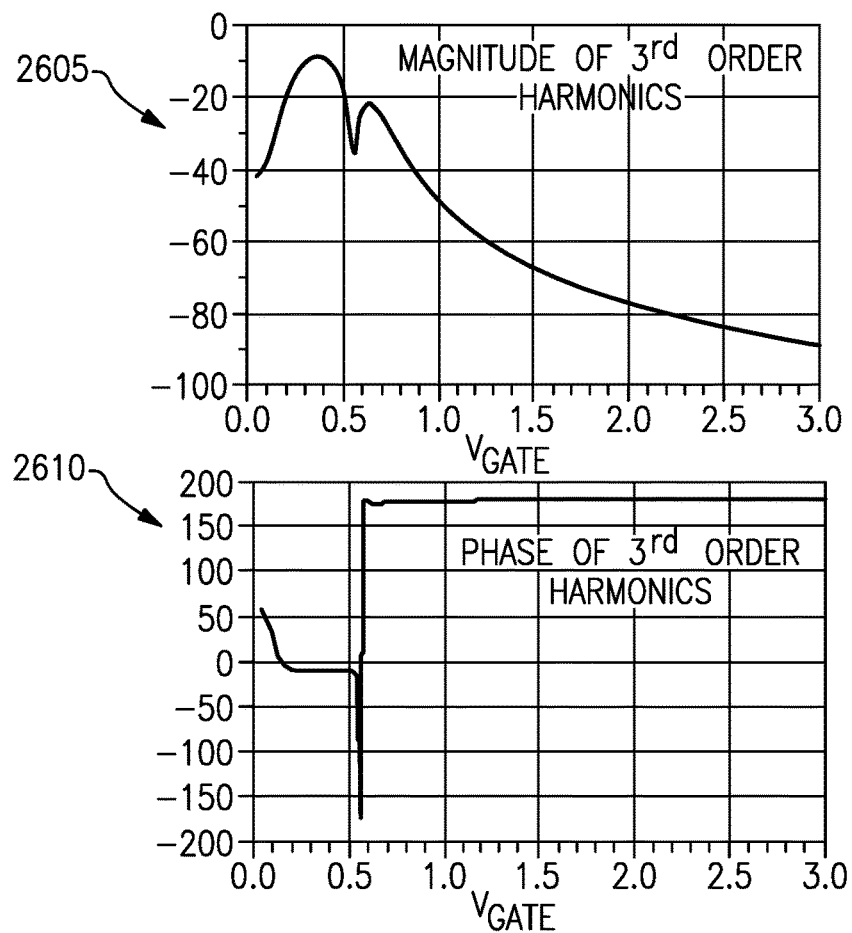
FIG. 26B illustrates the results of the example FET stack simulation of FIG. 26A.

FIG. 26A illustrates an example FET stack 2600 that is used in simulating the magnitude and phase of third-order harmonics, the results of which are illustrated in FIG. 26B. In the FET stack 2600, the total number of FETs in the simulation is 12 with a total width of 3.5 mm and a length of 0.24 μm. The input power of the signal was simulated as 20 dBm and $V_{body}$ is 0 V.

As is shown in the plot 2605 of FIG. 26B, the magnitude of the third-order harmonics varies as a function of the gate voltage. As shown in the plot 2610, the phase of the third-order harmonics also changes with gate voltage, with a change in phase of 180 degrees at a particular gate voltage. The gate voltage here is about 0.6 V where this transition occurs, but it is to be understood that different FET configurations will have a different gate voltage where this transition occurs. Accordingly, as is illustrated by this simulation, the gate bias of a FET stack can be tailored or tuned to achieve a targeted magnitude and phase of third-order harmonics. This can be done to reduce or cancel third-order harmonics generated by another FET stack in a switch path, for example, thereby improving linearity through the switch path.

Figure 27A:
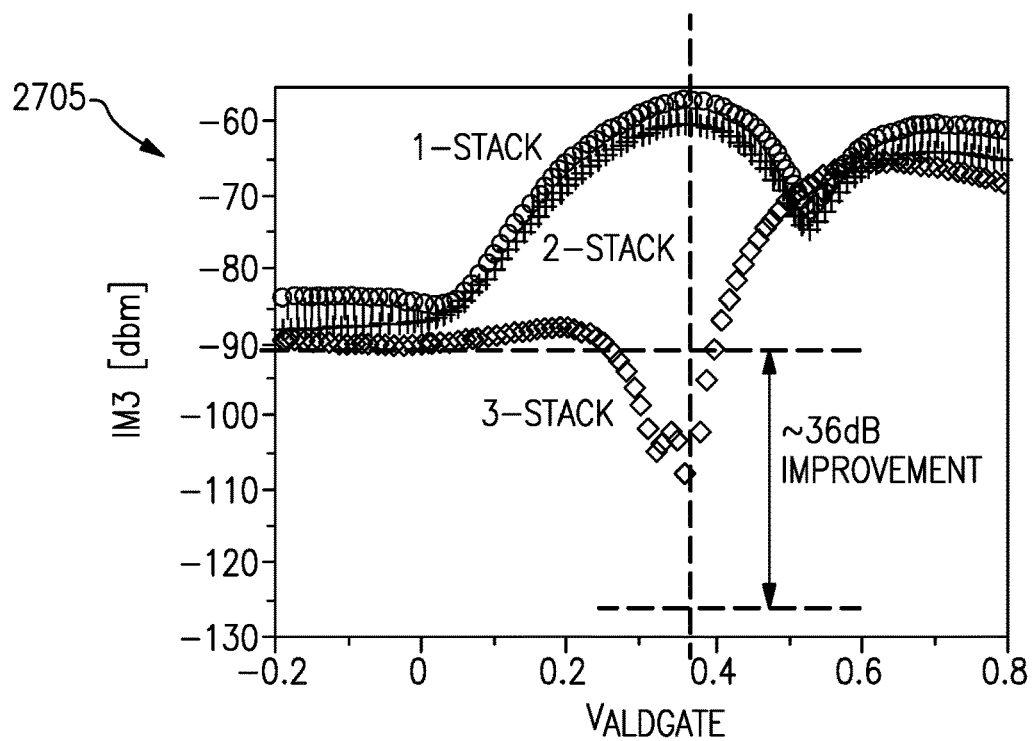
FIG. 27A illustrates a plot of data corresponding to third-order intermodulation products (IM3) of a switch path with a main path having a 12-FET stack biased using a gate bias of 3.5 V.

FIG. 27A illustrates a plot 2705 of data corresponding to third-order intermodulation products (IM3) of a switch path with a main path having a 12-FET stack biased using a gate bias of 3.5 V. The points labeled "1-stack" correspond to an auxiliary path in parallel with the main path where the auxiliary path includes a single FET. Similarly, the points labeled "2-stack" and "3-stack" correspond to auxiliary paths in parallel with the main path where the auxiliary path includes two FETs and three FETs, respectively. The gate bias is varied for the auxiliary path and the resulting signal characteristics are shown in the plot 2705. This data indicates that the FET stack size of the auxiliary path can influence the resulting improvements in signal linearity. Accordingly, in addition to tuning the gate bias, the auxiliary path can be configured to include a targeted or suitable number of FETs to achieve improvements in signal linearity.

Figure 27B:
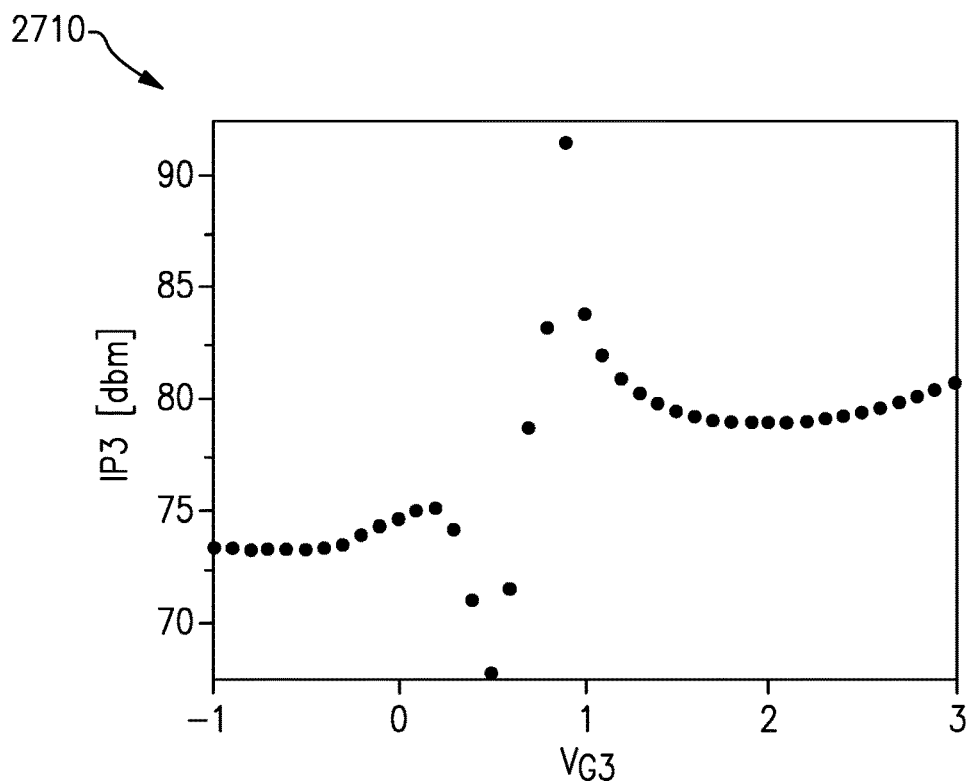
FIG. 27B illustrates a plot of third-order intercept point (IP3) as a function of gate bias applied to a subset of FETs in an auxiliary path.

FIG. 27B illustrates a plot 2710 of third-order intercept point (IP3) as a function of gate bias applied to a subset of FETs in an auxiliary path. The data corresponds to a circuit with a main path having a 12-FET stack biased using a gate bias of 3.5 V and an auxiliary path having a 12-FET stack where four of these FETs are biased using a fixed bias (1.2 V) and the remaining eight FETs were biased using a varying voltage, illustrated in the plot as $V_{G3}$. The plot 2710 illustrates the effect on IP3 of varying voltage on a subset of the FETs in an auxiliary path. Accordingly, another parameter that can be tuned in an auxiliary path to achieve improved signal linearity is the gate bias applied to a subset of FETs. In other words, different gate biases can be applied to different subsets of FETs in an auxiliary path to achieve targeted reductions in distortions.

Consequently, as described herein, linearity of a signal through a switch path can be improved through the introduction of an auxiliary path in addition to a main path. To tune the signal out of the auxiliary path to achieve a desired or targeted improvement in linearity, one or more of the following can be done: the number of FETs in an auxiliary path can be varied, the gate bias applied to one or more FETs in the auxiliary path can be tailored, different gate biases can be applied to different subsets of FETs in the auxiliary path, multiple auxiliary paths can be implemented, auxiliary paths can be implemented in series and/or in parallel with a main path, and the like. As is evident from the description herein, this list is not exhaustive of the ways to utilize an auxiliary path to improve signal linearity. It should be understood that the present disclosure encompasses variations and permutations of the embodiments described herein.

Examples Related to Implementations in Products

Various examples of main-auxiliary FET devices, circuits based on such devices, and bias/coupling configurations for such devices and circuits as described herein can be implemented in a number of different ways and at different product levels. Some of such product implementations are described by way of examples.

Figure 28A:
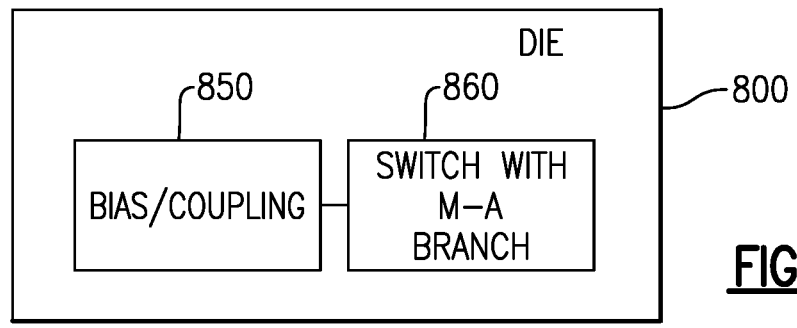
FIGS. 28A, 28B, 28C, and 28D illustrate non-limiting examples of biasing circuits and switches with main-auxiliary branches implemented on one or more semiconductor die.
Figure 28B:
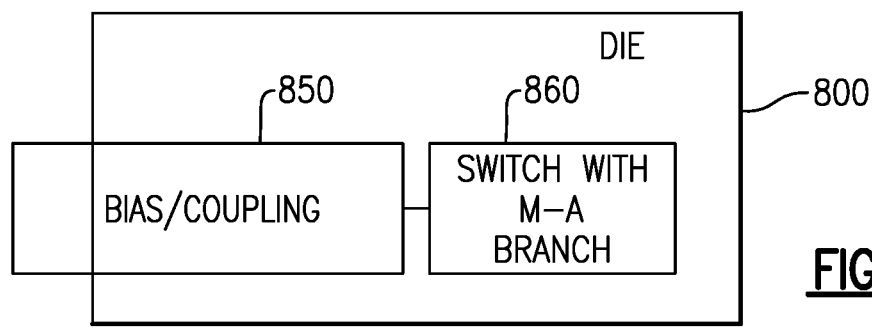

FIGS. 28A, 28B, 28C, and 28D illustrate non-limiting examples of such implementations on one or more semiconductor die. FIG. 28A illustrates that in some embodiments, a switch with a main-auxiliary branch 860 and a bias/coupling circuit 850 having one or more features as described herein can be implemented on a die 800. The switch with a main-auxiliary branch 860, for example, can include one or more main-auxiliary branches having the features described herein. The bias/coupling circuit 850, for example, can include one or more features of the bias networks described herein. FIG. 28B illustrates that in some embodiments, at least some of the bias/coupling circuit 850 can be implemented outside of the die 800 of FIG. 28A.

Figure 28C:
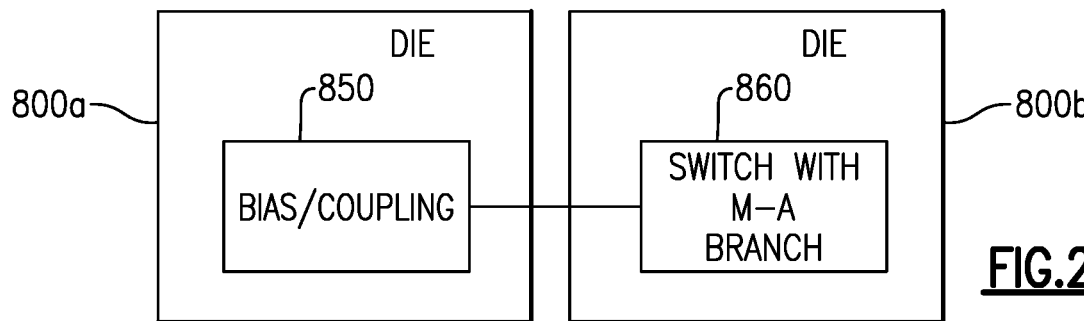
Figure 28D:
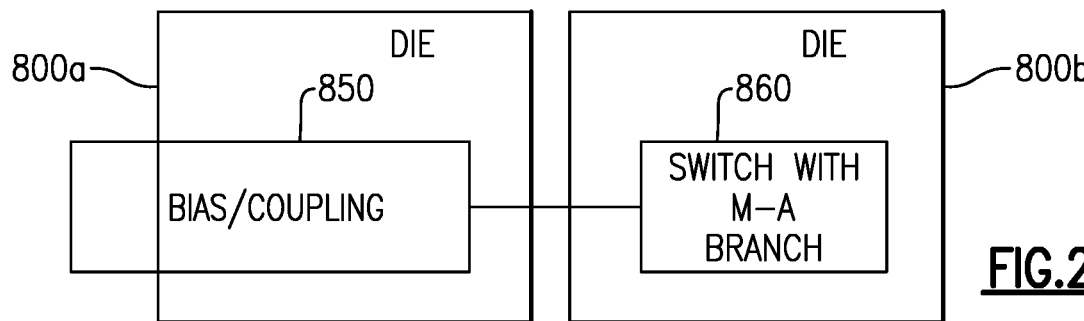

FIG. 28C illustrates that in some embodiments, a switch with a main-auxiliary branch 860 having one or more features as described herein can be implemented on one die 800b, and a bias/coupling circuit 850 having one or more features as described herein can be implemented on another die 800a. FIG. 28D illustrates that in some embodiments, at least some of the bias/coupling circuit 850 can be implemented outside of the other die 800a of FIG. 28C.

Figure 29A:
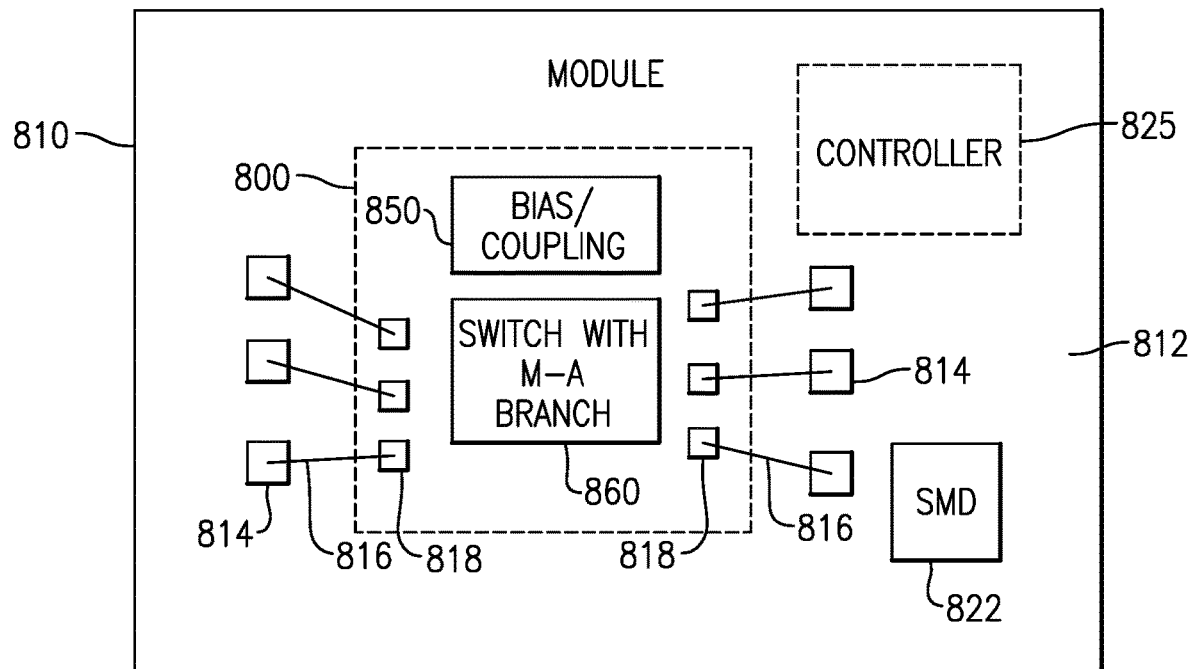
FIGS. 29A and 29B illustrate a plan view and a side view, respectively, of non-limiting examples of packaged modules that include biasing circuits and switches with main-auxiliary branches.

In some embodiments, one or more die having one or more features described herein can be implemented in a packaged module. An example of such a module is shown in FIGS. 29A (plan view) and 29B (side view). Although described in the context of both of the switch with a main-auxiliary branch and the bias/coupling circuit being on the same die (e.g., example configuration of FIG. 28A), it will be understood that packaged modules can be based on other configurations.

A module 810 is shown to include a packaging substrate 812. Such a packaging substrate can be configured to receive a plurality of components, and can include, for example, a laminate substrate. The components mounted on the packaging substrate 812 can include one or more die. In the example shown, a die 800 having a switch with a main-auxiliary branch 860 and a bias/coupling circuit 850 is shown to be mounted on the packaging substrate 812. The die 800 can be electrically connected to other parts of the module (and with each other where more than one die is utilized) through connections such as connection-wirebonds 816. Such connection-wirebonds can be formed between contact pads 818 formed on the die 800 and contact pads 814 formed on the packaging substrate 812. In some embodiments, one or more surface mounted devices (SMDs) 822 can be mounted on the packaging substrate 812 to facilitate various functionalities of the module 810.

In some embodiments, the packaging substrate 812 can include electrical connection paths for interconnecting the various components with each other and/or with contact pads for external connections. For example, a connection path 832 is illustrated as interconnecting the example SMD 822 and the die 800. In another example, a connection path 833 is illustrated as interconnecting the SMD 822 with an external-connection contact pad 834. In yet another example a connection path 835 is illustrated as interconnecting the die 800 with ground-connection contact pads 836.

In some embodiments, a space above the packaging substrate 812 and the various components mounted thereon can be filled with an overmold structure 830. Such an overmold structure can provide a number of desirable functionalities, including protection for the components and wirebonds from external elements, and easier handling of the packaged module 810.

Figure 29B:
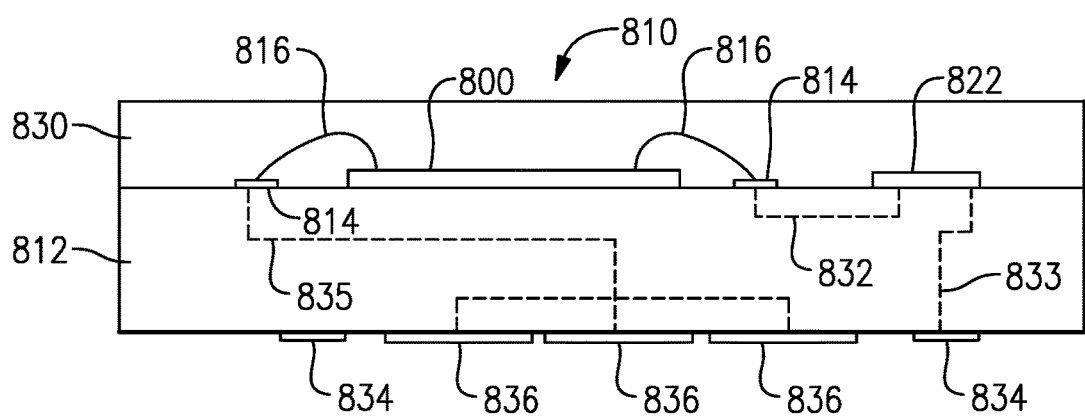
Figure 30:
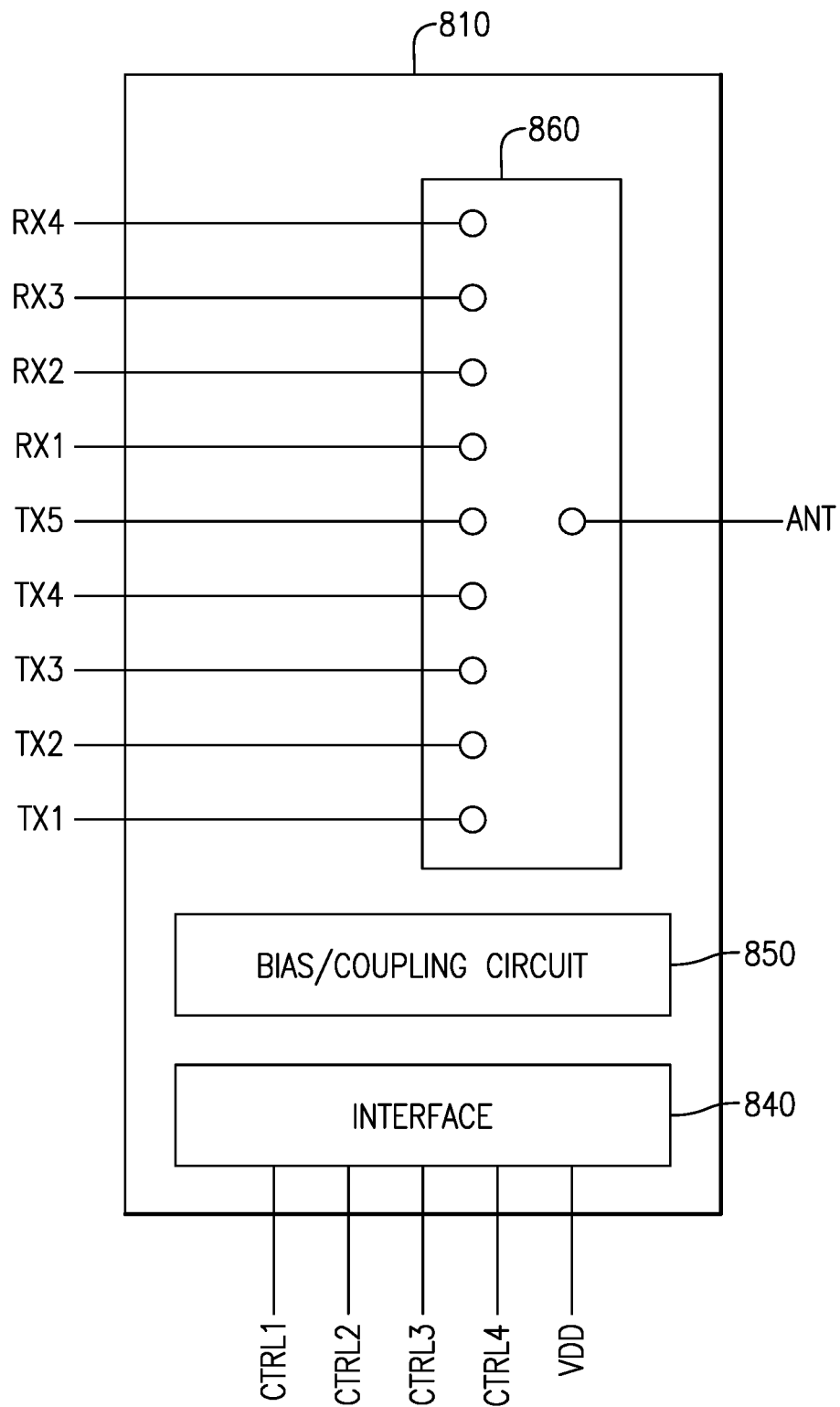
FIG. 30 illustrates a schematic diagram of an example switching configuration that can be implemented in the packaged module of FIGS. 29A and 29B.

FIG. 30 illustrates a schematic diagram of an example switching configuration that can be implemented in the module 810 described in reference to FIGS. 29A and 29B. In the example, the switch with a main-auxiliary branch 860 is illustrated as being an SP9T switch, with the pole being connectable to an antenna and the throws being connectable to various Rx and Tx paths. Such a configuration can facilitate, for example, multi-mode multi-band operations in wireless devices. As described herein, various switching configurations (e.g., including those configured for more than one antenna) can be implemented for the switch with a main-auxiliary branch 860. As also described herein, one or more throws of such switching configurations can be connectable to corresponding path(s) configured for TRx operations. One or more of the switchable paths through the switch with a main-auxiliary branch 860 can be implemented using a main-auxiliary configuration, examples of which have been described herein.

The module 810 can further include an interface for receiving power (e.g., supply voltage VDD) and control signals to facilitate operation of the switch with a main-auxiliary branch 860 and/or the bias/coupling circuit 850. In some implementations, supply voltage and control signals can be applied to the switch with a main-auxiliary branch 860 via the bias/coupling circuit 850.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 31:
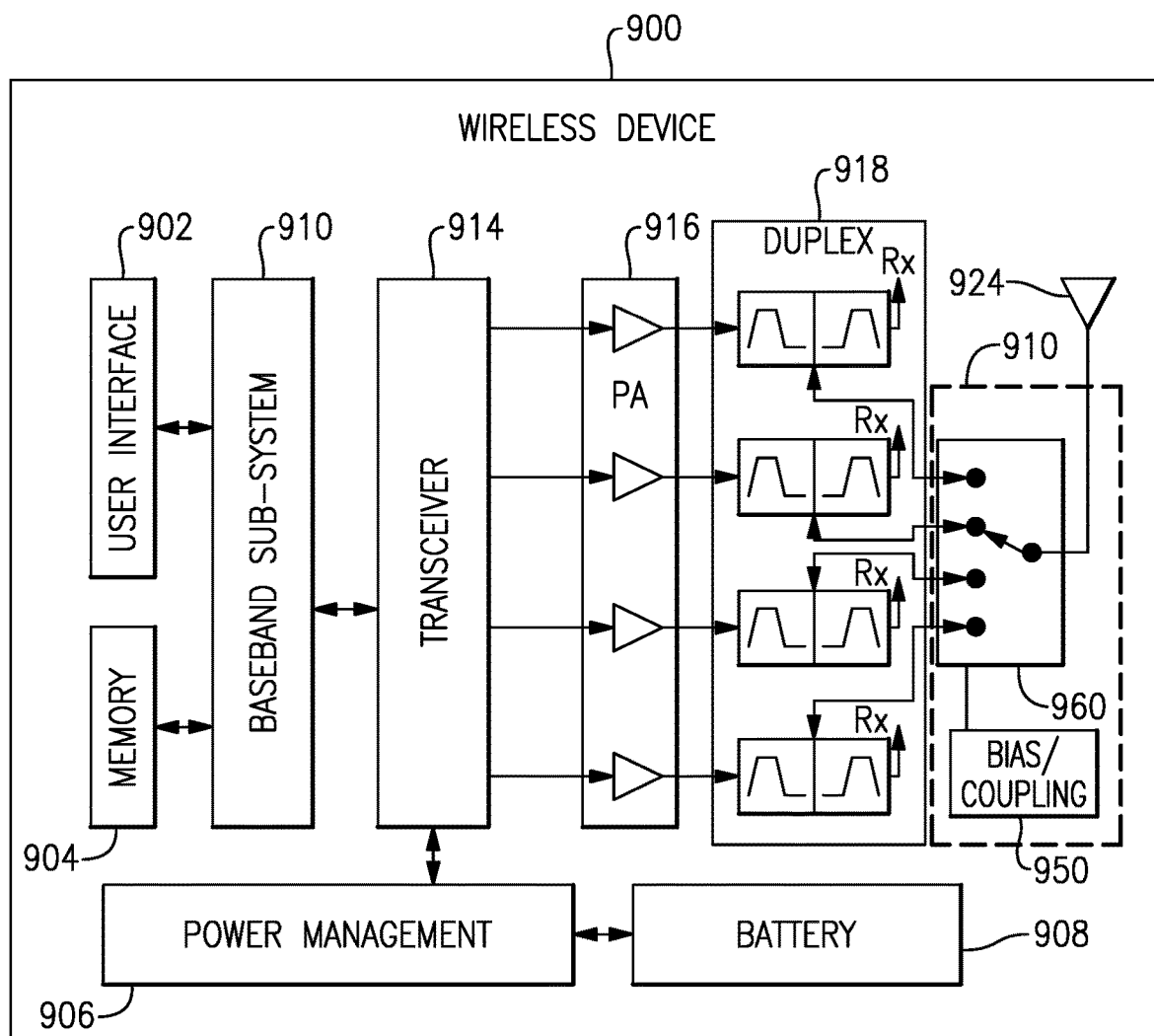
FIG. 31 illustrates an example wireless device having one or more advantageous features described herein.

FIG. 31 illustrates an example wireless device 900 having one or more advantageous features described herein. In the context of various switches and various biasing/coupling configurations as described herein, a switch with a main-auxiliary branch 960 and a bias/coupling circuit 950 can be part of a module 910. In some embodiments, the switch module 910 can facilitate, for example, multi-band multi-mode operations of the wireless device 900. The switch with a main-auxiliary branch 960 can use a main-auxiliary FET device on one or more of the switchable paths through the switch with a main-auxiliary branch 960. The bias/coupling circuit 950 can provide gate and/or body biasing to the main-auxiliary FET device(s) implemented in the switch with a main-auxiliary branch 960 using any of the gate and/or body bias network configurations described herein.

In the example wireless device 900, a power amplifier (PA) assembly 916 having a plurality of PAs can provide one or more amplified RF signals to the switch with a main-auxiliary branch 960 (via an assembly of one or more duplexers 918), and the switch with a main-auxiliary branch 960 can route the amplified RF signal(s) to one or more antennas. The PAs 916 can receive corresponding unamplified RF signal(s) from a transceiver 914 that can be configured and operated in known manners. The transceiver 914 can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900. Such a power management component can also control operations of the baseband sub-system 910 and the module 910.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexers 918 can allow transmit and receive operations to be performed simultaneously using a common antenna (e.g., 924). In FIG. 31, received signals are shown to be routed to "Rx" paths that can include, for example, one or more low-noise amplifiers (LNAs).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

General Comments

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure.

Some embodiments may be described with reference to equations, algorithms, and/or flowchart illustrations. These methods may be implemented using computer program instructions executable using one or more processors or dedicated integrated circuits or chips. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be executed by any suitable programmable processing apparatus to produce a machine, such that the computer program instructions implement the functions specified in the equations, algorithms, and/or flowcharts. It will also be understood that each equation and/or algorithm and combinations thereof, may be implemented by special purpose processors or other hardware-based systems that perform the specified functions or steps. The various functions disclosed herein may be embodied in computer-executable program instructions and/or implemented in application-specific circuitry (e.g., ASICs or FPGAs).

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency (RF) module comprising:
a packaging substrate configured to receive a plurality of devices; and
a circuit assembly mounted on the packaging substrate and implemented in a series arm of a multi-pole, multi-throw switch, the circuit assembly including a branch including a main path in parallel with an auxiliary path, and a gate bias network connected to the main path and to the auxiliary path, the main path and the auxiliary path each having different structures that are configured to improve linearity of the switching function upon application of a single gate bias signal that biases the main path in a strong inversion region and that biases the auxiliary path in a weak inversion region.

2. The circuit assembly RF module of claim 1 wherein the gate bias network is configured to bias the auxiliary path to generate third-order harmonics or third-order intermodulation products that are opposite in phase to third-order harmonics or third-order intermodulation products generated by the main path.

3. The RF module of claim 1 wherein the different structures include different well implants.

4. The RF module of claim 1 wherein the different structures include different halo implants.

5. The RF module of claim 1 wherein the different structures include different device geometries.

6. The RF module of claim 1 wherein the different structures include different gate oxide thicknesses.

7. The RF module of claim 1 wherein the different structures include different buried oxide (BOX) layer thickness.

8. The RF module of claim 1 wherein the different structures include different silicon thickness.

9. The RF module of claim 1 further comprising a body bias network connected to both the main path and the auxiliary path.

10. The RF module of claim 1 wherein the main path and the auxiliary path are part of a multi-finger device.

* * * * *